(12) United States Patent
Iijima et al.

(10) Patent No.: US 12,317,627 B2
(45) Date of Patent: May 27, 2025

(54) SEMICONDUCTOR APPARATUS AND SEMICONDUCTOR APPARATUS MANUFACTURING METHOD

(71) Applicant: SONY SEMICONDUCTOR SOLUTIONS CORPORATION, Kanagawa (JP)

(72) Inventors: Tadashi Iijima, Kanagawa (JP); Yuki Miyanami, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 608 days.

(21) Appl. No.: 17/619,750

(22) PCT Filed: Jun. 26, 2020

(86) PCT No.: PCT/JP2020/025145
§ 371 (c)(1),
(2) Date: Dec. 16, 2021

(87) PCT Pub. No.: WO2020/262582
PCT Pub. Date: Dec. 30, 2020

(65) Prior Publication Data
US 2022/0359599 A1 Nov. 10, 2022

(30) Foreign Application Priority Data
Jun. 26, 2019 (JP) .................. 2019-119166

(51) Int. Cl.
*H10F 39/00* (2025.01)
*H01L 23/00* (2006.01)

(52) U.S. Cl.
CPC .......... *H10F 39/809* (2025.01); *H01L 24/08* (2013.01); *H01L 24/80* (2013.01); *H10F 39/018* (2025.01);
(Continued)

(58) Field of Classification Search
CPC ..................................................... H10F 39/809
See application file for complete search history.

(56) References Cited

U.S. PATENT DOCUMENTS

| | | | |
|---|---|---|---|
| 2011/0155893 A1* | 6/2011 | Endo | H10F 39/199 257/292 |
| 2016/0284753 A1* | 9/2016 | Komai | H10F 39/811 |

(Continued)

FOREIGN PATENT DOCUMENTS

| | | |
|---|---|---|
| EP | 2518768 A1 | 10/2012 |
| EP | 3540776 A2 | 9/2019 |

(Continued)

OTHER PUBLICATIONS

International Search Report and Written Opinion of PCT Application No. PCT/JP2020/025145, issued on Sep. 8, 2020, 12 pages of ISRWO.

*Primary Examiner* — William A Harriston
(74) *Attorney, Agent, or Firm* — CHIP LAW GROUP

(57) ABSTRACT

Provided is a semiconductor apparatus that can realize further enhancement of capabilities regarding a stacked structure of plural substrates. The semiconductor apparatus includes a first substrate that includes a first element layer including a first active element, and a first wiring layer arranged on the first element layer; and a second substrate that includes a second element layer including a second active element arranged on the first wiring layer, and a second wiring layer arranged on the second element layer, in which the first substrate and the second substrate are stacked one on another, and the second active element is provided in a compound semiconductor substrate.

14 Claims, 76 Drawing Sheets

(52) U.S. Cl.
CPC .. *H10F 39/811* (2025.01); *H01L 2224/08145* (2013.01); *H01L 2224/80895* (2013.01); *H01L 2224/80896* (2013.01)

(56) References Cited

U.S. PATENT DOCUMENTS

| | | | |
|---|---|---|---|
| 2018/0166490 A1 | 6/2018 | Wakiyama et al. | |
| 2019/0252443 A1* | 8/2019 | Kobayashi | H01L 27/14634 |
| 2019/0319055 A1* | 10/2019 | Zaizen | H01L 31/035281 |
| 2021/0366961 A1* | 11/2021 | Yanagita | H10F 39/8057 |

FOREIGN PATENT DOCUMENTS

| | | |
|---|---|---|
| JP | 2014-099582 A | 5/2014 |
| JP | 2015-135938 A | 7/2015 |
| JP | 2016-096233 A | 5/2016 |
| JP | 2016-171297 A | 9/2016 |
| JP | 2018-078245 A | 5/2018 |
| WO | 2011/077580 A1 | 6/2011 |
| WO | 2015/093017 A1 | 6/2015 |
| WO | 2016/076138 A1 | 5/2016 |
| WO | 2016/143288 A1 | 9/2016 |
| WO | 2018/088083 A1 | 5/2018 |
| WO | 2018/186194 A1 | 10/2018 |

* cited by examiner

SEMICONDUCTOR APPARATUS AND SEMICONDUCTOR APPARATUS MANUFACTURING METHOD

CROSS REFERENCE TO RELATED APPLICATIONS

This application is a U.S. National Phase of International Patent Application No. PCT/JP2020/025145 filed on Jun. 26, 2020, which claims priority benefit of Japanese Patent Application No. JP 2019-119166 filed in the Japan Patent Office on Jun. 26, 2019. Each of the above-referenced applications is hereby incorporated herein by reference in its entirety.

TECHNICAL FIELD

The technology according to the present disclosure (present technology) relates to a semiconductor apparatus and a semiconductor apparatus manufacturing method.

BACKGROUND ART

In the past, there has been a known method of increasing the vertical density of elements such as transistors by stacking plural substrates each of which has elements formed therein (see PTL 1). This method has a feature that not only one planar surface is used, but the number of elements increases as the number of planar surfaces to be used increases to two or to three by stacking them one on another. In a case where this method is used for elements for which area sizes are limited, the elements can be increased, and a complicated circuit can be configured in small area sizes.

Pixel sizes in image sensors are fixed, and the area size of elements formed for each pixel is limited to a pixel size. Accordingly, the sizes of elements cannot be changed freely, and furthermore there is a limitation in terms of increase of the number of elements for the purpose of forming a complicated circuit. Accordingly, a method that increases area sizes of elements by forming a stacked structure of plural substrates is a very beneficial method for devices like image sensors in which area sizes of elements are restricted.

CITATION LIST

Patent Literature

[PTL 1]
JP 2014-99582A

SUMMARY

Technical Problem

There is a demand for further enhancement of capabilities of an image sensor that uses a stacked structure of plural substrates such as lower power consumption, suppression of heat generation, enhancement of withstand voltage or application and development regarding regions outside the visible light region.

An object of the present technology is to provide a semiconductor apparatus and a semiconductor apparatus manufacturing method that can realize further enhancement of capabilities regarding a stacked structure of plural substrates.

Solution to Problem

According to the gist of a semiconductor apparatus according to one aspect of the present technology, the semiconductor apparatus includes a first substrate that includes a first element layer including a first active element, and a first wiring layer arranged on the first element layer; and a second substrate that includes a second element layer including a second active element arranged on the first wiring layer, and a second wiring layer arranged on the second element layer, in which the first substrate and the second substrate are stacked one on another, and the second active element is provided in a compound semiconductor substrate.

According to the gist of a semiconductor apparatus according to another aspect of the present technology, the semiconductor apparatus includes a first substrate that includes a photoelectric converting section and a first wiring layer arranged on the photoelectric converting section; and a second substrate that includes an element layer including an active element arranged on the first wiring layer, and a second wiring layer arranged on the element layer, in which the first substrate and the second substrate are stacked one on another, and the photoelectric converting section is provided in a compound semiconductor substrate.

According to the gist of a semiconductor apparatus manufacturing method according to still another aspect of the present technology, the semiconductor apparatus manufacturing method includes forming a first substrate including a first element layer including a first active element, and a first wiring layer by forming the first wiring layer on the first element layer; preparing a second substrate in which a second element layer including a second active element is formed; forming the second element layer on the first wiring layer by pasting, on a first wiring layer side of the first substrate, a second element layer side of the second substrate; and forming a second wiring layer on the second element layer.

According to the gist of a semiconductor apparatus manufacturing method according to yet another aspect of the present technology, the semiconductor apparatus manufacturing method includes forming a first substrate including a photoelectric converting section provided in a compound semiconductor substrate, and a first wiring layer by forming the first wiring layer on the photoelectric converting section; preparing a second substrate in which an element layer including an active element is formed; forming the element layer on the first wiring layer by pasting, on a first wiring layer side of the first substrate, an element layer side of the second substrate; and forming a second wiring layer on the element layer.

BRIEF DESCRIPTION OF DRAWINGS

FIG. 74 is a planar schematic diagram representing another example of a pixel separating section depicted in FIG. 44A and the like.

DESCRIPTION OF EMBODIMENTS

Figure 1:
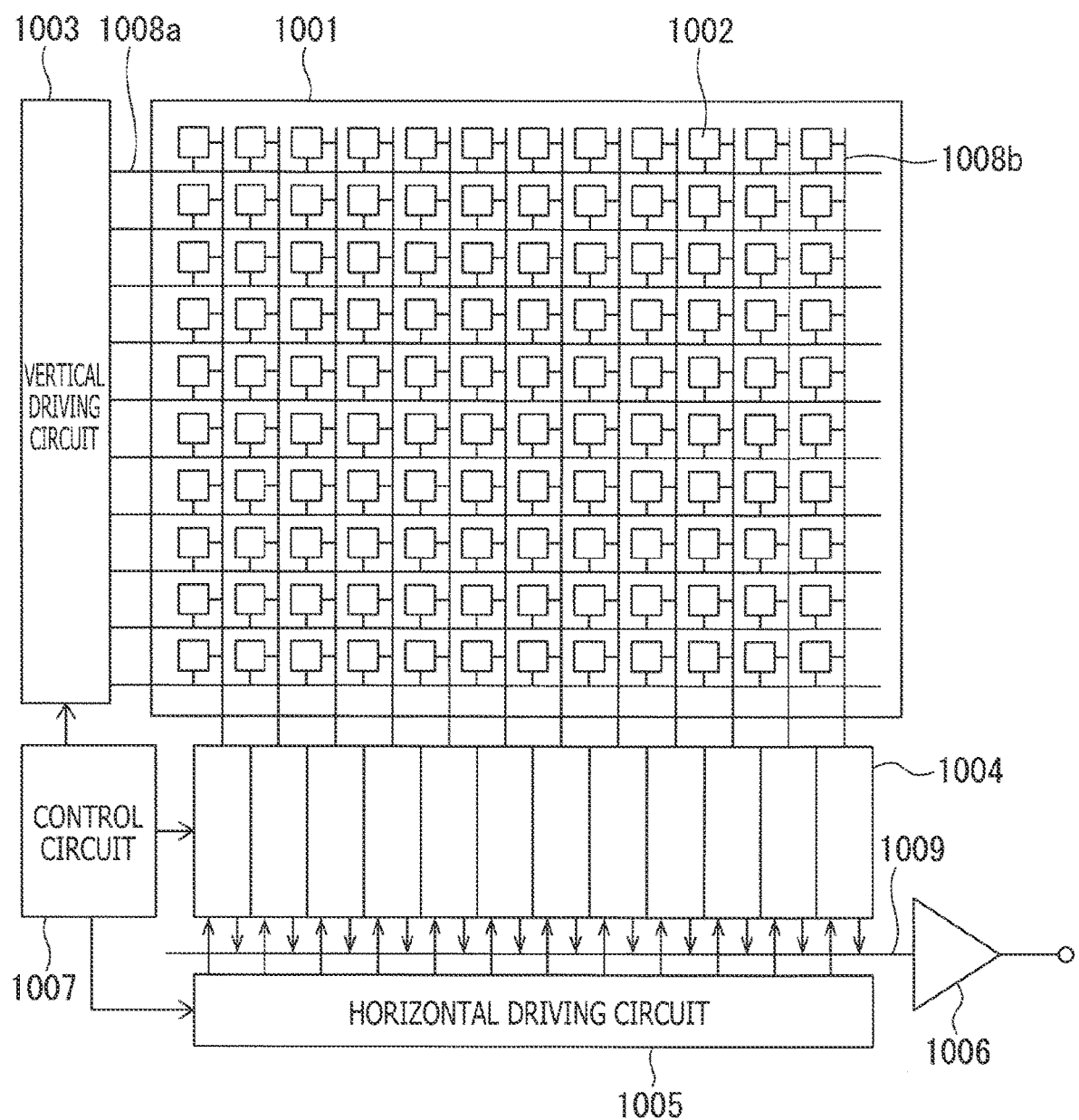
FIG. 1 is a schematic configuration diagram of a semiconductor apparatus according to a first embodiment of the present technology.

Hereinafter, first to fifth embodiments or the like of the present technology are explained with reference to the figures. In the descriptions of the figures that are referred to in the following explanation, identical or similar portions are given identical or similar reference characters. It should be noted however that the figures are schematic figures, and the relation between thicknesses and planar dimensions, the ratio of the thicknesses of layers and the like are different from actual ones. Accordingly, specific thicknesses and dimensions should be determined by taking the following explanation into consideration. In addition, certainly, dimensions depicted in different figures may have different relation and ratios from each other. Note that advantages described in the present specification are presented merely for illustrative purposes, the advantages of the present disclosure are not limited to them, and there may be other advantages.

First Embodiment

<Configuration of Semiconductor Apparatus>

As a semiconductor apparatus according to a first embodiment of the present technology, a backside illumination CMOS image sensor (solid-state image pickup apparatus) is illustrated. As depicted in FIG. 1, the semiconductor apparatus according to the first embodiment of the present technology includes a pixel region (unit cell region) 1001, a vertical driving circuit 1003, column signal processing circuits 1004, a horizontal driving circuit 1005, an output circuit 1006 and a control circuit 1007.

The pixel region 1001 has plural pixels (unit cells) 1002 arrayed in a two-dimensional matrix. Each of the plural pixels 1002 has a photoelectric converting section and plural pixel transistors (cell circuits). As the plural pixel transistors, for example, four transistors which are a transfer transistor, a reset transistor, a selection transistor and an amplification transistor can be adopted.

For example, the vertical driving circuit 1003 includes a shift register. The vertical driving circuit 1003 sequentially selects pixel driving wires 1008a, supplies the selected pixel driving wires 1008a with pulses for driving the pixels 1002, and drives each row of the pixels 1002. That is, the vertical driving circuit 1003 selectively scans each row of the pixels 1002 in the pixel region 1001 sequentially vertically, and supplies, through vertical signal lines 1008b, the column signal processing circuits 1004 with output signals (pixel signals) from the pixels based on signal charge generated by photoelectric converting sections of the pixels 1002.

For example, each column signal processing circuit 1004 is arranged for one column of pixels 1002, and performs signal processing such as noise removal on signals output from one row of pixels 1002, for each pixel column. For example, the column signal processing circuit 1004 performs signal processing such as correlated double sampling (CDS) for removing fixed pattern noise unique to pixels, or analog/digital (AD) conversion.

For example, the horizontal driving circuit 1005 includes a shift register. The horizontal driving circuit 1005 sequentially outputs horizontal scanning pulses to the column signal processing circuits 1004, sequentially selects the column signal processing circuits 1004, and causes the selected column signal processing circuits 1004 to output, to a horizontal signal line 1009, pixel signals on which the signal processing has been performed. The output circuit 1006 performs signal processing on a pixel signal supplied sequentially from each of the column signal processing circuits 1004 through the horizontal signal line 1009, and outputs the pixel signal.

On the basis of vertical synchronizing signals, horizontal synchronization signals and master clock signals, the control circuit 1007 generates clock signals and control signals to function as reference signals for operation of the vertical driving circuit 1003, the column signal processing circuits 1004, the horizontal driving circuit 1005 and the like. Then, the control circuit 1007 outputs the generated clock signals and control signals to the vertical driving circuit 1003, the column signal processing circuits 1004, the horizontal driving circuit 1005 and the like.

Figure 2:
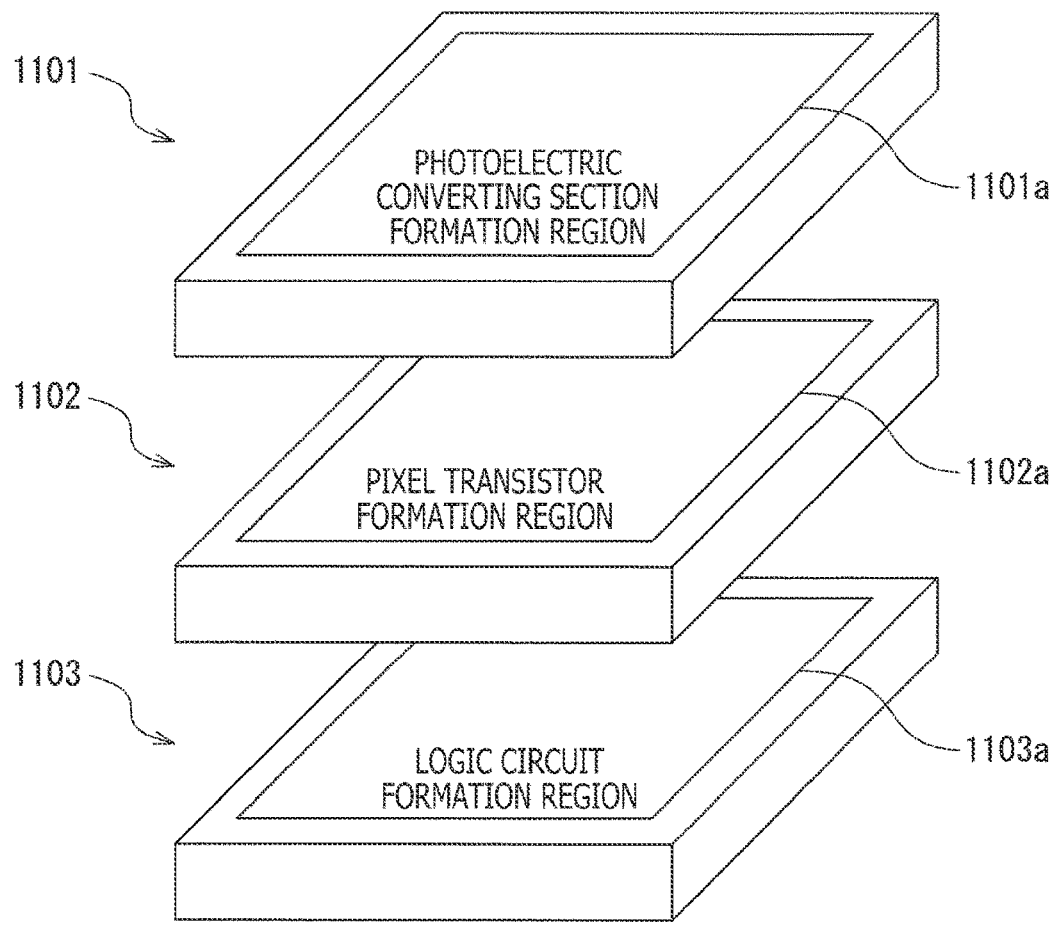
FIG. 2 is a conceptual diagram of stacking of substrates of the semiconductor apparatus according to the first embodiment of the present technology.

The semiconductor apparatus according to the first embodiment of the present technology has a three-dimensional structure formed by stacking the configuration depicted in FIG. 1 as depicted in FIG. 2. That is, the semiconductor apparatus according to the first embodiment of the present technology is configured to have a stacked structure formed by pasting together three substrates which are a first substrate (sensor substrate) 1101, a second substrate (pixel transistor substrate) 1102 and a third substrate (logic substrate) 1103.

The first substrate 1101 includes a photoelectric converting section formation region 1101a in which photoelectric converting sections that perform photoelectric conversion of incident light are formed. In addition to the photoelectric converting sections, at least some of pixel transistors such as transfer transistors that control photoelectrically converted signal charge may be formed in the photoelectric converting section formation region 1101a.

The second substrate 1102 includes a pixel transistor formation region 1102a in which at least some of pixel transistors that control photoelectrically converted signal charge are formed. For example, at least some of pixel transistors such as reset transistors, selection transistors or amplification transistors may be formed in the pixel transistor formation region 1102a. Note that, for example, only amplification transistors in pixel transistors may be provided in the second substrate 1102, and either of or both reset transistors and selection transistors may be provided in the third substrate 1103.

The third substrate 1103 includes a logic circuit formation region 1103a in which logic circuits to execute signal processing are formed. For example, as the logic circuits, the logic circuit formation region 1103a may include at least some of the vertical driving circuit 1003, the column signal processing circuits 1004, the horizontal driving circuit 1005, the output circuit 1006 and the control circuit 1007 depicted in FIG. 1.

Note that, although FIG. 2 illustrates a stacked structure formed by pasting together the three substrates which are the first substrate 1101, the second substrate 1102 and the third substrate 1103, for example, the stacked structure may be formed by pasting together two substrates which are the first substrate 1101 and the second substrate 1102. In that case, for example, the logic circuit formation region 1103a of the third substrate 1103 may be formed in the second substrate 1102 or the like. In addition, the stacked structure may be formed by further pasting together one or more substrates on the third substrate 1103.

Figure 3:
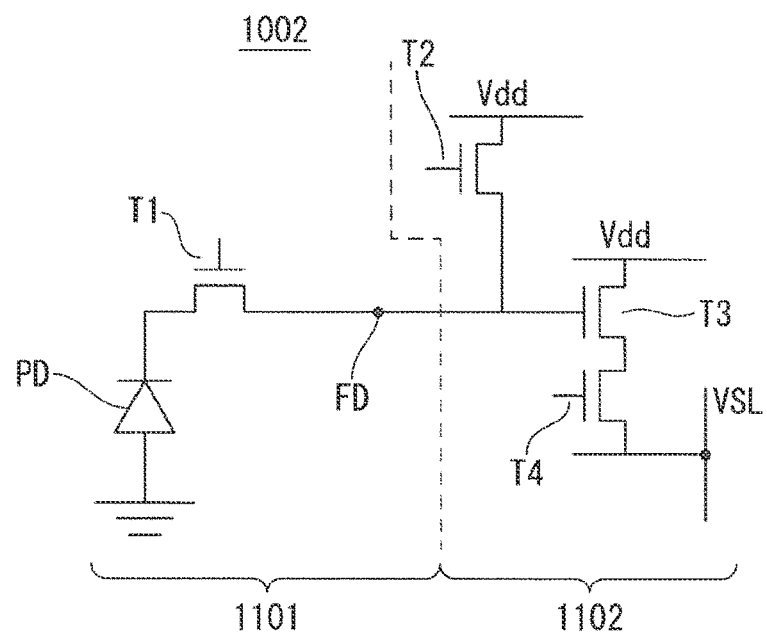
FIG. 3 is an equivalent circuit of a pixel region of the semiconductor apparatus according to the first embodiment of the present technology.

FIG. 3 represents an example of an equivalent circuit of a pixel 1002 in the semiconductor apparatus according to the first embodiment of the present technology. As represented by a boundary represented by a broken line in FIG. 3, the pixel 1002 includes a circuit including active elements provided in the first substrate 1101 and a circuit including active elements provided in the second substrate 1102. "Active elements" are semiconductor elements like transistors having amplification functions or switching functions.

As depicted in FIG. 3, the first substrate 1101 includes, as active elements therein, a photodiode PD which is a photoelectric converting section whose anode is grounded and a transfer transistor T1 whose source is connected with the cathode of the photodiode PD. The drain of the transfer transistor T1 is connected with an electric charge accumulation region (floating diffusion region) FD in a floating state. The electric charge accumulation region FD is connected to the source of a reset transistor T2 which is an active element provided in the second substrate 1102 and the gate of an amplification transistor T3 which is an active element. A selection transistor T4 is further provided as an active element in the second substrate 1102. The source of the amplification transistor T3 is connected to the drain of the selection transistor T4, and the drain of the amplification transistor T3 is connected to a power supply Vdd. The source of the selection transistor T4 is connected to a vertical signal line VSL. The drain of the reset transistor T2 is connected to the power supply Vdd.

At the time of operation of the semiconductor apparatus according to the first embodiment, signal charge generated by the photodiode PD is accumulated in the electric charge accumulation region FD via the transfer transistor T1, and the signal charge accumulated in the electric charge accumulation region FD is read out, and applied to the gate of the amplification transistor T3. The gate of the selection transistor T4 is given a horizontal line selection control signal from a vertical shift register. By making the selection control signal a high (H) level signal, the selection transistor T4 becomes conductive, and a current corresponding to the potential of the electric charge accumulation region FD amplified at the amplification transistor T3 flows to the vertical signal line VSL. In addition, by making a reset control signal to be applied to the gate of the reset transistor T2 a high (H) level signal, the reset transistor T2 becomes conductive, and signal charge accumulated in the electric charge accumulation region FD is reset.

Figure 4:
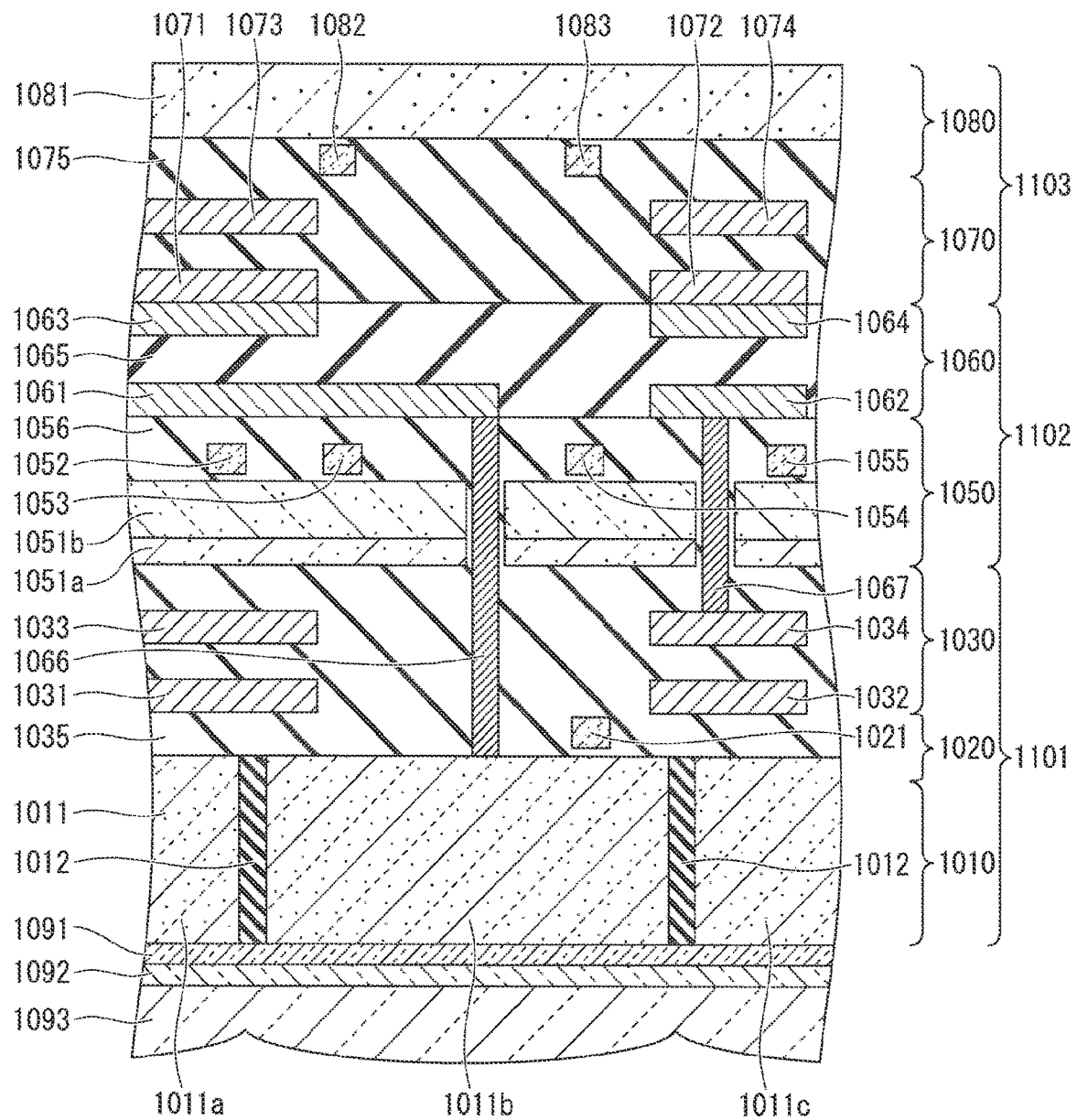
FIG. 4 is a cross-sectional view of main sections of the pixel region of the semiconductor apparatus according to the first embodiment of the present technology.

FIG. 4 schematically depicts a part of the cross-sectional structure of the semiconductor apparatus according to the first embodiment. The semiconductor apparatus according to the first embodiment has a stacked structure formed by pasting and joining together three substrates which are the first substrate 1101, the second substrate 1102 and the third substrate 1103. The semiconductor apparatus according to the first embodiment is a backside illumination solid-state image pickup apparatus, and receives light entering from the backside (the lower side in FIG. 4).

The first substrate 1101 includes a sensor layer 1010; a first element layer 1020 that is arranged on the sensor layer 1010 and includes a first active element 1021; and a first wiring layer 1030 arranged on the first element layer 1020. The second substrate 1102 includes a second element layer 1050 that is arranged on the first wiring layer 1030 via an interlayer dielectric film 1042 and includes second active elements 1052, 1053, 1054 and 1055; and a second wiring layer 1060 arranged on the second element layer 1050. The third substrate 1103 includes a third wiring layer 1070 arranged on the second wiring layer 1060; and a third element layer 1080 that is arranged on the third wiring layer 1070 and includes active elements.

The sensor layer 1010 has plural photoelectric converting sections 1011a, 1011b and 1011c formed in a semiconductor substrate (Si substrate) 1011 including silicon (Si) or the like. Each of the photoelectric converting sections 1011a, 1011b and 1011c includes a photodiode. The photodiode includes a pn junction between a p-type well region (not depicted) formed in the Si substrate 1011 and an n-type electric charge generation region (not depicted).

The adjacent photoelectric converting sections 1011a, 1011b and 1011c are element-separated by element separating sections 1012. For example, the element separating sections 1012 are formed like a grid when seen from below in FIG. 4. The element separating sections 1012 have functions of electrically and optically separating the adjacent photoelectric converting sections 1011a, 1011b and 1011c from each other. For example, the element separating sections 1012 can include insulating films embedded in groove sections provided in the Si substrate 1011. For example, the insulating films may be structures formed by stacking fixed electric charge films such as hafnium oxide films (HfO$_2$ films), and silicon oxide films (SiO$_2$ films). Alternatively, the element separating sections 1012 may include insulating films embedded in groove sections provided in the Si substrate 1011, and light-shielding metal films including tungsten (W) or the like embedded in the groove sections via the insulating films. Light-shielding films (not depicted) including tungsten (W) or the like may be arranged below the element separating sections 1012.

A flattening film 1091, a color filter 1092, a microlens 1093, wires (not depicted) and the like are arranged on the backside of the sensor layer 1010. The flattening film 1091 flattens the backsides of the photoelectric converting sections 1011a, 1011b and 1011c. The microlens 1093 condenses incident light entering the photoelectric converting sections 1011a, 1011b and 1011c. The color filter 1092 color-separates incident light entering the photoelectric converting sections 1011a, 1011b and 1011c.

For example, the first element layer 1020 is included in a first cell circuit that independently takes out electric signals generated by photoelectric conversion of the incident light by the plural photoelectric converting sections 1011a, 1011b and 1011c. The first element layer 1020 includes the first active element 1021 that is formed on the front surface of the Si substrate 1011, and is included in the first cell circuit. For example, the first active element 1021 can include the transfer transistor T1 depicted in FIG. 3. While the transfer transistor T1 can include a MOS transistor as an active element, more typically the transfer transistor T1 may be an insulated gate transistor (MIS transistor) such as a MISFET or a MISSIT including, in the gate insulating film, a material other than an oxide film (SiO$_2$ film).

For convenience, FIG. 4 schematically depicts only the gate electrode of the first active element 1021. For example, the gate electrode of the first active element 1021 may be a vertical gate having a T-shaped cross-sectional shape. Note that unlike the circuit configuration depicted in FIG. 3, the first element layer 1020 may further include at least any of pixel transistors such as the reset transistor T2, the amplification transistor T3 and the selection transistor T4, in addition to the transfer transistor T1.

The first wiring layer 1030 is electrically connected with the first element layer 1020. The first wiring layer 1030 has wires 1031, 1032, 1033 and 1034 embedded in an interlayer dielectric film 1035. As a material of the wires 1031, 1032, 1033 and 1034, for example, metal such as copper (Cu) can be used, and, as a material of the interlayer dielectric film 1035, a silicon oxide film (SiO$_2$ film) or the like can be used. FIG. 4 illustrates a case where the lower wires 1031 and 1032 and the upper wires 1033 and 1034 form a dual-layer wire structure, but the number of layers of wires of the first wiring layer 1030 is not limited to this. For example, the number of layers of wires of the first wiring layer 1030 may be one, or may be three or larger. The lower wires 1031 and 1032 and the upper wires 1033 and 1034 may be electrically connected by vias (not depicted).

For example, the second element layer 1050 is included in a second cell circuit connected to the first element layer 1020, corresponding to each of plural pixels 1002. The second element layer 1050 has the second active elements 1052, 1053, 1054 and 1055 that are formed in a semiconductor substrate (Si substrate) 1051 including Si, and are included in the second cell circuit. For example, each of the second active elements 1052, 1053, 1054 and 1055 can include at least any of the reset transistor T2, the amplification transistor T3 and the selection transistor T4 depicted in FIG. 3. Each of the reset transistor T2, the amplification transistor T3 and the selection transistor T4 can include a MOS transistor, but more typically may be a MIS transistor. For convenience, FIG. 4 schematically depicts only the gate electrodes of the second active elements 1052, 1053, 1054 and 1055.

The second element layer 1050 has a structure formed by stacking a semiconductor substrate (Si substrate) 1051a including Si, and a semiconductor substrate (compound semiconductor substrate) 1051b including a compound semiconductor arranged on the Si substrate 1051a. The second element layer 1050 has the second active elements 1052, 1053, 1054 and 1055 formed in the compound semiconductor substrate 1051b. That is, the source regions and drain regions of the second active elements 1052, 1053, 1054 and 1055 are formed in the compound semiconductor substrate 1051b.

As a material of the compound semiconductor substrate 1051b, for example, a compound semiconductor such as gallium nitride (GaN), gallium arsenide (GaAs) or silicon carbide (SiC) can be used, and any material can be used as long as desired capabilities can be attained as element characteristics. As a material of the compound semiconductor substrate 1051b, a semiconductor such as indium phosphide (InP) can also be used, and furthermore a semiconductor such as aluminum gallium arsenide (AlGaAs) including three chemical elements or more can also be used. Note that a semiconductor material different from Si and other than a compound semiconductor can also be adopted.

Table 1 depicts the mobility, saturated electron speed, heat conductivity, breakdown voltage and travelling electron density of Si, and GaAs, SiC and GaN which are compound semiconductors.

TABLE 1

| | Si | GaAs | SiC | GaN |
|---|---|---|---|---|
| Mobility (cm$^2$/Vs) | 1300 | 6000-8000 | 600 | 1500 |
| Saturated electron speed (cm/s) | $1 \times 10^7$ | $1.3 \times 10^7$ | $2 \times 10^7$ | $2.7 \times 10^7$ |
| Heat conductivity (W/cm/K) | 1.5 | 0.5 | 4.9 | 1.5 |
| Breakdown electric field (MV/cm) | 0.3 | 0.4 | 3 | 3 |
| Travelling electron density (/cm$^2$) | $1 \times 10^{12}$ | $1 \times 10^{12}$ | $1 \times 10^{12}$ | $1 \times 10^{13}$ |

As can be recognized from Table 1, the compound semiconductors have high electron mobility and high saturated electron density as compared with Si, and so low power consumption can be realized by using transistors that operate efficiently. Further, the compound semiconductors can reduce switching loss at a high voltage and a high frequency as compared with Si. Further, for example, SiC has heat conductivity which is three times or more higher than that of Si, and provides advantages of suppressing heat generation due to element driving, and of dissipating heat. Further, SiC and GaN have high withstand voltages as compared with Si, and provides an advantage of excellent characteristics in terms of high-voltage driving.

In a case where conventional semiconductor apparatuses have a stacked structure of plural substrates, typically, elements of each substrate are formed by using a Si substrate. However, there are limitations on Si elements, and there have been problems such as a problem that operation at a high-temperature, driving by a high voltage, and heat dissipation properties are restricted. In contrast to this, according to the semiconductor apparatus according to the first embodiment of the present technology, because the second element layer 1050 has the second active elements 1052, 1053, 1054 and 1055 including compound semiconductors, the second active elements 1052, 1053, 1054 and 1055 having excellent capabilities and the photoelectric converting sections 1011a, 1011b and 1011c having photodiodes including Si are formed in a hybrid manner, and capabilities that could not have been attained with conventional Si elements can be attained.

The second wiring layer 1060 is electrically connected with the second element layer 1050. The second wiring layer 1060 has wires 1061, 1062, 1063 and 1064 embedded in an interlayer dielectric film 1065. As a material of the wires 1061, 1062, 1063 and 1064, for example, metal such as copper (Cu) can be used, and, as a material of the interlayer dielectric film 1065, a silicon oxide film ($SiO_2$ film) or the like can be used. FIG. 4 illustrates a case where the lower wires 1061 and 1062 and the upper wires 1063 and 1064 form a dual-layer wire structure, but the number of layers of wires of the second wiring layer 1060 is not limited to this. For example, the number of layers of wires of the second wiring layer 1060 may be one, or may be three or larger. The lower wires 1061 and 1062 and the upper wires 1063 and 1064 may be electrically connected by vias (not depicted).

The wire 1061 which is at the lowermost layer of the second wiring layer 1060 is connected with the upper end of a connection wire 1066. The connection wire 1066 extends vertically to penetrate the second element layer 1050 and the first wiring layer 1030. The lower end of the connection wire 1066 is connected to a contact section (not depicted) that is included in the first element layer 1020 and is provided at an upper section of the Si substrate 1011. For example, the connection wire 1066 may electrically connect the gate electrode of an amplification transistor including the second active element 1053 electrically connected via the wire 1061, and an electric charge accumulation region that is included in the first element layer 1020, and is formed at an upper section of the Si substrate 1011.

In addition, the wire 1062 which is at the lowermost layer of the second wiring layer 1060 is connected with the upper end of a connection wire 1067. The connection wire 1067 extends vertically to penetrate the second element layer 1050. The lower end of the connection wire 1067 is connected to the wire 1034 of the first wiring layer 1030.

The third wiring layer 1070 has wires 1071, 1072, 1073 and 1074 embedded in an interlayer dielectric film 1075. As a material of the wires 1071, 1072, 1073 and 1074, for example, metal such as copper (Cu) can be used. FIG. 4 illustrates a case where the lower wires 1071 and 1072 and the upper wires 1073 and 1074 form a dual-layer wire structure, but the number of layers of wires of the third wiring layer 1070 is not limited to this. For example, the number of layers of wires of the third wiring layer 1070 may be one, or may be three or larger. The wires 1071 and 1072 at the lowermost layer are electrically connected with the wires 1063 and 1064 at the uppermost layer of the second wiring layer 1060.

The third element layer 1080 has active elements that are formed in a semiconductor substrate (Si substrate) 1081 including Si, and are included in a logic circuit. Each of the active elements can include a MOS transistor, but more typically may be a MIS transistor. For convenience, FIG. 4 schematically depicts only the gate electrodes of the active elements.

According to the semiconductor apparatus according to the first embodiment, because the first substrate 1101 provided with photodiodes, and the second substrate 1102 provided with at least some of pixel transistors are formed separately in advance, and are pasted together, it is possible to make the photodiode area size and the transistor area size larger than those in a case where photodiodes and pixel transistors are provided in the same substrate.

Further, because the second element layer 1050 has the second active elements 1052, 1053, 1054 and 1055 including compound semiconductors, the second active elements 1052, 1053, 1054 and 1055 having excellent capabilities such as low power consumption, high heat dissipation properties or high withstand voltages, and the photoelectric converting sections 1011a, 1011b and 1011c having photodiodes including Si are formed in a hybrid manner, and capabilities that could not have been attained with conventional Si elements can be attained.

Note that, although the first substrate 1101 has the Si substrate 1011 in the illustrated case, a compound semiconductor substrate including gallium nitride (GaN), gallium arsenide (GaAs), silicon carbide (SiC) or the like, for example, may be used instead of the Si substrate 11 (mentioned below in a second embodiment). That is, the photoelectric converting sections 1011a, 1011b and 1011c and the first element layer 1020 may be formed in a compound semiconductor substrate. Similarly, although the third substrate 1103 has the Si substrate 1081 in the illustrated case, a compound semiconductor substrate including gallium nitride (GaN), gallium arsenide (GaAs), silicon carbide (SiC) or the like, for example, may be used instead of the Si substrate 1081.

<Semiconductor Apparatus Manufacturing Method>

Next, an example of a semiconductor apparatus manufacturing method according to the first embodiment is explained with reference to FIGS. 5A, 5B, 6A, 6B. 7A, 7B, 8, 9, and 10.

Figure 5A:
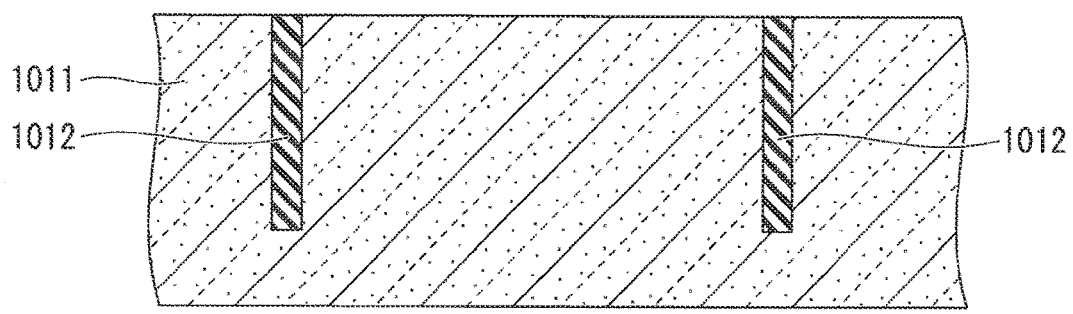
FIG. 5A is a cross-sectional view of a step of a semiconductor apparatus manufacturing method according to the first embodiment of the present technology.

First, a photoresist film is applied onto the Si substrate 1011, and patterning of the photoresist film is performed by using a photolithography technology. With use of the photoresist film on which the patterning has been performed as an etching mask, deep groove sections (trenches) having vertical side walls are formed by dry etching such as reactive ion etching (RIE). Thereafter, the photoresist film is removed, and the Si substrate 1011 is cleaned. Then, by an atomic layer deposition (ALD) method, a chemical vapor deposition (CVD) method or the like, insulating films or structures formed by stacking an insulating film and a metal film one on another are embedded inside the groove sections. Thereafter, by etch-back, chemical mechanical polishing (CMP) or the like, the insulating films and the metal films on the Si substrate 1011 are removed. As a result, as depicted in FIG. 5A, the element separating sections 1012 are formed like walls at an upper section of the Si substrate 1011.

Figure 5B:
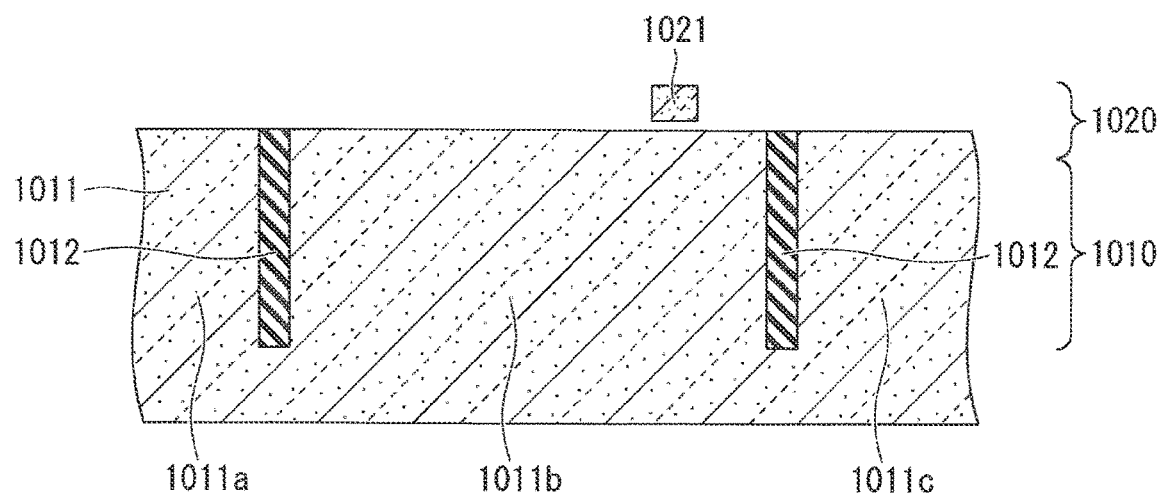
FIG. 5B is a cross-sectional view of a step next to that of FIG. 5A of the semiconductor apparatus manufacturing method according to the first embodiment of the present technology.

Next, by a photolithography technology, ion implantation, thermal treatment or the like, p-type well regions and n-type electric charge generation regions to be included in photodiodes are formed at the upper section of the Si substrate 1011, and the photoelectric converting sections 1011a, 1011b and 1011c are formed. In addition, diffusion layers such as n-type electric charge accumulation regions are also formed at the upper section of the Si substrate 1011. Further, by a CVD method, a lithography technology, etching or the like, a gate insulating film and a gate electrode of the first active element 1021 are formed. As a result, as depicted in FIG. 5B, the first active element 1021 is formed, and the first element layer 1020 is formed.

Figure 6A:
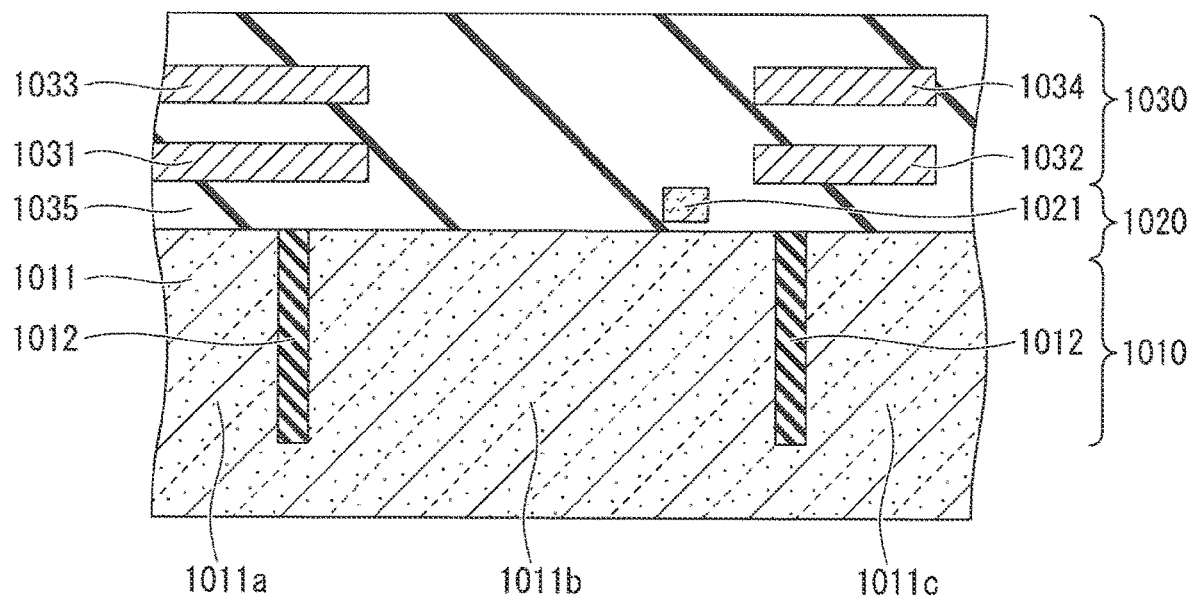
FIG. 6A is a cross-sectional view of a step next to that of FIG. 5B of the semiconductor apparatus manufacturing method according to the first embodiment of the present technology.

Next, by a dual damascene method or the like, as depicted in FIG. 6A, the interlayer dielectric film 1035 and the wires 1031, 1032, 1033 and 1034 are stacked alternately on the Si substrate 1011 to thereby form the first wiring layer 1030.

Figure 6B:
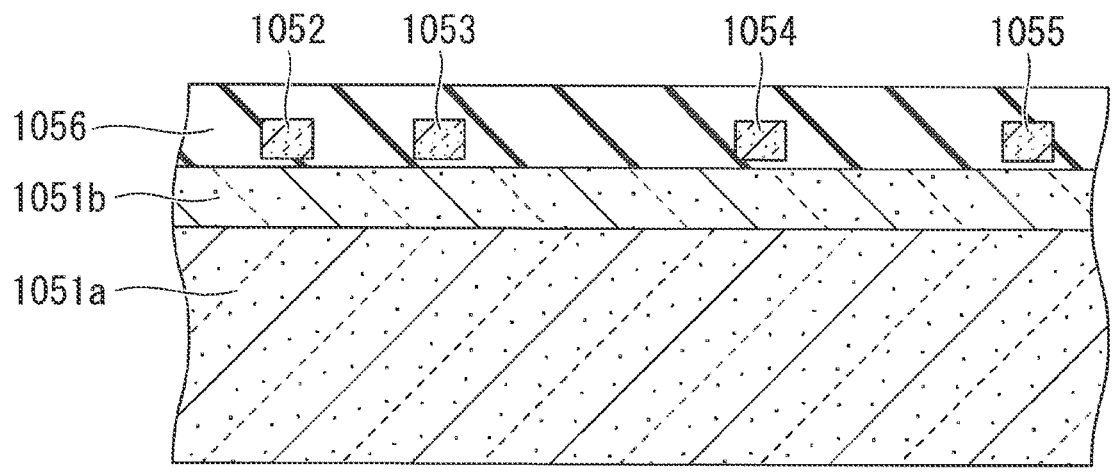
FIG. 6B is a cross-sectional view of a step next to that of FIG. 6A of the semiconductor apparatus manufacturing method according to the first embodiment of the present technology.

On the other hand, by separately preparing the Si substrate 1051*a* and the thin film compound semiconductor substrate 1051*b*, and pasting together the Si substrate 1051*a* and the thin film compound semiconductor substrate 1051*b*, a stacked substrate of the Si substrate 1051*a* and the compound semiconductor substrate 1051*b* is formed (see FIG. 4). Then, by a photolithography technology, ion implantation, thermal treatment or the like, source regions and drain regions of the second active elements 1052, 1053, 1054 and 1055 are formed at an upper section of the compound semiconductor substrate 1051*b*. In addition, by a CVD method, a photolithography technology, etching or the like, gate insulating films and gate electrodes of the second active elements 1052, 1053, 1054 and 1055 are formed on the compound semiconductor substrate 1051*b* to thereby form the second active elements 1052, 1053, 1054 and 1055 (see FIG. 4). Further, as depicted in FIG. 6B, an interlayer dielectric film 1056 is deposited by a CVD method or the like.

Figure 7A:
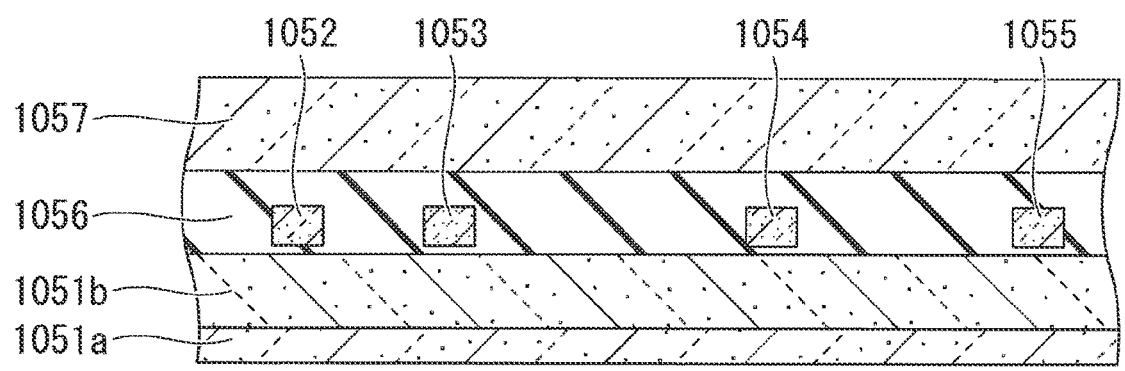
FIG. 7A is a cross-sectional view of a step next to that of FIG. 6B of the semiconductor apparatus manufacturing method according to the first embodiment of the present technology.

Next, a support substrate 1057 is adhered onto the compound semiconductor substrate 1051*b* on a surface (front surface) where the second active elements 1052, 1053, 1054 and 1055 are formed by using an adhesive or the like. Then, by CMP or the like, the Si substrate 1051*a* is polished from the backside to thereby make the Si substrate 1051*a* thin as depicted in FIG. 7A. As a result, the second element layer 1050 is formed.

Figure 7B:
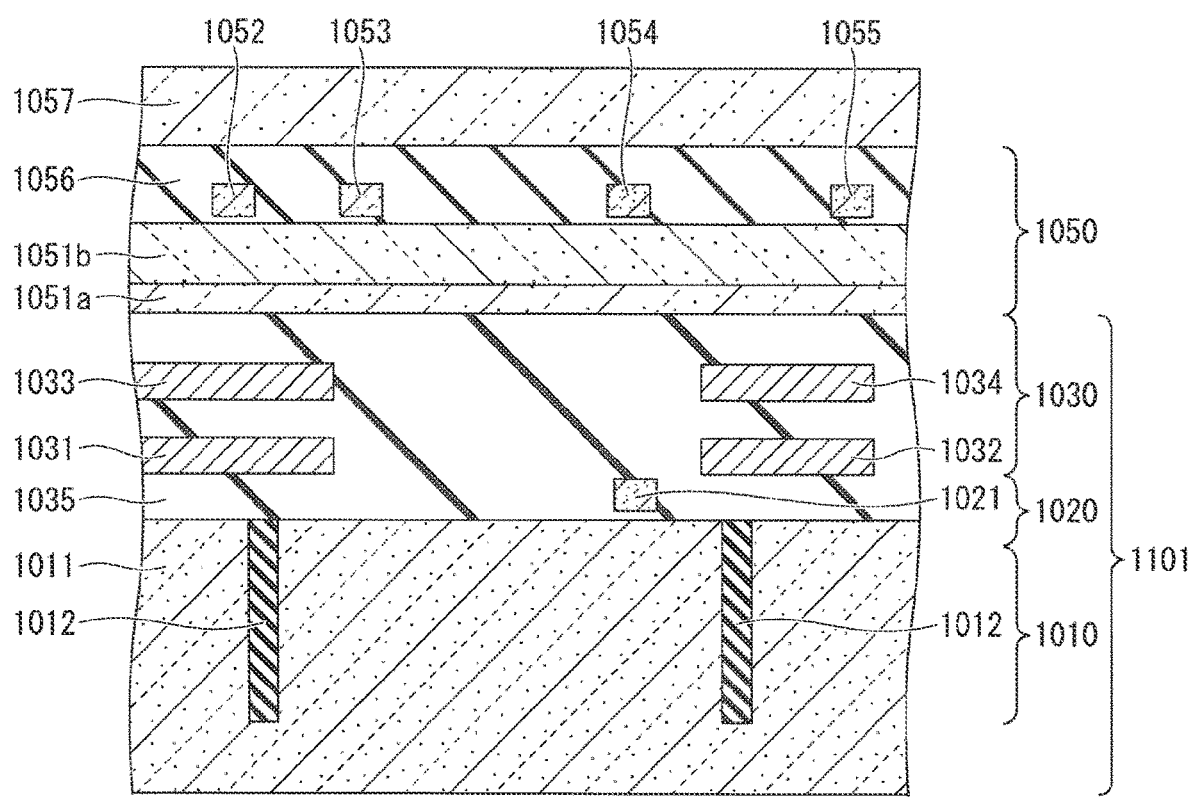
FIG. 7B is a cross-sectional view of a step next to that of FIG. 7A of the semiconductor apparatus manufacturing method according to the first embodiment of the present technology.

Next, the backside of the Si substrate 1051*a* of the second element layer 1050 depicted in FIG. 7A is caused to face the front surface side of the interlayer dielectric film 1042 of the first substrate 1101 depicted in FIG. 6A, and is adhered therewith as depicted in FIG. 7B. As an adhesion method, for example, after the wafers are irradiated with plasma, the wafers are washed with water, and are adhered to each other by a wafer joining apparatus. It should be noted however that the adhesion method is not limited to this, and the wafers may be adhered to each other by using an adhesive or the like, for example. Further, the support substrate 1057 is peeled off, and the adhesive used for the adhesion with the support substrate 1057 is removed off by cleaning.

Next, by dry etching such as a photoresist technology or RIE, or the like, a groove section that penetrates the second element layer 1050 and the first wiring layer 1030 makes the front surface of the Si substrate 1011 exposed, and is for forming the connection wire 1066, and a groove section that penetrates the second element layer 1050, makes the front surface of the wire 1034 exposed, and is for forming the connection wire 1067 are formed. Then, by a CVD method or the like, a metal film is deposited such that it fills the groove sections, and by etch-back, CMP or the like, the metal film on the interlayer dielectric film 1056 is removed. As a result, the connection wire 1066 whose lower end is connected with the Si substrate 1011, and the connection wire 1067 whose lower end is connected with the wire 1034 are formed (see FIG. 4). Insulation structures are formed in the Si substrate 1051*a* and the compound semiconductor substrate 1051*b* of the second element layer 1050 such that they surround the outer circumferential surfaces of the connection wires 1066 and 1067. Note that in a case where insulation layers are formed in advance at portions of the Si substrate 1051*a* and the compound semiconductor substrate 1051*b* of the second element layer 1050 where the connection wires 1066 and 1067 penetrate, insulation structures do not have to be formed in the Si substrate 1051*a* and the compound semiconductor substrate 1051*b*.

Figure 8:
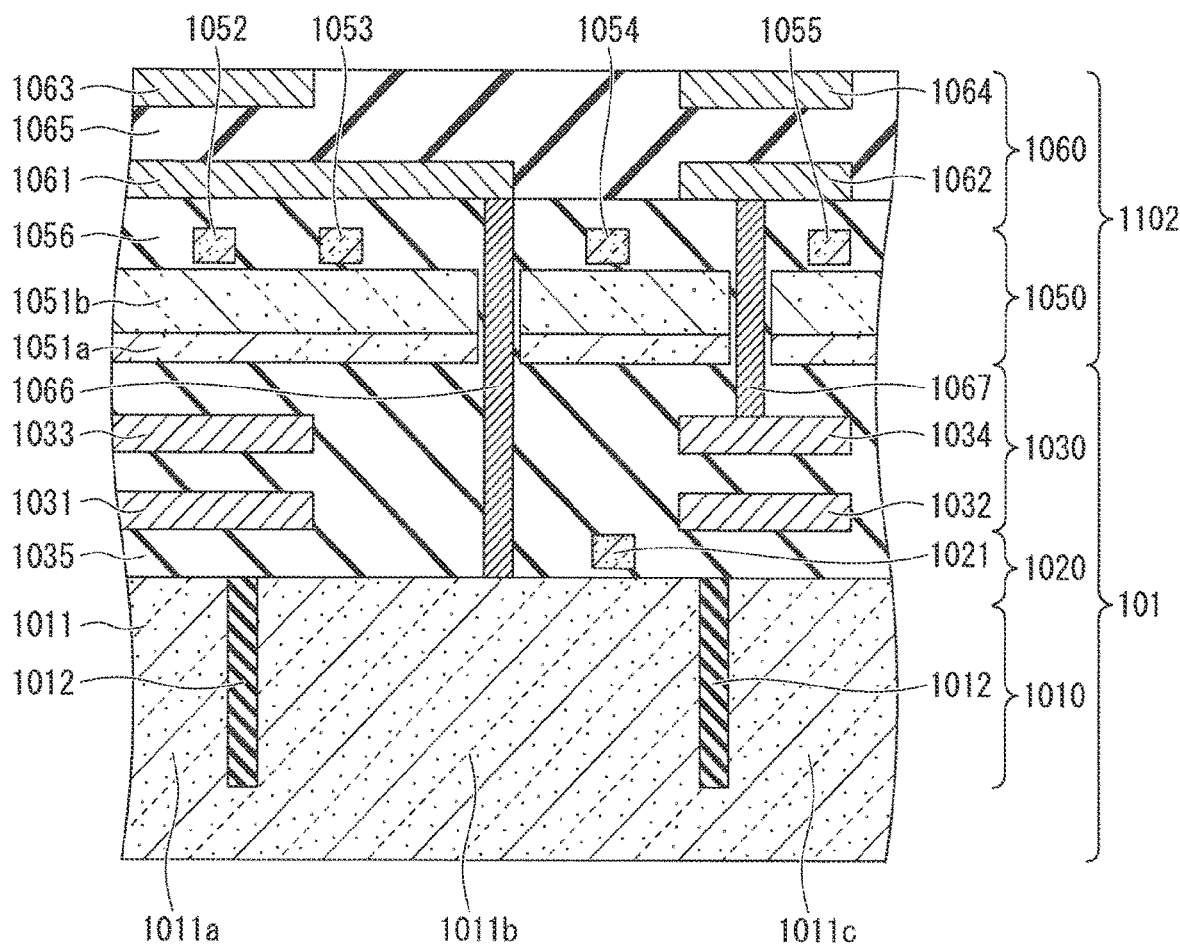
FIG. 8 is a cross-sectional view of a step next to that of FIG. 7B of the semiconductor apparatus manufacturing method according to the first embodiment of the present technology.

Next, by a dual damascene method or the like, as depicted in FIG. 8, the interlayer dielectric film 1065 and the wires 1061, 1062, 1063 and 1064 are stacked alternately on the interlayer dielectric film 1056 to thereby form the second wiring layer 1060. The wire 1061 of the second wiring layer 1060 is formed to be connected with the upper end of the connection wire 1066. The wire 1062 of the second wiring layer 1060 is formed to be connected with the upper end of the connection wire 1067.

Figure 9:
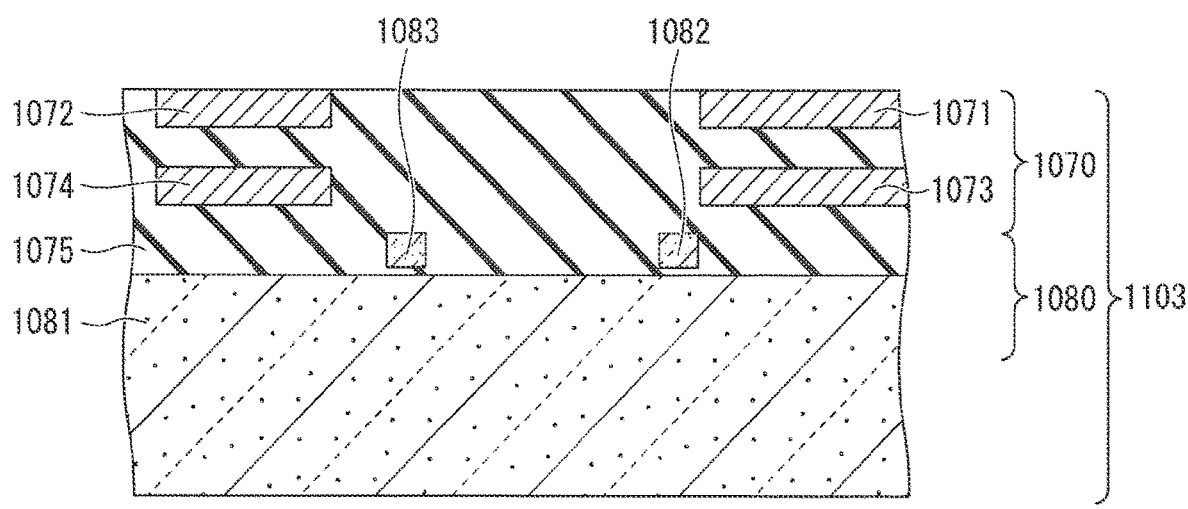
FIG. 9 is a cross-sectional view of a step next to that of FIG. 8 of the semiconductor apparatus manufacturing method according to the first embodiment of the present technology.

On the other hand, as depicted in FIG. 9, the Si substrate 1081 is prepared separately, and by a photolithography technology, ion implantation, thermal treatment or the like, source regions and drain regions of active elements are formed at an upper section of the Si substrate 1081. In addition, by a CVD method, a photolithography technology, etching or the like, gate insulating films and gate electrodes of the active elements are formed. As a result, the active elements are formed, and the third element layer 1080 is formed. Further, by a dual damascene method or the like, the interlayer dielectric film 1075 and the wires 1071, 1072, 1073 and 1074 are stacked alternately on the Si substrate 1081 to thereby form the third wiring layer 1070. As a result, the third substrate 1103 is formed.

Figure 10:
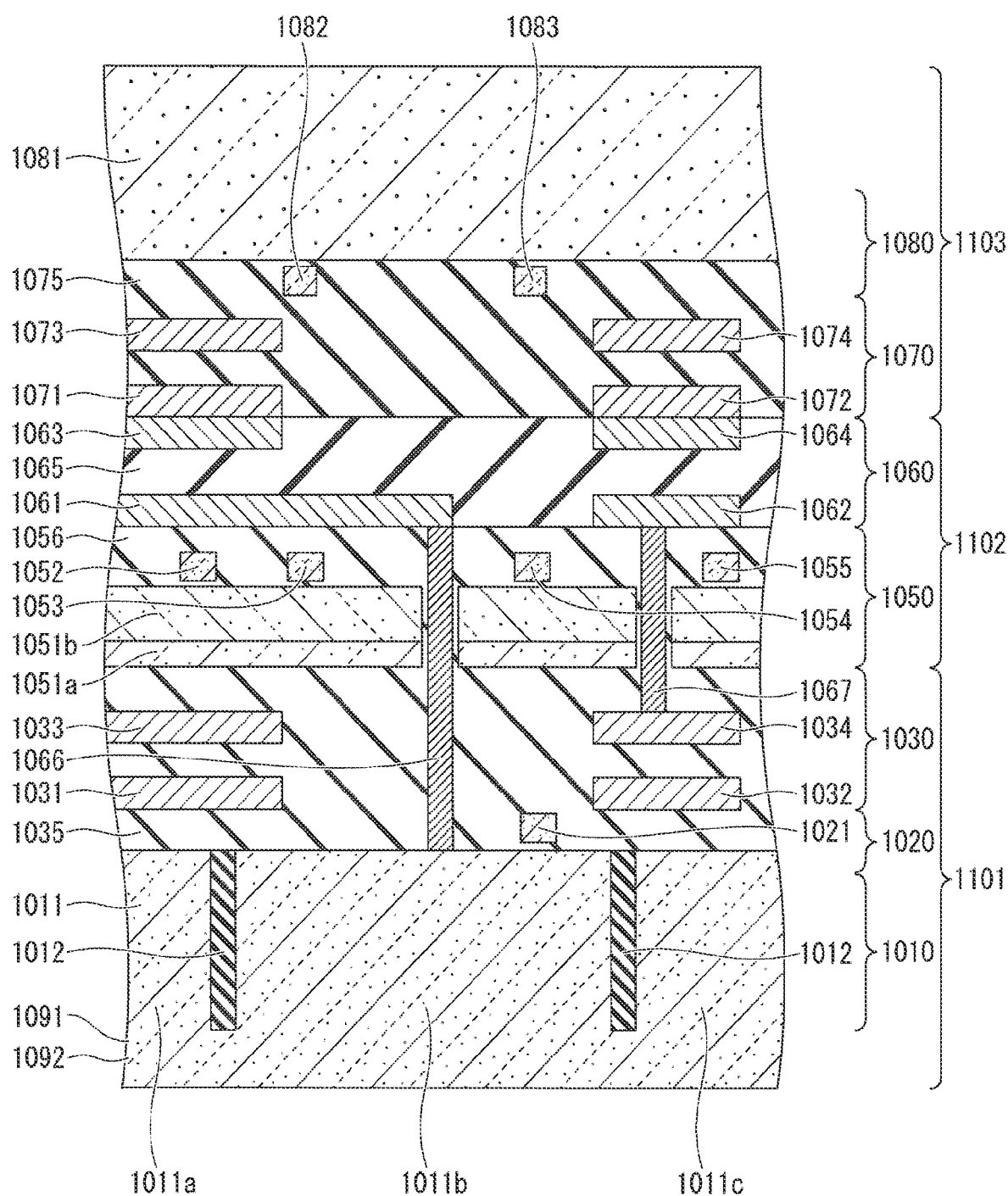
FIG. 10 is a cross-sectional view of a step next to that of FIG. 9 of the semiconductor apparatus manufacturing method according to the first embodiment of the present technology.

Next, the side of the third wiring layer 1070 of the third substrate 1103 depicted in FIG. 9 where the wires 1071 and 1072 are formed is caused to face the side of the second wiring layer 1060 of the second substrate 1102 depicted in FIG. 8 where the wires 1063 and 1064 are formed, and is pasted thereto as depicted in FIG. 10.

Next, by CMP or the like, the Si substrate 1011 is polished from the backside to thereby make the element separating section 1012 exposed, and element-separate the photoelectric converting sections 1011*a*, 1011*b* and 1011*c*. Further, wires (not depicted), the flattening film 1091, the color filter 1092, the microlens 1093 and the like are formed on the backside of the Si substrate 1011. Thereafter, by CMP or the like, the Si substrate 1081 is polished from the front surface side to thereby make the Si substrate 1081 thin. As a result, the semiconductor apparatus according to the first embodiment depicted in FIG. 1 is completed.

According to the semiconductor apparatus manufacturing method according to the first embodiment, because the second element layer 1050 has the second active elements 1052, 1053, 1054 and 1055 including compound semiconductors, the second active elements 1052, 1053, 1054 and 1055 having excellent capabilities and the photoelectric converting sections 1011*a*, 1011*b* and 1011*c* having photodiodes including Si are formed in a hybrid manner, and it becomes possible to manufacture the semiconductor apparatus with which capabilities that could not have been attained with conventional Si elements can be attained.

Modification Example of First Embodiment

Figure 11:
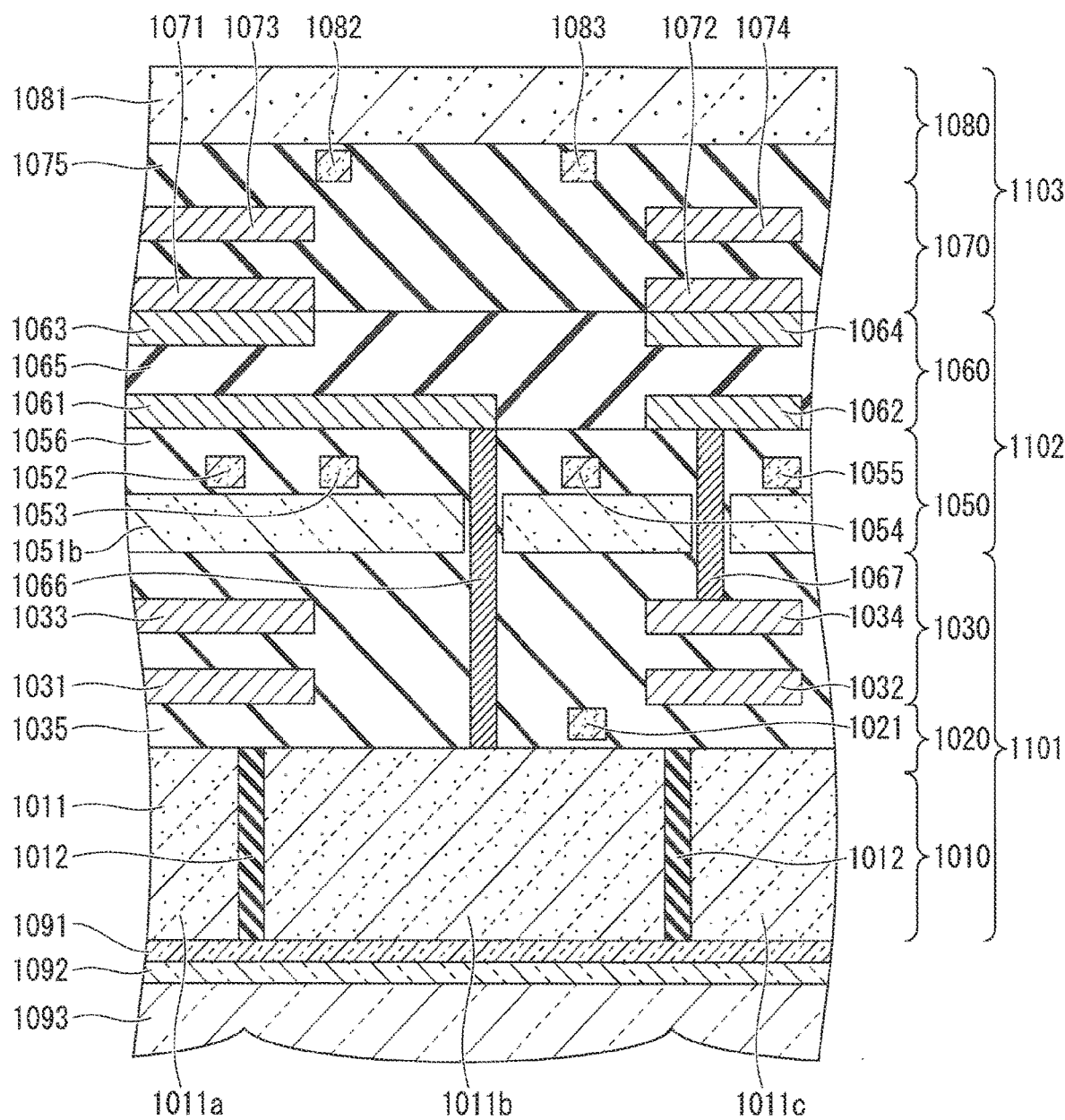
FIG. 11 is a cross-sectional view of main sections of a pixel region of a semiconductor apparatus according to a modification example of the first embodiment of the present technology.

As depicted in FIG. 11, a semiconductor apparatus according to a modification example of the first embodiment of the present technology is different from the semiconductor apparatus according to the first embodiment of the present technology depicted in FIG. 4 in that the second element layer 1050 does not have the Si substrate 1051*a*, but includes a single layer of the semiconductor substrate (compound semiconductor substrate) 1051*b* including a compound semiconductor. In other respects, the configuration of the semiconductor apparatus according to the modification example of the first embodiment of the present technology is similar to that of the semiconductor apparatus according to the first embodiment of the present technology depicted in FIG. 4, and so overlapping explanations are omitted.

According to the semiconductor apparatus according to the modification example of the first embodiment of the present technology, because the second element layer 1050 has the second active elements 1052, 1053, 1054 and 1055 including compound semiconductors, the second active elements 1052, 1053, 1054 and 1055 having excellent capabilities and the photoelectric converting sections 1011*a*, 1011*b* and 1011*c* having photodiodes including Si are formed in a hybrid manner, and capabilities that could not have been attained with conventional Si elements can be attained.

Further, because the second element layer 1050 includes the single layer of the compound semiconductor substrate 1051*b*, it becomes possible to make the second element layer 1050 thin as compared with a case of the stacked structure of the Si substrate 1051*a* and the compound semiconductor substrate 1051*b* as in the semiconductor apparatus according to the first embodiment of the present technology depicted in FIG. 4, and also it is possible to simplify manufacturing steps, and to reduce the costs. Further, because penetration portions of the compound semiconductor substrate 1051*b* are thin as compared with a case of the stacked structure of the Si substrate 1051*a* and the compound semiconductor substrate 1051*b*, it becomes easier to form the penetration portions.

Second Embodiment

<Configuration of Semiconductor Apparatus>

The semiconductor apparatus according to a second embodiment of the present technology can be applied to a solid-state image pickup apparatus or the like similarly to the semiconductor apparatus according to the first embodiment of the present technology. The overall configuration of the semiconductor apparatus according to the second embodiment of the present technology is similar to the overall configuration of the semiconductor apparatus according to the first embodiment of the present technology depicted in FIG. 1, and so overlapping explanations are omitted.

Figure 12:
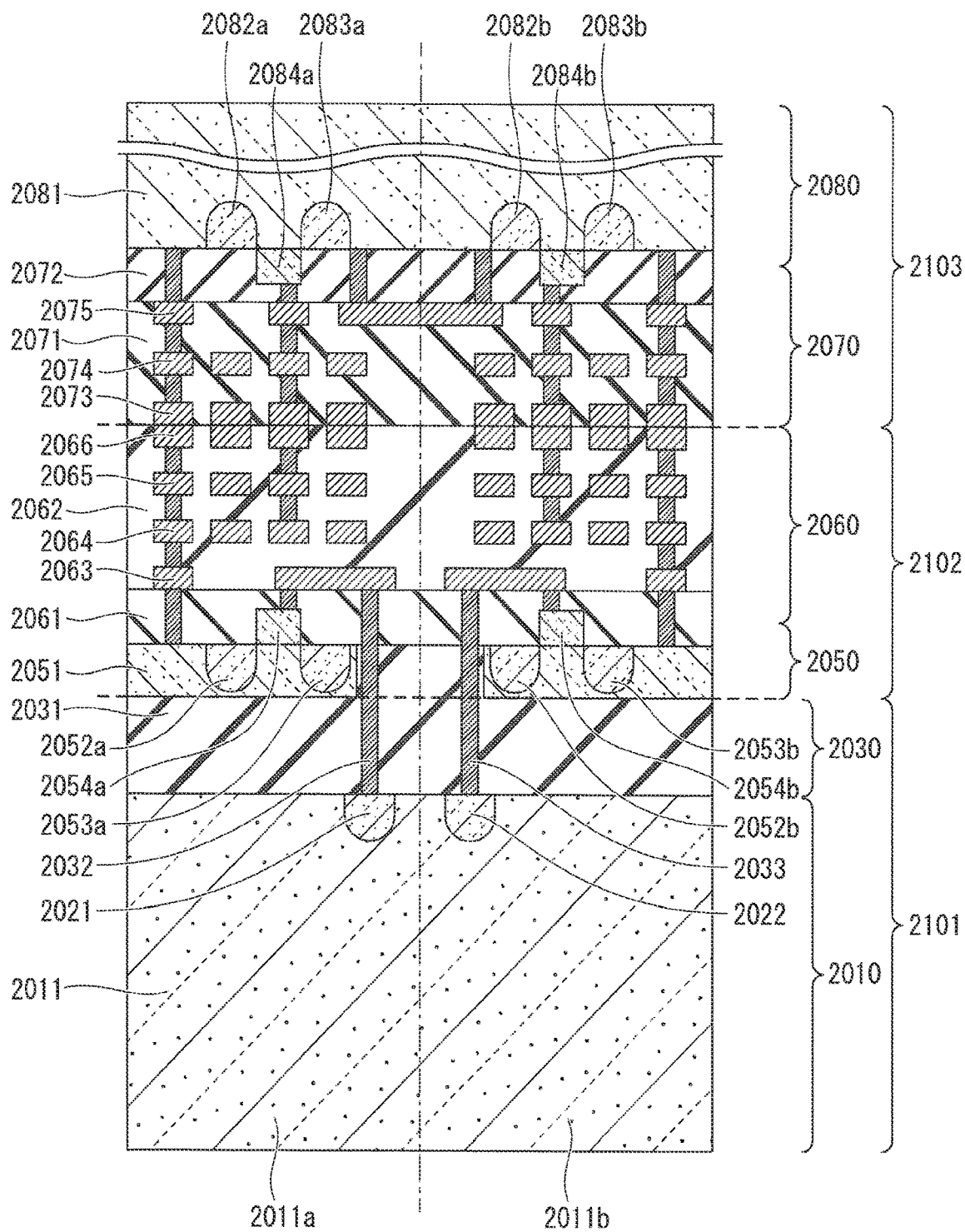
FIG. 12 is a cross-sectional view of main sections of a pixel region of a semiconductor apparatus according to a second embodiment of the present technology.

FIG. 12 schematically depicts a part of the cross-sectional structure of the semiconductor apparatus according to the second embodiment. The semiconductor apparatus according to the second embodiment has a stacked structure formed by pasting and joining together three substrates which are a first substrate 2101, a second substrate 2102 and a third substrate 2103. The semiconductor apparatus according to the second embodiment is a backside illumination solid-state image pickup apparatus, and receives light entering from the backside (the lower side in FIG. 12).

The first substrate 2101 includes a sensor layer 2010; and a first wiring layer 2030 arranged on the sensor layer 2010. The second substrate 2102 includes a first element layer 2050 that is arranged on the first wiring layer 2030 and includes active elements; and a second wiring layer 2060 arranged on the first element layer 2050. The third substrate 2103 includes a third wiring layer 2070 arranged on the second wiring layer 2060; and a second element layer 2080 that is arranged on the third wiring layer 2070 and includes active elements.

The sensor layer 2010 has plural photoelectric converting sections 2011*a* and 2011*b* formed in a substrate (compound semiconductor substrate) 2011 including a compound semiconductor. The photoelectric converting sections 2011*a* and 2011*b* are partitioned at the position of a dash-dotted line depicted schematically in FIG. 12. Note that the adjacent photoelectric converting sections 2011*a* and 2011*b* may be element-separated by providing an element separating section therebetween. Each of the photoelectric converting sections 2011*a* and 2011*b* includes a photodiode. The photodiode includes a pn junction between a p-type well region (not depicted) formed in the compound semiconductor substrate 2011 and an n-type electric charge generation region (not depicted).

As a material of the compound semiconductor substrate 2011, a compound semiconductor (narrow bandgap semiconductor) having a bandgap narrower than the bandgap of Si can be used as a material having light absorption sensitivity to the infrared light region which is on the side of longer wavelengths than the visible light region, and, for example, silicon germanium (SiGe), germanium (Ge), indium gallium arsenide (InGaAs), indium arsenide (InAs), indium antimonide (InSb) or the like can be used. As a material of the compound semiconductor substrate 2011, a compound semiconductor (wide bandgap semiconductor) having a bandgap wider than the bandgap of Si can be used as a material having light absorption sensitivity to the ultraviolet light region which is on the side of shorter wavelengths than the visible light region, and, for example, gallium nitride (GaN), aluminum nitride (AlN) or the like can be used. The material of the compound semiconductor substrate 2011 is not limited to the materials described above, and any material can be selected as appropriate according to a target wavelength region.

The upper-surface side of the sensor layer 2010 is provided with p-type diffusion layers 2021 and 2022. For example, the diffusion layers 2021 and 2022 can be formed by ion-implanting and activating impurities such as zinc (Zn). The diffusion layers 2021 and 2022 transfer electric charge from the photoelectric converting sections 2011*a* and 2011*b* to pixel transistors such as transfer transistors. Note that the diffusion layers 2021 and 2022 may be floating diffusion layers (floating diffusion layers), and the upper-surface side of the sensor layer 2010 may be provided with pixel transistors such as transfer transistors that transfer electric charge to the floating diffusion layers 2021 and 2022. That is, on the upper-surface side of the sensor layer 2010, the first substrate 2101 may have an element layer including active elements such as transfer transistors.

Although not depicted in the figure, on the backside of the sensor layer 2010, a flattening film that flattens the backsides of the photoelectric converting sections 2011*a* and 2011*b*, color filters that color-separate incident light entering the photoelectric converting sections 2011*a* and 2011*b*, microlenses that condense the incident light entering the photoelectric converting sections 2011*a* and 2011*b*, and other wires, electrodes, and the like may be arranged.

The first wiring layer 2030 is electrically connected with the sensor layer 2010. The first wiring layer 2030 has an interlayer dielectric film 2031. As a material of the interlayer dielectric film 2031, a silicon oxide film ($SiO_2$ film) or the like can be used. The first wiring layer 2030 may have wires embedded in the interlayer dielectric film 2031. As a material of the wires, for example, metal such as copper (Cu) can be used. The number of layers of wires of the first wiring layer 2030 is not limited to any particular number. For example, the number of layers of wires of the first wiring layer 2030 may be one, or may be three or larger. The wires may be electrically connected by vias.

For example, the first element layer 2050 is included in a first cell circuit that independently takes out electric signals generated by photoelectric conversion of the incident light by the plural photoelectric converting sections 2011a and 2011b. The first element layer 2050 includes first active elements (2052a, 2053a and 2054a) and (2052b, 2053b and 2054b) that are formed on the front surface of the compound semiconductor substrate 2011, and are included in the first cell circuit. The first active elements (2052a, 2053a and 2054a) and (2052b, 2053b and 2054b) can include pixel transistors such as the transfer transistor T1 depicted in FIG. 3, for example. While the pixel transistors can include MOS transistors as active elements, more typically the pixel transistors may be insulated gate transistors (MIS transistors) such as MISFETs or MISSITs including, in the gate insulating films, materials other than oxide films ($SiO_2$ films).

The first active elements (2052a, 2053a and 2054a) include a source region 2053a and a drain region 2054a that are provided in a semiconductor substrate (Si substrate) 2051 including Si; and a gate electrode 2054a that is provided on the Si substrate 2051 via a gate insulating film (not depicted). The first active elements (2052b, 2053b and 2054b) include a source region 2053b and a drain region 2054b that are provided in a semiconductor substrate (Si substrate) 1051 including Si; and a gate electrode 2054b that is provided on the Si substrate 2051 via a gate insulating film (not depicted).

Note that, instead of the Si substrate 2051, a compound semiconductor substrate may be used similarly to the semiconductor apparatus according to the first embodiment of the present technology. Then, the first active elements (2052a, 2053a and 2054a) and (2052b, 2053b and 2054b) may be provided in the compound semiconductor substrate.

The second wiring layer 2060 is electrically connected with the first element layer 2050. The second wiring layer 2060 has wires 2063, 2064, 2065 and 2065 embedded in an interlayer dielectric film 2062. As a material of the wires 2063, 2064, 2065 and 2065, for example, metal such as copper (Cu) can be used, and, as a material of the interlayer dielectric film 2062, a silicon oxide film ($SiO_2$ film) or the like can be used. The number of layers of wires of the second wiring layer 2060 is not limited to this. For example, the number of layers of wires of the second wiring layer 2060 may be one, or may be three or larger.

The gate electrode 2054a of the first active elements (2052a, 2053a and 2054a) is electrically connected to the diffusion layer 2021 via the wire 2063 at the lowermost layer, and a connection wire 2032. The gate electrode 2054b of the first active elements (2052b, 2053b and 2054b) is electrically connected to the floating diffusion layer 2022 via the wire 2063 at the lowermost layer, and a connection wire 2033. The connection wires 2032 and 2033 extend vertically to penetrate the first element layer 2050 and the first wiring layer 2030.

The third wiring layer 2070 has wires 2073, 2074 and 2075 embedded in an interlayer dielectric film 2071. As a material of the wires 2073, 2074 and 2075, for example, metal such as copper (Cu) can be used. The number of layers of wires of the third wiring layer 2070 is not limited to any particular number. For example, the number of layers of wires of the third wiring layer 2070 may be one, or may be three or larger. The wire 2073 at the lowermost layer is electrically connected with the wire 2066 at the uppermost layer of the second wiring layer 2060.

For example, the second element layer 2080 is included in a second cell circuit connected to the first element layer 2050, corresponding to each of plural pixels. The second element layer 2080 has second active elements (2082a, 2083a and 2084a) and (2082b, 2083b and 2084b) that are formed in a semiconductor substrate (Si substrate) 2081 including Si, and are included in the second cell circuit. For example, each of the second active elements (2082a, 2083a and 2084a) and (2082b, 2083b and 2084b) can include a pixel transistor such as the reset transistor T2, the amplification transistor T3 or the selection transistor T4 depicted in FIG. 3. Each of the pixel transistors can include a MOS transistor, but more typically may be a MIS transistor.

The second active elements (2082a, 2083a and 2084a) include a source region 2082a and a drain region 2083a that are provided in the Si substrate 2081; and a gate electrode 2084a that is provided under the Si substrate 2081 via a gate insulating film (not depicted). The second active elements (2082b, 2058b and 2084b) include a source region 2082b and a drain region 2083b that are provided in the Si substrate 2081; and a gate electrode 2084b that is provided under the Si substrate 2081 via a gate insulating film (not depicted).

According to the semiconductor apparatus according to the second embodiment, because the first substrate 2101 provided with photodiodes included in the photoelectric converting sections 2011a and 2011b and the second substrate 2102 provided with at least some of pixel transistors are formed separately in advance, and are pasted together, it is possible to make the photodiode area size and the transistor area size larger than those in a case where photodiodes and pixel transistors are provided in the same substrate.

In addition, in conventional image sensors, the photoelectric converting sections 2011a and 2011b are provided in a Si substrate, and application and development for regions outside the visible light region have not been possible. In contrast to this, because the photoelectric converting sections 2011a and 2011b are provided in the compound semiconductor substrate 2011 in the stacked structure formed by pasting together three substrates which are the first substrate 2101, the second substrate 2102 and the third substrate 2103, and the like, large openings can be formed for ultraviolet light or infrared light, and so it becomes possible to realize a highly sensitive image sensor.

Note that, although the second substrate 2102 has the Si substrate 2051 in the semiconductor apparatus according to the second embodiment in the illustrated case, a compound semiconductor substrate including indium phosphide (InP), gallium nitride (GaN), gallium arsenide (GaAs), silicon carbide (SiC) or the like may be used instead of the Si substrate 2051. Similarly, although the third substrate 2103 has the Si substrate 1081 in the illustrated case, a compound semiconductor substrate including indium phosphide (InP), gallium nitride (GaN), gallium arsenide (GaAs), silicon carbide (SiC) or the like, for example, may be used instead of the Si substrate 1081.

<Semiconductor Apparatus Manufacturing Method>

The semiconductor apparatus manufacturing method according to the second embodiment of the present technology is basically similar to the semiconductor apparatus manufacturing method according to the second embodiment of the present technology, and so overlapping explanations are omitted. Regarding the semiconductor apparatus manufacturing method according to the second embodiment of the present technology, an explanation is given with a focus on a step of forming the compound semiconductor substrate 2011. A compound semiconductor substrate is formed by using an aspect ratio trapping (ART) method in a case illustrated here.

Figure 13A:
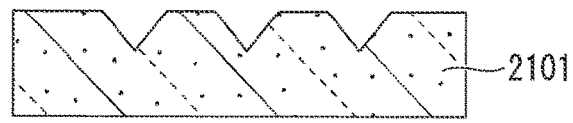
FIG. 13A is a cross-sectional view of a step of a semiconductor apparatus manufacturing method according to the second embodiment of the present technology.
Figure 13B:
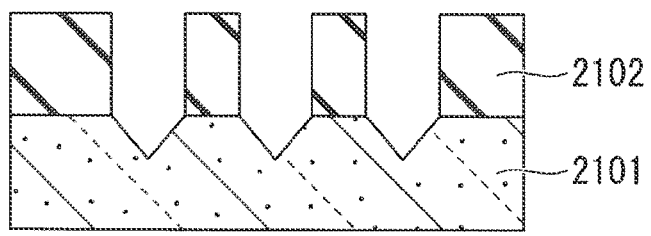
FIG. 13B is a cross-sectional view of a step next to that of FIG. 13A of the semiconductor apparatus manufacturing method according to the second embodiment of the present technology.
Figure 13C:
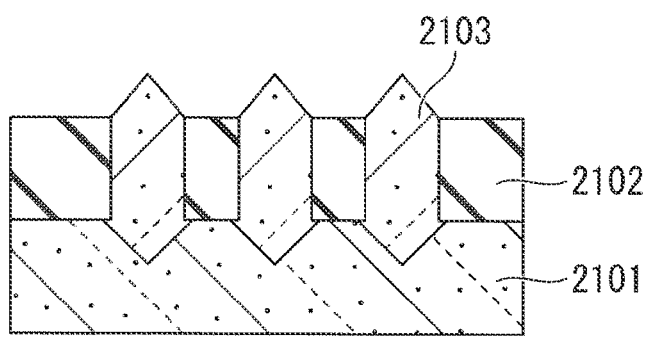
FIG. 13C is a cross-sectional view of a step next to that of FIG. 13B of the semiconductor apparatus manufacturing method according to the second embodiment of the present technology.

First, a support substrate 2101 including Si is prepared, and groove sections are formed at an upper section of the support substrate 2101 by a photolithography technology and an etching technology as depicted in FIG. 13A. Next, an insulating film 2102 such as an $SiO_2$ film is deposited on the support substrate 2101 by a CVD method or the like. Then, parts of the insulating film 2102 are removed by a photolithography technology and an etching technology to thereby form openings penetrating the insulating film 2102 as depicted in FIG. 13B.

Next, columnar or tabular epitaxial growth layers (ART layers) 2103 including a compound semiconductor such as SiGe or Ge are formed so as to fill the through-holes of the insulating film 2102 by an epitaxial growth method. Next, a continuous epitaxial growth layer 2104 is formed on the top surface of the insulating film 2102 so as to connect upper sections of the ART layers 2103 by an epitaxial growth method. Then, the epitaxial growth layer 2104 is flattened by CMP. Further, an insulating film 2105 such as an $SiO_2$ film is deposited on the epitaxial growth layer 2104 by a CVD method or the like.

Figure 14A:
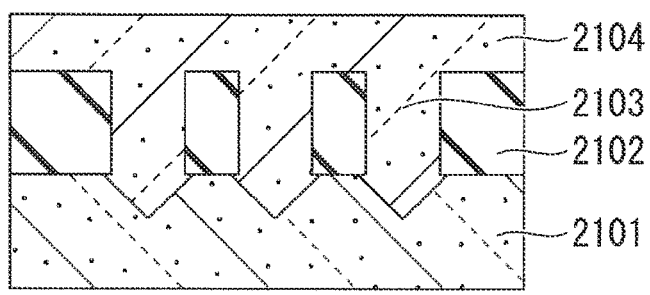
FIG. 14A is a cross-sectional view of a step next to that of FIG. 13C of the semiconductor apparatus manufacturing method according to the second embodiment of the present technology.
Figure 14B:
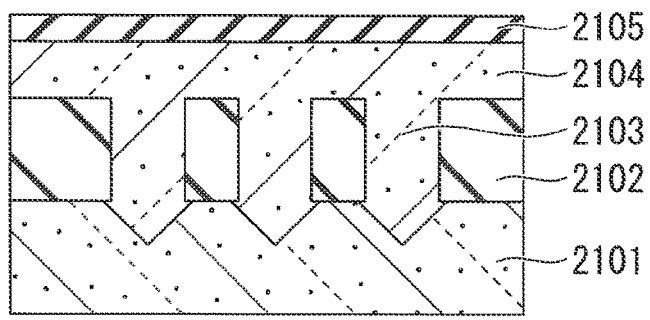
FIG. 14B is a cross-sectional view of a step next to that of FIG. 14A of the semiconductor apparatus manufacturing method according to the second embodiment of the present technology.
Figure 14C:
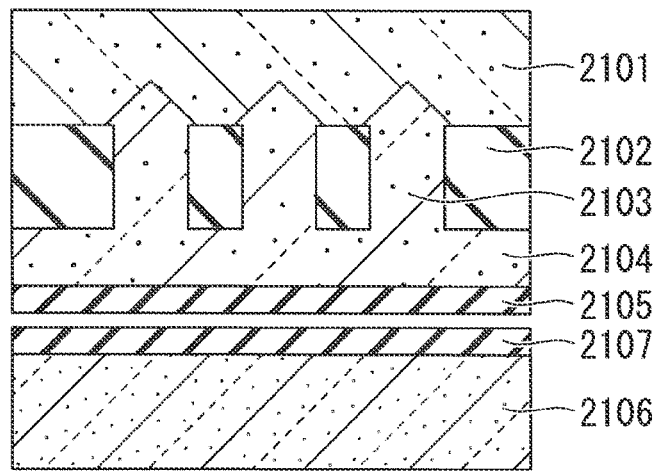
FIG. 14C is a cross-sectional view of a step next to that of FIG. 14B of the semiconductor apparatus manufacturing method according to the second embodiment of the present technology.

On the other hand, a support substrate 2106 including Si is prepared, and an insulating film 2107 such as an $SiO_2$ film is deposited on the support substrate 2106 by a CVD method or the like. Then, a surface on which the insulating film 2107 is formed and a surface of the structure depicted in FIG. 14B on which surface the insulating film 2105 is formed are caused to face each other, and are pasted together as depicted in FIG. 14C.

Figure 15A:
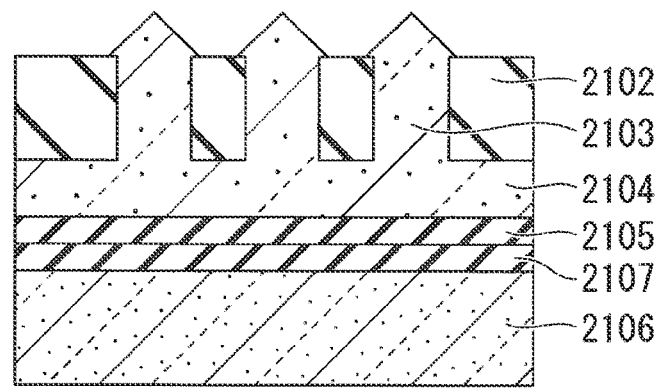
FIG. 15A is a cross-sectional view of a step next to that of FIG. 14C of the semiconductor apparatus manufacturing method according to the second embodiment of the present technology.
Figure 15B:
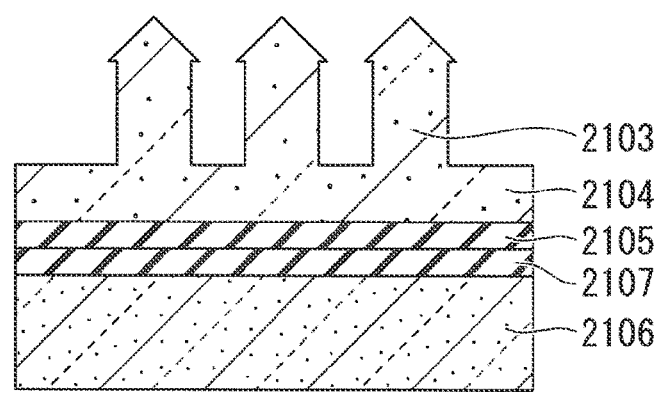
FIG. 15B is a cross-sectional view of a step next to that of FIG. 15A of the semiconductor apparatus manufacturing method according to the second embodiment of the present technology.
Figure 15C:
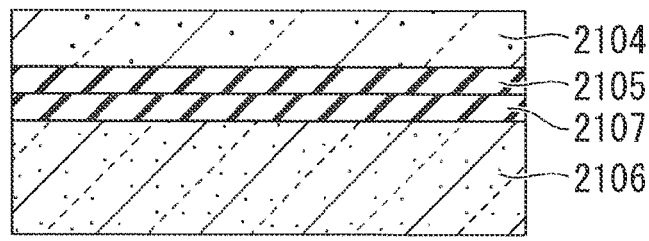
FIG. 15C is a cross-sectional view of a step next to that of FIG. 15B of the semiconductor apparatus manufacturing method according to the second embodiment of the present technology.

Next, the support substrate 2101 is removed as depicted in FIG. 15A by using a nitric hydrofluoric acid or the like. Further, the insulating film 2102 is removed as depicted in FIG. 15B by using a fluorinated acid or the like. Further, the ART layer 2103 is removed as depicted in FIG. 15C by CMP, and the front surface of the epitaxial growth layer 2104 is flattened. As a result, the remaining epitaxial growth layer 2104 can be used as the compound semiconductor substrate 2011 depicted in FIG. 12.

First Modification Example of Second Embodiment

Figure 16A:
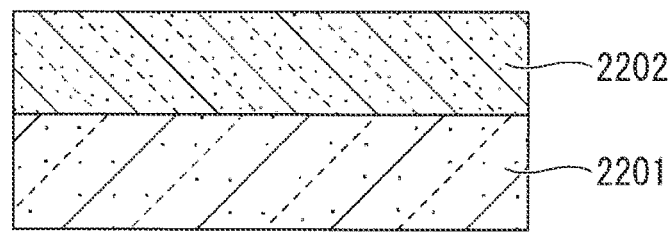
FIG. 16A is a cross-sectional view of a step next to that of FIG. 15C of a semiconductor apparatus manufacturing method according to a first modification example of the second embodiment of the present technology.
Figure 16B:
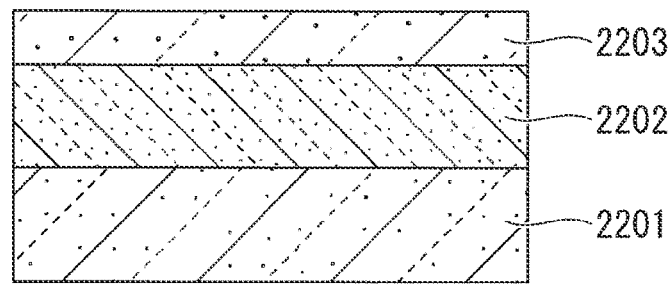
FIG. 16B is a cross-sectional view of a step next to that of FIG. 16A of the semiconductor apparatus manufacturing method according to the first modification example of the second embodiment of the present technology.

As a first modification example of the second embodiment of the present technology, another method of manufacturing a compound semiconductor substrate is illustrated. First, a support substrate 2201 including Si is prepared. Then, as depicted in FIG. 16A, a strain relaxation buffer layer (SRB layer) 2202 that includes a compound semiconductor such as InGaAs and has a lattice constant that gradually changes such that there are fewer defects on the front surface side is formed on the support substrate 2201 by an epitaxial growth method. Further, an epitaxial growth layer 2203 including a compound semiconductor such as InGaAs is formed on the SRB layer 2202 by an epitaxial growth method. Further, an insulating film 2204 such as an $SiO_2$ film is deposited on the epitaxial growth layer 2203 by a CVD method or the like.

Figure 16C:
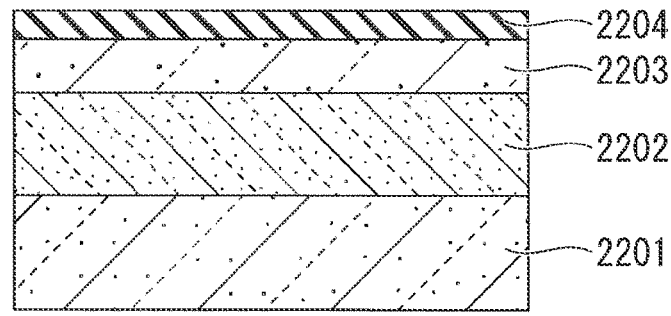
FIG. 16C is a cross-sectional view of a step next to that of FIG. 16B of the semiconductor apparatus manufacturing method according to the first modification example of the second embodiment of the present technology.
Figure 17A:
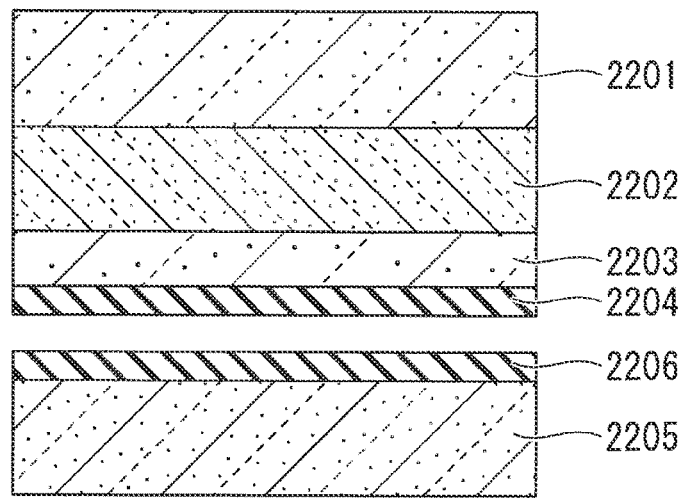
FIG. 17A is a cross-sectional view of a step next to that of FIG. 16C of the semiconductor apparatus manufacturing method according to the first modification example of the second embodiment of the present technology.
Figure 17B:
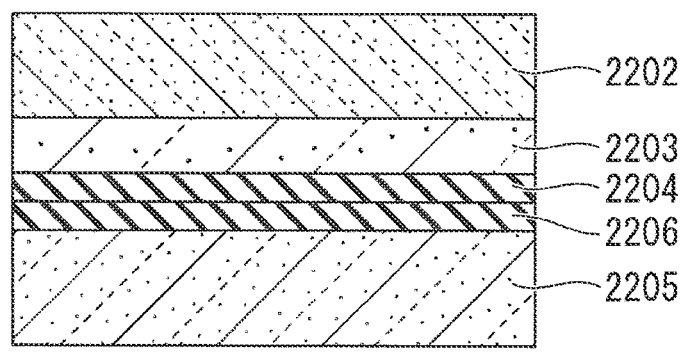
FIG. 17B is a cross-sectional view of a step next to that of FIG. 17A of the semiconductor apparatus manufacturing method according to the first modification example of the second embodiment of the present technology.
Figure 17C:
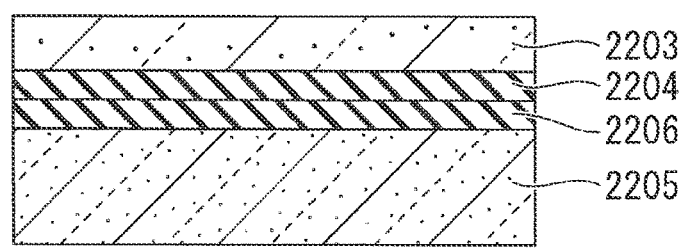
FIG. 17C is a cross-sectional view of a step next to that of FIG. 17B of the semiconductor apparatus manufacturing method according to the first modification example of the second embodiment of the present technology.

On the other hand, a support substrate 2205 including Si is prepared, and an insulating film 2206 such as an $SiO_2$ film is deposited on the support substrate 2205. Then, a surface on which the insulating film 2206 is formed and a surface of the structure depicted in FIG. 16C on which surface the insulating film 2204 is formed are caused to face each other, and are pasted together as depicted in FIG. 17A. Thereafter, the support substrate 2201 is removed as depicted in FIG. 17B by using a nitric hydrofluoric acid or the like. Further, the SRB layer 2202 is removed as depicted in FIG. 17C by CMP or the like. As a result, the remaining epitaxial growth layer 2203 can be used as the compound semiconductor substrate 2011 depicted in FIG. 12.

Second Modification Example of Second Embodiment

Figure 18:
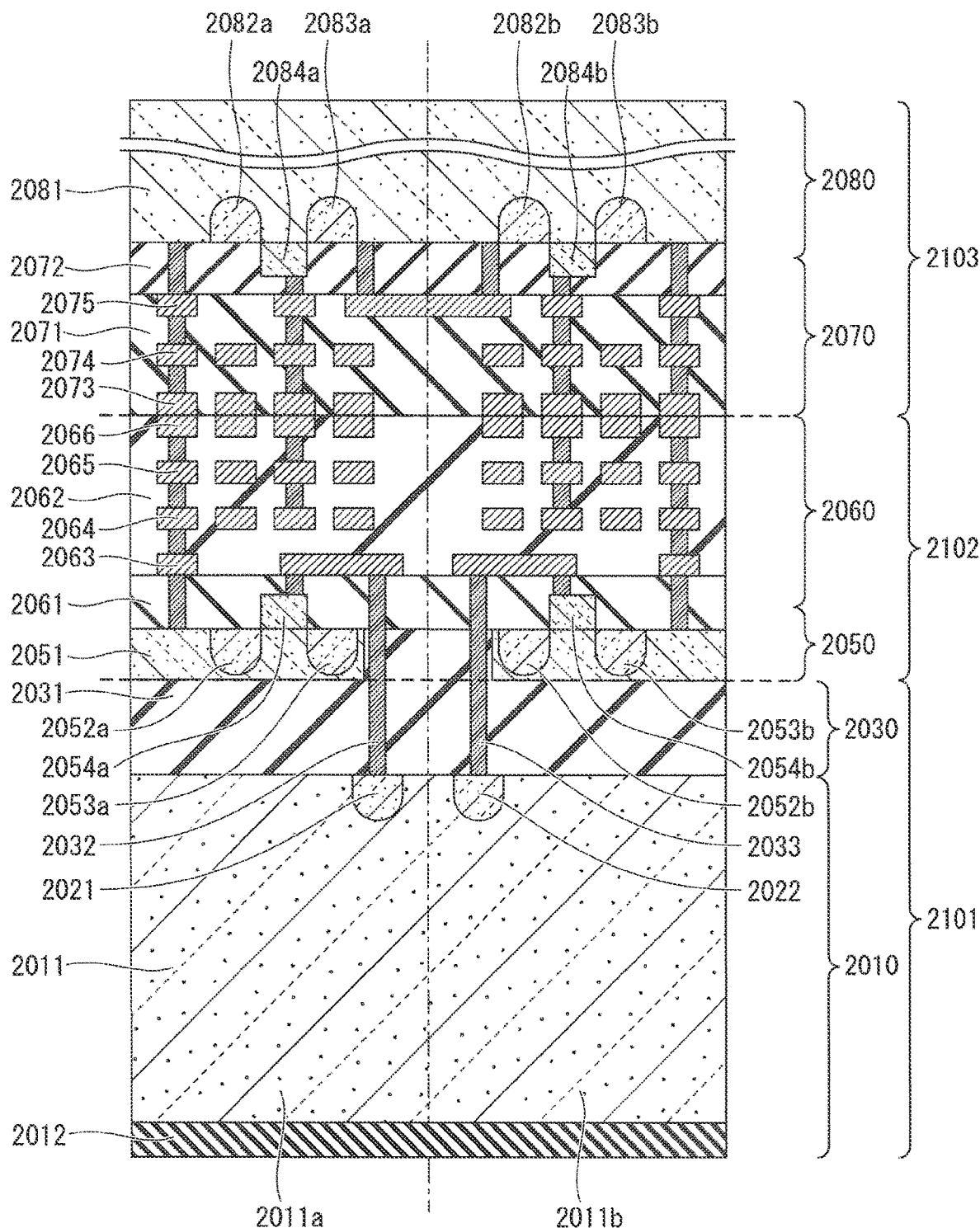
FIG. 18 is a cross-sectional view of main sections of a pixel region of a semiconductor apparatus according to a second modification example of the second embodiment of the present technology.

As depicted in FIG. 18, a semiconductor apparatus according to a second modification example of the second embodiment of the present technology is different from the semiconductor apparatus according to the second embodiment of the present technology depicted in FIG. 12 in that an antireflection film 2012 is provided on the backside of the compound semiconductor substrate 2011. By providing the antireflection film 2012 on the backside of the compound semiconductor substrate 2011, reflection of light can be suppressed, and occurrence of ghosts and flares can be suppressed. In other respects, the configuration of the semiconductor apparatus according to the second modification example of the second embodiment of the present technology is similar to that of the semiconductor apparatus according to the second embodiment of the present technology depicted in FIG. 12, and so overlapping explanations are omitted.

Third Modification Example of Second Embodiment

Figure 19:
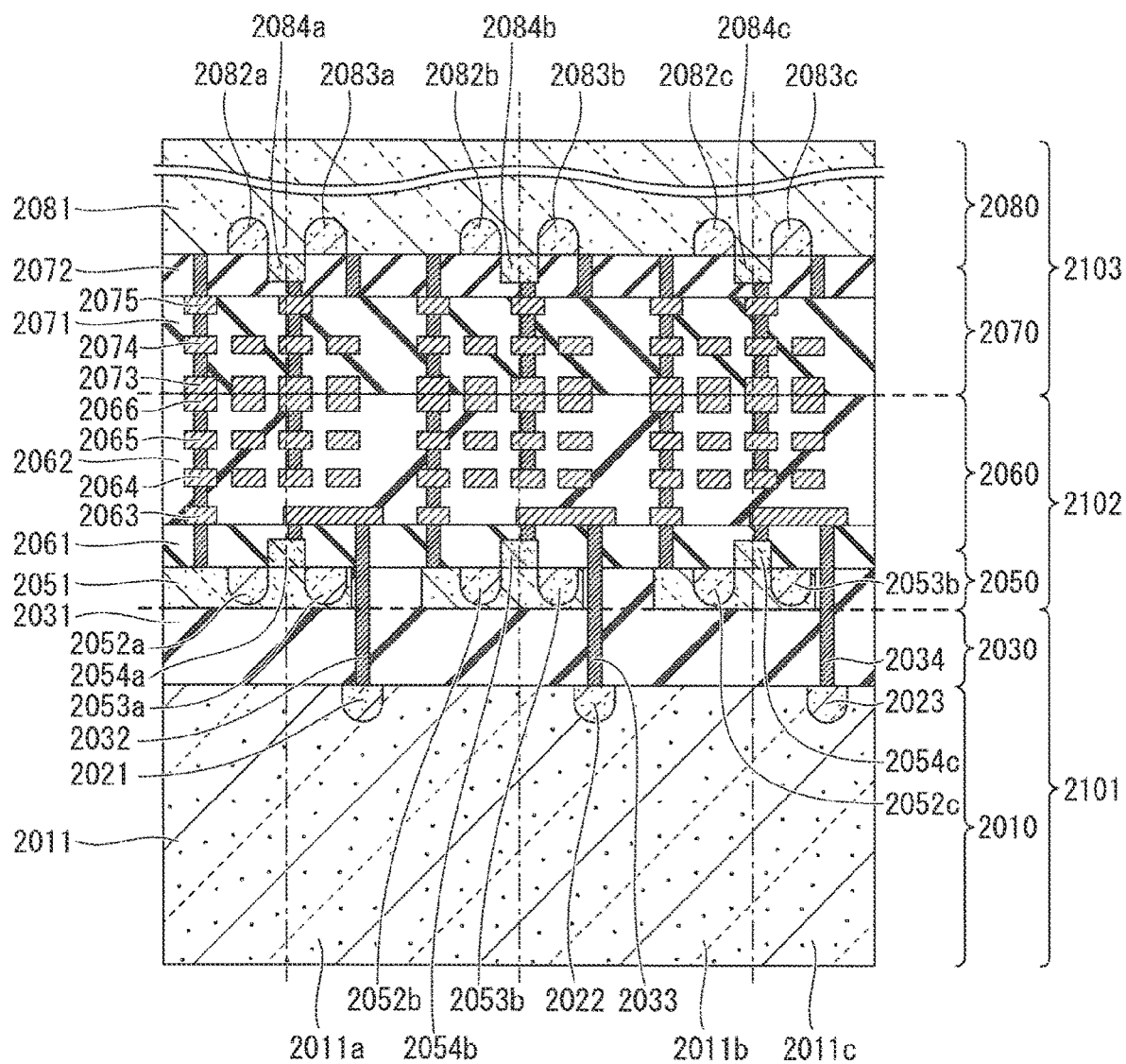
FIG. 19 is a cross-sectional view of main sections of a pixel region of a semiconductor apparatus according to a third modification example of the second embodiment of the present technology.

As depicted in FIG. 19, a semiconductor apparatus according to a third modification example of the second embodiment of the present technology is different from the semiconductor apparatus according to the second embodiment of the present technology depicted in FIG. 12 in that the positions of plural photoelectric converting sections 2011a, 2011b and 2011c provided in the first substrate 2101 and the positions of elements provided in the second substrate 2102 and the third substrate 2103 are displaced by a half cycle. In other respects, the configuration of the semiconductor apparatus according to the third modification example of the second embodiment of the present technology is similar to that of the semiconductor apparatus according to the second embodiment of the present technology depicted in FIG. 12, and so overlapping explanations are omitted.

Fourth Modification Example of Second Embodiment

Figure 20:
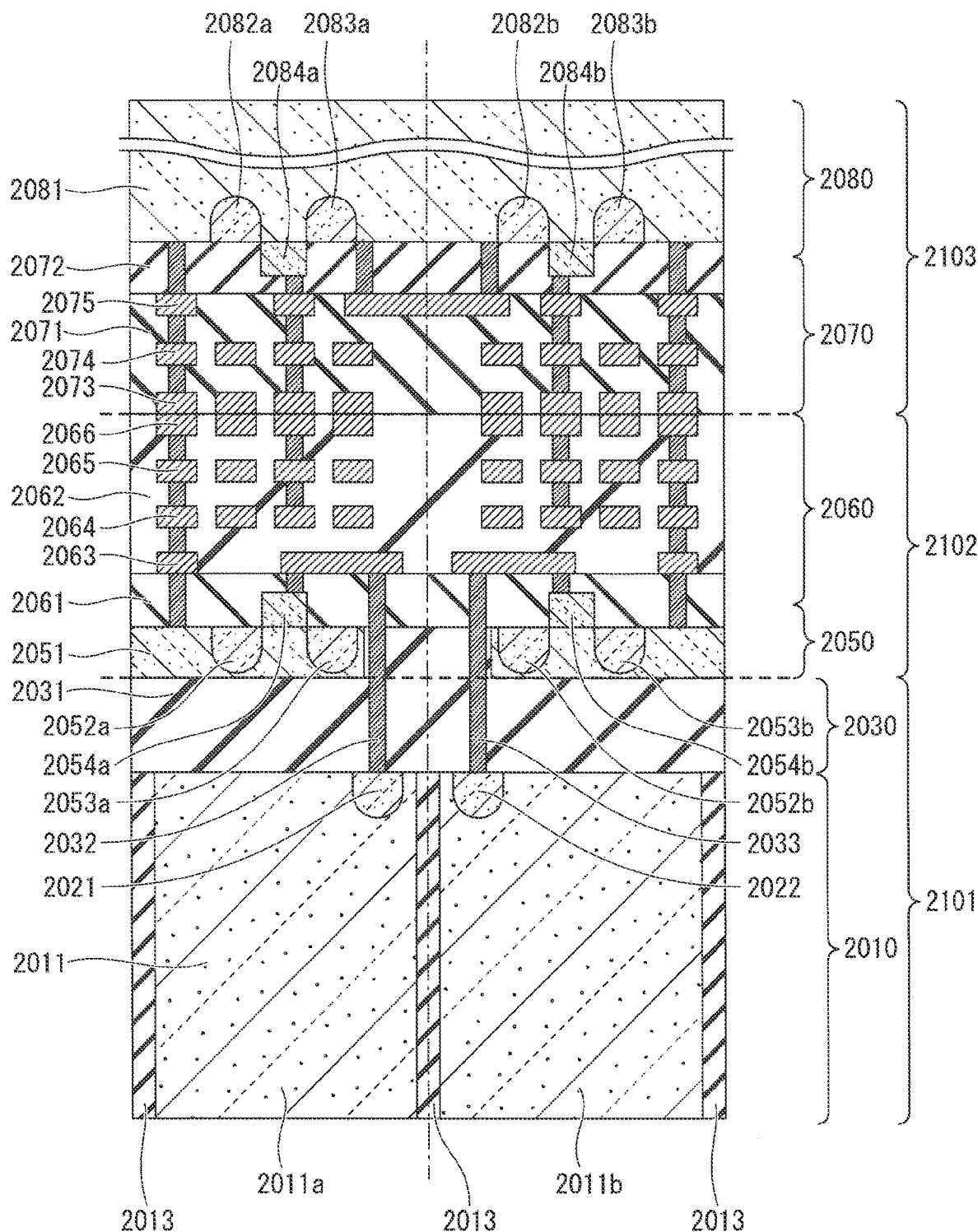
FIG. 20 is a cross-sectional view of main sections of a pixel region of a semiconductor apparatus according to a fourth modification example of the second embodiment of the present technology.

As depicted in FIG. 20, a semiconductor apparatus according to a fourth modification example of the second embodiment of the present technology is different from the semiconductor apparatus according to the second embodiment of the present technology depicted in FIG. 12 in that the adjacent photoelectric converting sections 2011a and 2011b are element-separated from each other by element separating sections 2013. For example, the element separating sections 2013 are formed like a grid when seen from below in FIG. 20. The element separating sections 2013 have functions of electrically and optically separating the adjacent photoelectric converting sections 2011a and 2011b from each other. For example, the element separating sections 2013 can include insulating films embedded in groove sections provided in the compound semiconductor substrate 2011. For example, the insulating films may be structures formed by stacking fixed electric charge films such as hafnium oxide films ($HfO_2$ films), and silicon oxide films (SiO$_2$ films). Alternatively, the element separating sections 2013 may include insulating films embedded in groove sections provided in the compound semiconductor substrate 2011, and light-shielding metal films including tungsten (W) or the like embedded in the groove sections via the insulating films. Light-shielding films (not depicted) including tungsten (W) or the like may be arranged below the element separating sections 2013. In other respects, the configuration of the semiconductor apparatus according to the third embodiment of the present technology is similar to that of the semiconductor apparatus according to the second embodiment of the present technology depicted in FIG. 12, and so overlapping explanations are omitted.

Fifth Modification Example of Second Embodiment

Figure 21:
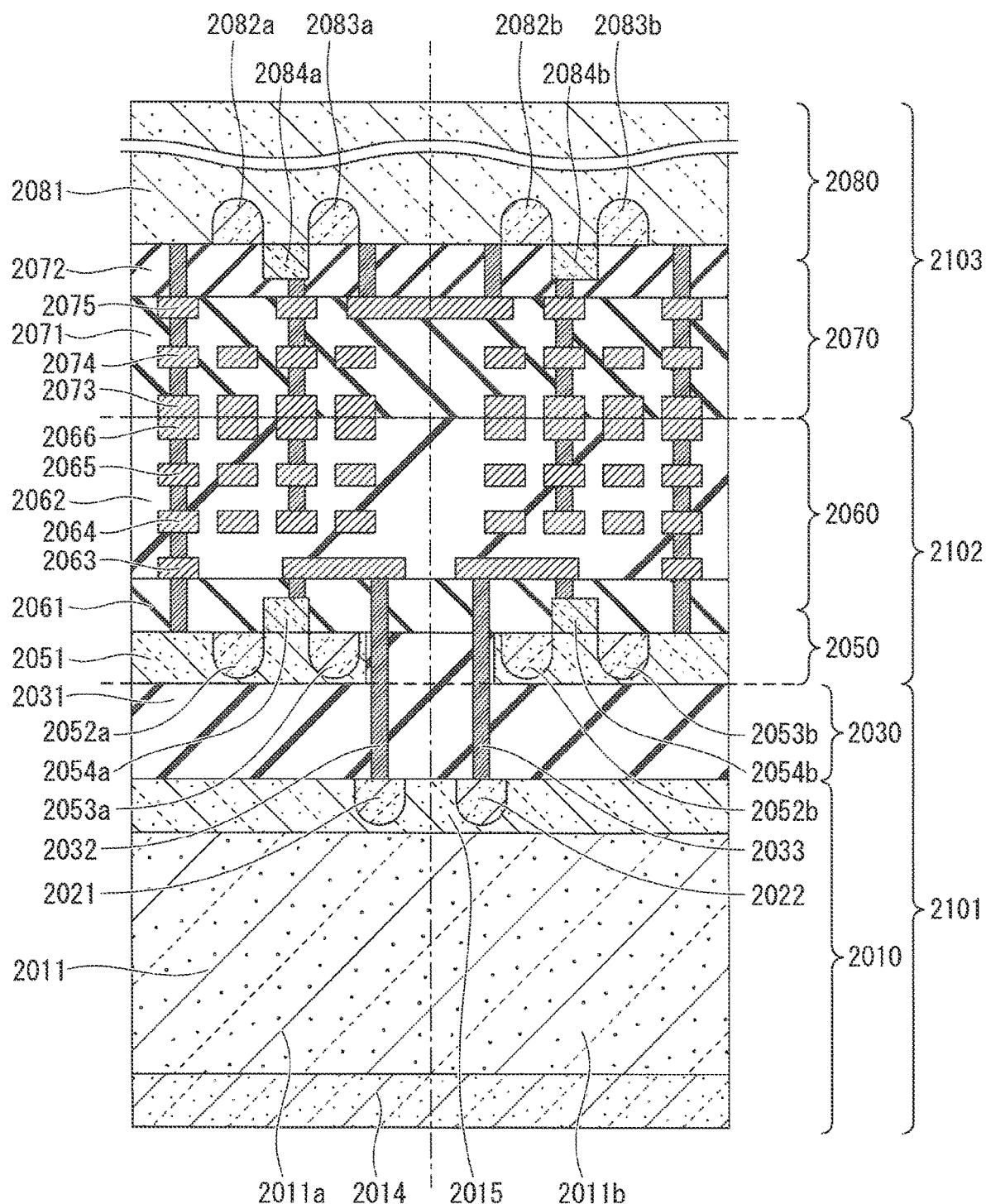
FIG. 21 is a cross-sectional view of main sections of a pixel region of a semiconductor apparatus according to a fifth modification example of the second embodiment of the present technology.

As depicted in FIG. 21, a semiconductor apparatus according to a fifth modification example of the second embodiment of the present technology is different from the semiconductor apparatus according to the second embodiment of the present technology depicted in FIG. 12 in that the first substrate 2101 has a structure formed by stacking a first compound semiconductor substrate 2011, a second compound semiconductor substrate 2014 provided on the backside of the first compound semiconductor substrate 2011 and a third compound semiconductor substrate 2015 provided on the front surface of the first compound semiconductor substrate 2011. The diffusion regions 2021 and 2022 are provided in the second compound semiconductor substrate 2014.

As a material of the first compound semiconductor substrate 2011, a compound semiconductor similar to a material of the compound semiconductor substrate 2011 of the semiconductor apparatus according to the second embodiment of the present technology can be used, and, for example, indium gallium arsenide (InGaAs) can be used. As materials of the second compound semiconductor substrate 2014 and the third compound semiconductor substrate 2015, compound semiconductors having bandgaps wider than the bandgap of the first compound semiconductor substrate 2011 can be used, for example. As materials of the second compound semiconductor substrate 2014 and the third compound semiconductor substrate 2015, indium phosphide (InP) can be used, for example. The materials of the second compound semiconductor substrate 2014 and the third compound semiconductor substrate 2015 may be the same or may be different. In other respects, the configuration of the semiconductor apparatus according to the second embodiment of the present technology is similar to that of the semiconductor apparatus according to the second embodiment of the present technology depicted in FIG. 12, and so overlapping explanations are omitted.

Note that, although FIG. 21 depicts an example of the first substrate 2101 with a triple-layer structure, the first substrate 2101 may have a dual-layer structure of the first compound semiconductor substrate 2011, and the second compound semiconductor substrate 2014 provided on the backside of the first compound semiconductor substrate 2011. In addition, the first substrate 2101 may have a dual-layer structure of the first compound semiconductor substrate 2011, and the third compound semiconductor substrate 2015 provided on the front surface of the first compound semiconductor substrate 2011.

Third Embodiment

Figure 22:
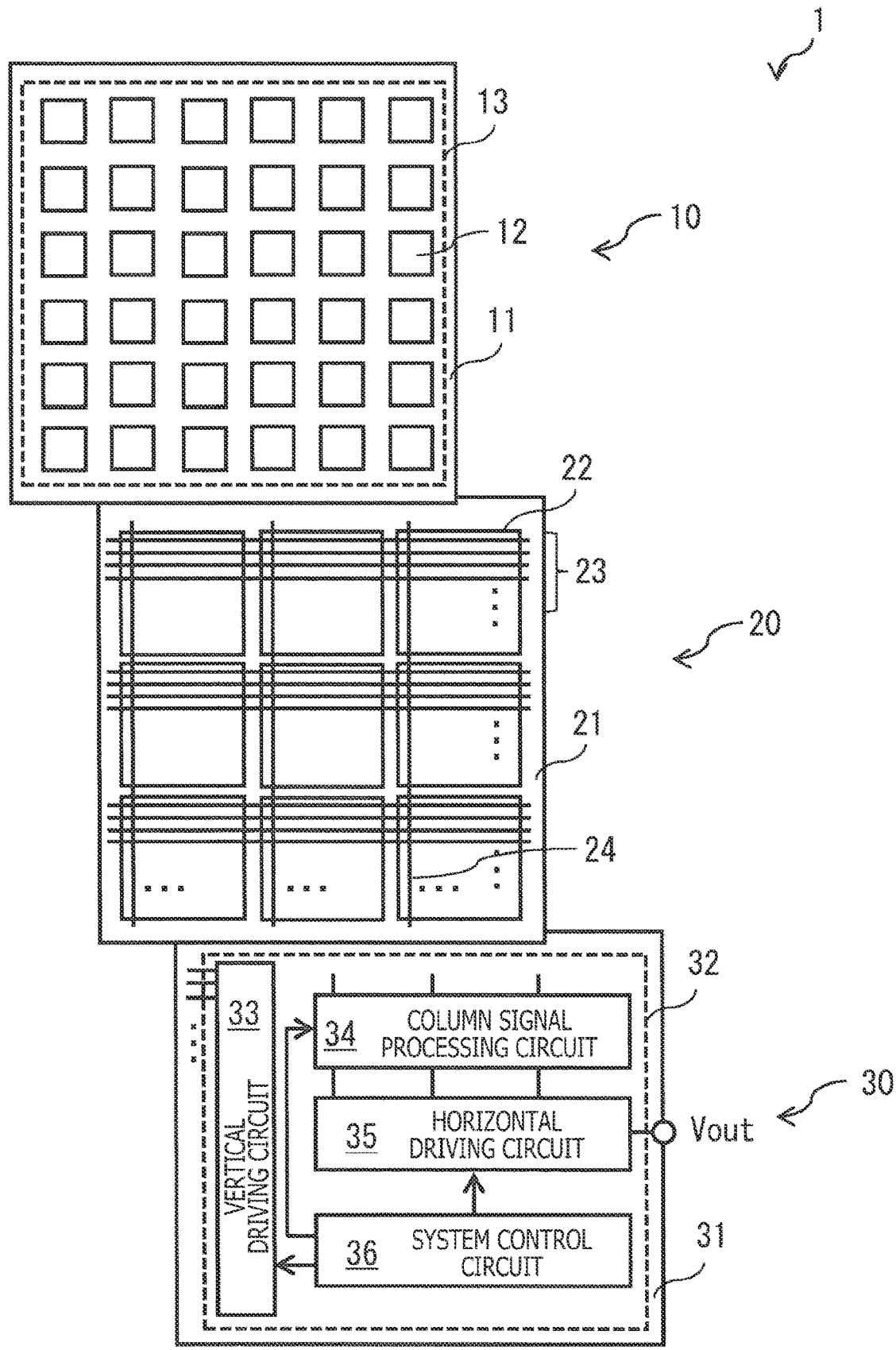
FIG. 22 is a figure representing an example of a schematic configuration of an image pickup apparatus according to a third embodiment of the present technology.

FIG. 22 represents an example of a schematic configuration of an image pickup apparatus 1 according to a third embodiment of the present technology. The image pickup apparatus 1 includes three substrates (a first substrate 10, a second substrate 20 and a third substrate 30). The image pickup apparatus 1 is an image pickup apparatus with a three-dimensional structure including the three substrates (the first substrate 10, the second substrate 20 and the third substrate 30) that are pasted together. The first substrate 10, the second substrate 20 and the third substrate 30 are stacked one on another in this order.

The first substrate 10 has a semiconductor substrate 11 having plural sensor pixels 12 that perform photoelectric conversion. The plural sensor pixels 12 are provided in a matrix in a pixel region 13 of the first substrate 10. The second substrate 20 has a semiconductor substrate 21 having, for each set of four sensor pixels 12, one read circuit 22 that outputs pixel signals based on electric charge output from the sensor pixels 12. The second substrate 20 has plural pixel driving lines 23 extending in the row direction and plural vertical signal lines 24 extending in the column direction. The third substrate 30 has a semiconductor substrate 31 having a logic circuit 32 that processes pixel signals. For example, the logic circuit 32 has a vertical driving circuit 33, a column signal processing circuit 34, a horizontal driving circuit 35 and a system control circuit 36. The logic circuit 32 (specifically, the horizontal driving circuit 35) outputs an output voltage Vout of each sensor pixel 12 to the outside. For example, the logic circuit 32 has an impurity diffusion region contacting source electrodes and drain electrodes, and the front surface of the impurity diffusion region may have low resistance regions including a silicide such as CoSi$_2$ or NiSi formed by using the salicide (Self Aligned Silicide) process.

For example, the vertical driving circuit 33 sequentially selects each row of the plural sensor pixels 12. For example, on a pixel signal output from each sensor pixel 12 in a row selected by the vertical driving circuit 33, the column signal processing circuit 34 performs a correlated double sampling (Correlated Double Sampling: CDS) process. For example, by performing the CDS process, the column signal processing circuit 34 extracts the signal level of a pixel signal, and retains pixel data according to a received light amount of each sensor pixel 12. For example, the horizontal driving circuit 35 sequentially outputs pixel data retained at the column signal processing circuit 34 to the outside. For example, the system control circuit 36 controls driving of each block (the vertical driving circuit 33, the column signal processing circuit 34 and the horizontal driving circuit 35) in the logic circuit 32.

Figure 23:
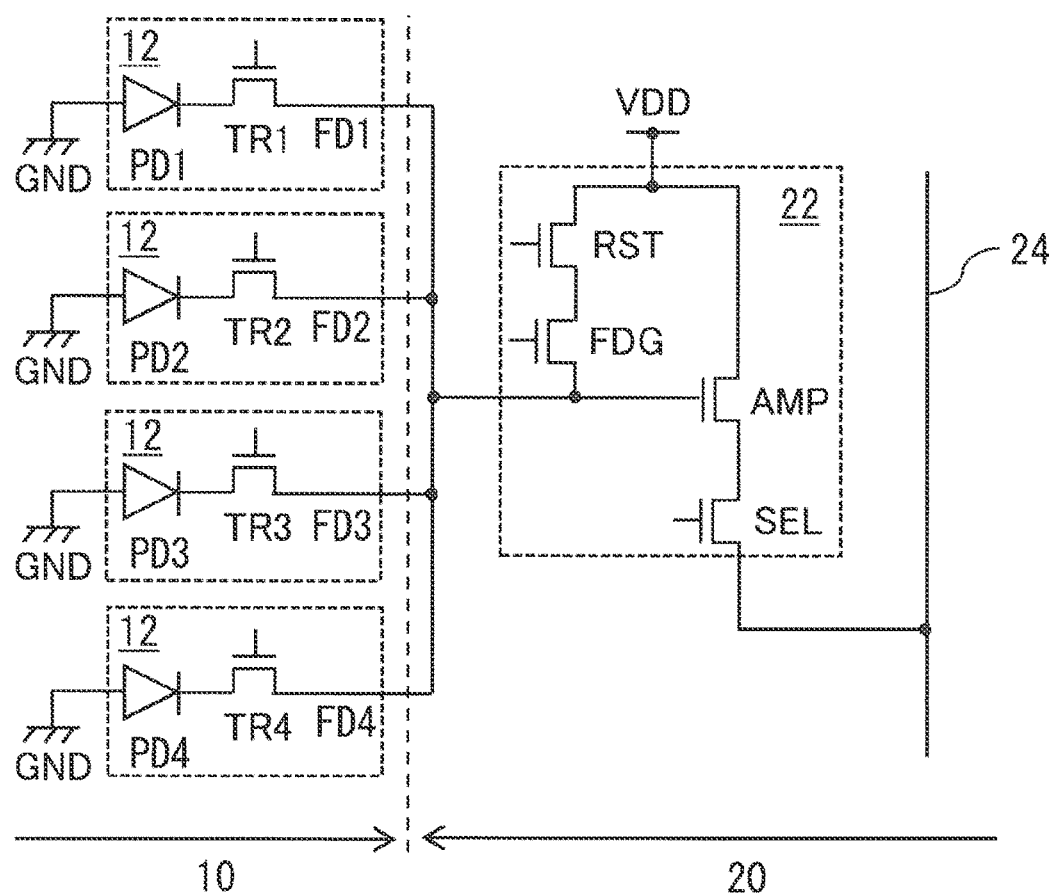
FIG. 23 is a figure representing an example of sensor pixels and read circuits in FIG. 22.

FIG. 23 represents an example of the sensor pixels 12 and the read circuits 22. In the following cases that are explained, as depicted in FIG. 23, four sensor pixels 12 share one read circuit 22. Here, to "share" means that output of the four sensor pixels 12 is input to the common read circuit 22.

The sensor pixels 12 have mutually the same constituent elements. In order to make distinctions between constituent elements of the sensor pixels 12, identification numbers (1, 2, 3 and 4) are given at the ends of reference characters of the constituent elements of the sensor pixels 12 in FIG. 23. Hereinbelow, the identification numbers are given at the ends of the reference characters of the constituent elements of the sensor pixels 12 in a case where it is necessary to make distinctions between the constituent elements of the sensor pixels 12, but the identification numbers at the ends of the reference characters of the constituent elements of the sensor pixels 12 are omitted in a case where it is not necessary to make distinctions between the constituent elements of the sensor pixels 12.

For example, each sensor pixel 12 has a photodiode PD, a transfer transistor TR electrically connected with the photodiode PD and a floating diffusion FD that temporarily retains electric charge output from the photodiode PD via the transfer transistor TR. The photodiode PD performs photoelectric conversion, and generates electric charge according to a received light amount. The cathode of the photodiode PD is electrically connected to the source of the transfer transistor TR, and the anode of the photodiode PD is electrically connected to a reference potential line (e.g., ground). The drain of the transfer transistor TR is electrically connected to the floating diffusion FD, and the gate of the transfer transistor TR is electrically connected to a pixel driving line 23. For example, the transfer transistor TR is a CMOS (Complementary Metal Oxide Semiconductor) transistor.

The floating diffusions FD of the sensor pixels 12 sharing the one read circuit 22 are electrically connected with each other, and are electrically connected to an input terminal of the common read circuit 22. For example, the read circuit 22 has a reset transistor RST, a selection transistor SEL and an amplification transistor AMP. Note that the selection transistor SEL may be omitted as necessary. The source (the input terminal of the read circuit 22) of the reset transistor RST is electrically connected to the floating diffusions FD, and the drain of the reset transistor RST is electrically connected to a power line VDD and the drain of the amplification transistor AMP. The gate of the reset transistor RST is electrically connected to a pixel driving line 23 (see FIG. 22). The source of the amplification transistor AMP is electrically connected to the drain of the selection transistor SEL, and the gate of the amplification transistor AMP is electrically connected to the source of the reset transistor RST. The source (an output terminal of the read circuit 22) of the selection transistor SEL is electrically connected to a vertical signal line 24, and the gate of the selection transistor SEL is electrically connected to a pixel driving line 23 (see FIG. 22).

Figure 25:
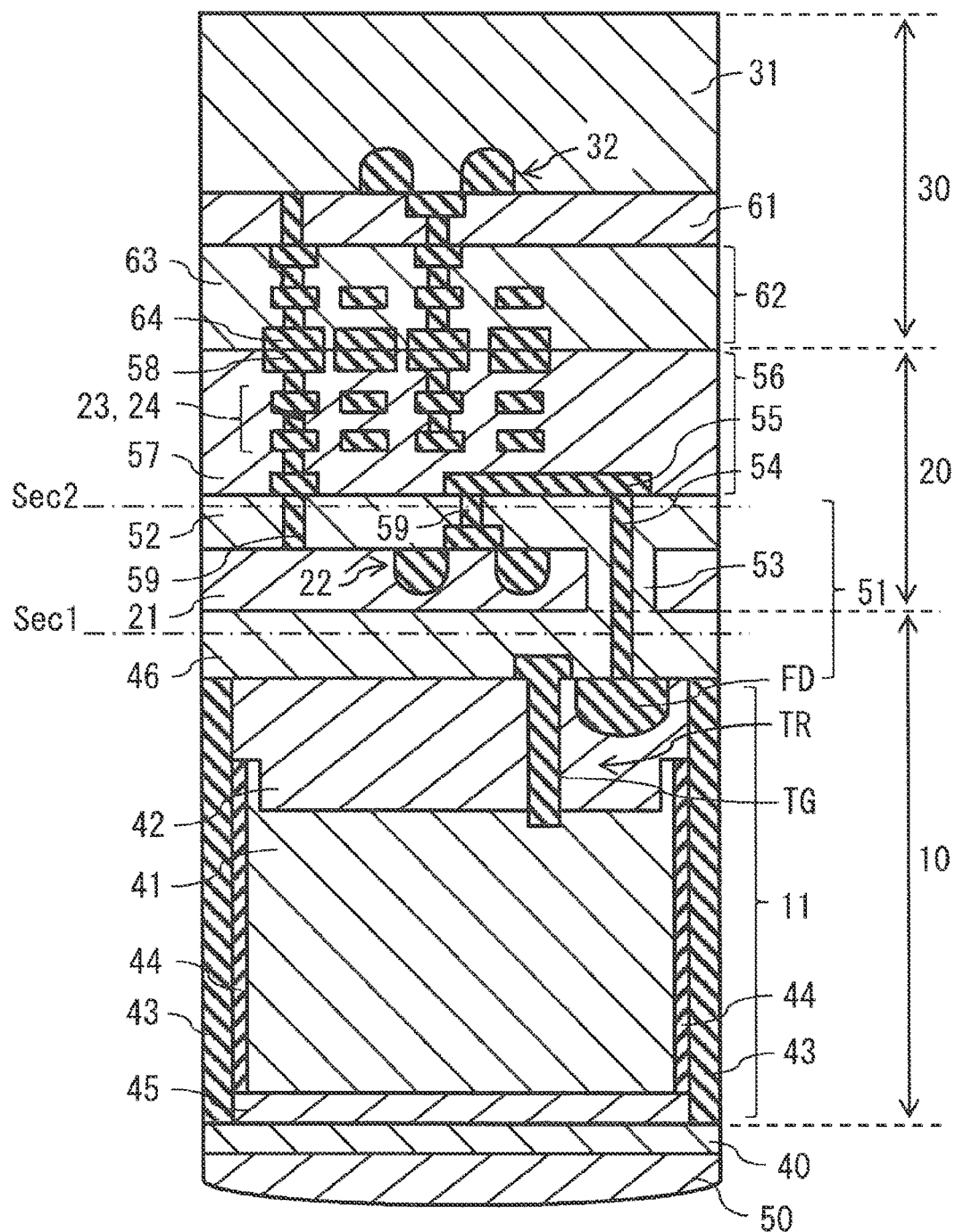
FIG. 25 is a figure representing an example of a vertical cross-sectional configuration of the image pickup apparatus in FIG. 22.

When the transfer transistor TR is turned on, the transfer transistor TR transfers electric charge of the photodiode PD to the floating diffusion FD. For example, as depicted in FIG. 25 mentioned below, the gate (transfer gate TG) of the transfer transistor TR extends from the front surface of the semiconductor substrate 11 through a well layer 42 to a depth that reaches a PD 41. The reset transistor RST resets the potential of the floating diffusion FD to a predetermined potential. When the reset transistor RST is turned on, the potential of the floating diffusion FD is reset to the potential of the power line VDD. The selection transistor SEL controls the output timing of a pixel signal from the read circuit 22. The amplification transistor AMP generates, as a pixel signal, a signal at a voltage according to the level of electric charge retained at the floating diffusion FD. The amplification transistor AMP includes a source follower type amplifier, and outputs a pixel signal at a voltage according to the level of electric charge generated at the photodiode PD. When the selection transistor SEL is turned on, the amplification transistor AMP amplifies the potential of the floating diffusion FD, and outputs a voltage according to the potential to the column signal processing circuit 34 via the vertical signal line 24. For example, the reset transistor RST, the amplification transistor AMP and the selection transistor SEL are CMOS transistors.

The source (the output terminal of the read circuit 22) of the amplification transistor AMP is electrically connected to the vertical signal line 24, an FD transfer transistor FDG is provided between the source of the reset transistor RST and the gate of the amplification transistor AMP, and the gate of the amplification transistor AMP is electrically connected to the source of the FD transfer transistor FDG.

The FD transfer transistor FDG is used when conversion efficiency is to be switched. Typically, pixel signals are small at the time of imaging at a dark location. On the basis of Q=CV, when electric charge-voltage conversion is performed, if the capacitance (FD capacitance C) of the floating diffusion FD is large, V at the time of conversion into a voltage with the amplification transistor AMP inevitably becomes small. On the other hand, pixel signals become large at a bright location, and so if the FD capacitance C is not large, the floating diffusion FD cannot fully receive the electric charge of the photodiode PD. Further, it is necessary for the FD capacitance C to have become large in order to prevent V at the time of conversion into a voltage at the amplification transistor AMP from becoming too large (in other words, in order for V to become small). Taking these into consideration, when the FD transfer transistor FDG is turned on, there is an increase of the gate capacitance by an amount corresponding to the FD transfer transistor FDG, and so the overall FD capacitance C becomes large. On the other hand, when the FD transfer transistor FDG is turned off, the overall FD capacitance C becomes small. In such a manner, it is possible to make the FD capacitance C variable, and switch the conversion efficiency by turning on and off the FD transfer transistor FDG.

Figure 24:
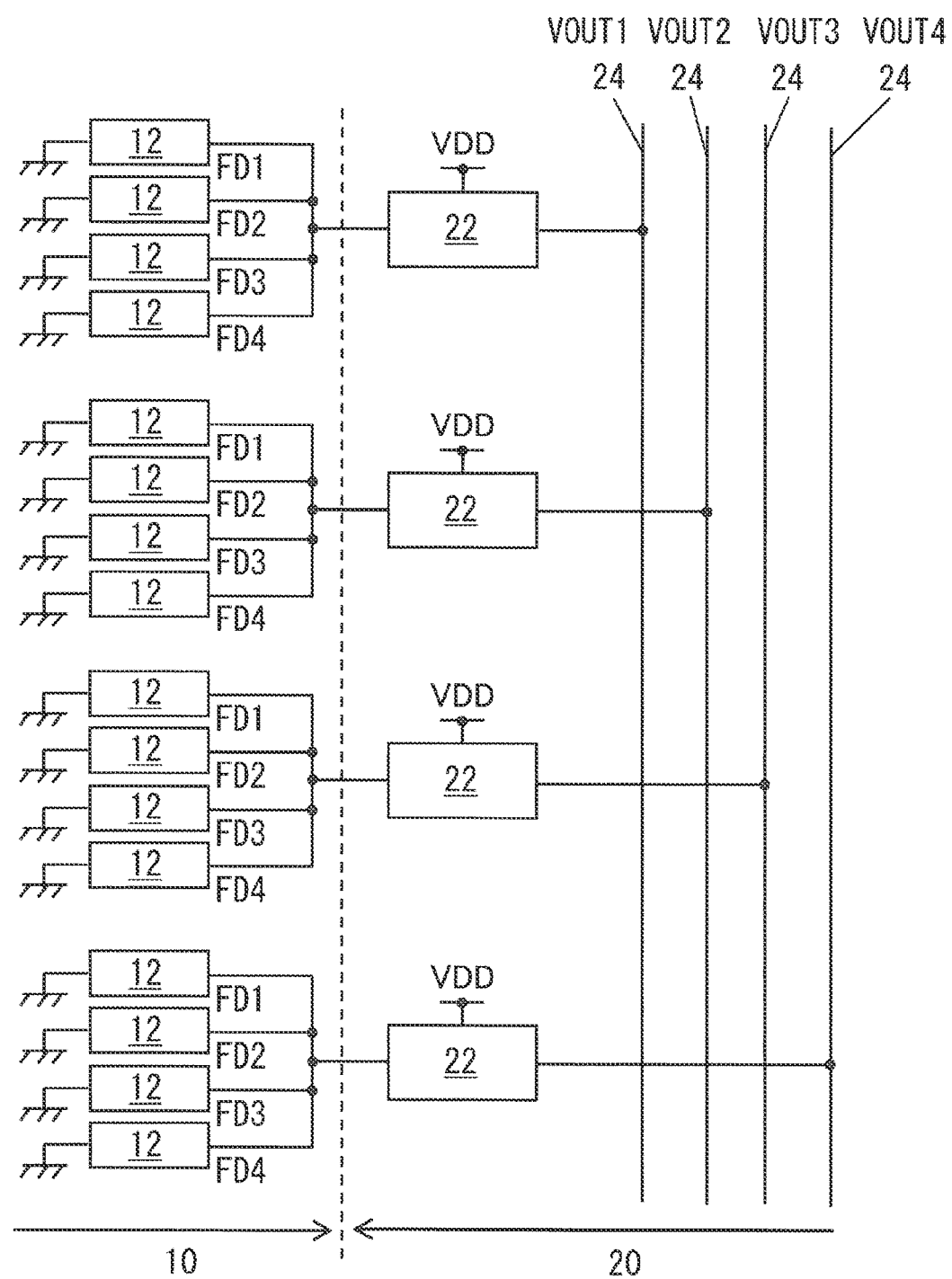
FIG. 24 is a figure representing an example of the manner of connection of plural read circuits and plural vertical signal lines.

FIG. 24 represents an example of the manner of connection of plural read circuits 22 and plural vertical signal lines 24. In a case where the plural read circuits 22 are arranged next to each other in the extending direction (e.g., the column direction) of the vertical signal lines 24, each of the plural vertical signal lines 24 may be allocated to one of the read circuits 22. For example, as depicted in FIG. 24, in a case where four read circuits 22 are arranged next to each other in the extending direction (e.g., the column direction) of the vertical signal lines 24, each of four vertical signal lines 24 may be allocated to one of the read circuits 22. Note that in order to make distinctions between the vertical signal lines 24, identification numbers (1, 2, 3 and 4) are given at the ends of reference characters of the vertical signal lines 24 in FIG. 24.

FIG. 25 represents an example of a vertical cross-sectional configuration of the image pickup apparatus 1. FIG. 25 illustrates a cross-sectional configuration of a location that is in the image pickup apparatus 1 and faces a sensor pixel 12. The image pickup apparatus 1 includes the first substrate 10, the second substrate 20 and the third substrate 30 that are stacked one on another in this order, and further includes a color filter 40 and a light-reception lens 50 on the backside (light-incidence surface side) of the first substrate 10. For example, one set of the color filter 40 and the light-reception lens 50 is provided for each sensor pixel 12. That is, the image pickup apparatus 1 is a backside illumination image pickup apparatus.

The first substrate 10 includes an insulation layer 46 stacked on the semiconductor substrate 11. Here, the semiconductor substrate 11 may include a compound semiconductor substrate having a coefficient of absorption of infrared light or ultraviolet light, similarly to the second embodiment of the present technology. As a material of the compound semiconductor substrate, a compound semiconductor (narrow bandgap semiconductor) having a bandgap narrower than the bandgap of Si can be used as a material having light absorption sensitivity to the infrared light region which is on the side of longer wavelengths than the visible light region, and, for example, silicon germanium (SiGe), germanium (Ge), indium gallium arsenide (InGaAs), indium arsenide (InAs), indium antimonide (InSb) or the like can be used. As a material of the compound semiconductor substrate, a compound semiconductor (wide bandgap semiconductor) having a bandgap wider than the bandgap of Si can be used as a material having light absorption sensitivity to the ultraviolet light region which is on the side of shorter wavelengths than the visible light region, and, for example, GaN or AlN can be used. The material of the compound semiconductor substrate is not limited to the materials described above, and any material can be selected as appropriate according to a target wavelength region.

The first substrate 10 has the insulation layer 46 as a part of an interlayer dielectric film 51. The insulation layer 46 is provided at the gap between the semiconductor substrate 11 and the semiconductor substrate 21 mentioned below. The semiconductor substrate 11 includes a silicon substrate. For example, at and near a part of its front surface, the semiconductor substrate 11 has a p well layer 42, and in another region (a region deeper than the p well layer 42), the semiconductor substrate 11 has a PD 41 whose conductivity type is different from that of the p well layer 42. The p well layer 42 includes a p-type semiconductor region. The PD 41 includes a semiconductor region whose conductivity type (specifically, n type) is different from that of the p well layer 42. In the p well layer 42, the semiconductor substrate 11 has a floating diffusion FD as a semiconductor region whose conductivity type (specifically, n type) is different from that of the p well layer 42.

For each sensor pixel 12, the first substrate 10 has a photodiode PD, a transfer transistor TR and a floating diffusion FD. At a portion on the front surface side (a side opposite to the light-incidence surface side, the second substrate 20 side) of the semiconductor substrate 11, the first substrate 10 includes transfer transistors TR and floating diffusions FD. The first substrate 10 has element separating sections 43 that separate sensor pixels 12 from each other. Each element separating section 43 is formed as a section extending in the normal direction of the semiconductor substrate 11 (a direction perpendicular to the front surface of the semiconductor substrate 11). The element separating section 43 is provided between two sensor pixels 12 that are adjacent to each other. The element separating section 43 electrically separates, from each other, the sensor pixels 12 that are adjacent to each other. For example, the element separating section 43 includes silicon oxide. For example, the element separating section 43 penetrates the semiconductor substrate 11. For example, the first substrate 10 further has p well layers 44 that are in contact with surfaces which are side surfaces of the element separating sections 43, and that are on the photodiode PD sides. Each p well layer 44 includes a semiconductor region whose conductivity type (specifically, p type) is different from that of the photodiodes PD. For example, the first substrate 10 further has fixed electric charge films 45 that are in contact with the backside of the semiconductor substrate 11. The fixed electric charge film 45 is charged negatively in order to suppress generation of dark currents caused by the interface state on the light-reception surface side of the semiconductor substrate 11. For example, each fixed electric charge film 45 includes an insulating film having negative fixed electric charge. For example, examples of a material of such an insulating film include hafnium oxide, zirconium oxide, aluminum oxide, titanium oxide and tantalum oxide. An electrical field induced by the fixed electric charge film 45 forms a hole accumulation layer at the interface on the light-reception surface side of the semiconductor substrate 11. This hole accumulation layer suppresses generation of electrons from the interface. The color filter 40 is provided on the backside of the semiconductor substrate 11. For example, the color filter 40 is provided in contact with the fixed electric charge film 45, and is provided at a position facing the sensor pixel 12 with the fixed electric charge film 45 being interposed therebetween. For example, the light-reception lens 50 is provided in contact with the color filter 40, and is provided at a position facing the sensor pixel 12 with the color filter 40 and the fixed electric charge film 45 being interposed therebetween.

The second substrate 20 includes an insulation layer 52 stacked on the semiconductor substrate 21. Here, the semiconductor substrate 21 may include a compound semiconductor substrate similarly to the first embodiment of the present technology. As a material of the compound semiconductor substrate, a compound semiconductor (narrow bandgap semiconductor) having a bandgap narrower than the bandgap of Si can be used as a material having light absorption sensitivity to the infrared light region which is on the side of longer wavelengths than the visible light region, and, for example, silicon germanium (SiGe), germanium (Ge), indium gallium arsenide (InGaAs), indium arsenide (InAs), indium antimonide (InSb) or the like can be used. As a material of the compound semiconductor substrate, a compound semiconductor (wide bandgap semiconductor) having a bandgap wider than the bandgap of Si can be used as a material having light absorption sensitivity to the ultraviolet light region which is on the side of shorter wavelengths than the visible light region, and, for example, GaN or AlN can be used. The material of the compound semiconductor substrate is not limited to the materials described above, and any material can be selected as appropriate according to a target wavelength region.

The second substrate 20 has the insulation layer 52 as a part of the interlayer dielectric film 51. The insulation layer 52 is provided at the gap between the semiconductor substrate 21 and the semiconductor substrate 31. The semiconductor substrate 21 includes a silicon substrate. The second substrate 20 has one read circuit 22 for each set of four sensor pixels 12. The second substrate 20 includes the read circuit 22 provided at a portion on the front surface side (third substrate 30 side) of the semiconductor substrate 21. The second substrate 20 is pasted onto the first substrate 10 with the backside of the semiconductor substrate 21 facing the front surface side of the semiconductor substrate 11. That is, the second substrate 20 is pasted onto the first substrate 10 face-to-back. In the layer where there is the semiconductor substrate 21, the second substrate 20 further has an insulation layer 53 penetrating the semiconductor substrate 21. The second substrate 20 has the insulation layer 53 as a part of the interlayer dielectric film 51. The insulation layer 53 is provided to cover the side surface of a through-wire 54 mentioned below.

The stack including the first substrate 10 and the second substrate 20 has the interlayer dielectric film 51 and the through-wire 54 provided in the interlayer dielectric film 51. The stack described above has one through-wire 54 for each sensor pixel 12. The through-wire 54 extends in the normal direction of the semiconductor substrate 21, and is provided to penetrate a location which is in the interlayer dielectric film 51 and includes the insulation layer 53. The first substrate 10 and the second substrate 20 are electrically connected with each other by the through-wire 54. Specifically, the through-wire 54 is electrically connected to the floating diffusion FD and a connection wire 55 mentioned below.

The stack including the first substrate 10 and the second substrate 20 further has through-wires 47 and 48 (see FIG. 31 mentioned below) provided in the interlayer dielectric film 51. The stack described above has one through-wire 47 and one through-wire 48 for each sensor pixel 12. Each through-wire 47 or 48 extends in the normal direction of the semiconductor substrate 21, and is provided to penetrate a location which is in the interlayer dielectric film 51 and includes the insulation layer 53. The first substrate 10 and the second substrate 20 are electrically connected with each other by the through-wires 47 and 48. Specifically, the through-wire 47 is electrically connected to the p well layer 42 of the semiconductor substrate 11 and a wire in the second substrate 20. The through-wire 48 is electrically connected to a transfer gate TG and a pixel driving line 23.

For example, in the insulation layer 52, the second substrate 20 has plural connecting sections 59 that are electrically connected with the read circuit 22 and the semiconductor substrate 21. For example, the second substrate 20 further has a wiring layer 56 on the insulation layer 52. For example, the wiring layer 56 has an insulation layer 57, and plural pixel driving lines 23 and plural vertical signal lines 24 that are provided in the insulation layer 57. For example, in the insulation layer 57, the wiring layer 56 further has one of the plural connection wires 55 for each set of four sensor pixels 12. The connection wire 55 electrically connects, with each other, through-wires 54 that are electrically connected to floating diffusions FD included in four sensor pixels 12 sharing the read circuit 22. Here, the total number of the through-wires 54 and 48 is larger than the total number of sensor pixels 12 included in the first substrate 10, and is twice as large as the total number of the sensor pixels 12 included in the first substrate 10. In addition, the total number of the through-wires 54, 48 and 47 is larger than the total number of sensor pixels 12 included in the first substrate 10, and is three times as large as the total number of the sensor pixels 12 included in the first substrate 10.

For example, in the insulation layer 57, the wiring layer 56 further has plural pad electrodes 58. For example, each pad electrode 58 includes metal such as Cu (copper) or Al (aluminum). Each pad electrode 58 is exposed at the front surface of the wiring layer 56. Each pad electrode 58 is used for electrically connecting the second substrate 20 and the third substrate 30, and pasting together the second substrate 20 and the third substrate 30. For example, each of the plural pad electrodes 58 is provided for one of pixel driving lines 23 and vertical signal lines 24. Here, the total number of the pad electrodes 58 (or the total number of junctions between the pad electrodes 58 and pad electrodes 64 (mentioned below)) is smaller than the total number of sensor pixels 12 included in the first substrate 10.

For example, the third substrate 30 includes an interlayer dielectric film 61 stacked on the semiconductor substrate 31. Note that, as mentioned below, the third substrate 30 is pasted together with the second substrate 20 on surfaces on their front surface sides, and so when the configuration in the third substrate 30 is explained, its upward/downward direction is the reverse direction of the upward/downward direction of figures. The semiconductor substrate 31 includes a silicon substrate. The third substrate 30 includes the logic circuit 32 provided at a portion on the front surface side of the semiconductor substrate 31. For example, the third substrate 30 further has a wiring layer 62 on the interlayer dielectric film 61. For example, the wiring layer 62 has an insulation layer 63, and plural pad electrodes 64 provided in the insulation layer 63. The plural pad electrodes 64 are electrically connected with the logic circuit 32. For example, each pad electrode 64 includes Cu (copper). Each pad electrode 64 is exposed at the front surface of the wiring layer 62. Each pad electrode 64 is used for electrically connecting the second substrate 20 and the third substrate 30, and pasting together the second substrate 20 and the third substrate 30. In addition, there does not necessarily have to be plural pad electrodes 64, but even one pad electrode 64 can form electrical connection with the logic circuit 32. The second substrate 20 and the third substrate 30 are electrically connected with each other by junctions between the pad electrodes 58 and 64. That is, the gate (transfer gate TG) of the transfer transistor TR is electrically connected to the logic circuit 32 via the through-wire 54 and the pad electrodes 58 and 64. The third substrate 30 is pasted onto the second substrate 20 with the front surface of the semiconductor substrate 31 facing the front surface side of the semiconductor substrate 21. That is, the third substrate 30 is pasted onto the second substrate 20 face-to-face.

[Advantages]

In the past, miniaturization of the area size per pixel of an image pickup apparatus with a two-dimensional structure has been realized by introduction of miniaturization processes and enhancement of implementation density. In recent years, in order to realize further size reduction of image pickup apparatuses and miniaturization of the area size per pixel, image pickup apparatuses with three-dimensional structures have been developed. For example, in an image pickup apparatus with a three-dimensional structure, a semiconductor substrate having plural sensor pixels and a semiconductor substrate having a signal processing circuit that processes signals obtained by the sensor pixels are stacked one on another. Thereby, it is possible to further increase the degree of integration of sensor pixels, further increase the size of a signal processing circuit, and so on with chip sizes equivalent to conventional chip sizes.

Meanwhile, in a case where three layers of semiconductor chips are stacked one on another in an image pickup apparatus with a three-dimensional structure, it is not possible to paste together all the semiconductor substrates on surfaces on their front surface sides (face-to-face). In a case where three layers of semiconductor substrates are stacked one on another aimlessly, there is a possibility that a structure that electrically connects the semiconductor substrates with each other inevitably increases the chip sizes, inhibits miniaturization of the area size per pixel, and so on.

On the other hand, in the present embodiment, sensor pixels 12 and read circuits 22 are formed in different substrates (the first substrate 10 and the second substrate 20). Thereby, as compared with a case where sensor pixels 12 and read circuits 22 are formed in the same substrate, the area sizes of the sensor pixels 12 and the read circuits 22 can be expanded. As a result, it is possible to enhance photoelectric conversion efficiency, reduce transistor noise, and so on. In addition, the first substrate 10 having sensor pixels 12 and the second substrate 20 having read circuits 22 are electrically connected to each other by through-wires 54 provided in the interlayer dielectric film 51. Thereby, as compared with a case where the first substrate 10 and the second substrate 20 are electrically connected with each other by junctions between pad electrodes or through-wires (e.g., TSVs (Thorough Si Vias)) that penetrate the semiconductor substrates, it is possible to further reduce the chip sizes. In addition, further miniaturization of the area size per pixel enables a higher resolution. In addition, in a case where chip sizes similar to conventional chip sizes are adopted, the formation region of sensor pixels 12 can be expanded. In addition, in the present embodiment, read circuits 22 and logic circuits 32 are formed in different substrates (the second substrate 20 and the third substrate 30). Thereby, as compared with a case where read circuits 22 and logic circuits 32 are formed in the same substrate, the area sizes of the read circuits 22 and the logic circuits 32 can be expanded. In addition, because the area sizes of read circuits 22 and logic circuits 32 are not constrained by element separating sections 43, noise characteristics can be enhanced. In addition, in the present embodiment, the second substrate 20 and the third substrate 30 are electrically connected with each other by junctions between the pad electrodes 58 and 64. Here, because read circuits 22 are formed in the second substrate 20, and logic circuits 32 are formed in the third substrate 30, as compared with a structure for electrically connecting the first substrate 10 and the second substrate 20 with each other, a structure for electrically connecting the second substrate 20 and the third substrate 30 with each other can be formed with a layout which is free in terms of arrangement, the number of contacts for connection and the like. Accordingly, junctions between pad electrodes 58 and 64 can be used for electrical connection between the second substrate 20 and the third substrate 30. In such a manner, in the present embodiment, electrical connection between substrates are formed according to the degree of integration of the substrates. Thereby, a structure that electrically connects substrates will not inevitably necessitate an increase of the chip sizes, inhibit miniaturization of the area size per pixel, and so on. As a result, it is possible to provide the image pickup apparatus 1 having a triple-layer structure that will not inhibit miniaturization of the area size per pixel with chip sizes equivalent to conventional chip sizes.

In addition, in the present embodiment, sensor pixels 12 having photodiodes PD, transfer transistors TR and floating diffusions FD are formed in the first substrate 10, and read circuits 22 having reset transistors RST, amplification transistors AMP and selection transistors SEL are formed in the second substrate 20. Thereby, as compared with a case where sensor pixels 12 and read circuits 22 are formed in the same substrate, the area sizes of the sensor pixels 12 and the read circuits 22 can be expanded. As a result, even in a case where junctions between pad electrodes 58 and 64 are used for electrical connection between the second substrate 20 and the third substrate 30, the chip sizes will not increase, miniaturization of the area size per pixel will not be inhibited, and so on. As a result, it is possible to provide the image pickup apparatus 1 having a triple-layer structure that will not inhibit miniaturization of the area size per pixel with chip sizes equivalent to conventional chip sizes. Specifically, because fewer transistors are provided in the first substrate 10, particularly the area sizes of photodiodes PD of sensor pixels 12 can be expanded. Thereby, the saturation signal charge amount in photoelectric conversion can be increased, and the photoelectric conversion efficiency can be enhanced. In the second substrate 20, the degree of freedom of the layout of transistors in read circuits 22 can be ensured. In addition, because the area sizes of transistors can be expanded, particularly by expanding the area sizes of amplification transistors AMP, noise that influences pixel signals can be reduced. Even in a case where junctions between pad electrodes 58 and 64 are used for electrical connection between the second substrate 20 and the third substrate 30, the chip sizes will not increase, miniaturization of the area size per pixel will not be inhibited, and so on. As a result, it is possible to provide the image pickup apparatus 1 having a triple-layer structure that will not inhibit miniaturization of the area size per pixel with chip sizes equivalent to conventional chip sizes.

In addition, in the present embodiment, the second substrate 20 is pasted onto the first substrate 10 with the backside of the semiconductor substrate 21 facing the front surface side of the semiconductor substrate 11, and the third substrate 30 is pasted onto the second substrate 20 with the front surface side of the semiconductor substrate 31 facing the front surface side of the semiconductor substrate 21. Thereby, by using through-wires 54 for electrical connection between the first substrate 10 and the second substrate 20, and using junctions between pad electrodes 58 and 64 for electrical connection between the second substrate 20 and the third substrate 30, it is possible to provide the image pickup apparatus 1 having a triple-layer structure that will not inhibit miniaturization of the area size per pixel, with chip sizes equivalent to conventional chip sizes.

In addition, in the present embodiment, the cross-sectional area size of a through-wire 54 is smaller than the cross-sectional area size of a location of a junction between pad electrodes 58 and 64. Thereby, it is possible to provide the image pickup apparatus 1 having a triple-layer structure that will not inhibit miniaturization of the area size per pixel with chip sizes equivalent to conventional chip sizes.

In addition, the logic circuit 32 of the present embodiment has an impurity diffusion region contacting source electrodes and drain electrodes, and the front surface of the impurity diffusion region has low resistance regions including a silicide such as $CoSi_2$ or NiSi formed by using the salicide (Self Aligned Silicide) process. The low resistance regions including a silicide include a compound of metal and a material of a semiconductor substrate. Here, the logic circuits 32 are provided in the third substrate 30. Accordingly, the logic circuits 32 can be formed by a process different from processes for forming sensor pixels 12 and read circuits 22. As a result, when sensor pixels 12 and read circuits 22 are formed, a high-temperature process such as thermal oxidation can be used. In addition, a silicide, which is a less heat-resistant material, can also be used for logic circuits 32. Accordingly, in a case where low resistance regions including a silicide are provided on the front surface of the impurity diffusion region contacting the source electrodes and the drain electrodes of logic circuits 32, the contact resistance can be lowered; as a result, the speed of calculation at the logic circuits 32 can be increased.

In addition, in the present embodiment, the first substrate 10 is provided with element separating sections 43 that separate sensor pixels 12 from each other. However, in the present embodiment, sensor pixels 12 having photodiodes PD, transfer transistors TR and floating diffusions FD are formed in the first substrate 10, and read circuits 22 having reset transistors RST, amplification transistors AMP and selection transistors SEL are formed in the second substrate 20. Thereby, even in a case where the sizes of areas surrounded by element separating sections 43 become smaller due to miniaturization of the area size per pixel, the area sizes of sensor pixels 12 and read circuits 22 can be expanded. As a result, even in a case where element separating sections 43 are used, the chip sizes will not increase, miniaturization of the area size per pixel will not be inhibited, and so on. Accordingly, it is possible to provide the image pickup apparatus 1 having a triple-layer structure that will not inhibit miniaturization of the area size per pixel with chip sizes equivalent to conventional chip sizes.

In addition, in the present embodiment, element separating sections 43 penetrate the semiconductor substrate 11.

Thereby, even in a case where the distances between sensor pixels 12 become shorter due to miniaturization of the area size per pixel, signal crosstalk between adjacent sensor pixels 12 can be suppressed, and resolution deterioration on a reproduced image and image quality deterioration due to color mixing can be suppressed.

In addition, in the present embodiment, the stack including the first substrate 10 and the second substrate 20 has three through-wires 54, 47 and 48 for each sensor pixel 12. Each through-wire 54 is electrically connected to the gate (transfer gate TG) of a transfer transistor TR, each through-wire 47 is electrically connected to a p well layer 42 of the semiconductor substrate 11, and each through-wire 48 is electrically connected to a floating diffusion FD. That is, the number of through-wires 54, 47 and 48 is larger than the number of sensor pixels 12 included in the first substrate 10. However, in the present embodiment, through-wires 54 with small cross-sectional area sizes are used for electrical connection between the first substrate 10 and the second substrate 20. Thereby, the chip sizes can be reduced further, and also the area size per pixel in the first substrate 10 can be miniaturized further. As a result, it is possible to provide the image pickup apparatus 1 having a triple-layer structure that will not inhibit miniaturization of the area size per pixel with chip sizes equivalent to conventional chip sizes.

Modification Examples

Hereinafter, modification examples of the image pickup apparatus 1 according to the embodiment described above are explained. Note that in the following modification examples, configurations which are the same as those in the embodiment described above are given identical reference characters.

Modification Example A

Figure 26:
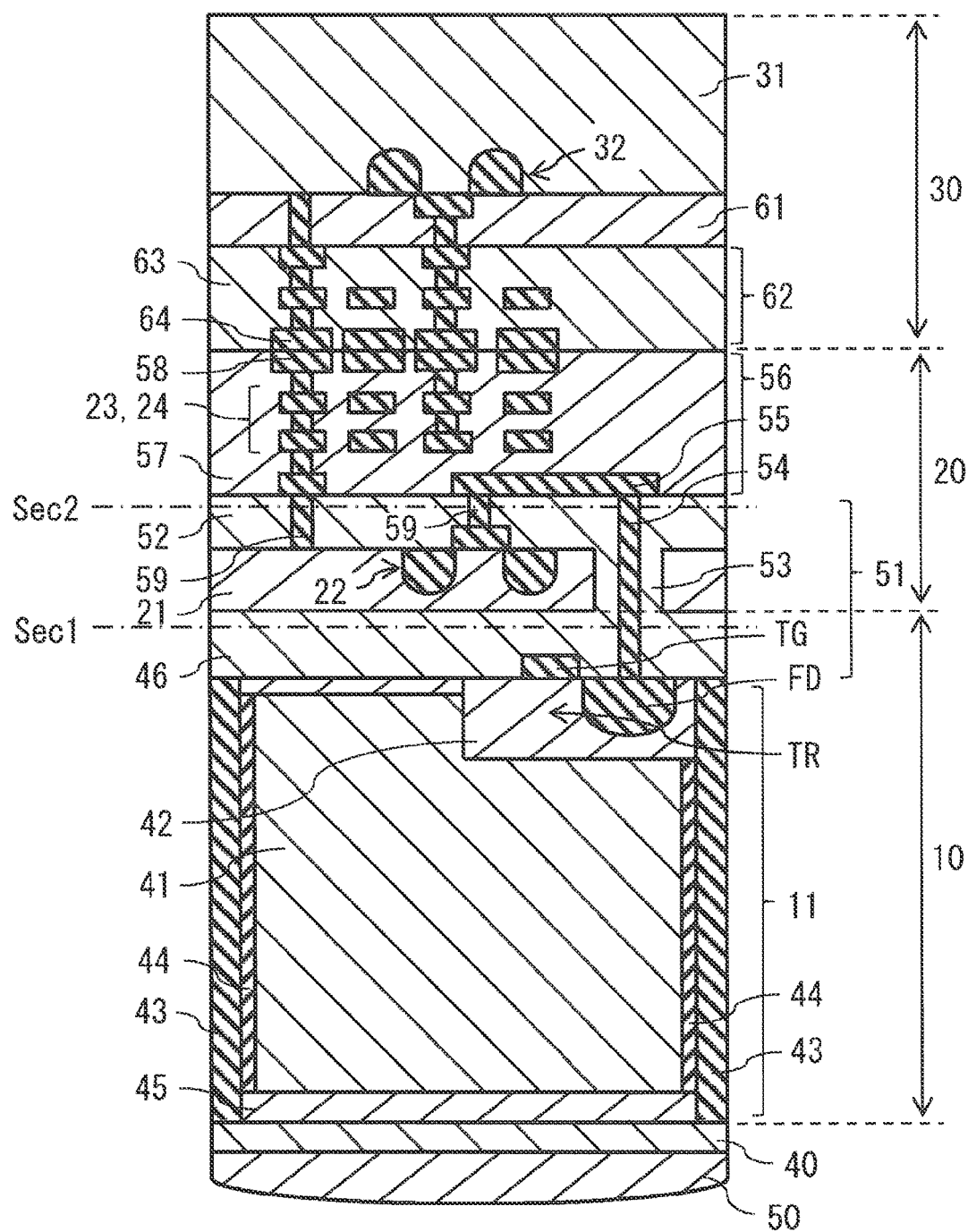
FIG. 26 is a figure representing another example of the vertical cross-sectional configuration of the image pickup apparatus in FIG. 22.

FIG. 26 represents a modification example of a vertical cross-sectional configuration of the image pickup apparatus 1 according to the embodiment described above. FIG. 26 depicts a modification example of the cross-sectional configuration described in FIG. 25. In the present modification example, the transfer transistor TR has a planar surface-type transfer gate TG. Accordingly, the transfer gate TG does not penetrate the well layer 42, and is formed only on the front surface of the semiconductor substrate 11. Even in a case where the planar surface-type transfer gate TG is used as the transfer transistor TR, the image pickup apparatus 1 provides advantages similar to those of the embodiment described above.

Modification Example B

Figure 27:
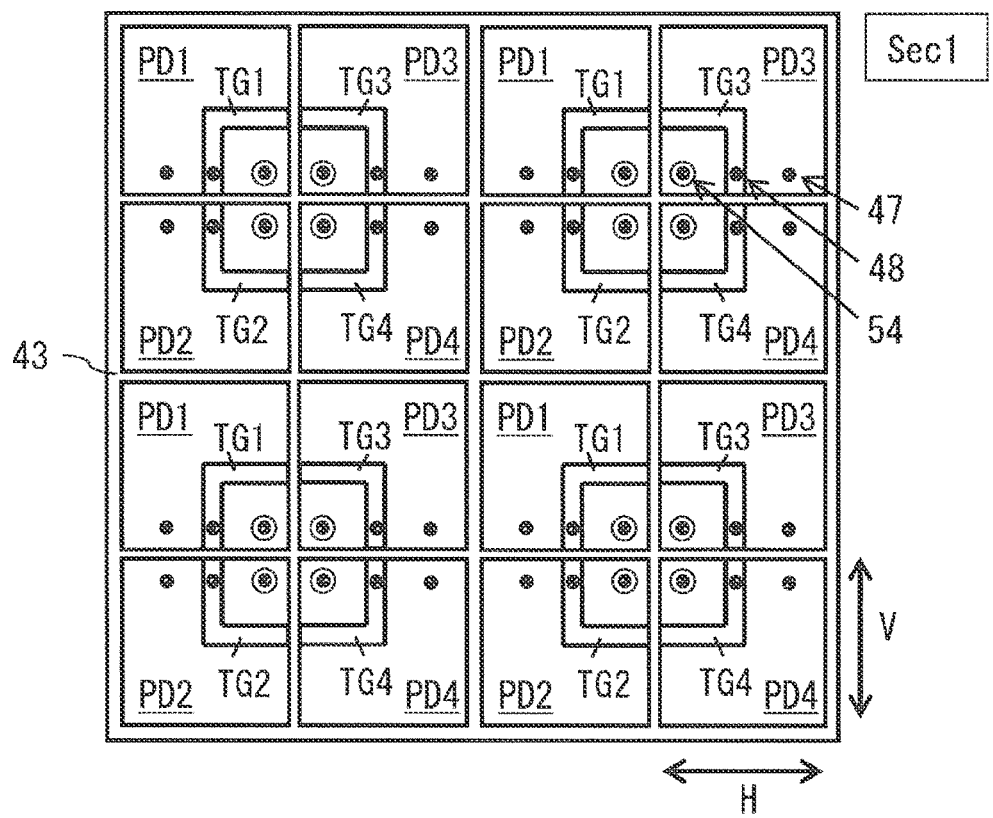
FIG. 27 is a figure representing an example of a horizontal cross-sectional configuration of the image pickup apparatus in FIG. 22.
Figure 27:
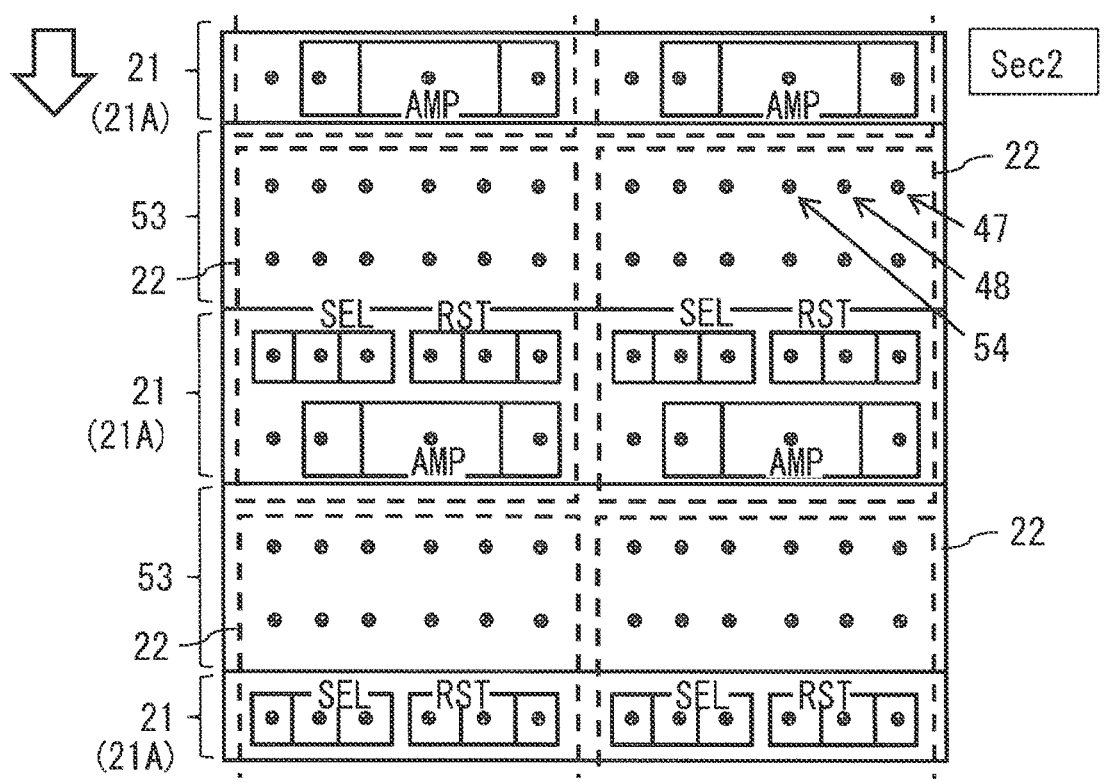
Figure 28:
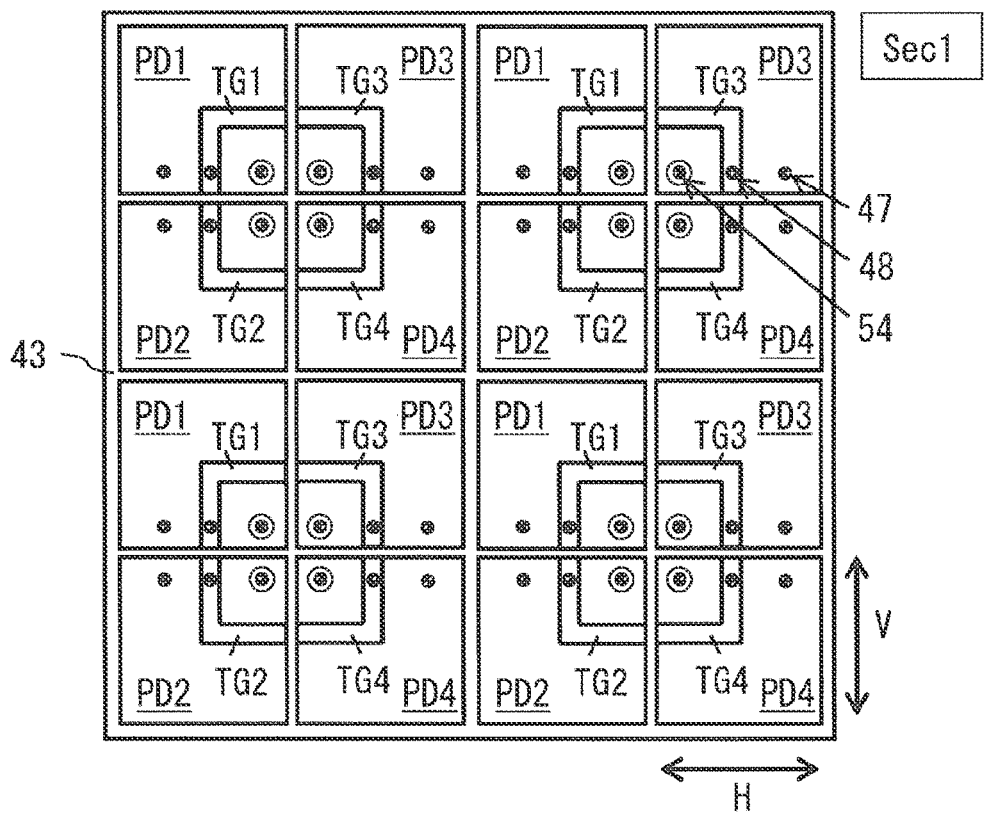
FIG. 28 is a figure representing another example of the horizontal cross-sectional configuration of the image pickup apparatus in FIG. 22.
Figure 28:
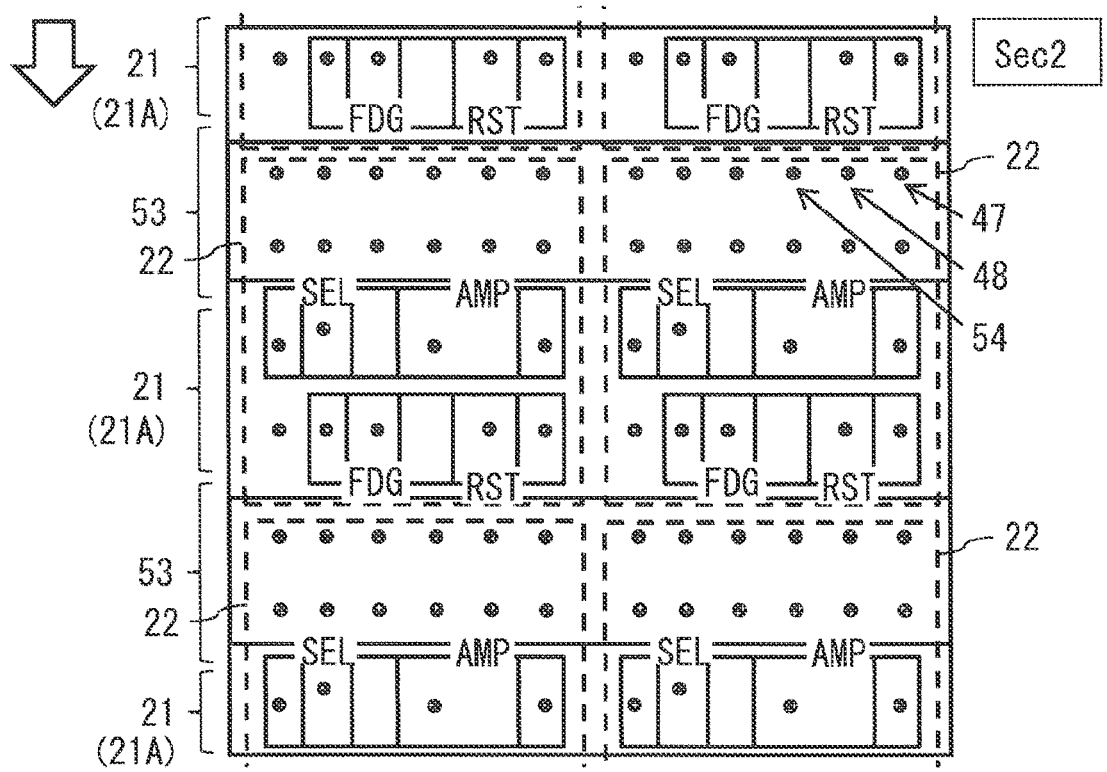

FIG. 27 and FIG. 28 represent modification examples of a horizontal cross-sectional configuration of the image pickup apparatus 1 according to the embodiment described above. The top figures in FIG. 27 and FIG. 28 depict modification examples of a cross-sectional configuration of cross-section Sec1 in FIG. 25, and the bottom figure in FIG. 27 depicts a modification example of a cross-sectional configuration of cross-section Sec2 in FIG. 25. Note that in the top cross-sectional views in FIG. 27 and FIG. 28, figures representing modification examples of a front surface configuration of the semiconductor substrate 11 in FIG. 25 are placed over figures representing the modification examples of the cross-sectional configuration of cross-section Sec1 in FIG. 25, and also the insulation layer 46 is omitted. In addition, in the bottom cross-sectional views in FIG. 27 and FIG. 28, figures representing modification examples of a front surface configuration of the semiconductor substrate 21 are placed over figures representing the modification examples of the cross-sectional configuration of cross-section Sec2 in FIG. 25.

As depicted in FIG. 27 and FIG. 28, plural through-wires 54, plural through-wires 48 and plural through-wires 47 (plural dots arranged in a matrix in the figures) are arranged next to each other in bands in first direction V1 (the leftward/rightward direction in FIG. 27 and FIG. 28) within a surface of the first substrate 10. Note that FIG. 27 and FIG. 28 illustrate cases where the plural through-wires 54, the plural through-wires 48 and the plural through-wires 47 are arranged next to each other in two columns extending in first direction V1. In four sensor pixels 12 sharing a read circuit 22, four floating diffusions FD are arranged proximately to each other with element separating sections 43 being interposed therebetween, for example. In the four sensor pixels 12 sharing the read circuit 22, four transfer gates TG (TG1, TG2, TG3 and TG4) are arranged to surround the four floating diffusions FD, and, for example, the four transfer gates TG form an annular shape.

The insulation layer 53 includes plural blocks extending in first direction V1. The semiconductor substrate 21 includes plural island-like blocks 21A that extend in first direction V1, and are arranged next to each other in second direction V2 orthogonal to first direction V1 with insulation layers 53 being interposed therebetween. For example, each block 21A is provided with reset transistors RST, amplification transistors AMP and selection transistors SEL. For example, each read circuit 22 shared by four sensor pixels 12 is not arranged to directly face the four sensor pixels 12, but is arranged by being displaced in second direction V2.

In FIG. 27, in the second substrate 20, each read circuit 12 shared by four sensor pixels 12 includes a reset transistor RST, an amplification transistor AMP and a selection transistors SEL that are in a region that is displaced in second direction V2 from a region facing the four sensor pixels 12. For example, each read circuit 22 shared by four sensor pixels 12 includes an amplification transistor AMP, a reset transistor RST and a selection transistor SEL that are in one block 21A.

In FIG. 28, in the second substrate 20, each read circuit 22 shared by four sensor pixels 12 includes a reset transistor RST, an amplification transistor AMP, a selection transistor SEL and an FD transfer transistor FDG that are in a region that is displaced in second direction V2 from a region facing the four sensor pixels 12. For example, each read circuit 22 shared by four sensor pixels 12 includes an amplification transistor AMP, a reset transistor RST, a selection transistor SEL and an FD transfer transistor FDG that are in one block 21A.

In the present modification example, for example, each read circuit 22 shared by four sensor pixels 12 is not arranged to directly face the four sensor pixels 12, but is arranged by being displaced in second direction V2 from a position directly facing the four sensor pixels 12. In a case where such arrangement is adopted, wires 25 can be made short, or wires 25 can be omitted, and the source of an amplification transistor AMP and the drain of a selection transistor SEL can be formed by a common impurity region. As a result, it is possible to reduce the sizes of read circuits 22, to increase the sizes of other locations in the read circuits 22, and so on.

Modification Example C

Figure 29:
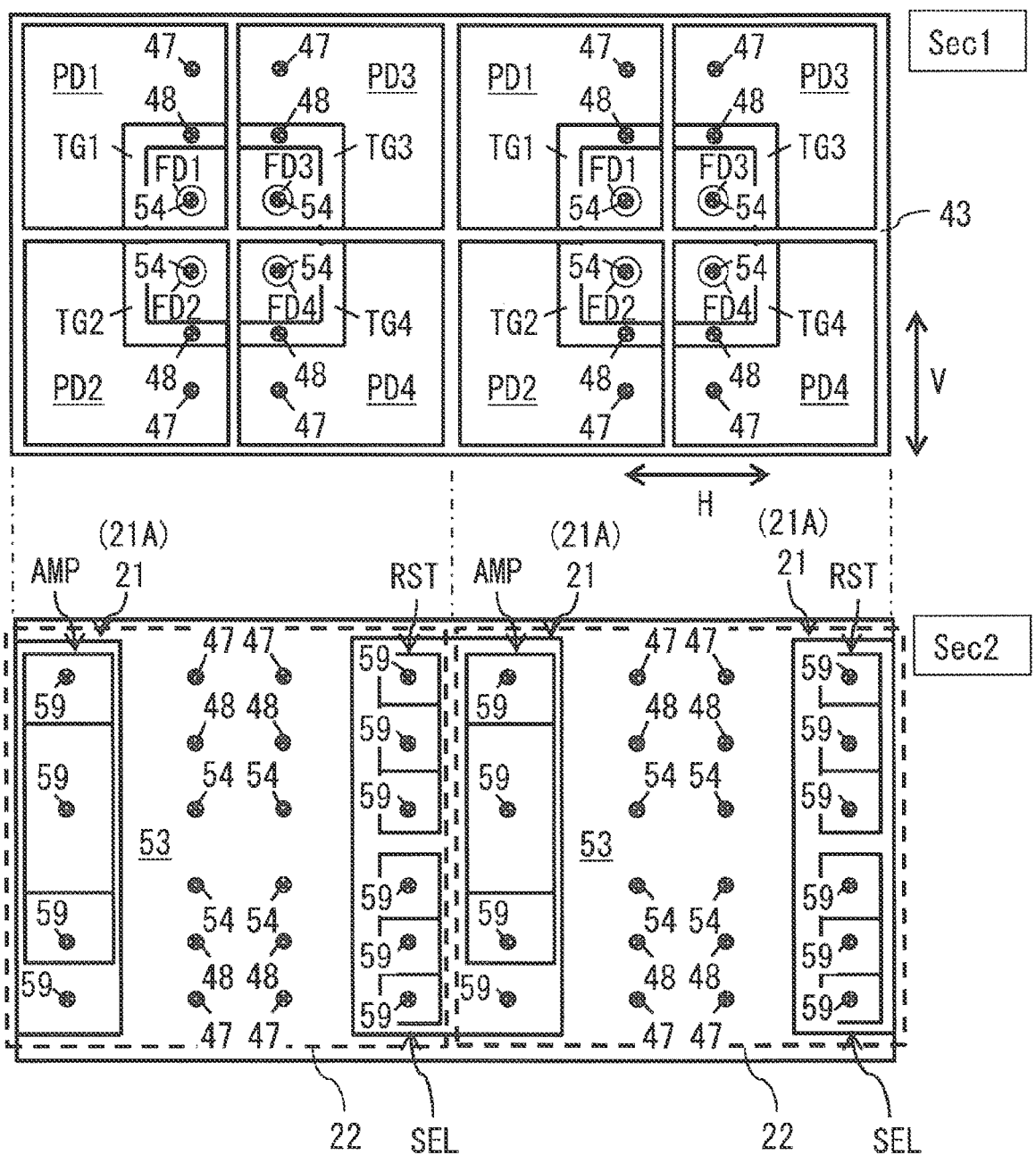
FIG. 29 is a figure representing still another example of the horizontal cross-sectional configuration of the image pickup apparatus in FIG. 22.

FIG. 29 represents a modification example of a horizontal cross-sectional configuration of the image pickup apparatus 1 according to the embodiment described above. FIG. 29 depicts a modification example of a cross-sectional configuration in FIG. 31.

In the present modification example, the semiconductor substrate 21 includes plural island-like blocks 21A arranged next to each other in first direction V1 and second direction V2 with insulation layers 53 being interposed therebetween. For example, each block 21A is provided with one set of a reset transistor RST, an amplification transistor AMP and a selection transistor SEL. In a case where such arrangement is adopted, crosstalk between read circuits 22 that are adjacent to each other can be suppressed by insulation layers 53, and resolution deterioration on a reproduced image and image quality deterioration due to color mixing can be suppressed.

Modification Example D

Figure 30:
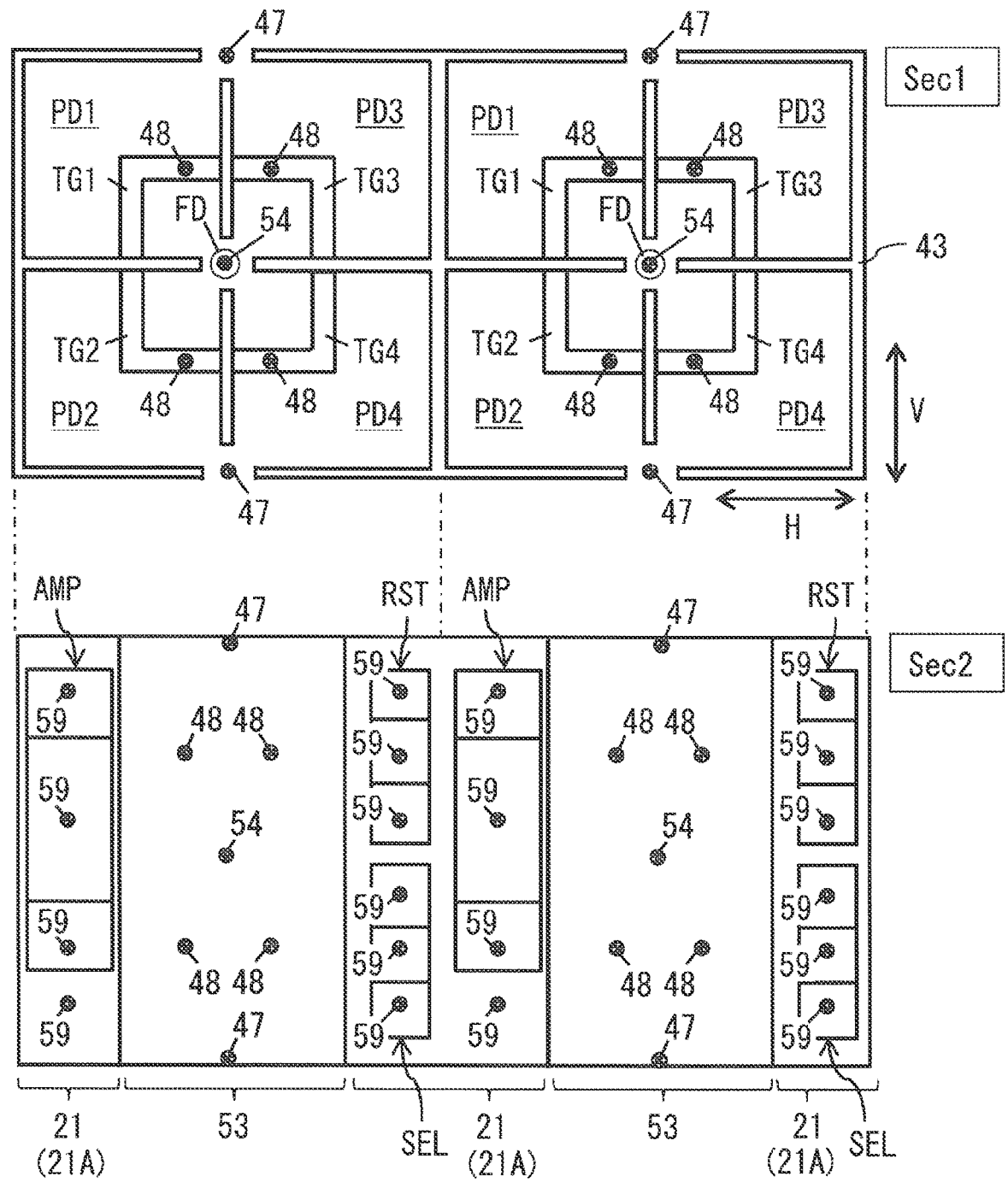
FIG. 30 is a figure representing yet another example of the horizontal cross-sectional configuration of the image pickup apparatus in FIG. 22.

FIG. 30 represents an example of a horizontal cross-sectional configuration of the image pickup apparatus 1 according to the embodiment described above and modification examples thereof.

In the present modification example, the first substrate 10 has a photodiode PD and a transfer transistor TR for each sensor pixel 12, and each floating diffusion FD is shared by four sensor pixels 12. Accordingly, in the present modification example, one through-wire 54 is provided for each set of four sensor pixels 12.

In plural sensor pixels 12 arranged in a matrix, four sensor pixels 12 corresponding to a region obtained by displacing a unit region corresponding to four sensor pixels 12 sharing one floating diffusion FD in first direction V1 by an amount corresponding to one sensor pixel 12 are referred to as four sensor pixels 12A for convenience. At this time, in the present modification example, each through-wire 47 is shared by a set of four sensor pixels 12A in the first substrate 10. Accordingly, in the present modification example, one through-wire 47 is provided for each set of four sensor pixels 12A.

In the present modification example, the first substrate 10 has element separating sections 43 that separate photodiodes PD and transfer transistors TR for each sensor pixel 12. As seen in the normal direction of the semiconductor substrate 11, the element separating sections 43 do not completely surround sensor pixels 12, and have gaps (regions where the element separating sections 43 are not formed) near floating diffusions FD (through-wires 54) and near through-wires 47. Then, the gaps allow sharing of one through-wire 54 by four sensor pixels 12 and sharing of one through-wire 47 by four sensor pixels 12A. In the present modification example, the second substrate 20 has a read circuit 22 for each set of four sensor pixels 12 sharing a floating diffusion FD.

Modification Example E

Figure 31:
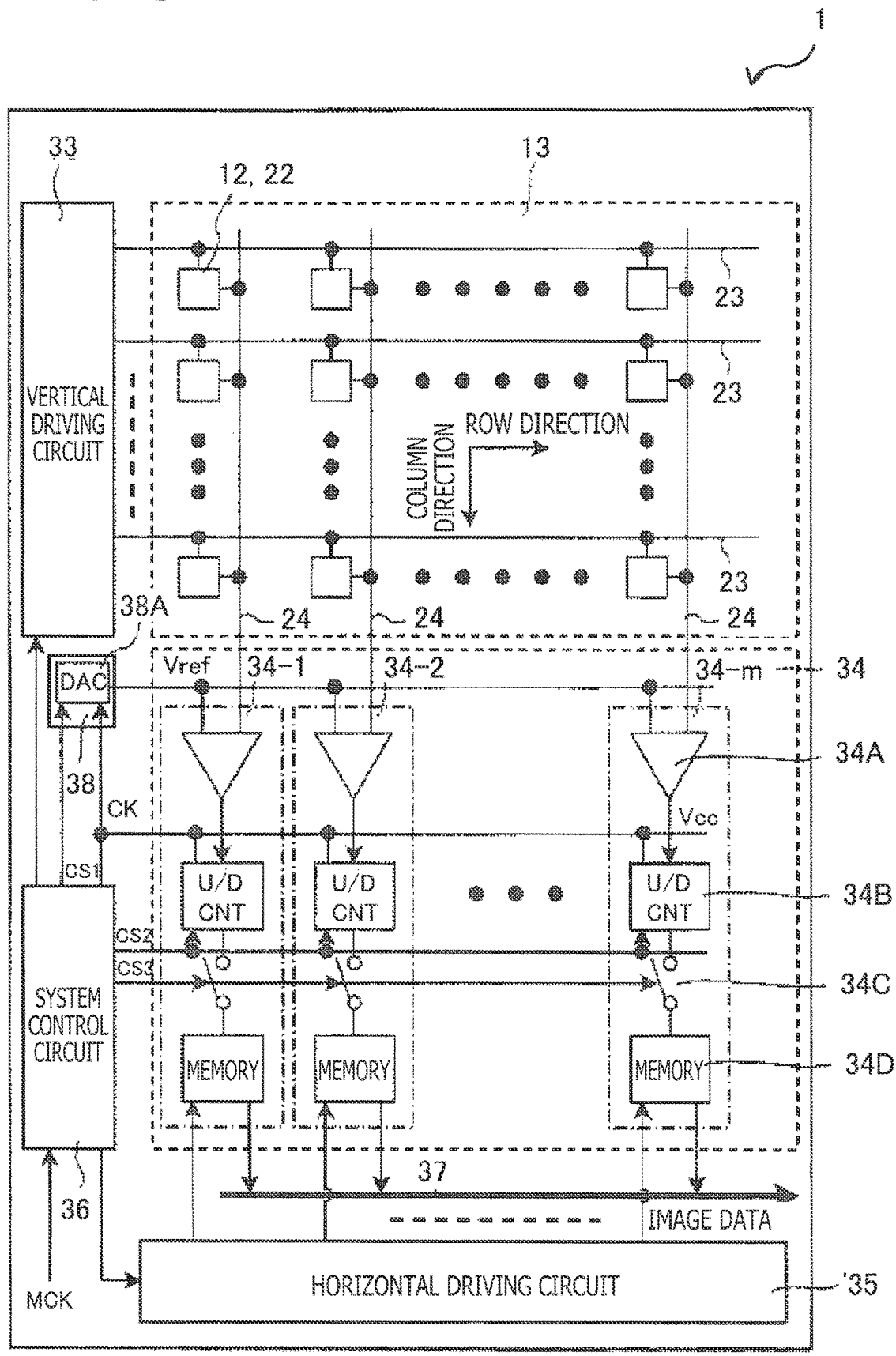
FIG. 31 is a figure representing an example of a circuit configuration of an image pickup apparatus including the image pickup apparatus according to the third embodiment of the present technology and modification examples thereof.

FIG. 31 represents an example of a circuit configuration of the image pickup apparatus 1 according to the embodiment described above and modification examples thereof. The image pickup apparatus 1 according to the present modification example is a CMOS image sensor having a column parallel ADC mounted thereon.

As depicted in FIG. 31, in addition to the pixel region 13 including plural sensor pixels 12 including photoelectric converting elements that are arranged two-dimensionally in a matrix (in a matrix), the image pickup apparatus 1 according to the present modification example has a configuration having the vertical driving circuit 33, the column signal processing circuit 34, a reference voltage supply section 38, the horizontal driving circuit 35, a horizontal output line 37 and the system control circuit 36.

In this system configuration, on the basis of a master clock MCK, the system control circuit 36 generates clock signals, control signals and the like that function as reference signals for operation of the vertical driving circuit 33, the column signal processing circuit 34, the reference voltage supply section 38, the horizontal driving circuit 35 and the like, and give them to the vertical driving circuit 33, the column signal processing circuit 34, the reference voltage supply section 38, the horizontal driving circuit 35 and the like.

In addition, the vertical driving circuit 33 is formed in the first substrate 10 along with the sensor pixels 12 in the pixel region 13, and is further formed also in the second substrate 20 where read circuits 22 are formed. The column signal processing circuit 34, the reference voltage supply section 38, the horizontal driving circuit 35, the horizontal output line 37 and the system control circuit 36 are formed in the third substrate 30.

As the sensor pixels 12, although not depicted in the figure here, for example, ones with a configuration having, in addition to photodiodes PD, transfer transistors TR that transfer electric charge obtained by photoelectric conversion at the photodiodes PD to floating diffusions FD can be used. In addition, as read circuits 22, although not depicted in the figure here, for example, ones each with a three-transistor configuration having a reset transistor RST that controls the potential of a floating diffusion FD, an amplification transistor AMP that outputs a signal according to the potential of the floating diffusion FD and a selection transistor SEL for performing pixel selection can be used.

In the pixel region 13, sensor pixels 12 are arranged two-dimensionally. In this pixel arrangement including m rows and n columns, a pixel driving line 23 is placed for each row, and a vertical signal line 24 is placed for each column. One end of each of the plural pixel driving lines 23 is connected to each output terminal of the vertical driving circuit 33 corresponding to one row. The vertical driving circuit 33 includes a shift register or the like, and controls row addressing and row scanning of the pixel region 13 via the plural pixel driving lines 23.

For example, the column signal processing circuit 34 has ADCs (analog-digital conversion circuits) 34-1 to 34-$m$ each provided for one pixel column in the pixel region 13, that is, for one vertical signal line 24, converts analog signals output from each column of sensor pixels 12 in the pixel region 13 into digital signals, and outputs the digital signals.

For example, the reference voltage supply section 38 has a DAC (digital-analog conversion circuit) 38A as means for generating a reference voltage Vref with what is generally called a ramp (RAMP) waveform whose level changes gradually over time. Note that means for generating the reference voltage Vref with a ramp waveform is not limited to the DAC 38A.

Under the control of a control signal CS1 given from the system control circuit 36, the DAC 38A generates the reference voltage Vref with a ramp waveform on the basis of a clock CK given from the system control circuit 36, and supplies the reference voltage Vref to the ADCs 34-1 to 34-$m$ of a column processing section 15.

Note that each of the ADCs 34-1 to 34-$m$ is configured to be able to selectively perform AD conversion operation corresponding to each operation mode of a normal frame rate mode in a progressive scanning format in which information of all sensor pixels 12 is read out, and a high frame rate mode in which light-exposure time of sensor pixels 12 is set to 1/N, and the frame rate is made N times high, for example, twice high, as compared with that at the time of the normal frame rate mode. This switching of the operation mode is executed under the control of control signals CS2 and CS3 given from the system control circuit 36. In addition, from an external system controller (not depicted), the system control circuit 36 is given instruction information for switching the operation mode between the normal frame rate mode and the high frame rate mode.

The ADCs 34-1 to 34-*m* all have the same configuration, and here the ADC 34-*m* is explained as an example. The ADC 34-*m* has a comparator 34A, an up/down counter (denoted as a U/DCNT in the FIG. 34B, for example, which is counting means, a transfer switch 34C and a memory apparatus 34D.

The comparator 34A compares a signal voltage Vx of a vertical signal line 24 according to a signal output from each sensor pixel 12 in the n-th column in the pixel region 13, and the reference voltage Vref with a ramp waveform supplied from the reference voltage supply section 38. For example, when the reference voltage Vref is higher than the signal voltage Vx, output Vco is at the "H" level, and when the reference voltage Vref is equal to or lower than the signal voltage Vx, output Vco is at the "L" level.

The up/down counter 34B is an asynchronous counter. Under the control of the control signal CS2 given from the system control circuit 36, the up/down counter 34B is given the clock CK from the system control circuit 36 simultaneously with a DAC 18A, and counts down (DOWN) or counts up (UP) in synchronization with the clock CK to thereby measure a comparison period from the start of the comparison operation at the comparator 34A to the end of the comparison operation.

Specifically, in the normal frame rate mode, in operation of reading out signals from one sensor pixel 12, down-counting is performed at the time of the first read operation to thereby measure comparison time at the time of the first read operation, and up-counting is performed at the time of the second read operation to thereby measure comparison time at the time of the second read operation.

On the other hand, in the high frame rate mode, a count result of a sensor pixel 12 in a row is retained as is. Subsequently, about a sensor pixel 12 in the next row, down-counting from the previous count result is performed at the time of the first read operation to thereby measure comparison time at the time of the first read operation, and up-counting is performed at the time of the second read operation to thereby measure comparison time at the time of the second read operation.

Under the control of the control signal CS3 given from the system control circuit 36, the transfer switch 34C in the normal frame rate mode is turned on (closed) at a time point when counting operation of the up/down counter 34B about a sensor pixel 12 in a row has been completed, and transfers the count result of the up/down counter 34B to the memory apparatus 34D.

On the other hand, for example, in the high frame rate mode in which N=2, the transfer switch 34C remains turned off (opened) at a time point when counting operation of the up/down counter 34B about a sensor pixel 12 in a row has been completed. Subsequently, the transfer switch 34C is turned on at a time point when counting operation of the up/down counter 34B about a sensor pixel 12 in the next row has been completed, and transfers, to the memory apparatus 34D, the count result about the two vertical pixels of the up/down counter 34B.

In such a manner, analog signals supplied from each column of sensor pixels 12 in the pixel region 13 through a vertical signal line 24 are converted into N-bit digital signals by operation of each of comparators 34A and up/down counters 34B in the ADCs 34-1 to 34-*m*, and the digital signals are stored on memory apparatuses 34D.

The horizontal driving circuit 35 includes a shift register or the like, and controls column addressing and column scanning of the ADCs 34-1 to 34-*m* in the column signal processing circuit 34. Under the control of the horizontal driving circuit 35, an AD-converted N-bit digital signal that is obtained at each of the ADCs 34-1 to 34-*m* is sequentially read out to the horizontal output line 37, and is output as image pickup data through the horizontal output line 37.

Note that, although not depicted particularly because they are not directly related to the present technology, circuits that perform various types of signal processing on image pickup data output through the horizontal output line 37 and the like can also be provided, in addition to the constituent elements described above.

In the image pickup apparatus 1 having the column parallel ADCs mounted thereon according to the present modification example with the configuration described above, a count result of the up/down counter 34B can be transferred selectively to the memory apparatus 34D via the transfer switch 34C, and so it is possible to independently control counting operation of the up/down counter 34B and operation of reading the count result of the up/down counter 34B out to the horizontal output line 37.

Modification Example F

Figure 32:
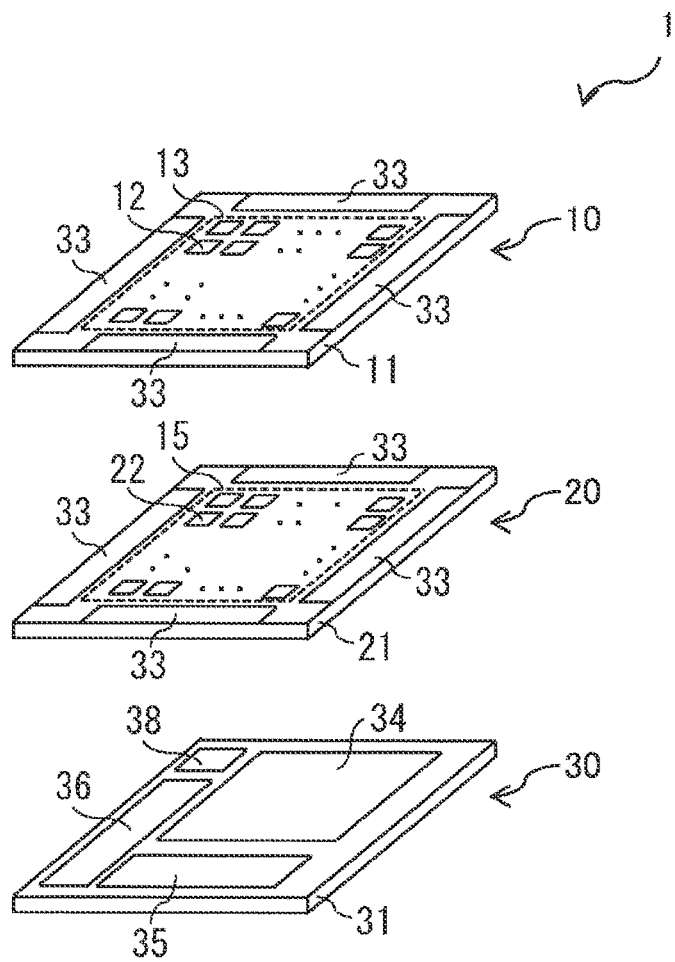
FIG. 32 is a figure representing an example in which the image pickup apparatus in FIG. 31 is configured by stacking three substrates.

FIG. 32 represents an example in which the image pickup apparatus in FIG. 31 includes three substrates (the first substrate 10, the second substrate 20 and the third substrate 30) that are stacked one on another. In the present modification example, the pixel region 13 including plural sensor pixels 12 is formed at a middle portion of the first substrate 10, and vertical driving circuits 33 are formed around the pixel region 13. In addition, a read circuit region 15 including plural read circuits 22 is formed at a middle portion of the second substrate 20, and vertical driving circuits 33 are formed around the read circuit region 15. The column signal processing circuit 34, the horizontal driving circuit 35, the system control circuit 36, the horizontal output line 37 and the reference voltage supply section 38 are formed in the third substrate 30. Thereby, similarly to the embodiment described above and modification examples thereof, a structure that electrically connects substrates will not inevitably necessitate an increase of the chip sizes, inhibit miniaturization of the area size per pixel, and so on. As a result, it is possible to provide the image pickup apparatus 1 having a triple-layer structure that will not inhibit miniaturization of the area size per pixel with chip sizes equivalent to conventional chip sizes. Note that the vertical driving circuits 33 may be formed only in the first substrate 10 or may be formed only in the second substrate 20.

Modification Example G

Figure 33:
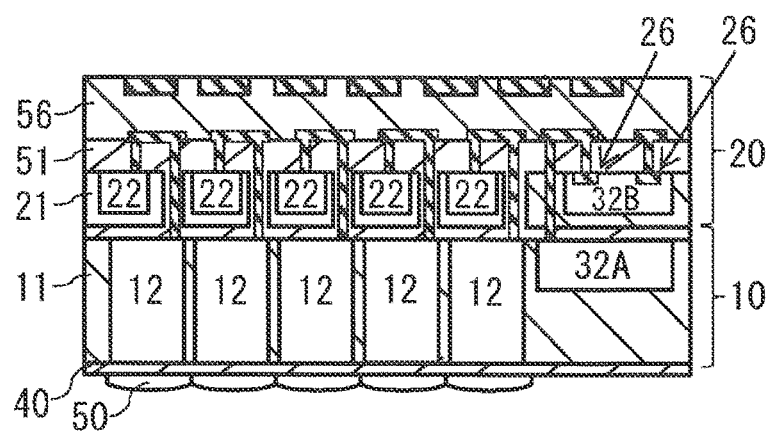
FIG. 33 is a figure representing an example in which a logic circuit is formed by using separate substrates which are a substrate provided with sensor pixels and a substrate provided with read circuits.

FIG. 33 represents a modification example of a cross-sectional configuration of the image pickup apparatus 1 according to the embodiment described above and modification examples thereof. In the embodiment described above and modification examples thereof, the image pickup apparatus 1 includes three substrates (the first substrate 10, the second substrate 20 and third substrate 30) that are stacked one on another. However, in the embodiment described above and modification examples thereof, the image pickup apparatus 1 may include two substrates (the first substrate 10 and the second substrate 20) that are stacked one on another. At this time, for example, each logic circuit 32 is formed separately in the first substrate 10 and the second substrate 20 as depicted in FIG. 33. Here, a circuit 32A in the logic circuits 32 that is provided on the first substrate 10 side is provided with a transistor having a gate structure in which a high-dielectric constant film including a material (e.g., high-k) that can withstand a high-temperature process and a metal gate electrode are stacked one on another. On the other hand, a circuit 32B provided on the second substrate 20 side has an impurity diffusion region contacting source electrodes and drain electrodes, and the front surface of the impurity diffusion region has low resistance regions 26 including a silicide such as $CoSi_2$ or NiSi formed by using the salicide (Self Aligned Silicide) process. The low resistance regions including a silicide include a compound of metal and a material of a semiconductor substrate. Thereby, when sensor pixels 12 are formed, a high-temperature process such as thermal oxidation can be used. In addition, in a case where the circuit 32B in the logic circuits 32 that is provided on the second substrate 20 side has an impurity diffusion region contacting the source electrodes and the drain electrodes, and the front surface of the impurity diffusion region is provided with the low resistance regions 26 including a silicide, the contact resistance can be lowered. As a result, the speed of calculation at the logic circuits 32 can be increased.

Figure 34:
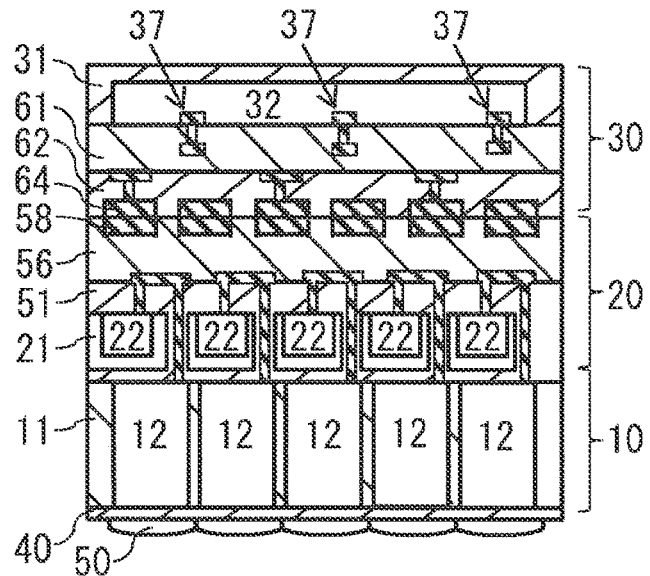
FIG. 34 is a figure representing an example in which a logic circuit is formed in a third substrate.

FIG. 34 represents a modification example of a cross-sectional configuration of the image pickup apparatus 1 according to the embodiment described above and modification examples thereof. The logic circuit 32 of the third substrate 30 according to the embodiment described above and modification examples thereof has an impurity diffusion region contacting source electrodes and drain electrodes, and the front surface of the impurity diffusion region may have low resistance regions 37 including a silicide such as $CoSi_2$ or NiSi formed by using the salicide (Self Aligned Silicide) process. Thereby, when sensor pixels 12 are formed, a high-temperature process such as thermal oxidation can be used. In addition, in a case where the logic circuits 32 have an impurity diffusion region contacting the source electrodes and the drain electrodes, and the front surface of the impurity diffusion region is provided with the low resistance regions 37 including a silicide, the contact resistance can be lowered. As a result, the speed of calculation at the logic circuits 32 can be increased.

Modification Example H

In the embodiment described above and modification examples thereof, conductivity types may be reverse. For example, in the description of the embodiment described above and modification examples thereof, p type may be read as meaning n type, and n type may be read as meaning p type. Even in a case where such arrangement is adopted, advantages similar to those of the embodiment described above and modification examples thereof can be attained.

Application Example

Figure 35:
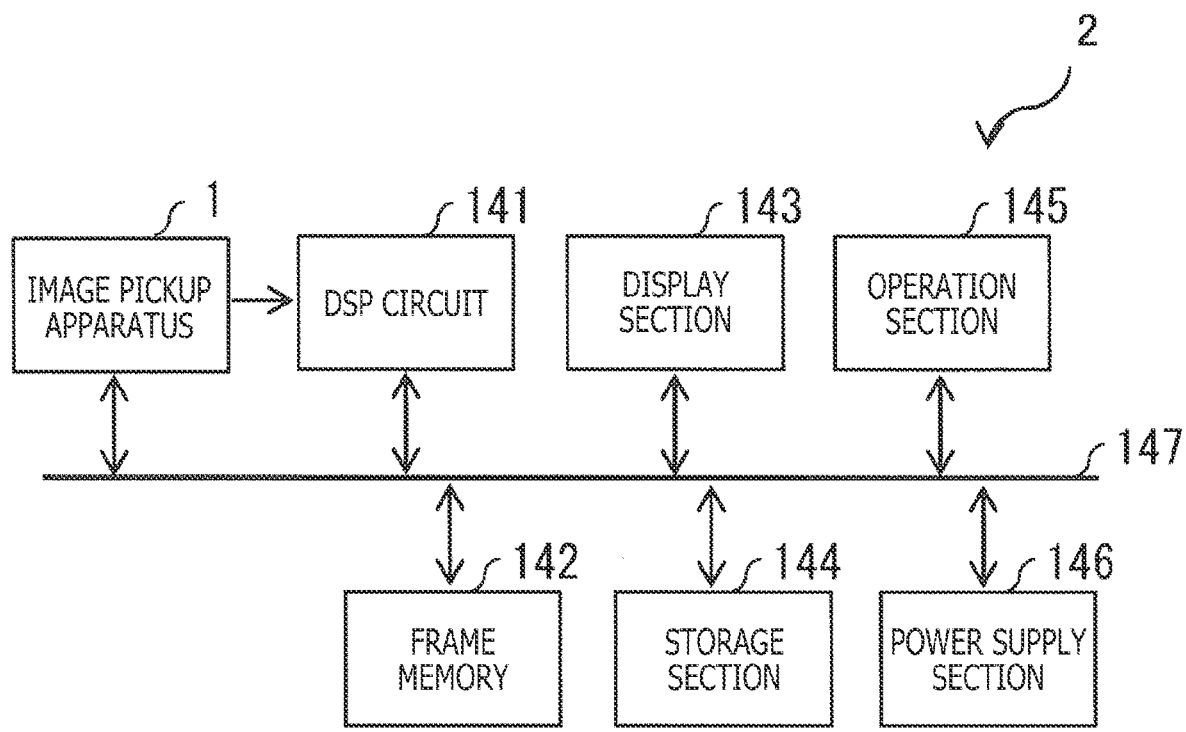
FIG. 35 is a figure representing an example of a schematic configuration of an image pickup system including the image pickup apparatus according to the embodiments described above and modification examples thereof.

FIG. 35 represents an example of a schematic configuration of an image pickup system 2 including the image pickup apparatus 1 according to the embodiment described above and modification examples thereof.

For example, the image pickup system 2 is electronic equipment such as an image pickup apparatus such as a digital still camera or a video camera, or a mobile terminal apparatus such as a smartphone or a tablet-type terminal. For example, the image pickup system 2 includes the image pickup apparatus 1 according to the embodiment described above and modification examples thereof, a DSP circuit 141, a frame memory 142, a display section 143, a storage section 144, an operation section 145 and a power supply section 146. In the image pickup system 2, the image pickup apparatus 1 according to the embodiment described above and modification examples thereof, the DSP circuit 141, the frame memory 142, the display section 143, the storage section 144, the operation section 145 and the power supply section 146 are connected with each other via a bus line 147.

The image pickup apparatus 1 according to the embodiment described above and modification examples thereof outputs image data according to an incident light. The DSP circuit 141 is a signal processing circuit that processes signals (image data) output from the image pickup apparatus 1 according to the embodiment described above and modification examples thereof. The frame memory 142 temporarily retains framewise image data processed by the DSP circuit 141. For example, the display section 143 includes a panel-type display apparatus such as a liquid crystal panel or an organic EL (Electro Luminescence) panel, and displays moving images or still images picked up by the image pickup apparatus 1 according to the embodiment described above and modification examples thereof. The storage section 144 records image data of moving images or still images picked up by the image pickup apparatus 1 according to the embodiment described above and modification examples thereof on a recording medium such as a semiconductor memory or a hard disk. According to operation by a user, the operation section 145 gives an operation command for various types of functions that the image pickup system 2 has. As appropriate, the power supply section 146 supplies the image pickup apparatus 1 according to the embodiment described above and modification examples thereof, the DSP circuit 141, the frame memory 142, the display section 143, the storage section 144 and the operation section 145 with various types of power supplies to be operation power supplies of those supply targets.

Next, an image pickup procedure at the image pickup system 2 is explained.

Figure 36:
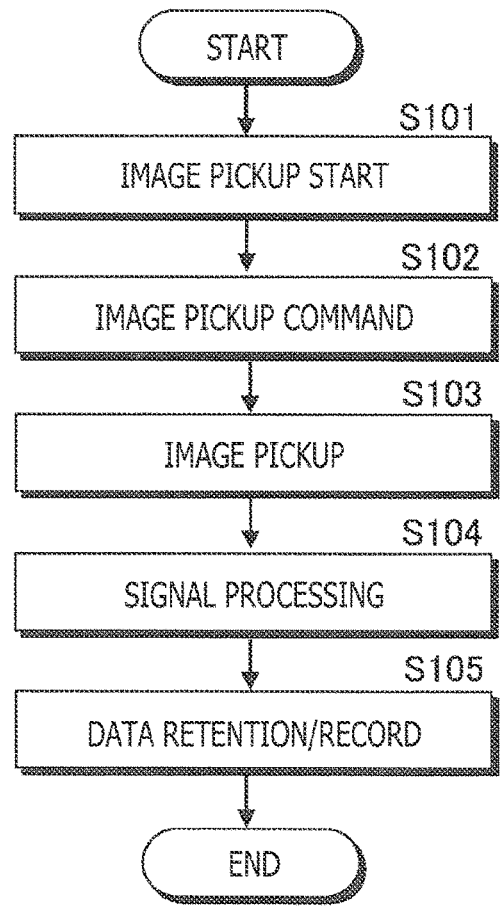
FIG. 36 is a figure representing an example of an image pickup procedure in the image pickup system in FIG. 35.

FIG. 36 represents an example of a flowchart of image pickup operation at the image pickup system 2. A user operates the operation section 145 to thereby give instructions on start image pickup (Step S101). Then, the operation section 145 transmits an image pickup command to the image pickup apparatus (Step S102). Upon receiving the image pickup command, the image pickup apparatus 1 (specifically, the system control circuit 36) executes image pickup by a predetermined image pickup method (Step S103).

The image pickup apparatus 1 outputs image data obtained by the image pickup to the DSP circuit 141. Here, the image data means data corresponding to all pixels of pixel signals generated on the basis of electric charge temporarily retained in floating diffusions FD. On the basis of the image data input from the image pickup apparatus 1, the DSP circuit 141 performs predetermined signal processing (e.g., a noise reduction process, etc.) (Step S104). The DSP circuit 141 makes the frame memory 142 retain the image data on which the predetermined signal processing has been performed, and the frame memory 142 causes the image data to be stored on the storage section 144 (Step S105). In such a manner, image pickup at the image pickup system 2 is performed.

In the present application example, the image pickup apparatus 1 according to the embodiment described above and modification examples thereof is applied to the image pickup system 2. Thereby, the image pickup apparatus 1 with a smaller size or higher resolution can be realized, and so the image pickup system 2 with a smaller size or higher resolution can be provided.

Figure 37:
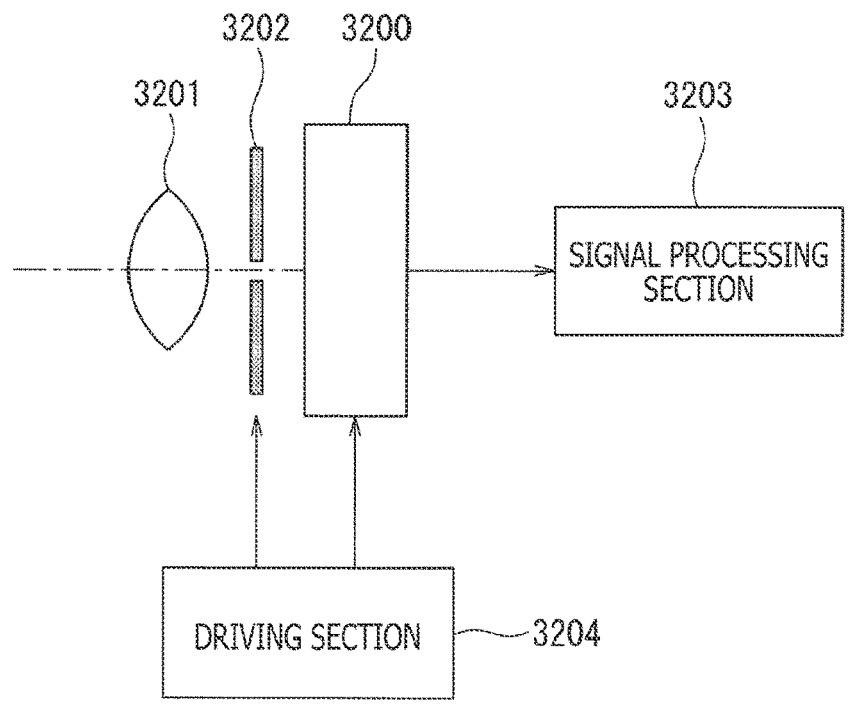
FIG. 37 is a schematic configuration diagram of electronic equipment according to another embodiment of the present technology.

For example, the semiconductor apparatus according to the first to third embodiments of the present technology can be applied to any type of electronic equipment having an image pickup function, such as a camera system such as a digital still camera or a video camera, or a mobile phone having an image pickup function, for example. For example, it can be applied to electronic equipment (camera) depicted in FIG. 37. For example, the electronic equipment depicted in FIG. 37 is a video camera that can pick up still images or moving images, and has a semiconductor apparatus 3200, an optical system (optical lens) 3201, a shutter apparatus 3202, a driving section 3204 that drives the semiconductor apparatus 3200 and the shutter apparatus 3202 and a signal processing section 3203.

The semiconductor apparatus according to the first to third embodiments can be applied as the semiconductor apparatus 3200. The optical system 3201 guides image light (incident light) from a subject to a pixel region of the semiconductor apparatus 3200. This optical system 3201 may include plural optical lenses. The shutter apparatus 3202 controls a light illumination period and a light blocking period of light heading toward the semiconductor apparatus 3200. The driving section 3204 controls transfer operation of the semiconductor apparatus 3200 and shutter operation of the shutter apparatus 3202. The signal processing section 3203 performs various types of signal processing on signals output from the semiconductor apparatus 3200. Video signals that have undergone the signal processing are stored on a storage medium such as a memory or output to a monitor or the like.

According to the image pickup apparatus according to embodiments of the present technology, because electrical connection is established between substrates according to the degree of integration of the substrates, a structure that electrically connects the substrates will not inevitably necessitate an increase of the chip sizes, inhibit miniaturization of the area size per pixel, and so on. As a result, it is possible to provide the image pickup apparatus with a triple-layer structure that will not inhibit miniaturization of the area size per pixel with chip sizes equivalent to conventional chip sizes. Note that advantages of the present technology are not necessarily limited to the advantages described here, and may be any of advantages described in the present specification.

Those skilled in the art can conceive of various corrections, combinations, sub-combinations and changes according to requirements in terms of designs and other factors, and it should be understood that they are included within the scope of the attached claims and equivalents thereof.

In addition, while a backside illumination CMOS image sensor is depicted as an example of the semiconductor apparatus according to the first to third embodiments of the present technology, the semiconductor apparatus according to the first to fifth embodiments of the present technology can also be applied to a solid-state image pickup apparatus such as a backside illumination CCD image sensor. Further, the semiconductor apparatus of the present technology may be applied also to various types of semiconductor apparatuses other than solid-state image pickup apparatuses, such as a storage apparatus that uses a semiconductor, a display apparatus that uses a semiconductor, a sensor apparatus that uses a semiconductor or a computing apparatus that uses a semiconductor, for example.

For example, the semiconductor apparatus of the present technology may be applied to the configuration of a semiconductor storage apparatus such as a DRAM that has memory cells as unit cells, instead of pixels having photoelectric converting sections. Although current DRAMs include one-transistor type memory cells (unit cells), by adopting the stacked structure of the present technology, DRAMs having three transistor-type memory cells (unit cells) that were used in the 1970's can be configured without deteriorating the integration densities.

In addition, while negative electric charge (electrons) is used as signal charge in the semiconductor apparatus according to the first to third embodiments of the present technology in the examples explained, the present technology can be applied also to cases where positive electric charge (holes) is used as signal charge. In a case where holes are used as signal charge, it is sufficient if p-type regions and n-type regions are configured in opposite arrangement.

Fourth Embodiment

Hereinafter, the image pickup apparatus 1 according to a fourth embodiment of the present disclosure is explained in detail by referring to figures. Note that explanations are given in the following order.

1. Embodiment (Image Pickup Apparatus Having Stacked Structure of Three Substrates)
2. First Modification Example (First Example of Planar Configuration)
3. Second Modification Example (Second Example of Planar Configuration)
4. Third Modification Example (Third Example of Planar Configuration)
5. Fourth Modification Example (Example in which Middle Section of Pixel Array Section Has Contact Section between Substrates)
6. Fifth Modification Example (Example in which Planar Transfer Transistors are Provided)
7. Sixth Modification Example (Example in which One Pixel Circuit is Connected with One Pixel)
8. Seventh Modification Example (Configuration Example of Pixel Separating Section)

1. Embodiment

[Functional Configuration of Image Pickup Apparatus 1]

Figure 38:
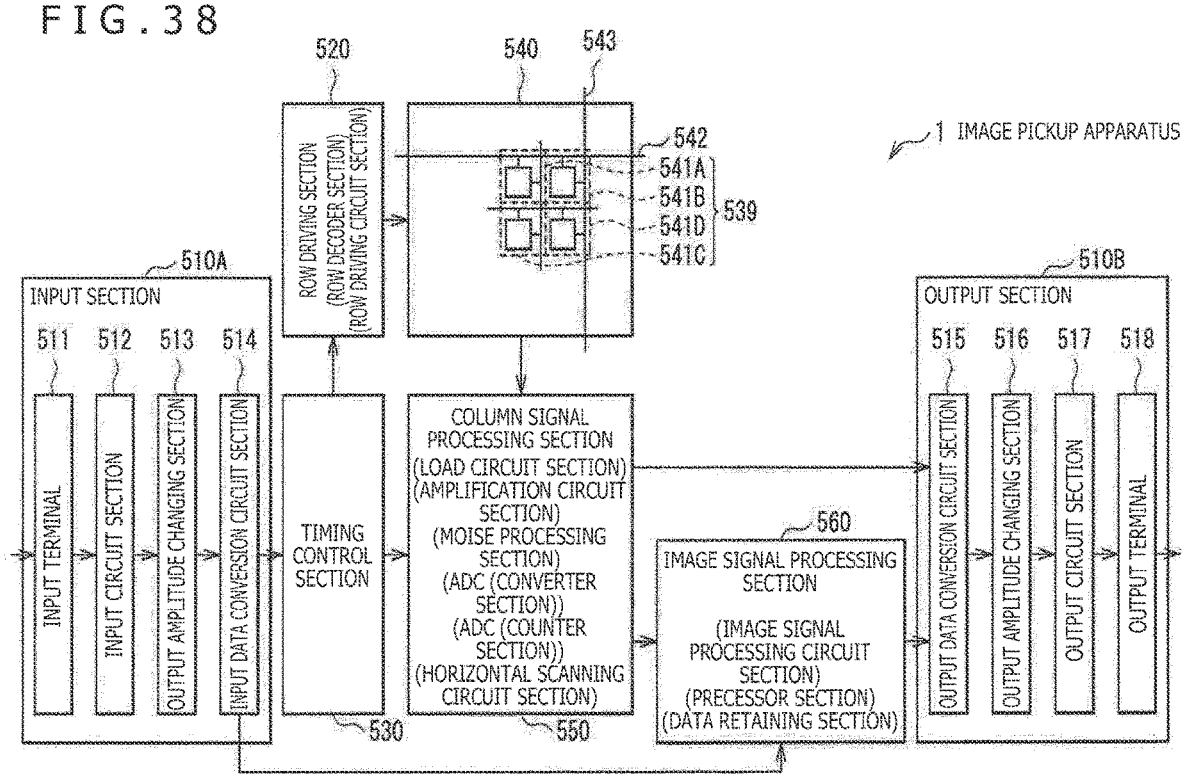
FIG. 38 is a block diagram representing an example of a functional configuration of the image pickup apparatus according to one embodiment of the present disclosure.

FIG. 38 is a block diagram depicting an example of a functional configuration of the image pickup apparatus (image pickup apparatus 1) according to one embodiment of the present disclosure.

For example, the image pickup apparatus 1 in FIG. 38 includes an input section 510A, a row driving section 520, a timing control section 530, a pixel array section 540, a column signal processing section 550, an image signal processing section 560 and an output section 510B.

The pixel array section 540 includes pixels 541 that are arranged repetitively in an array. More specifically, a pixel sharing unit 539 including plural pixels is a unit of repetition, and this is arranged repetitively in an array having a row direction and a column direction. Note that, in the present specification, for convenience, the row direction is called direction H, and the column direction orthogonal to the row direction is called direction V, in some cases. In the example in FIG. 38, one pixel sharing unit 539 includes four pixels (pixels 541A, 541B, 541C and 541D). Each of the pixels 541A, 541B, 541C and 541D has a photodiode PD (depicted in FIG. 43 mentioned below and the like). Each pixel sharing unit 539 is a unit in which one pixel circuit (a pixel circuit 210 in FIG. 40 mentioned below) is shared. Stated differently, each set of the four pixels (pixels 541A, 541B, 541C and 541D) has one pixel circuit (the pixel circuit 210 mentioned below). By causing the pixel circuit to operate time-divisionally, a pixel signal of each of the pixels 541A, 541B, 541C and 541D is read out sequentially. For example, the pixels 541A, 541B, 541C and 541D are arranged in two rows and two columns. The pixel array section 540 is provided with plural row driving signal lines 542 and plural vertical signal lines (column read lines) 543, along with the pixels 541A, 541B, 541C and 541D. The row driving signal lines 542 drive pixels 541 included in each of plural pixel sharing units 539 that are arrayed in the pixel array section 540 next to each other in the row direction. The row driving signal lines 542 drive pixels in the pixel sharing units 539 that are arrayed next to each other in the row direction. As explained later in detail by referring to FIG. 41, each pixel sharing unit 539 is provided with plural transistors. In order to drive each of the plural transistors, one pixel sharing unit 539 is connected with the plural row driving signal lines 542. The vertical signal lines (column read lines) 543 are connected with the pixel sharing units 539. From each of the pixels 541A, 541B, 541C and 541D included in the pixel sharing units 539, a pixel signal is read out via a vertical signal line (column read line) 543.

For example, the row driving section 520 includes a row addressing control section that determines the position of a row whose pixels are to be driven, in other words, a row decoder section, and a row driving circuit section that generates signals for driving the pixels 541A, 541B, 541C and 541D.

For example, the column signal processing section 550 includes a load circuit section that is connected to the vertical signal lines 543, and forms a source follower circuit with the pixels 541A, 541B, 541C and 541D (pixel sharing units 539). The column signal processing section 550 may have an amplification circuit section that amplifies signals read out from the pixel sharing units 539 via the vertical signal lines 543. The column signal processing section 550 may have a noise processing section. For example, the noise processing section removes a noise level of the system from signals read out from the pixel sharing units 539 as a result of photoelectric conversion.

For example, the column signal processing section 550 has an analog-digital converter (ADC). The analog-digital converter converts signals read out from the pixel sharing units 539 or analog signals having been subjected to the noise process described above into digital signals. For example, the ADC includes a comparator section and a counter section. The comparator section compares analog signals which are the targets of conversion and reference signals which are the targets of comparison with the analog signals. The counter section measures time taken until a result of the comparison at the comparator section is inverted. The column signal processing section 550 may include a horizontal scanning circuit section that performs control to scan read columns.

On the basis of a reference clock signal or a timing control signal input to the apparatus, the timing control section 530 supplies the row driving section 520 and the column signal processing section 550 with signals for controlling timing.

The image signal processing section 560 is a circuit that performs various types of signal processing on data obtained as a result of photoelectric conversion, in other words, data obtained as a result of image pickup operation at the image pickup apparatus 1. For example, the image signal processing section 560 includes an image signal processing circuit section and a data retaining section. The image signal processing section 560 may include a processor section.

An example of the signal processing executed at the image signal processing section 560 is a tone curve correction process that increases gradations in a case where AD-converted image pickup data is data in which a captured subject is dark, and reduces gradations in a case where AD-converted image pickup data is data in which a captured subject is bright. In this case, tone curve characteristics data defining the type of a tone curve on the basis of which gradations of image pickup data are to be corrected is desirably stored in advance on a data retaining section of the image signal processing section 560.

For example, the input section 510A is for inputting the reference clock signal, timing control signal and characteristics data that are described above, and the like from the outside of the apparatus to the image pickup apparatus 1. For example, the timing control signal is a vertical synchronizing signal, a horizontal synchronization signal or the like. For example, the characteristics data is for being stored on the data retaining section of the image signal processing section 560. For example, the input section 510A includes an input terminal 511, an input circuit section 512, an input amplitude changing section 513, an input data conversion circuit section 514 and a power supply section (not depicted).

The input terminal 511 is an external terminal for inputting data. The input circuit section 512 is for taking in signals input to the input terminal 511 to the inside of the image pickup apparatus 1. The input amplitude changing section 513 changes the amplitudes of signals taken in through the input circuit section 512 into amplitudes that are easier to use inside the image pickup apparatus 1. The input data conversion circuit section 514 changes the order of the data array of input data. For example, the input data conversion circuit section 514 includes a serial-parallel conversion circuit. The serial-parallel conversion circuit converts serial signals received as input data into parallel signals. Note that the input amplitude changing section 513 and the input data conversion circuit section 514 may be omitted from the input section 510A. On the basis of power supply supplied from the outside to the image pickup apparatus 1, the power supply section supplies power supply set to various types of voltages that are necessary inside the image pickup apparatus 1.

When the image pickup apparatus 1 is connected with an external memory device, the input section 510A may be provided with a memory interface circuit that receives data from the external memory device. For example, the external memory device is a flash memory, an SRAM, a DRAM or the like.

The output section 510B outputs image data to the outside of the apparatus. For example, this image data is image data of images picked up at the image pickup apparatus 1, image data which has been subjected to signal processing at the image signal processing section 560, or the like. For example, the output section 510B includes an output data conversion circuit section 515, an output amplitude changing section 516, an output circuit section 517 and an output terminal 518.

For example, the output data conversion circuit section 515 includes a parallel-serial conversion circuit, and the output data conversion circuit section 515 converts parallel signals used inside the image pickup apparatus 1 into serial signals. The output amplitude changing section 516 changes the amplitudes of the signals used inside the image pickup apparatus 1. The signals with the changed amplitudes are easier to use in an external device which is connected outside the image pickup apparatus 1. The output circuit section 517 is a circuit that outputs data from the inside of the image pickup apparatus 1 to the outside of the apparatus, and the output circuit section 517 drives a wire that is outside of the image pickup apparatus 1 and connected to the output terminal 518. The output terminal 518 outputs data from the image pickup apparatus 1 to the outside of the apparatus. The output data conversion circuit section 515 and the output amplitude changing section 516 may be omitted from the output section 510B.

When the image pickup apparatus 1 is connected with an external memory device, the output section 510B may be provided with a memory interface circuit that outputs data to the external memory device. For example, the external memory device is a flash memory, an SRAM, a DRAM or the like.

[Schematic Configuration of Image Pickup Apparatus 1]

Figure 39:
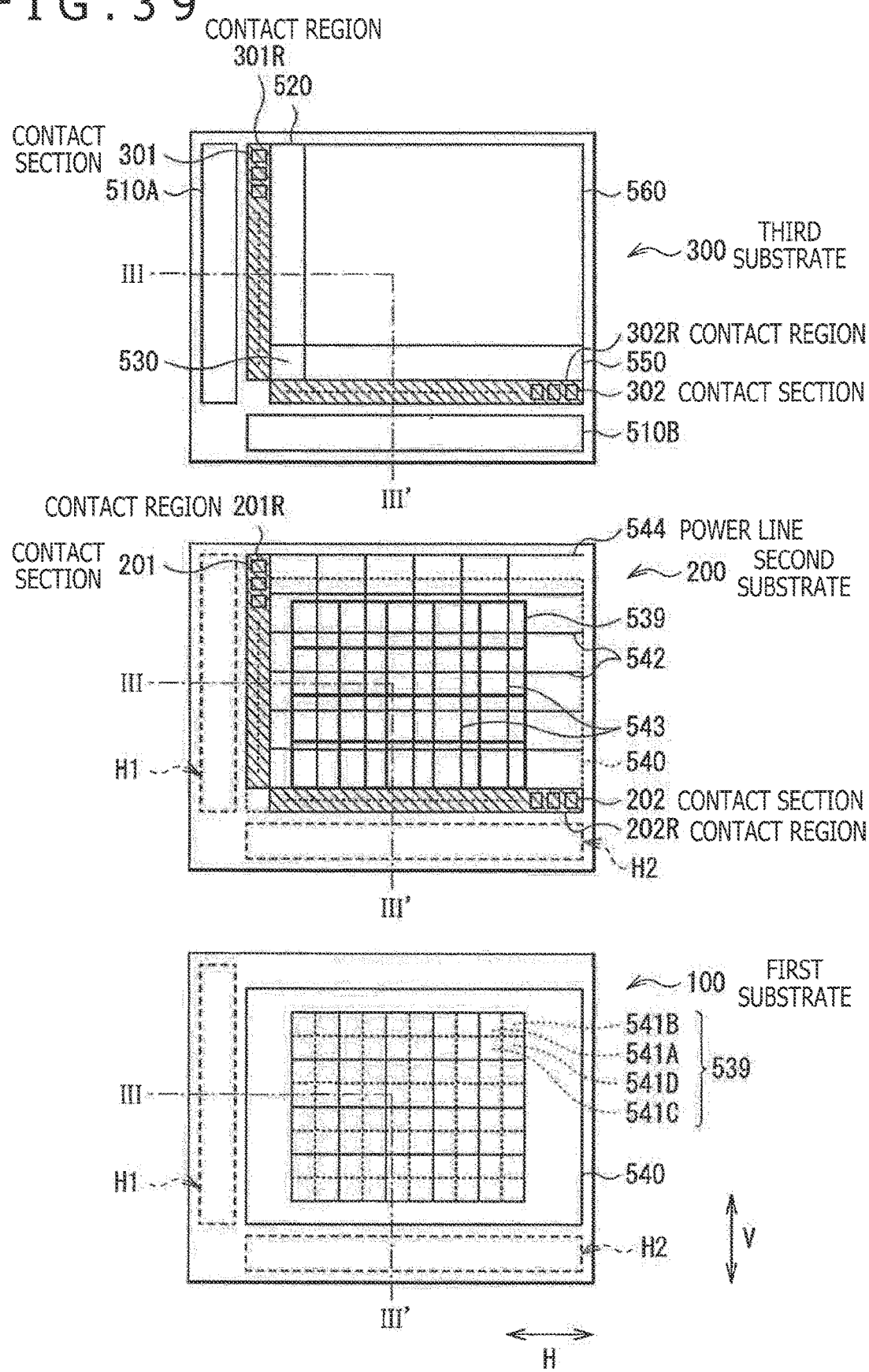
FIG. 39 is a planar schematic diagram representing a schematic configuration of the image pickup apparatus depicted in FIG. 38.
Figure 40:
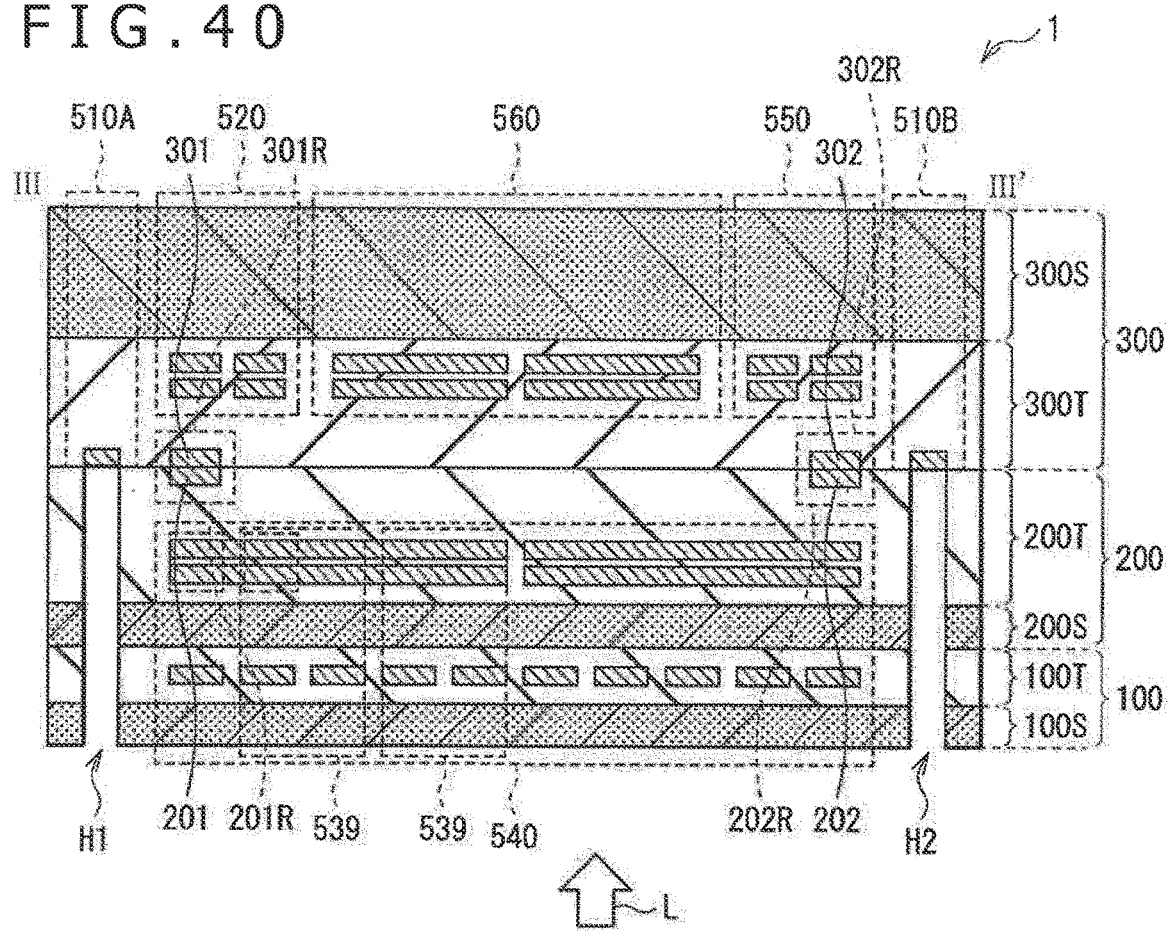
FIG. 40 is a schematic diagram representing a cross-sectional configuration along line III-III' depicted in FIG. 39.

FIG. 39 and FIG. 40 represent an example of a schematic configuration of the image pickup apparatus 1. The image pickup apparatus 1 includes three substrates (a first substrate 100, a second substrate 200 and a third substrate 300). FIG. 39 schematically represents a planar configuration of each of the first substrate 100, the second substrate 200 and the third substrate 300, and FIG. 40 schematically represents a cross-sectional configuration of the first substrate 100, the second substrate 200 and the third substrate 300 that are stacked one on another. FIG. 40 corresponds to a cross-sectional configuration along line III-III' depicted in FIG. 39. The image pickup apparatus 1 is an image pickup apparatus with a three-dimensional structure including the three substrates (the first substrate 100, the second substrate 200 and the third substrate 300) that are pasted together. The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a set of wires included in each substrate of the first substrate 100, the second substrate 200 and the third substrate 300, and surrounding interlayer dielectric films is called a wiring layer (100T, 200T and 300T) provided in the substrate (the first substrate 100, the second substrate 200 and the third substrate 300), for convenience. The first substrate 100, the second substrate 200 and the third substrate 300 are stacked one on another in this order, and the semiconductor layer 100S, the wiring layer 100T, the semiconductor layer 200S, the wiring layer 200T, the wiring layer 300T and the semiconductor layer 300S are arranged in this order along the stacking direction. Specific configuration of the first substrate 100, the second substrate 200 and the third substrate 300 is mentioned below. The arrow depicted in FIG. 40 represents the direction of incidence of light L toward the image pickup apparatus 1. In the present specification, for convenience, in the following cross-sectional views, the light-incidence side of the image pickup apparatus 1 is called "under," "lower" or "downward," and the side opposite to the light-incidence side of the image pickup apparatus 1 is called "on," "upper" or "above," in some cases. In addition, in the present specification, for convenience, with respect to a substrate including a semiconductor layer and a wiring layer, the side of the wiring layer is called a front surface, and the side of the semiconductor layer is called a backside, in some cases. Note that the description of the specification is not limited to the nomenclature described above. For example, the image pickup apparatus 1 is a backside illumination image pickup apparatus which receives light entering from the backside of the first substrate 100 that has photodiodes.

Both the pixel array section 540 and the pixel sharing units 539 included in the pixel array section 540 are configured by using both the first substrate 100 and the second substrate 200. The first substrate 100 is provided with plural pixels 541A, 541B, 541C and 541D provided in the pixel sharing units 539. Each of these pixels 541 has a photodiode (a photodiode PD mentioned below) and a transfer transistor (a transfer transistor TR mentioned below). The second substrate 200 is provided with pixel circuits (pixel circuits 210 mentioned below) provided in the pixel sharing units 539. Each pixel circuit reads out a pixel signal transferred from the photodiode of the pixel 541A, 541B, 541C or 541D via the transfer transistor, or resets the photodiode. In addition to such pixel circuits, the second substrate 200 has plural row driving signal lines 542 extending in the row direction and plural vertical signal lines 543 extending in the column direction. The second substrate 200 further has a power line 544 extending in the row direction. For example, the third substrate 300 has the input section 510A, the row driving section 520, the timing control section 530, the column signal processing section 550, the image signal processing section 560 and the output section 510B. For example, the row driving section 520 is provided in a region that partially overlaps the pixel array section 540 in the stacking direction of the first substrate 100, the second substrate 200 and the third substrate 300 (hereinafter, simply referred to as the stacking direction). More specifically, the row driving section 520 is provided in a region overlapping, in the stacking direction, a portion near an end section in direction H of the pixel array section 540 (FIG. 39). For example, the column signal processing section 550 is provided in a region partially overlapping the pixel array section 540 in the stacking direction. More specifically, the column signal processing section 550 is provided in a region overlapping, in the stacking direction, a portion near an end section in direction V of the pixel array section 540 (FIG. 39). Although not depicted in the figure, the input section 510A and the output section 510B may be arranged at portions not in the third substrate 300, and may be arranged in the second substrate 200, for example. Alternatively, the input section 510A and the output section 510B may be provided on the backside (light-incidence surface side) of the first substrate 100. Note that the pixel circuits provided in the second substrate 200 described above are called by another name such as pixel transistor circuits, a pixel transistor group, pixel transistors, pixel read circuits or read circuits, in some cases. In the present specification, pixel circuits are used as their name.

For example, the first substrate 100 and the second substrate 200 are electrically connected by through-electrodes (through-electrodes 120E and 121E in FIG. 43 mentioned below). For example, the second substrate 200 and the third substrate 300 are electrically connected via contact sections 201, 202, 301 and 302. The second substrate 200 is provided with the contact sections 201 and 202, and the third substrate 300 is provided with the contact sections 301 and 302. The contact sections 201 in the second substrate 200 are in contact with the contact sections 301 in the third substrate 300, and the contact sections 202 in the second substrate 200 are in contact with the contact sections 302 in the third substrate 300. The second substrate 200 has a contact region 201R provided with the plural contact sections 201, and a contact region 202R provided with the plural contact sections 202. The third substrate 300 has a contact region 301R provided with the plural contact sections 301, and a contact region 302R provided with the plural contact sections 302. The contact regions 201R and 301R are provided between the pixel array section 540 and the row driving section 520 in the stacking direction (FIG. 40). Stated differently, for example, the contact regions 201R and 301R are provided in a region where the row driving section 520 (third substrate 300) and the pixel array section 540 (second substrate 200) overlap in the stacking direction, or in a nearby region of the region. For example, the contact regions 201R and 301R are arranged at an end section in direction H of such a region (FIG. 39). For example, in the third substrate 300, the contact region 301R is provided at a part of the row driving section 520, specifically at a position overlapping an end section in direction H of the row driving section 520 (FIG. 39 and FIG. 40). For example, the contact sections 201 and 301 connect the row driving section 520 provided in the third substrate 300, and the row driving line 542 provided in the second substrate 200. For example, the contact sections 201 and 301 may connect the input section 510A provided in the third substrate 300, and the power line 544 and a reference potential line (a reference potential line VSS mentioned below). The contact regions 202R and 302R are provided between the pixel array section 540 and the column signal processing section 550 in the stacking direction (FIG. 40). Stated differently, for example, the contact regions 202R and 302R are provided in a region where the column signal processing section 550 (third substrate 300) and the pixel array section 540 (second substrate 200) overlap in the stacking direction, or in a nearby region of the region. For example, the contact regions 202R and 302R are arranged at an end section in direction V of such a region (FIG. 39). For example, in the third substrate 300, the contact region 301R is provided at a part of the column signal processing section 550, specifically at a position overlapping an end section in direction V of the column signal processing section 550 (FIG. 39 and FIG. 40). For example, the contact sections 202 and 302 are for connecting a pixel signal output from each of the plural pixel sharing units 539 provided in the pixel array section 540 (a signal corresponding to the amount of electric charge generated as a result of photoelectric conversion at the photodiode) to the column signal processing section 550 provided in the third substrate 300. The pixel signal is to be sent from the second substrate 200 to the third substrate 300.

FIG. 40 is an example of a cross-sectional view of the image pickup apparatus 1 as described above. The first substrate 100, the second substrate 200 and the third substrate 300 are electrically connected via the wiring layers 100T, 200T and 300T. For example, the image pickup apparatus 1 has electrical connecting sections that electrically connect the second substrate 200 and the third substrate 300. Specifically, electrodes including an electrically conductive material form the contact sections 201, 202, 301 and 302. For example, the electrically conductive material includes a metal material such as copper (Cu), aluminum (Al) or gold (Au). For example, the contact regions 201R, 202R, 301R and 302R directly join wires formed as electrodes to thereby electrically connect the second substrate and the third substrate, and make it possible to input and/or output signals between the second substrate 200 and the third substrate 300.

The electrical connecting sections electrically connecting the second substrate 200 and the third substrate 300 can be provided at desired locations. For example, as mentioned as being the contact regions 201R, 202R, 301R and 302R with reference to FIG. 40, the electrical connecting sections may be provided in regions overlapping the pixel array section 540 in the stacking direction. In addition, the electrical connecting sections may be provided in regions not overlapping the pixel array section 540 in the stacking direction. Specifically, the electrical connecting sections may be provided in regions overlapping, in the stacking direction, peripheral sections arranged outside the pixel array section 540.

For example, the first substrate 100 and the second substrate 200 are provided with connection hole sections H1 and H2. The connection hole sections H1 and H2 penetrate the first substrate 100 and the second substrate 200 (FIG. 40). The connection hole sections H1 and H2 are provided outside the pixel array section 540 (or a portion overlapping the pixel array section 540) (FIG. 39). For example, the connection hole section H1 is arranged outside the pixel array section 540 in direction H, and the connection hole section H2 is arranged outside the pixel array section 540 in direction V. For example, the connection hole section H1 reaches the input section 510A provided in the third substrate 300, and the connection hole section H2 reaches the output section 510B provided in the third substrate 300. The connection hole sections H1 and H2 may be cavities, and may at least partially include an electrically conductive material. For example, electrodes formed as the input section 510A and/or the output section 510B are connected with bonding wire, in possible configuration. Alternatively, the electrodes formed as the input section 510A and/or the output section 510B, and the electrically conductive material provided in the connection hole sections H1 and H2 are connected, in possible configuration. The electrically conductive material provided in the connection hole sections H1 and H2 may be embedded in parts of or the entire connection hole sections H1 and H2, or the electrically conductive material may be formed in the side walls of the connection hole sections H1 and H2.

Note that while FIG. 40 depicts a structure in which the third substrate 300 is provided with the input section 510A and the output section 510B, this is not the sole example. For example, by adopting configuration in which signals of the third substrate 300 are sent to the second substrate 200 via the wiring layers 200T and 300T, the input section 510A and/or the output section 510B can be provided in the second substrate 200. Similarly, by adopting configuration in which signals of the second substrate 200 are sent to the first substrate 1000 via the wiring layers 100T and 200T, the input section 510A and/or the output section 510B can be provided in the first substrate 100.

Figure 41:
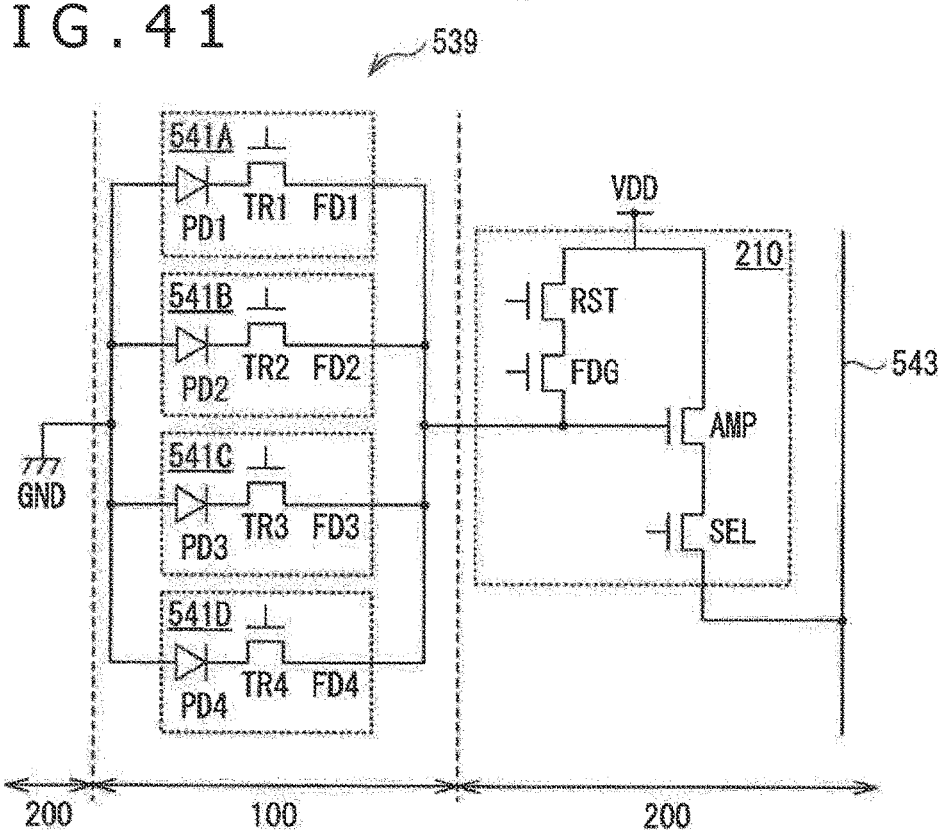
FIG. 41 is an equivalent circuit diagram of a pixel sharing unit depicted in FIG. 38.

FIG. 41 is an equivalent circuit diagram representing an example of a configuration of a pixel sharing unit 539. The pixel sharing unit 539 includes plural pixels 541 (FIG. 41 represents four pixels 541 which are pixels 541A, 541B, 541C and 541D), one pixel circuit 210 connected to the plural pixels 541, and a vertical signal line 5433 connected to the pixel circuit 210. For example, the pixel circuit 210 includes four transistors, specifically, an amplification transistor AMP, a selection transistor SEL, a reset transistor RST and an FD conversion gain switch transistor FD. As mentioned above, the pixel sharing unit 539 operates the one pixel circuit 210 time-divisionally to thereby sequentially output pixel signals of the four pixels 541 (pixel 541A, 541B, 541C and 541D) included in the pixel sharing unit 539 to the vertical signal line 543. The mode in which the plural pixels 541 are connected with the one pixel circuit 210, and pixel signals of the plural pixels 541 are output time-divisionally by the one pixel circuit 210 is called a mode in which "the plural pixels 541 share the one pixel circuit 210."

The pixels 541A, 541B, 541C and 541D have mutually the same constituent elements. Hereinafter, in order to make distinctions between the constituent elements of the pixels 541A, 541B, 541C and 541D, an identification number 1 is given at the ends of reference characters of constituent elements of the pixel 541A, an identification number 2 is given at the ends of reference characters of constituent elements of the pixel 541B, an identification number 3 is given at the ends of reference characters of constituent elements of the pixel 541C, and an identification number 4 is given at the ends of reference characters of constituent elements of the pixel 541D. In a case where it is not necessary to make distinctions between constituent elements of the pixels 541A, 541B, 541C and 541D, the identification numbers at the ends of the reference characters of the constituent elements of the pixels 541A, 541B, 541C and 541D are omitted.

For example, the pixels 541A, 541B, 541C and 541D have photodiodes PD, transfer transistors TR electrically connected with the photodiodes PD and floating diffusions FD electrically connected to the transfer transistors TR. The cathode of each photodiode PD (PD1, PD2, PD3 and PD4) is electrically connected to the source of a transfer transistor TR, and the anode of the photodiode PD is electrically connected to a reference potential line (e.g., ground). The photodiode PD performs photoelectric conversion of incident light, and generates electric charge according to the received light amount. For example, the transfer transistors TR (transfer transistors TR1, TR2, TR3 and TR4) are n-type CMOS (Complementary Metal Oxide Semiconductor) transistors. The drain of each transfer transistor TR is electrically connected to a floating diffusion FD, and the gate of the transfer transistor TR is electrically connected to a driving signal line. The driving signal line is a part of plural row driving signal lines 542 (see FIG. 38) connected to the one pixel sharing unit 539. The transfer transistor TR transfers electric charge generated at a photodiode PD to the floating diffusion FD. The floating diffusions FD (floating diffusions FD1, FD2, FD3 and FD4) are n-type diffusion layer regions formed in a p-type semiconductor layer. Each floating diffusion FD is electric charge retention means that temporarily retains electric charge transferred from the photodiode PD, and is electric charge—voltage conversion means that generates a voltage according to the electric charge amount.

The four floating diffusions FD (floating diffusions FD1, FD2, FD3 and FD4) included in the one pixel sharing unit 539 are electrically connected with each other, and are electrically connected to the gate of the amplification transistor AMP, and the source of the FD conversion gain switch transistor FDG. The drain of the FD conversion gain switch transistor FDG is connected to the source of the reset transistor RST, and the gate of the FD conversion gain switch transistor FDG is connected to a driving signal line. The driving signal line is a part of the plural row driving signal lines 542 connected to the one pixel sharing unit 539. The drain of the reset transistor RST is connected to the power line VDD, and the gate of the reset transistor RST is connected to a driving signal line. The driving signal line is a part of the plural row driving signal lines 542 connected to the one pixel sharing unit 539. The gate of the amplification transistor AMP is connected to the floating diffusions FD, the drain of the amplification transistor AMP is connected to the power line VDD, and the source of the amplification transistor AMP is connected to the drain of the selection transistor SEL. The source of the selection transistor SEL is connected to the vertical signal line 543, and the gate of the selection transistor SEL is connected to a driving signal line. The driving signal line is a part of the plural row driving signal lines 542 connected to the one pixel sharing unit 539.

When a transfer transistor TR is turned on, the transfer transistor TR transfers electric charge of the photodiode PD to the floating diffusion FD. For example, the gate (transfer gate TG) of the transfer transistor TR includes what is generally called a vertical electrode, and, as depicted in FIG. 43 mentioned below, is provided to extend from the front surface of a semiconductor layer (the semiconductor layer 100S in FIG. 43 mentioned below) to a depth that reaches the PD. The reset transistor RST resets the potential of the floating diffusion FD to a predetermined potential. When the reset transistor RST is turned on, the potential of the floating diffusion FD is reset to the potential of the power line VDD. The selection transistor SEL controls the output timing of a pixel signal from the pixel circuit 210. The amplification transistor AMP generates, as a pixel signal, a signal at a voltage according to the level of electric charge retained at the floating diffusion FD. The amplification transistor AMP is connected to the vertical signal line 543 via the selection transistor SEL. The amplification transistor AMP is included in a source follower along with the load circuit section (see FIG. 38) connected to the vertical signal line 543 in the column signal processing section 550. When the selection transistor SEL is turned on, the amplification transistor AMP outputs the voltage of the floating diffusion FD to the column signal processing section 550 via the vertical signal line 543. For example, the reset transistor RST, the amplification transistor AMP and the selection transistor SEL are N-type CMOS transistors.

The FD conversion gain switch transistor FDG is used when the gain of electric charge-voltage conversion at the floating diffusion FD is to be changed. Typically, pixel signals are small at the time of imaging at a dark location. On the basis of Q=CV, when electric charge-voltage conversion is performed, if the capacitance (FD capacitance C) of the floating diffusion FD is large, V at the time of conversion into a voltage with the amplification transistor AMP becomes small inevitably. On the other hand, pixel signals become large at a bright location, and so if the FD capacitance C is not large, the floating diffusion FD cannot fully receive the electric charge of the photodiode PD. Further, it is necessary for the FD capacitance C to have become large in order to prevent V at the time of conversion into a voltage at the amplification transistor AMP from becoming too large (in other words, in order for V to become small). Taking these into consideration, when the FD conversion gain switch transistor FDG is turned on, there is an increase of the gate capacitance by an amount corresponding to the FD conversion gain switch transistor FDG, and so the overall FD capacitance C becomes large. On the other hand, when the FD conversion gain switch transistor FDG is turned off, the overall FD capacitance C becomes small. In such a manner, it is possible to make the FD capacitance C variable, and switch the conversion efficiency by turning on and off the FD conversion gain switch transistor FDG. For example, the FD conversion gain switch transistor FDG is an N-type CMOS transistor.

Note that in another possible configuration, the FD conversion gain switch transistor FDG is not provided. At this time, for example, the pixel circuit 210 includes three transistors which are the amplification transistor AMP, the selection transistor SEL and the reset transistor RST, for example. For example, the pixel circuit 210 has at least one of pixel transistors such as the amplification transistor AMP, the selection transistor SEL, the reset transistor RST or the FD conversion gain switch transistor FDG.

The selection transistor SEL may be provided between the power line VDD and the amplification transistor AMP. In this case, the drain of the reset transistor RST is electrically connected to the power line VDD and the drain of the selection transistor SEL. The source of the selection transistor SEL is electrically connected to the drain of the amplification transistor AMP, and the gate of the selection transistor SEL is electrically connected to a row driving signal line 542 (see FIG. 38). The source (the output terminal of the pixel circuit 210) of the amplification transistor AMP is electrically connected to the vertical signal line 543, and the gate of the amplification transistor AMP is electrically connected to the source of the reset transistor RST. Note that, although not depicted in the figure, the number of pixels 541 sharing one pixel circuit 210 may not be four. For example, two or eight pixels 541 may share one pixel circuit 210.

Figure 42:
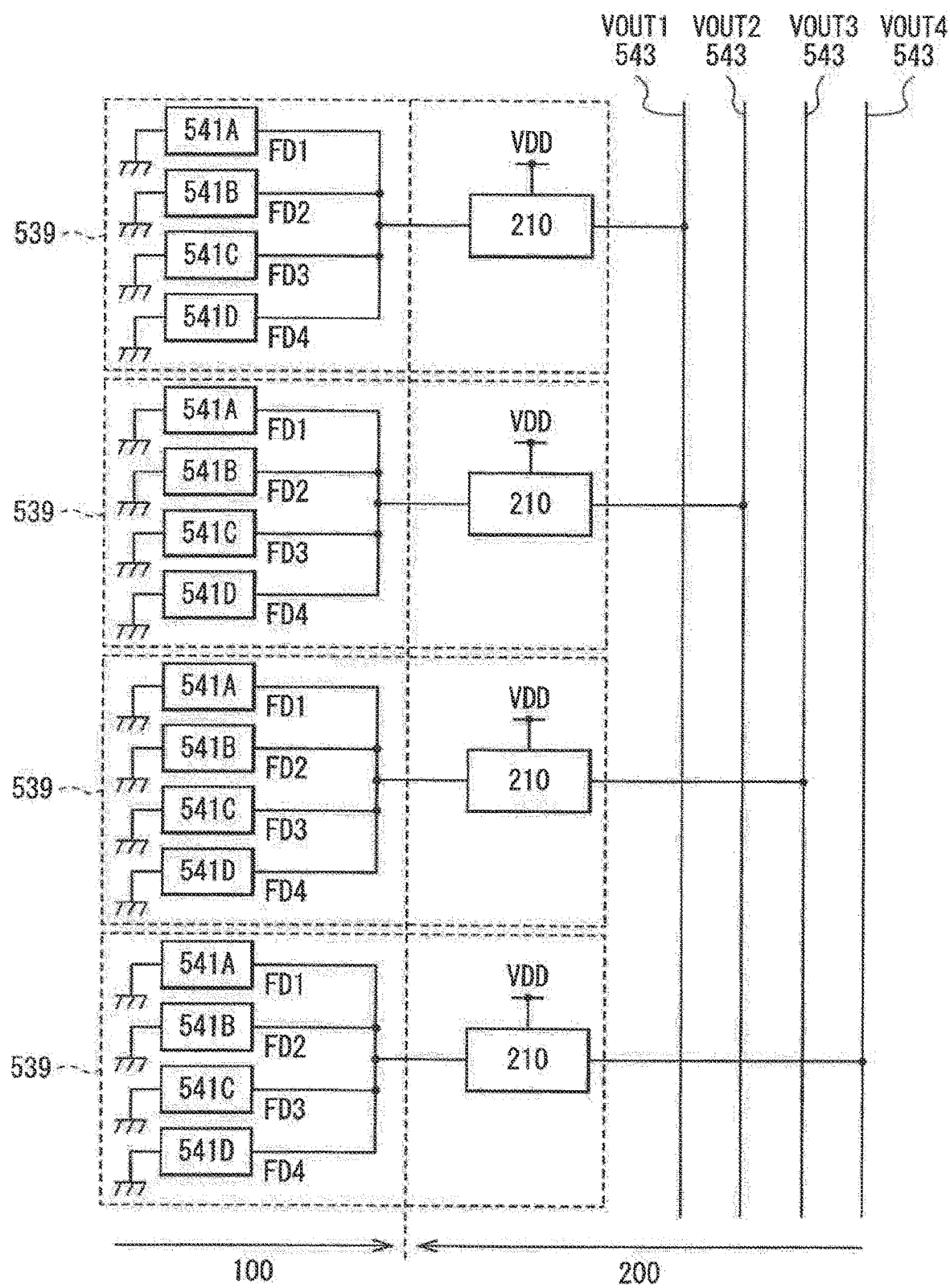
FIG. 42 is a figure representing an example of the manner of connection of plural pixel sharing units and plural vertical signal lines.

FIG. 42 represents an example of the manner of connection of plural pixel sharing units 539 and vertical signal lines 543. For example, four pixel sharing units 539 arranged next to each other in the column direction are grouped into four groups, and each of the four groups is connected with a vertical signal line 543. While FIG. 42 depicts an example in which each of the four groups has one pixel sharing unit 539 for simplification of explanation, each of the four groups may include plural pixel sharing units 539. In such a manner, in the image pickup apparatus 1, the plural pixel sharing units 539 arranged next to each other in the column direction may be grouped into groups each including one or more pixel sharing units 539. For example, each of the groups is connected with a vertical signal line 543 and the column signal processing circuit 550, and pixel signals can be read out simultaneously from the groups. Alternatively, in the image pickup apparatus 1, plural pixel sharing units 539 arranged next to each other in the column direction may be connected with one vertical signal line 543. At this time, pixel signals are read out sequentially and time-divisionally from the plural pixel sharing units 539 connected to the one vertical signal line 543.

[Specific Configuration of Image Pickup Apparatus 1]

Figure 43:
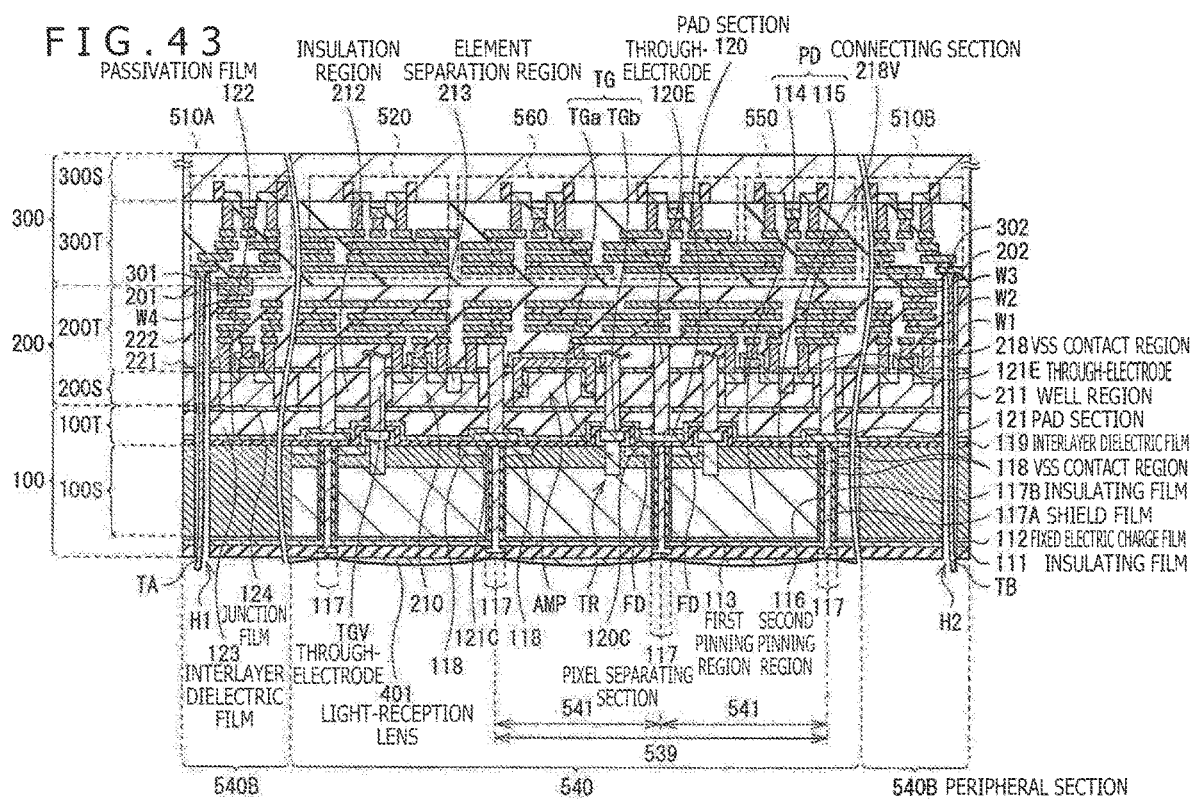
FIG. 43 is a cross-sectional schematic diagram representing an example of a specific configuration of the image pickup apparatus depicted in FIG. 40.

FIG. 43 represents an example of cross-sectional configuration vertical to the main surfaces of the first substrate 100, the second substrate 100 and the third substrate 300 of the image pickup apparatus 1. FIG. 43 represents it schematically in order to make it easier to understand the positional relation of constituent elements, and may be different from an actual cross-section. The image pickup apparatus 1 has the first substrate 100, the second substrate 200 and the third substrate 300 that are stacked one on another in this order. The image pickup apparatus 1 further has light-reception lenses 401 on the backside (light-incidence surface side) of the first substrate 100. A color filter layer (not depicted) may be provided between the light-reception lenses 401 and the first substrate 100. For example, a light-reception lens 401 is provided in each of the pixels 541A, 541B, 541C and 541D. For example, the image pickup apparatus 1 is a backside illumination image pickup apparatus. The image pickup apparatus 1 has the pixel array section 540 arranged at a middle section, and a peripheral section 540B arranged outside the pixel array section 540.

The first substrate 100 has an insulating film 111, a fixed electric charge film 112, the semiconductor layer 100S and the wiring layer 100T sequentially from the light-reception lens 401 side. For example, the semiconductor layer 100S includes a silicon substrate. For example, the semiconductor layer 100S has p well layers 115 at and near parts of the front surface (a surface on the wiring layer 100T side), and n-type semiconductor regions 114 in other regions (regions deeper than the p well layers 115). For example, the n-type semiconductor regions 114 and the p well layers 115 are included in pn junction-type photodiodes PD. The p well layers 115 are p-type semiconductor regions.

Figure 44A:
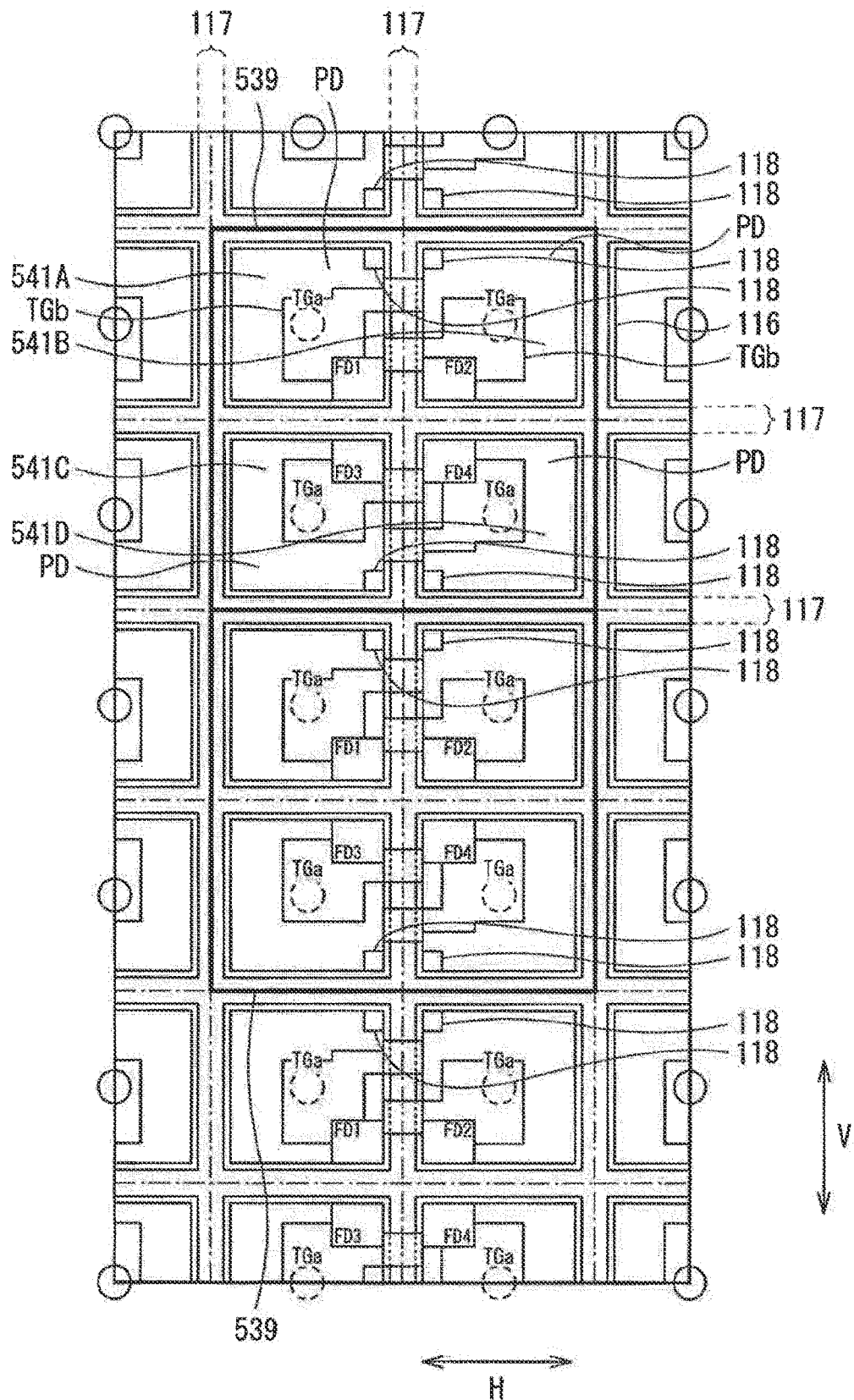
FIG. 44A is a schematic diagram representing an example of a planar configuration of main sections of a first substrate depicted in FIG. 43.

FIG. 44A represents an example of a planar configuration of the first substrate 100. FIG. 44A mainly represents a planar configuration of a pixel separating section 117, photodiodes PD, floating diffusions FD, VSS contact regions 118 and transfer transistors TR of the first substrate 100. The configuration of the first substrate 100 is explained by using FIG. 44A along with FIG. 43.

Near the front surface of the semiconductor layer 100S, floating diffusions FD and VSS contact regions 118 are provided. The floating diffusions FD include the n-type semiconductor regions provided in the p well layers 115. For example, the floating diffusions FD (floating diffusions FD1, FD2, FD3 and FD4) of the pixels 541A, 541B, 541C and 541D are provided proximately to each other at middle sections of pixel sharing units 539 (FIG. 44A). As mentioned below in detail, four floating diffusions FD (floating diffusions FD1, FD2, FD3 and FD4) included in a sharing unit 539 are electrically connected with each other via electrical connection means (a pad section 120 mentioned below) in the first substrate 100 (more specifically, in the wiring layer 100T). Further, the floating diffusions FD are connected from the first substrate 100 to the second substrate 200 (more specifically, from the wiring layer 100T to the wiring layer 200T) via electrical means (a through-electrode 120E mentioned below). In the second substrate 200 (more specifically, inside the wiring layer 200T), the electrical means electrically connects the floating diffusions FD to the gate of the amplification transistor AMP and the source of the FD conversion gain switch transistor FDG.

The VSS contact regions 118 are regions electrically connected to the reference potential line VSS, and are arranged apart from the floating diffusions FD. For example, in the pixels 541A, 541B, 541C and 541D, a floating diffusion FD is arranged at one end of each pixel in direction V, and a VSS contact region 118 is arranged at the other end (FIG. 44A). For example, the VSS contact regions 118 include p-type semiconductor regions. For example, the VSS contact regions 118 are connected to a ground potential or a fixed potential. Thereby, the semiconductor layer 100S is supplied with a reference potential.

The first substrate 100 is provided with transfer transistors TR, along with photodiodes PD, floating diffusions FD and VSS contact regions 118. A photodiode PD, a floating diffusion FD, a VSS contact region 118 and a transfer transistor TR are provided in each of the pixels 541A, 541B, 541C and 541D. Each transfer transistor TR is provided on the front surface side (a side opposite to the light-incidence surface, the second substrate 200 side) of the semiconductor layer 100S. The transfer transistor TR has a transfer gate TG. For example, the transfer gate TG includes a horizontal portion TGb facing the front surface of the semiconductor layer 100S, and a vertical portion TGa provided in the semiconductor layer 100S. The vertical portion TGa extends in the thickness direction of the semiconductor layer 100S. One end of the vertical portion TGa is in contact with the horizontal portion TGb, and the other end is provided in an n-type semiconductor region 114. Because the transfer transistor TR includes such a vertical transistor, occurrence of a transfer failure of pixel signals becomes unlikely, and it is possible to enhance the efficiency of reading out pixel signals.

The horizontal portion TGb of the transfer gate TG extends from a position facing the vertical portion TGa toward a middle section of the pixel sharing unit 539 in direction H, for example (FIG. 44A). Thereby, the position in direction H of a through-electrode (a through-electrode TGV mentioned below) that reaches the transfer gate TG can be made close to the positions in direction H of through-electrodes (through-electrodes 120E and 121E mentioned below) connected to the floating diffusion FD and the VSS contact region 118. For example, plural pixel sharing units 539 provided in the first substrate 100 have mutually the same configuration (FIG. 44A).

Figure 44B:
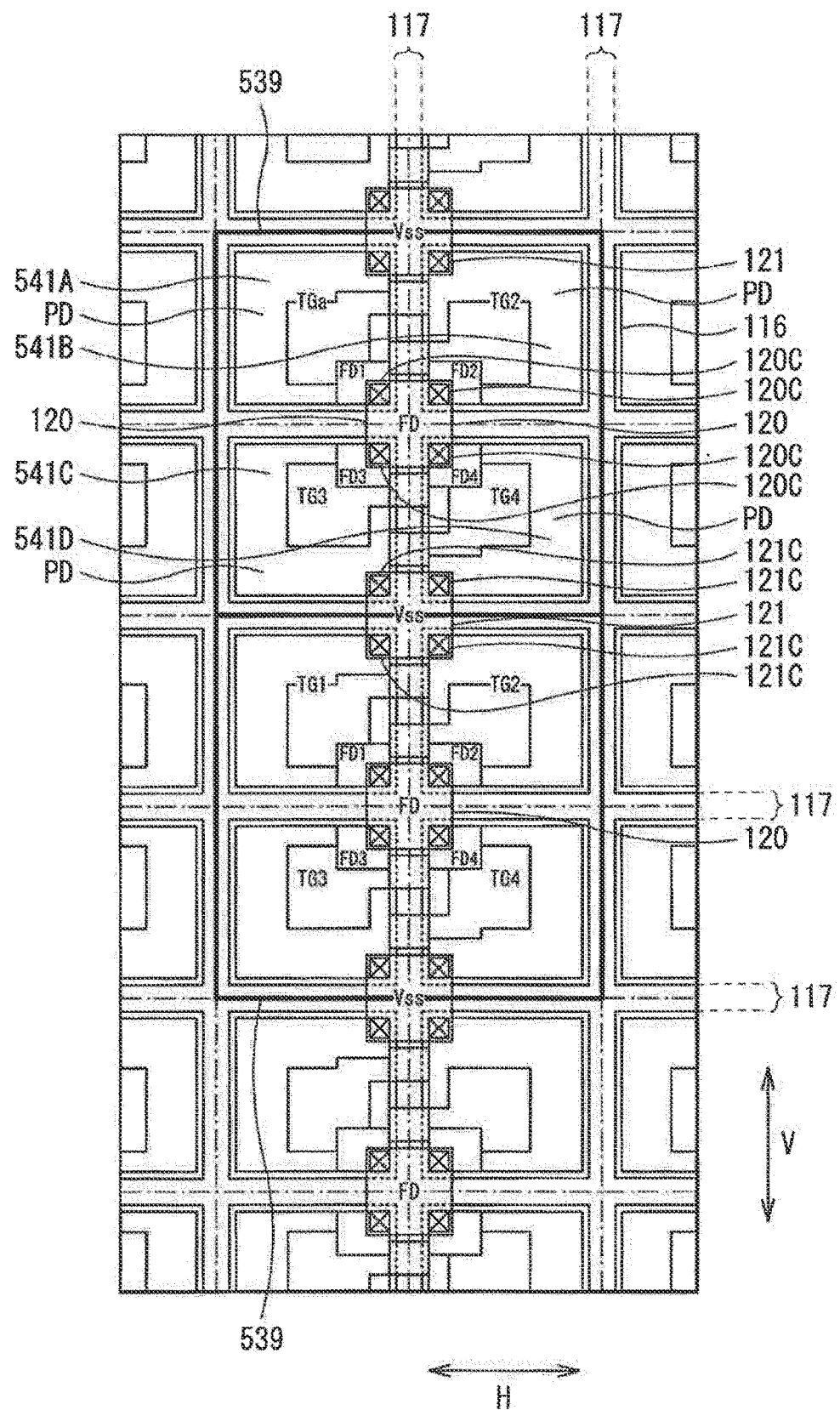
FIG. 44B is a schematic diagram representing a planar configuration of pad sections along with the main sections of the first substrate depicted in FIG. 44A.

The semiconductor layer 100S is provided with the pixel separating section 117 separating the pixels 541A, 541B, 541C and 541D from each other. Each pixel separating section 117 is formed as a section extending in the normal direction of the semiconductor layer 100S (a direction perpendicular to the front surface of the semiconductor layer 100S). The pixel separating section 117 is provided to partition the pixels 541A, 541B, 541C and 541D, and has a grid planar shape, for example (FIG. 44A and FIG. 44B). For example, the pixel separating section 117 electrically and optically separates the pixels 541A, 541B, 541C and 541D from each other. For example, the pixel separating section 117 includes a light-shielding film 117A and an insulating film 117B. For example, tungsten (W) or the like is used for the light-shielding film 117A. The insulating film 117B is provided between the light-shielding film 117A and a p well layer 115 or an n-type semiconductor region 114. For example, the insulating film 117B includes silicon oxide (SiO). For example, the pixel separating section 117 has an FTI (Full Trench Isolation) structure, and penetrates the semiconductor layer 100S. Although not depicted in figures, the structure of the pixel separating section 117 is not limited to the FTI structure penetrating the semiconductor layer 100S. For example, it may be a DTI (Deep Trench Isolation) structure not penetrating the semiconductor layer 100S. The pixel separating section 117 extends in the normal direction of the semiconductor layer 100S, and is formed in a partial region of the semiconductor layer 100S.

For example, the semiconductor layer 100S is provided with first pinning regions 113 and second pinning regions 116. Each first pinning region 113 is provided near the backside of the semiconductor layer 100S, and is arranged between an n-type semiconductor region 114 and the fixed electric charge film 112. Each second pinning region 116 is provided on the side surface of the pixel separating section 117, specifically, between the pixel separating section 117 and a p well layer 115 or an n-type semiconductor region 114. For example, the first pinning regions 113 and the second pinning regions 116 include p-type semiconductor regions.

The fixed electric charge film 112 having negative fixed electric charge is provided between the semiconductor layer 100S and the insulating film 111. Due to an electrical field induced by the fixed electric charge film 112, the first pinning regions 113 of a hole accumulation layer are formed at an interface on the light-reception surface side (backside) of the semiconductor layer 100S. Thereby, generation of a dark current due to the interface state on the light-reception surface side of the semiconductor layer 100S is suppressed. For example, the fixed electric charge film 112 includes an insulating film having negative fixed electric charge. For example, examples of a material of the insulating film having the negative fixed electric charge include hafnium oxide, zirconium oxide, aluminum oxide, titanium oxide and tantalum oxide.

Light-shielding films 117A are provided between the fixed electric charge film 112 and the insulating film 111. The light-shielding films 117A may be provided continuously with the light-shielding films 117A included in the pixel separating section 117. For example, the light-shielding films 117A between the fixed electric charge film 112 and the insulating film 111 are provided selectively at positions that are in the semiconductor layer 100S and that face the pixel separating section 117. The insulating film 111 is provided to cover the light-shielding films 117A. For example, the insulating film 111 includes silicon oxide.

The wiring layer 100T provided between the semiconductor layer 100S and the second substrate 200 has an interlayer dielectric film 119, pad sections 120 and 121, a passivation film 122, an interlayer dielectric film 123 and a junction film 124 in this order from the semiconductor layer 100S side. For example, the horizontal portions TGb of the transfer gates TG are provided in the wiring layer 100T. The interlayer dielectric film 119 is provided over the entire front surface of the semiconductor layer 100S, and is in contact with the semiconductor layer 100S. For example, the interlayer dielectric film 119 includes a silicon oxide film. Note that the configuration of the wiring layer 100T is not limited to the one mentioned above, and only has to be configuration having wires and an insulating film.

FIG. 44B represents a configuration of the pad sections 120 and 121 along with the planar configuration depicted in FIG. 44A. The pad sections 120 and 121 are provided in selected regions on the interlayer dielectric film 119. Each pad section 120 is for connecting the floating diffusions FD (floating diffusions FD1, FD2, FD3 and FD4) of pixels 541A, 541B, 541C and 541D with each other. For example, in each pixel sharing unit 539, a pad sections 120 is arranged at a middle section of the pixel sharing unit 539 when seen in a plan view (FIG. 44B). The pad section 120 is provided to cross the pixel separating section 117, and is arranged to overlap at least a part of each of the floating diffusions FD1, FD2, FD3 and FD4 (FIG. 43 and FIG. 44B). Specifically, the pad section 120 is formed in a region that overlaps, in a direction perpendicular to the front surface of the semiconductor layer 100S, at least a part of each of plural floating diffusions FD (floating diffusions FD1, FD2, FD3 and FD4) sharing the pixel circuit 210, and at least a part of the pixel separating section 117 formed between plural photodiodes PD (photodiodes PD1, PD2, PD3 and PD4) sharing the pixel circuit 210. The interlayer dielectric film 119 is provided with connection vias 120C for electrically connecting the pad section 120 and the floating diffusions FD1, FD2, FD3 and FD4. A connection via 120C is provided for each of the pixels 541A, 541B, 541C and 541D. For example, by a part of a pad section 120 being embedded in a connection via 120C, the pad section 120 and each of the floating diffusions FD1, FD2, FD3 and FD4 are electrically connected to each other.

The pad sections 121 are for connecting plural VSS contact regions 118 with each other. For example, a pad section 121 electrically connects VSS contact regions 118 provided in pixels 541C and 541D of one of pixel sharing units 539 that are adjacent to each other in direction V, and VSS contact regions 118 provided in pixels 541A and 541B of the other pixel sharing unit 539. For example, each pad section 121 is provided to cross the pixel separating section 117, and is arranged to overlap at least a part of each of the four VSS contact regions 118. Specifically, the pad section 121 is formed in a region overlapping, in a direction perpendicular to the front surface of the semiconductor layer 100S, at least a part of each of plural VSS contact regions 118S, and at least a part of the pixel separating section 117 formed between the plural VSS contacts 118. The interlayer dielectric film 119 is provided with connection vias 121C for electrically connecting the pad sections 121 and the VSS contact regions 118. A connection via 121C is provided for each of the pixels 541A, 541B, 541C and 541D. For example, by a part of a pad section 121 being embedded in a connection via 121C, the pad section 121 and a VSS contact region 118 are electrically connected. For example, a pad section 120 and a pad section 121 of each of plural pixel sharing units 539 arranged next to each other in direction V are arranged at approximately the same positions in direction H (FIG. 44B).

By providing the pad sections 120, it is possible to reduce wires for connecting floating diffusions FD to pixel circuits 210 (e.g., the gate electrodes of amplification transistors AMP) over the entire chip. Similarly, by providing the pad sections 121, it is possible to reduce wires that supply a potential to VSS contact regions 118 over the entire chip. Thereby, reduction of the overall area size of the chip, suppression of electrical interference between wires in miniaturized pixels, cost reduction due to reduction of the number of parts, and/or the like become possible.

The pad sections 120 and 121 can be provided at desired positions of the first substrate 100 and the second substrate 200. Specifically, the pad sections 120 and 121 can be provided in either the wiring layer 100T or an insulation region 212 of the semiconductor layer 200S. In a case where the pad sections 120 and 121 are provided in the wiring layer 100T, the pad sections 120 and 121 may be brought into direct contact with the semiconductor layer 100S. Specifically, the pad sections 120 and 121 may be directly connected with at least a part of each of floating diffusions FD and/or VSS contact regions 118, in possible configuration. In addition, connection vias 120C and 121C may be provided from each of floating diffusions FD and/or VSS contact regions 118 connected to the pad sections 120 and 121, and the pad sections 120 and 121 may be provided at desired positions of the wiring layer 100T and the insulation region 2112 of the semiconductor layer 200S, in possible configuration.

In particular, in a case where the pad sections 120 and 121 are provided in the wiring layer 100T, it is possible to reduce wires connected to floating diffusions FD and/or VSS contact regions 118 in the insulation region 212 of the semiconductor layer 200S. Thereby, it is possible to reduce the area size of the insulation region 212 that is in the second substrate 200 where pixel circuits 210 are formed, and is for forming through-wires for connection from floating diffusions FD to the pixel circuits 210. Therefore, it is possible to ensure that there is a large area size for formation of the pixel circuits 210 in the second substrate 200. By ensuring that there is a large area size for the pixel circuits 210, pixel transistors can be formed large, and this can contribute to enhancement of the image quality due to noise reduction or the like.

In particular, in a case where an FTI structure is used for the pixel separating section 117, a floating diffusion FD and/or a VSS contact region 118 are/is preferably provided for each pixel 541, and so it is possible to significantly reduce wires that connect the first substrate 100 and the second substrate 200 by using the configuration with the pad sections 120 and 121.

In addition, as in FIG. 44B, for example, the pad sections 120 each of which is connected with plural floating diffusions FD, and the pad sections 121 each of which is connected with plural VSS contacts 118 are arranged alternately linearly in direction V. In addition, the pad sections 120 and 121 are formed at positions surrounded by plural photodiodes PD, plural transfer gates TG and plural floating diffusions FD. Thereby, elements other than floating diffusions FD and VSS contact regions 118 can be arranged freely in the first substrate 100 where plural elements are formed, and it is possible to attempt to enhance the layout efficiency of the entire chip. In addition, it is possible to ensure that there is the symmetricity of the layout of elements formed in each pixel sharing unit 539, and to suppress variations of characteristics of each pixel 541.

For example, the pad sections 120 and 121 include polysilicon (Poly Si), more specifically doped polysilicon doped with impurities. The pad sections 120 and 121 preferably include a highly heat-resistant electrically conductive material such as polysilicon, tungsten (W), titanium (Ti) or titanium nitride (TiN). Thereby, it becomes possible to form pixel circuits 210 after the semiconductor layer 200S of the second substrate 200 is pasted onto the first substrate 100. Hereinafter, reasons for this are explained. Note that in the following explanation, a method in which pixel circuits 210 are formed after the first substrate 100 and the semiconductor layer 200S of the second substrate 200 are pasted together is called a first manufacturing method.

Here, pixel circuits 210 are formed in the second substrate 200, and then the second substrate 200 is pasted onto the first substrate 100 in another possible method (hereinafter, this is called a second manufacturing method). In this second manufacturing method, in each of the front surface (the front surface of the wiring layer 100T) of the first substrate 100, and the front surface (the front surface of the wiring layer 200T) of the second substrate 200, electrodes for electrical connection are formed in advance. When the first substrate 100 and the second substrate 200 are pasted together, simultaneously, the electrodes for electrical connection formed in the front surface of the first substrate 100 and the front surface of the second substrate 200 come into contact with each other. Thereby, electrical connection are formed between wires included in the first substrate 100 and wires included in the second substrate 200. Therefore, by adopting the configuration of the image pickup apparatus 1 formed by using the second manufacturing method, for example, it can be manufactured by using appropriate processes according to the configuration of each of the first substrate 100 and the second substrate 200, and a high-quality, high-performance image pickup apparatus can be manufactured.

When the first substrate 100 and the second substrate 200 are pasted together in such a second manufacturing method, an alignment error occurs due to a manufacturing apparatus for pasting in some cases. In addition, for example, the first substrate 100 and the second substrate 200 have sizes with diameters which are approximately several dozen centimeters, and when the first substrate 100 and the second substrate 200 are pasted together, there is a risk that expansion/contraction of the substrates occurs in microscopic regions of each section of the first substrate 100 and the second substrate 200. This expansion/contraction of the substrates is attributable to the fact there are slight differences in the timing at which the substrates come into contact with each other. Due to such expansion/contraction of the first substrate 100 and the second substrate 200, an error occurs in the positions of the electrodes for electrical connection formed in the front surface of the first substrate 100 and the front surface of the second substrate 200 in some cases. In the second manufacturing method, preferably, measures are taken to ensure that the electrodes of the first substrate 100 and the second substrate 200 come into contact with each other even if such an error occurs.

Specifically, electrodes of at least one of the first substrate 100 and the second substrate 200, preferably both the first substrate 100 and the second substrate 200, are made larger taking the error described above into consideration. Because of this, if the second manufacturing method is used, for example, the sizes (the sizes in the substrate planar surface direction) of the electrodes formed in the front surface of the first substrate 100 or the second substrate 200 become larger than the sizes of inner electrodes extending from the inside of the first substrate 100 or the second substrate 200 toward the front surface in the thickness direction.

On the other hand, if the pad sections 120 and 121 include a heat-resistant electrically conductive material, it becomes possible to use the first manufacturing method described above. In the first manufacturing method, the first substrate 100 including photodiodes PD, transfer transistors TR and the like is formed, and then the first substrate 100 and the second substrate 200 (semiconductor layer 2000S) are pasted together. At this time, in the second substrate 200, patterns of active elements, wiring layers and the like included in the pixel circuit 210 have not been formed yet. Because patterns are not formed in the second substrate 200 yet, even if an error occurs in positions where the first substrate 100 and the second substrate 200 are pasted together when the first substrate 100 and the second substrate 200 are pasted together, such an error in the pasting does not cause an error in alignment between patterns of the first substrate 100 and patterns of the second substrate 200. This is because the patterns of the second substrate 200 are formed after the first substrate 100 and the second substrate 200 are pasted together. Note that when patterns are formed in the second substrate, for example, the patterns are formed in a light-exposure apparatus for pattern formation by using the patterns formed in the first substrate as the alignment targets. For the reason described above, an error in positions where the first substrate 100 and the second substrate 200 are pasted together does not become a problem in manufacturing of the image pickup apparatus 1 in the first manufacturing method. For a similar reason, an error attributable to expansion/contraction of the substrates that occurs in the second manufacturing method also does not become a problem in manufacturing of the image pickup apparatus 1 in the first manufacturing method.

In the first manufacturing method, the first substrate 100 and the second substrate 200 (semiconductor layer 200S) are pasted together, and then active elements are formed on the second substrate 200 in such a manner. Thereafter, through-electrodes 120E and 121E and through-electrodes TGV (FIG. 43) are formed. For example, in this formation of the through-electrodes 120E, 121E and TGV, patterns of the through-electrodes are formed by using reduced projection exposure by a light-exposure apparatus from above the second substrate 200. Because reduced exposure projection is used, even if an error occurs in alignment between the second substrate 200 and the light-exposure apparatus, the size of the error in the second substrate 200 becomes only a fraction of an error in the second manufacturing method described above (the reciprocal of the magnification of the reduced exposure projection). Therefore, by using the configuration of the image pickup apparatus 1 formed by using the first manufacturing method, it becomes easier to align elements formed in each of the first substrate 100 and the second substrate 200, and a high-quality, high-performance image pickup apparatus can be manufactured.

The image pickup apparatus 1 manufactured by using such a first manufacturing method has features that are different from those of an image pickup apparatus manufactured by using the second manufacturing method. Specifically, in the image pickup apparatus 1 manufactured by the first manufacturing method, for example, the through-electrodes 120E, 121E and TGV have approximately uniform thicknesses (sizes in the substrate planar surface direction) from the second substrate 200 to the first substrate 100. Alternatively, when the through-electrodes 120E, 121E and TGV have tapered shapes, the tapered shapes have constant inclinations. The image pickup apparatus 1 having such through-electrodes 120E, 121E and TGV allows easier miniaturization of pixels 541.

Here, if the image pickup apparatus 1 is manufactured by the first manufacturing method, active elements are formed in the second substrate 200 after the first substrate 100 and the second substrate 200 (semiconductor layer 200S) are pasted together, and so the influence of a heating process necessary at the time of the formation of the active elements reaches the first substrate 100 also. Because of this, as described above, a highly heat-resistant electrically conductive material is preferably used for the pad sections 120 and 121 provided in the first substrate 100. For example, a material with a melting point higher than (i.e., more heat-resistant than) at least a part of wire materials included in the wiring layer 200T of the second substrate 200 is preferably used for the pad sections 120 and 121. For example, a highly heat-resistant electrically conductive material such as doped polysilicon, tungsten, titanium or titanium nitride is used for the pad sections 120 and 121. Thereby, it becomes possible to manufacture the image pickup apparatus 1 by using the first manufacturing method described above.

For example, the passivation film 122 is provided over the entire front surface of the semiconductor layer 100S such that it covers the pad sections 120 and 121 (FIG. 43). For example, the passivation film 122 includes a silicon nitride (SiN) film. The interlayer dielectric film 123 covers the pad sections 120 and 121 with the passivation film 122 being interposed therebetween. For example, the interlayer dielectric film 123 is provided over the entire front surface of the semiconductor layer 100S. For example, the interlayer dielectric film 123 includes a silicon oxide (SiO) film. The junction film 124 is provided at the surface of junction between the first substrate 100 (specifically, the wiring layer 100T) and the second substrate 200. That is, the junction film 124 is in contact with the second substrate 200. The junction film 124 is provided over the entire main surface of the first substrate 100. For example, the junction film 124 includes a silicon nitride film.

For example, the light-reception lenses 401 face the semiconductor layer 100S with the fixed electric charge film 112 and the insulating film 111 being interposed therebetween (FIG. 43). For example, each light-reception lens 401 is provided at a position facing a photodiode PD of one of the pixels 541A, 541B, 541C and 541D.

The second substrate 200 has the semiconductor layer 200S and the wiring layer 200T in this order from the first substrate 100 side. The semiconductor layer 200S includes a silicon substrate. In the semiconductor layer 200S, well regions 211 are provided in the thickness direction. For example, the well regions 211 are p-type semiconductor regions. The second substrate 20 is provided with pixel circuits 210 each of which is arranged for one pixel sharing unit 539. For example, the pixel circuits 210 are provided on the front surface side (wiring layer 200T side) of the semiconductor layer 200S. In the image pickup apparatus 1, the second substrate 200 is pasted onto the first substrate 100 such that the backside (semiconductor layer 200S side) of the second substrate 200 faces the front surface side (wiring layer 100T side) of the first substrate 100. That is, the second substrate 200 is pasted onto the first substrate 100 face-to-back.

Figure 45:
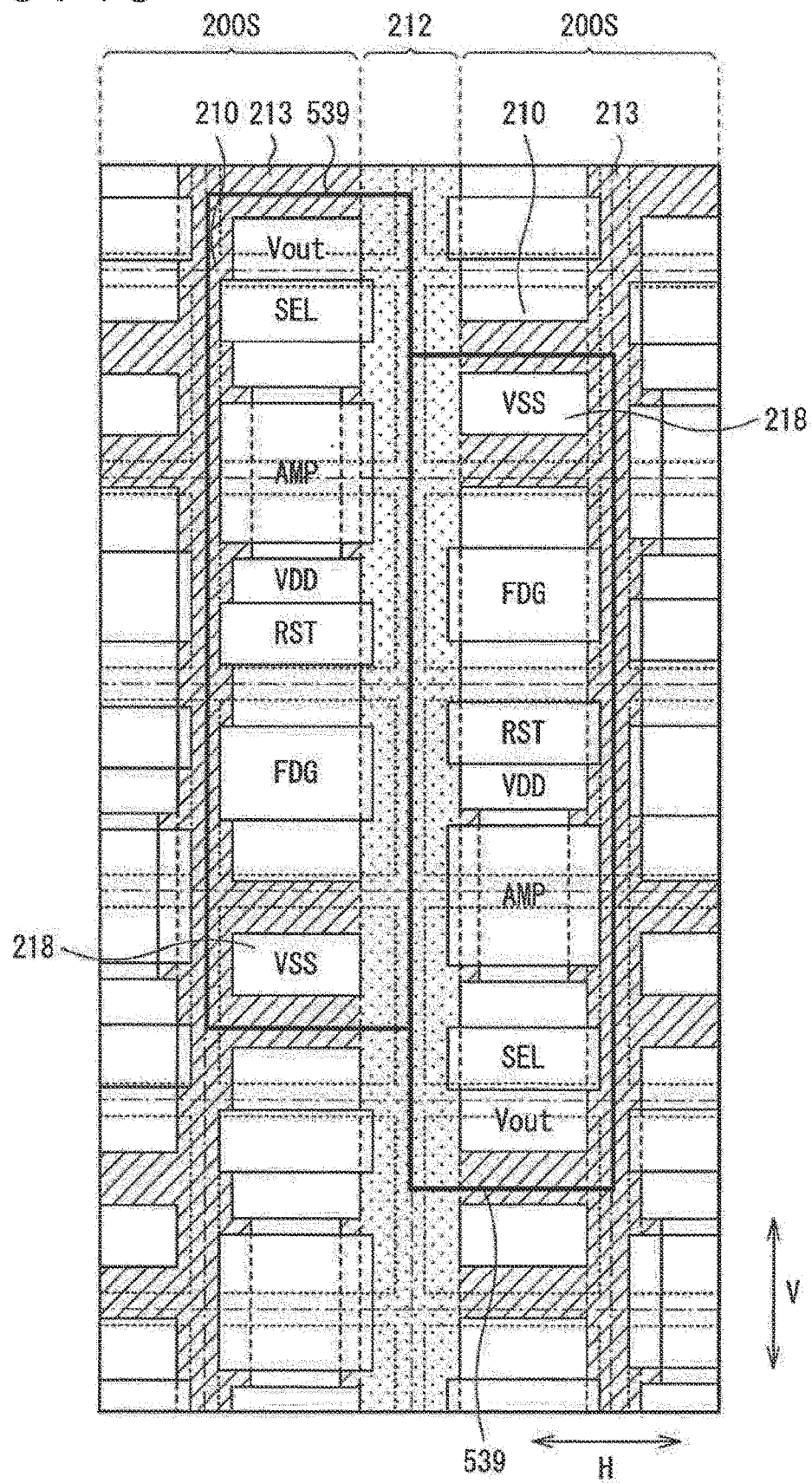
FIG. 45 is a schematic diagram representing an example of a planar configuration of a second substrate (semiconductor layer) depicted in FIG. 43.
Figure 46:
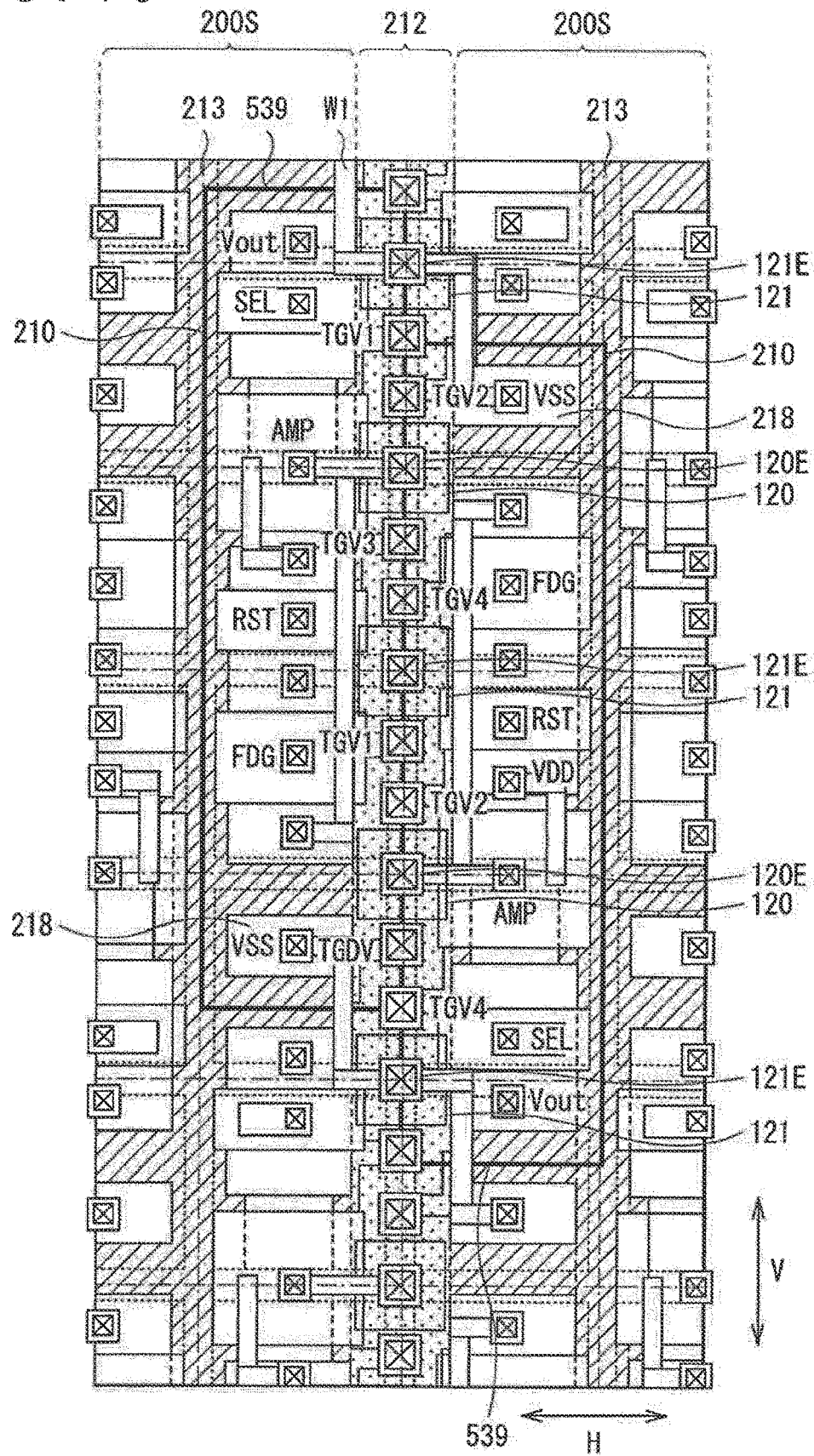
FIG. 46 is a schematic diagram representing an example of a planar configuration of main sections of pixel circuits and the first substrate along with a first wiring layer depicted in FIG. 43.
Figure 47:
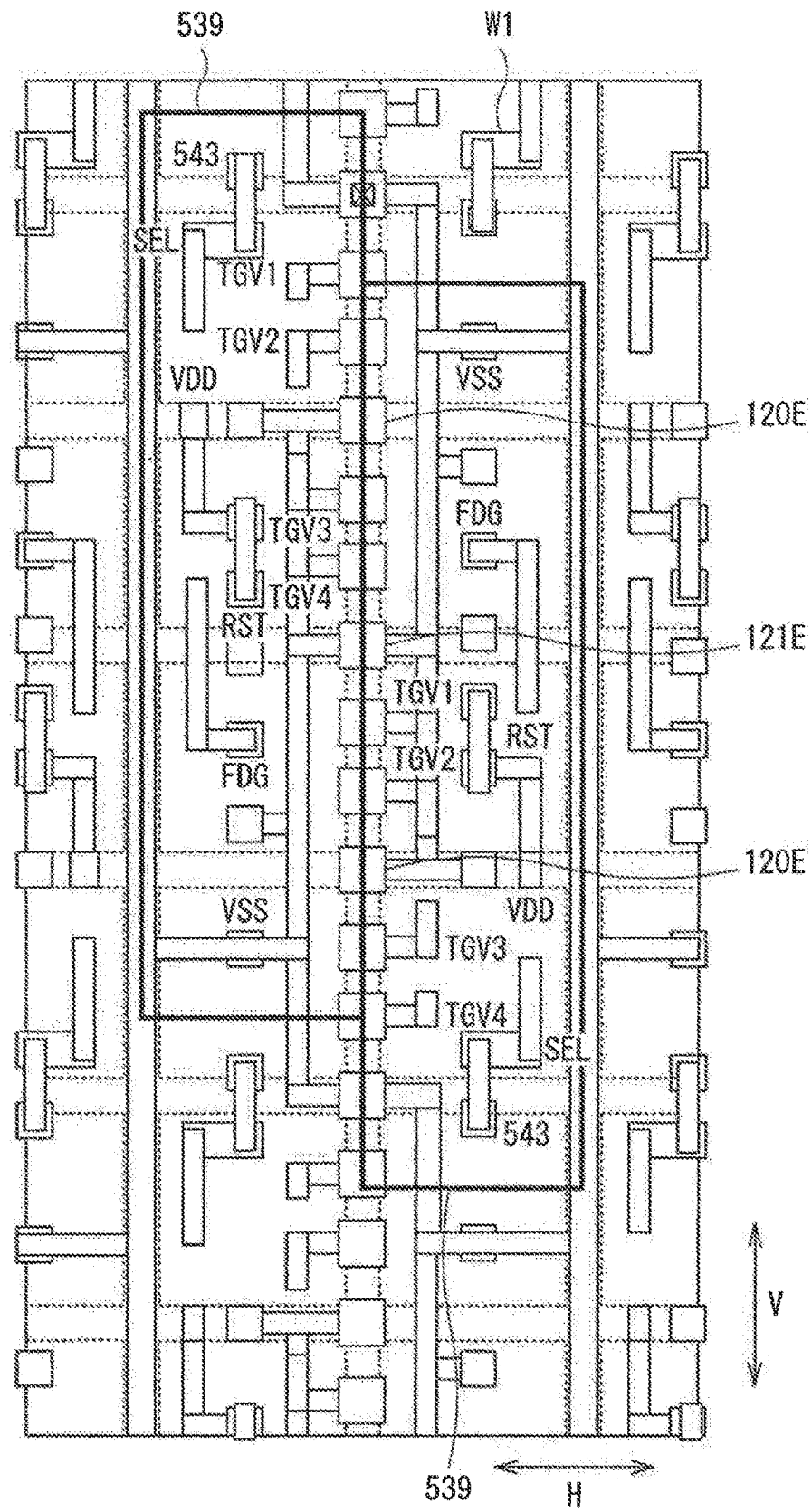
FIG. 47 is a schematic diagram representing an example of a planar configuration of the first wiring layer and a second wiring layer depicted in FIG. 43.
Figure 48:
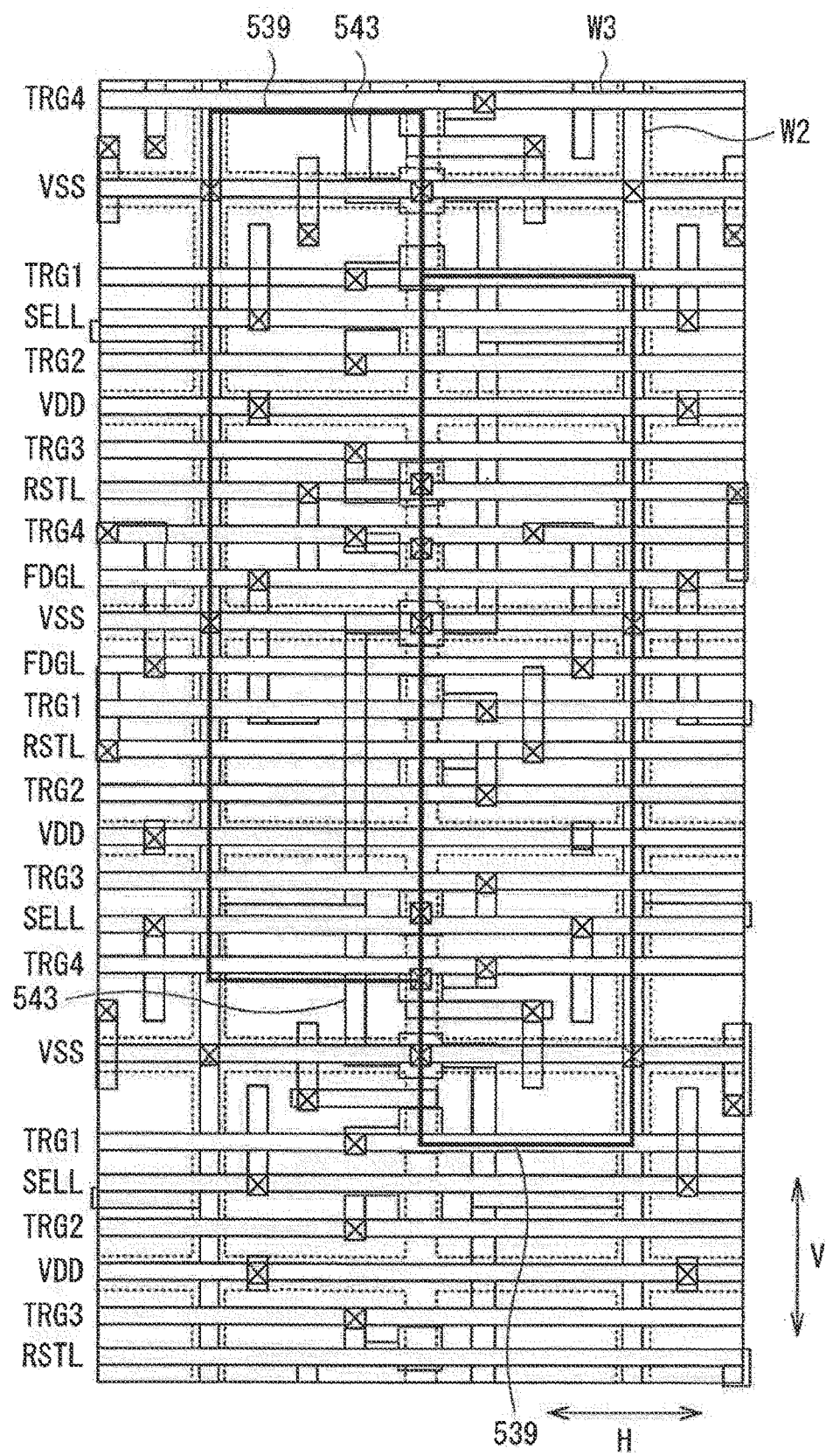
FIG. 48 is a schematic diagram representing an example of a planar configuration of the second wiring layer and a third wiring layer depicted in FIG. 43.
Figure 49:
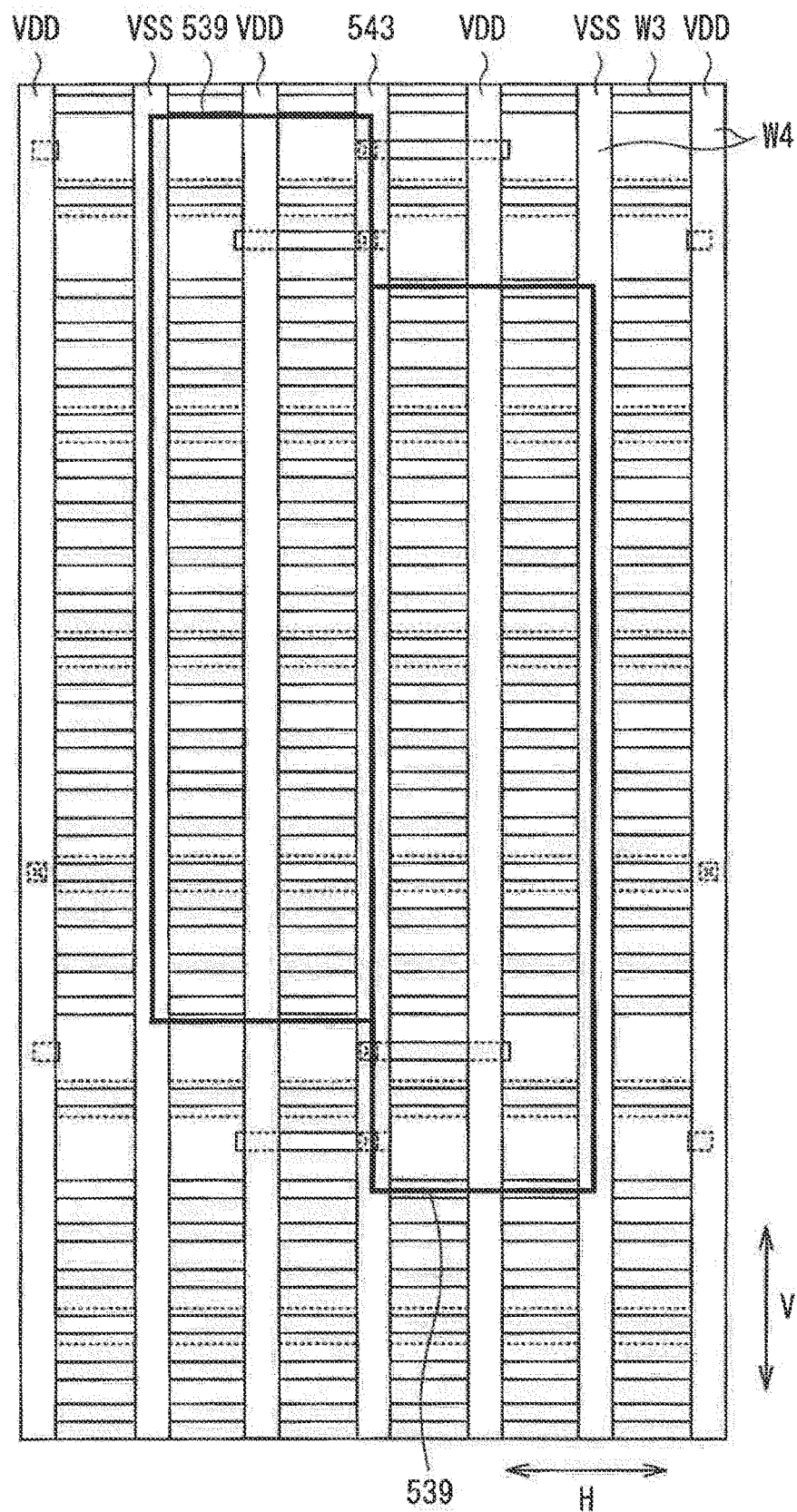
FIG. 49 is a schematic diagram representing an example of a planar configuration of the third wiring layer and a fourth wiring layer depicted in FIG. 43.

FIG. 45 to FIG. 49 schematically represent an example of a planar configuration of the second substrate 200. FIG. 45 represents a configuration of pixel circuits 210 provided near the front surface of the semiconductor layer 200S. FIG. 46 schematically represents a configuration of the wiring layer 200T (specifically a first wiring layer W1 mentioned below), and each section that is in the semiconductor layer 200S and the first substrate 100 and is connected to the wiring layer 200T. FIG. 47 to FIG. 49 represent an example of a planar configuration of the wiring layer 200T. Hereinafter, the configuration of the second substrate 200 is explained by using FIG. 45 to FIG. 49 along with FIG. 43. In FIG. 45 and FIG. 46, the outlines of photodiodes PD (the boundaries between the pixel separating section 117 and the photodiodes PD) are represented by broken lines, and the boundaries between element separation regions 213 or insulation regions 214 and the semiconductor layer 200S at portions overlapping the gate electrodes of transistors included in the pixel circuits 210 are represented by dotted lines. At each portion overlapping the gate electrode of an amplification transistor AMP, the boundary between the semiconductor layer 200S and an element separation region 213, and the boundary between the element separation region 213 and the insulation region 213 are provided on one side in the channel width direction.

The second substrate 200 is provided with the insulation region 212 that splits the semiconductor layer 200S, and the element separation regions 213 provided at parts of the semiconductor layer 200S in the thickness direction (FIG. 43). For example, in the insulation region 212 provided between two pixel circuits 210 that are adjacent to each other in direction H, through-electrodes 120E and 121E and through-electrodes TGV (through-electrodes TGV1, TGV2, TGV3 and TGV4) of two pixel sharing units 539 connected to those two pixel circuits 210 are arranged (FIG. 46).

The insulation region 212 has a thickness which is approximately the same as the thickness of the semiconductor layer 200S (FIG. 43). The semiconductor layer 200S is split by the insulation region 212. The through-electrodes 120E and 121E and the through-electrodes TGV are arranged in the insulation region 212. For example, the insulation region 212 includes silicon oxide.

The through-electrodes 120E and 121E are provided to penetrate the insulation region 212 in the thickness direction. The upper ends of the through-electrodes 120E and 121E are connected to wires (a first wire W1, a second wire W2, a third wire W3 and a fourth wire W4 mentioned below) of the wiring layer 200T. The through-electrodes 120E and 121E are provided to penetrate the insulation region 212, the junction film 124, the interlayer dielectric film 123 and the passivation film 122, and the lower ends thereof are connected to the pad sections 120 and 121 (FIG. 43). The through-electrodes 120E are for electrically connecting pad sections 120 and pixel circuits 210. That is, the through-electrodes 120E electrically connect floating diffusions FD of the first substrate 100 to the pixel circuits 210 of the second substrate 200. The through-electrodes 121E are for electrically connecting pad sections 121 and reference potential lines VSS of the wiring layer 200T. That is, the through-electrodes 121E electrically connect VSS contact regions 118 of the first substrate 100 to the reference potential lines VSS of the second substrate 200.

The through-electrodes TGV are provided to penetrate the insulation region 212 in the thickness direction. The upper ends of the through-electrodes TGV are connected to wires of wires 200T. The through-electrodes TGV are provided to penetrate the insulation region 212, the junction film 124, the interlayer dielectric film 123, the passivation film 122 and the interlayer dielectric film 119, and the lower ends thereof are connected to transfer gates TG (FIG. 43). Such through-electrodes TGV electrically connect the transfer gates TG (transfer gates TG1, TG2, TG3 and TG4) of the pixels 541A, 541B, 541C and 541D and the wires of the wiring layer 200T (some of row driving signal lines 542, specifically, wires TRG1, TRG2, TRG3 and TRG4 in FIG. 48 mentioned below). That is, the through-electrodes TGV electrically connect the transfer gates TG of the first substrate 100 to wires TRG of the second substrate 200, and driving signals are sent to the transfer transistors TR (transfer transistors TR1, TR2, TR3 and TR4).

The insulation region 212 is a region for providing the through-electrodes 120E and 121E and the through-electrodes TGV for electrically connecting the first substrate 100 and the second substrate 200 such that they are insulated from the semiconductor layer 200S. For example, in an insulation region 212 provided between two pixel circuits 210 (sharing units 539) that are adjacent to each other in direction H, through-electrodes 120E and 121E and through-electrodes TGV (through-electrodes TGV1, TGV2, TGV3 and TGV4) connected to those two pixel circuits 210 are arranged. For example, the insulation region 212 is provided extending in direction V (FIG. 45 and FIG. 46). Here, by devising the arrangement of horizontal portions TGb of transfer gates TG, the positions of the through-electrodes TGV in direction H are arranged close to the positions of the through-electrodes 120E and 121E in direction H as compared with the positions of the vertical portions TGa (FIG. 44A and FIG. 46). For example, the through-electrodes TGV are arranged at positions which are approximately the same as the positions of the through-electrodes 120E and 120E in direction H. Thereby, the through-electrodes 120E and 121E and the through-electrodes TGV can be provided together in the insulation region 212 extending in direction V. In another possible arrangement example, the horizontal portions TGb are provided only in regions that overlap the vertical portions TGa.

In this case, the through-electrodes TGV are formed approximately directly above the vertical portions TGa, and, for example, the through-electrodes TGV are arranged at approximately middle sections of the pixels 541 in direction H and direction V. At this time, the positions of the through-electrodes TGV in direction H, and the positions of the through-electrodes 120E and 121E in direction H are significantly displaced relative to each other. For example, the insulation region 212 is provided around the through-electrodes TGV and the through-electrodes 120E and 121E in order to electrically insulate them from the proximate semiconductor layer 200S. In a case where the positions of the through-electrodes TGV in direction H and the positions of the through-electrodes 120E and 121E in direction H differ significantly, it is necessary to provide the insulation region 212 independently around each of the through-electrodes 120E, 121E and TGV. Thereby, the semiconductor layer 200S is split into small pieces. As compared with this, the layout in which the through-electrodes 120E and 121E and the through-electrodes TGV are arranged together in the insulation region 212 extending in direction V allows a size increase of the semiconductor layer 200S in direction H. Therefore, it is possible to ensure that there is a large area size for the semiconductor element formation region in the semiconductor layer 200S. Thereby, for example, it becomes possible to increase the sizes of amplification transistors AMP, and suppress noise.

As explained with reference to FIG. 41, each pixel sharing unit 539 has a structure in which floating diffusions FD provided in plural pixels 541 are electrically connected with each other, and the plural pixels 541 share one pixel circuit 210. Then, electrical connection between the floating diffusions FD are formed by a pad section 120 provided in the first substrate 100 (FIG. 43 and FIG. 44B). An electrical connecting section (pad section 120) provided in the first substrate 100 and pixel circuits 210 provided in the second substrate 200 are electrically connected with each other via one through-electrode 120E. In another possible structure example, electrical connecting sections between the floating diffusions FD are provided in the second substrate 200. In this case, each pixel sharing unit 539 is provided with four through-electrodes each of which is connected to one of the floating diffusions FD1, FD2, FD3 and FD4. Accordingly, the number of through-electrodes penetrating the semiconductor layer 200S in the second substrate 200 increases, and the insulation region 212 to insulate surrounding portions of the through-electrodes becomes large. As compared with this, the structure in which the first substrate 100 is provided with pad sections 120 (FIG. 43 and FIG. 44B) makes it possible to reduce the number of through-electrodes, and to make the insulation region 212 small. Therefore, it is possible to ensure that there is a large area size for the semiconductor element formation region in the semiconductor layer 200S. Thereby, for example, it becomes possible to increase the sizes of amplification transistors AMP, and suppress noise.

The element separation regions 213 are provided on the front surface side of the semiconductor layer 200S. The element separation regions 213 have an STI (Shallow Trench Isolation) structure. In the element separation regions 213, the semiconductor layer 200S has trenches extending in the thickness direction (in a direction vertical to the main surface of the second substrate 200), and insulating films are embedded in the trenches. For example, the insulating films include silicon oxide. Each element separation region 213 element-separates plural transistors included in a pixel circuit 210 from each other according to the layout of the pixel circuit 210. The semiconductor layer 200S (specifically, the well region 211) extends below the element separation regions 213 (at a deep section of the semiconductor layer 200S).

Here, differences between the outline shapes (the outline shapes in the substrate planar surface direction) of pixel sharing units 539 in the first substrate 100, and the outline shapes of pixel sharing units 539 in the second substrate 200 are explained with reference to FIGS. 44A, 44B, and 45.

In the image pickup apparatus 1, pixel sharing units 539 are provided over both the first substrate 100 and the second substrate 200. For example, the outline shapes of the pixel sharing units 539 provided in the first substrate 100, and the outline shapes of the pixel sharing units 539 provided in the second substrate 200 are different from each other.

In FIG. 44A and FIG. 44B, the outlines of the pixels 541A, 541B, 541C and 541D are represented by dash-dotted lines, and the outline shapes of the pixel sharing units 539 are represented by bold lines. For example, each pixel sharing unit 539 of the first substrate 100 includes two pixels 541 (pixels 541A and 541B) that are arranged adjacent to each other in direction H, and two pixels 541 (pixels 541C and 541D) that are arranged adjacent to them in direction V. That is, the pixel sharing unit 539 of the first substrate 100 includes the four pixels 541 in two rows and two columns that are adjacent to each other, and the pixel sharing unit 539 of the first substrate 100 has an approximately square outline shape. In the pixel array section 540, such pixel sharing units 539 are arrayed adjacent to each other at a two-pixel pitch (a pitch corresponding to two pixels 541) in direction H, and a two-pixel pitch (a pitch corresponding to two pixels 541) in direction V.

In FIG. 45 and FIG. 46, the outlines of the pixels 541A, 541B, 541C and 541D are represented by dash-dotted lines, and the outline shapes of the pixel sharing units 539 are represented by bold lines. For example, the outline shapes of the pixel sharing units 539 of the second substrate 200 are smaller than the outline shapes of the pixel sharing units 539 of the first substrate 100 in direction H, and are larger than the outline shapes of the pixel sharing units 539 of the first substrate 100 in direction V. For example, each pixel sharing unit 539 of the second substrate 200 is formed with a size (region) corresponding to one pixel in direction H, and with a size corresponding to four pixels in direction V. That is, the pixel sharing unit 539 of the second substrate 200 is formed with a size corresponding to pixels arrayed in one row and four columns that are adjacent to each other, and the pixel sharing unit 539 of the second substrate 200 has an approximately rectangular outline shape.

For example, in each pixel circuit 210, a selection transistor SEL, an amplification transistor AMP, a reset transistor RST and an FD conversion gain switch transistor FDG are arranged next to each other in direction V in this order (FIG. 45). By providing the outline shape of each pixel circuit 210 in an approximately rectangular shape as described above, it is possible to arrange four transistors (a selection transistor SEL, an amplification transistor AMP, a reset transistor RST and an FD conversion gain switch transistor FDG) next to each other in one direction (in direction V in FIG. 45). Thereby, the drain of the amplification transistor AMP and the drain of the reset transistor RST can share one diffusion region (a diffusion region connected to a power line VDD). For example, it is also possible to provide the formation region of each pixel circuit 210 in an approximately square shape (see FIG. 58 mentioned below). In this case, two transistors are arranged in one direction, and it becomes difficult for the drain of the amplification transistor AMP and the drain of the reset transistor RST to share one diffusion region. Therefore, by providing the formation region of each pixel circuit 210 in an approximately rectangular shape, it becomes easier to arrange four transistors proximately to each other, and it is possible to make the formation region of the pixel circuit 210 smaller. That is, miniaturization of pixels is possible. In addition, when it is not necessary to make the formation region of each pixel circuit 210 smaller, it becomes possible to make the formation region of each amplification transistor AMP larger, and suppress noise.

For example, in addition to selection transistors SEL, amplification transistors AMP, reset transistors RST and FD conversion gain switch transistors FDG, VSS contact regions 218 connected to reference potential lines VSS are provided near the front surface of the semiconductor layer 200S. For example, the VSS contact regions 218 include p-type semiconductor regions. The VSS contact regions 218 are electrically connected to VSS contact regions 118 of the first substrate 100 (semiconductor layer 100S) via wires of the wiring layer 200T and through-electrodes 121E. For example, the VSS contact regions 218 are provided at positions that are adjacent to the sources of FD conversion gain switch transistors FDG with element separation regions 213 being interposed therebetween (FIG. 45).

Next, the positional relation between pixel sharing units 539 provided in the first substrate 100 and pixel sharing units 539 provided in the second substrate 200 is explained with reference to FIG. 44B and FIG. 45. For example, one pixel sharing unit 539 (e.g., one on the upper side on the paper surface of FIG. 44B) in two pixel sharing units 539 of the first substrate 100 that are next to each other in direction V is connected to one pixel sharing unit 539 (e.g., one on the left side on the paper surface of FIG. 45) in two pixel sharing units 539 of the second substrate 200 that are next to each other in direction H. For example, the other pixel sharing unit 539 (e.g., one on the lower side on the paper surface of FIG. 44B) in the two pixel sharing units 539 of the first substrate 100 that are next to each other in direction V is connected to the other pixel sharing unit 539 (e.g., one on the right side on the paper surface of FIG. 45) in the two pixel sharing units 539 of the second substrate 200 that are next to each other in direction H.

For example, the internal layout (the arrangement of transistors or the like) of one pixel sharing unit 539 in two pixel sharing units 539 of the second substrate 200 that are next to each other in direction H is approximately equal to an inversion in direction V and direction H of the internal layout of the other pixel sharing unit 539. Hereinafter, advantages attained by this layout are explained.

In two pixel sharing units 539 of the first substrate 100 that are next to each other in direction V, each pad section 120 is arranged at a middle section of the outline shape of a pixel sharing unit 539, that is, at a middle section of the pixel sharing unit 539 in direction V and direction H (FIG. 44B). On the other hand, because pixel sharing units 539 of the second substrate 200 have approximately rectangular outline shapes that are long in direction V as described above, for example, an amplification transistor AMP connected to a pad section 120 is arranged at a position that is displaced upward on the paper surface from the middle of a pixel sharing unit 539 in direction V. For example, when the internal layouts of two pixel sharing units 539 of the second substrate 200 that are next to each other in direction H are the same, the distance between an amplification transistor AMP of one pixel sharing unit 539, and a pad section 120 (e.g., a pad section 120 of a pixel sharing unit 539 on the upper side on the paper surface of FIG. 76) becomes relatively short. However, the distance between an amplification transistor AMP of the other pixel sharing unit 539 and a pad section 120 (e.g., a pad section 120 of a pixel sharing unit 539 on the lower side on the paper surface of FIG. 76) becomes long. Because of this, the area size of a wire required for connection between the amplification transistor AMP and the pad section 120 becomes large, and there is a risk that the wiring layout of the pixel sharing unit 539 becomes complicated. There is a possibility that this influences miniaturization of the image pickup apparatus 1.

In contrast to this, by inverting, relative to each other at least in direction V, the internal layouts of two pixel sharing units 539 of the second substrate 200 that are next to each other in direction H, the distance between each pair of an amplification transistors AMP and a pad section 120 of both the two pixel sharing units 539 can be made short. Accordingly, as compared with the configuration in which the internal layouts of two pixel sharing units 539 of the second substrate 200 that are next to each other in direction H are made the same, miniaturization of the image pickup apparatus 1 becomes easy. Note that the planar layout of each of plural pixel sharing units 539 of the second substrate 200 is symmetric in the left and right directions in the area described in FIG. 45, but is asymmetric in the left and right directions in an area including the layout of the first wiring layer W1 described in FIG. 46 mentioned below.

In addition, the internal layouts of two pixel sharing units 539 of the second substrate 200 that are next to each other in direction H are preferably inverted also in direction H relative to each other. Hereinafter, reasons for this are explained. As depicted in FIG. 46, each of two pixel sharing units 539 of the second substrate 200 that are next to each other in direction H is connected to pad sections 120 and 121 of the first substrate 100. For example, pad sections 120 and 121 are arranged at middle sections in direction H (between two pixel sharing units 539 that are next to each other in direction H) of the two pixel sharing units 539 of the second substrate 200 that are next to each other in direction H. Accordingly, by inverting, relative to each other also in direction H, the internal layouts of the two pixel sharing units 539 of the second substrate 200 that are next to each other in direction H, the distances between each of plural pixel sharing units 539 of the second substrate 200 and pad sections 120 and 121 can be reduced. That is, miniaturization of the image pickup apparatus 1 becomes further easier.

In addition, the position of the outline of each pixel sharing unit 539 of the second substrate 200 does not have to be aligned with the outline of any of pixel sharing units 539 of the first substrate 100. For example, regarding one pixel sharing unit 539 (e.g., one on the left side on the paper surface of FIG. 46) in two pixel sharing units 539 of the second substrate 200 that are next to each other in direction H, the outline of one side (e.g., the upper side on the paper surface of FIG. 46) in direction V is arranged outside the outline on one side in direction V of a corresponding pixel sharing unit 539 (e.g., one on the upper side on the paper surface of FIG. 44B) of the first substrate 100. In addition, regarding the other pixel sharing unit 539 (e.g., one on the right side on the paper surface of FIG. 46) in the two pixel sharing units 539 of the second substrate 200 that are next to each other in direction H, the outline of the other side (e.g., the lower side on the paper surface of FIG. 46) in direction V is arranged outside the outline on the other side in direction V of a corresponding pixel sharing unit 539 (e.g., one on the lower side on the paper surface of FIG. 44B) of the first substrate 100. By arranging pixel sharing units 539 of the second substrate 200 and pixel sharing units 539 of the first substrate 100 relative to each other in such a manner, it becomes possible to make the distance between each pair of an amplification transistor AMP and a pad section 120 shorter. Accordingly, miniaturization of the image pickup apparatus 1 becomes easier.

In addition, the positions of the outlines of plural pixel sharing units 539 of the second substrate 200 may not be aligned with each other. For example, the positions in direction V of the outlines of two pixel sharing units 539 of the second substrate 200 that are next to each other in direction H are arranged by being displaced relative to each other. Thereby, it becomes possible to make the distance between each pair of an amplification transistor AMP and a pad section 120 shorter. Accordingly, miniaturization of the image pickup apparatus 1 becomes easier.

Repetitive arrangement of pixel sharing units 539 in the pixel array section 540 is explained with reference to FIG. 44B and FIG. 46. Pixel sharing units 539 of the first substrate 100 have sizes of two pixels 541 in direction H, and sizes of two pixels 541 in direction V (FIG. 44B). For example, in the pixel array section 540 of the first substrate 100, the pixel sharing units 539 with sizes corresponding to four pixels 541 are arrayed adjacent to each other repetitively at a two-pixel pitch (a pitch corresponding to two pixels 541) in direction H, and a two-pixel pitch (a pitch corresponding to two pixels 541) in direction V. Alternatively, in the pixel array section 540 of the first substrate 100, a pair of pixel sharing units 539 including two pixel sharing units 539 that are arranged adjacent to each other in direction V may be provided. For example, in the pixel array section 540 of the first substrate 100, the pair of pixel sharing units 539 are arrayed adjacent to each other repetitively at a two-pixel pitch (a pitch corresponding to two pixels 541) in direction H, and a four-pixel pitch (a pitch corresponding to four pixels 541) in direction V. Pixel sharing units 539 of the second substrate 200 have sizes of one pixel 541 in direction H, and sizes of four pixels 541 in direction V (FIG. 46). For example, in the pixel array section 540 of the second substrate 200, a pair of pixel sharing units 539 including the two pixel sharing units 539 with sizes corresponding to four pixels 541 is provided. The pixel sharing units 539 are arranged adjacent to each other in direction H, and arranged by being displaced relative to each other in direction V. For example, in the pixel array section 540 of the second substrate 200, the pair of pixel sharing units 539 are arrayed adjacent to each other without gaps repetitively at a two-pixel pitch (a pitch corresponding to two pixels 541) in direction H, and a four-pixel pitch (a pitch corresponding to four pixels 541) in direction V. Such repetitive arrangement of the pixel sharing units 539 makes it possible to arrange the pixel sharing units 539 without gaps. Accordingly, miniaturization of the image pickup apparatus 1 becomes easier.

For example, amplification transistors AMP preferably have a three-dimensional structure such as a Fin type structure (FIG. 43). Thereby, the sizes of effective gate widths become large, and it becomes possible to suppress noise. For example, selection transistors SEL, reset transistors RST and FD conversion gain switch transistors FDG have planar structures. Amplification transistors AMP may have a planar structure. Alternatively, selection transistors SEL, reset transistors RST or FD conversion gain switch transistors FDG may have a three-dimensional structure.

For example, the wiring layer 200T includes a passivation film 221, an interlayer dielectric film 222 and plural wires (a first wiring layer W1, a second wiring layer W2, a third wiring layer W3 and a fourth wiring layer W4). For example, the passivation film 221 is in contact with the front surface of the semiconductor layer 200S, and covers the entire front surface of the semiconductor layer 200S. The passivation film 221 covers the gate electrode of each of selection transistors SEL, amplification transistors AMP, reset transistors RST and FD conversion gain switch transistors FDG. The interlayer dielectric film 222 is provided between the passivation film 221 and the third substrate 300. The interlayer dielectric film 222 separates the plural wires (the first wiring layer W1, the second wiring layer W2, the third wiring layer W3 and the fourth wiring layer W4). For example, the interlayer dielectric film 222 includes silicon oxide.

For example, in the wiring layer 200T, the first wiring layer W1, the second wiring layer W2, the third wiring layer W3, the fourth wiring layer W4 and the contact sections 201 and 202 are provided in this order from the semiconductor layer 200S side, and these are insulated from each other by the interlayer dielectric film 222. The interlayer dielectric film 222 is provided with plural connecting sections that connect the first wiring layer W1, the second wiring layer W2, the third wiring layer W3 or the fourth wiring layer W4 and a layer underlying the layer. The connecting sections are portions formed by embedding an electrically conductive material in connection holes provided through the interlayer dielectric film 222. For example, the interlayer dielectric film 222 is provided with connecting sections 218V that connect the first wiring layer W1 and VSS contact regions 218 of the semiconductor layer 200S. For example, the hole sizes of such connecting sections that connect elements of the second substrate 200 are different from the hole sizes of through-electrodes 120E and 121E and through-electrodes TGV. Specifically, the hole sizes of the connection holes connecting elements of the second substrate 200 are preferably smaller than the hole sizes of the through-electrodes 120E and 121E and the through-electrodes TGV. Hereinafter, reasons for this are explained. The depths of connecting sections (the connecting sections 218V, etc.) provided in the wiring layer 200T are shallower than the depths of the through-electrodes 120E and 121E and the through-electrodes TGV. Because of this, it is possible to embed the electrically conductive material in the connection holes of the connecting sections easily as compared with the through-electrodes 120E and 121E and the through-electrodes TGV. By making the hole sizes of the connecting sections smaller than the hole sizes of the through-electrodes 120E and 121E and the through-electrodes TGV, miniaturization of the image pickup apparatus 1 becomes easier.

For example, the first wiring layer W1 connects through-electrodes 120E, and the gates of amplification transistors AMP and the sources of FD conversion gain switch transistors FDG (specifically, connection holes reaching the sources of the FD conversion gain switch transistors FDG). For example, the first wiring layer W1 connects through-electrodes 121E and connecting sections 218V, and thereby electrically connects VSS contact regions 218 of the semiconductor layer 200S and VSS contact regions 118 of the semiconductor layer 100S.

Next, a planar configuration of the wiring layer 200T is explained by using FIG. 47 to FIG. 49. FIG. 47 represents an example of a planar configuration of the first wiring layer W1 and the second wiring layer W2. FIG. 48 represents an example of a planar configuration of the second wiring layer W2 and the third wiring layer W3. FIG. 49 represents an example of a planar configuration of the third wiring layer W3 and the fourth wiring layer W4.

For example, the third wiring layer W3 includes wires TRG1, TRG2, TRG3, TRG4, SELL, RSTL and FDGL extending in direction H (row direction) (FIG. 48). These wires correspond to the plural row driving signal lines 542 explained with reference to FIG. 41. Each of the wires TRG1, TRG2, TRG3 and TRG4 is for sending a driving signal to a corresponding one of the transfer gates TG1, TG2, TG3 and TG4. Each of the wires TRG1, TRG2, TRG3 and TRG4 is connected to the corresponding one of the transfer gates TG1, TG2, TG3 and TG4 via the second wiring layer W2, the first wiring layer W1 and a through-electrode 120E. A wire SELL, a wire RSTL and a wire FDGL are for sending driving signals to the gate of a selection transistor SEL, the gate of a reset transistor RST and the gate of an FD conversion gain switch transistor FDG, respectively. The wires SELL, RSTL and FDGL are connected to the gates of the selection transistor SEL, the reset transistor RST and the FD conversion gain switch transistor FDG, respectively, via the second wiring layer W2, the first wiring layer W1 and a connecting section.

For example, the fourth wiring layer W4 includes power lines VDD, reference potential lines VSS and vertical signal lines 543 extending in direction V (column direction) (FIG. 49). The power lines VDD are connected to the drains of amplification transistors AMP and the drains of reset transistors RST via the third wiring layer W3, the second wiring layer W2, the first wiring layer W1 and connecting sections. The reference potential lines VSS are connected to VSS contact regions 218 via the third wiring layer W3, the second wiring layer W2, the first wiring layer W1 and connecting sections 218V. In addition, the reference potential lines VSS are connected to VSS contact regions 118 of the first substrate 100 via the third wiring layer W3, the second wiring layer W2, the first wiring layer W1, through-electrodes 121E and pad sections 121. The vertical signal lines 543 are connected to the sources (Vout) of selection transistors SEL via the third wiring layer W3, the second wiring layer W2, the first wiring layer W1 and connecting sections.

Contact sections 201 and 202 may be provided at positions overlapping the pixel array section 540 when seen in a plan view (e.g., FIG. 40), or may be provided in the peripheral section 540B outside the pixel array section 540 (e.g., FIG. 43). The contact sections 201 and 202 are provided on the front surface (a surface on the wiring layer 200T side) of the second substrate 200. For example, the contact sections 201 and 202 include metal such as Cu (copper) or Al (aluminum). The contact sections 201 and 202 are exposed at the front surface (a surface on the third substrate 300 side) of the wiring layer 200T. The contact sections 201 and 202 are used for electrically connecting the second substrate 200 and the third substrate 300, and for pasting together the second substrate 200 and the third substrate 300.

FIG. 43 depicts an example in which peripheral circuits are provided in the peripheral section 540B of the second substrate 200. The peripheral circuits may include a part of the row driving section 520, a part of the column signal processing section 550 or the like. In addition, as described in FIG. 40, peripheral circuits may not be arranged in the peripheral section 540B of the second substrate 200, and the connection hole sections H1 and H2 may be arranged near the pixel array section 540.

For example, the third substrate 300 has the wiring layer 300T and the semiconductor layer 300S in this order from the second substrate 200 side. For example, the front surface of the semiconductor layer 300S is provided on the second substrate 200 side. The semiconductor layer 300S includes a silicon substrate. Portions on the front surface side of the semiconductor layer 300S are provided with circuits. Specifically, for example, the portions on the front surface side of the semiconductor layer 300S are provided with at least some of the input section 510A, the row driving section 520, the timing control section 530, the column signal processing section 550, the image signal processing section 560 and the output section 510B. For example, the wiring layer 300T provided between the semiconductor layer 300S and the second substrate 200 includes an interlayer dielectric film, plural wiring layers separated by the interlayer dielectric film, and contact sections 301 and 302. The contact sections 301 and 302 are exposed at the front surface (a surface on the second substrate 200 side) of the wiring layer 300T, the contact section 301 is in contact with a contact section 201 of the second substrate 200, and the contact section 302 is in contact with a contact section 202 of the second substrate 200. The contact sections 301 and 302 are electrically connected to circuits (e.g., at least any of the input section 510A, the row driving section 520, the timing control section 530, the column signal processing section 550, the image signal processing section 560 and the output section 510B) formed in the semiconductor layer 300S. For example, the contact sections 301 and 302 include metal such as Cu (copper) or aluminum (Al). For example, an external terminal TA is connected to the input section 510A via the connection hole section H1, and an external terminal TB is connected to the output section 510B via the connection hole section H2.

Here, features of the image pickup apparatus 1 are explained.

Typically, an image pickup apparatus includes photodiodes and pixel circuits as a main configuration. Here, if the area sizes of the photodiodes are increased, electric charge that is generated as a result of photoelectric conversion increases; as a result, the signal/noise ratio (S/N ratio) of pixel signals is improved, and the image pickup apparatus can output better image data (image information). On the other hand, if the sizes of transistors (particularly, the sizes of amplification transistors) included in the pixel circuits are increased, noise that is generated in the pixel circuits decreases; as a result, the S/N ratio of image pickup signals is improved, and the image pickup apparatus can output better image data (image information).

However, if the area sizes of photodiodes are increased within a limited area size of a semiconductor substrate in an image pickup apparatus in which the photodiodes and pixel circuits are provided in the same semiconductor substrate, it can be considered that the sizes of transistors included in the pixel circuits become smaller inevitably. In addition, if the sizes of the transistors included in the pixel circuits are increased, it can be considered that the area sizes of the photodiodes become smaller inevitably.

In order to solve these problems, for example, the image pickup apparatus 1 according to the present embodiment uses a structure in which plural pixels 541 share one pixel circuit 210, and the shared pixel circuit 210 is arranged to overlap photodiodes PD. Thereby, it is possible to realize the largest possible increases of the area sizes of photodiodes PD, and the largest possible increases of the sizes of transistors provided in the pixel circuits 210 within a limited area size of semiconductor substrates. Thereby, the S/N ratio of pixel signals can be improved, and the image pickup apparatus 1 can output better image data (image information).

When a structure in which plural pixels 541 share one pixel circuit 210, and the one pixel circuit 210 is arranged to overlap photodiodes PD is realized, there are plural wires extending from floating diffusions FD of the plural pixels 541, and being connected to the one pixel circuit 210. In order to ensure that there is a large area size for formation of pixel circuits 210 in the semiconductor substrate 200, for example, a connection wire that connects the plural extending wires with each other into one can be formed. The same applies also to plural wires extending from VSS contact regions 118, and a connection wire that connects the plural extending wires with each other into one can be formed.

For example, if the connection wire that connects the plural wires extending from the floating diffusions FD of the plural pixels 541 with each other is formed in the semiconductor substrate 200 in which pixel circuits 210 are formed, it can be considered that the area sizes for forming transistors included in the pixel circuits 210 become smaller inevitably. Similarly, if the connection wire that connects the plural wires extending from the VSS contact regions 118 of the plural pixels 541 with each other into one is formed in the semiconductor substrate 200 in which the pixel circuits 210 are formed, it can be considered that the area sizes for forming the transistors included in the pixel circuits 210 become smaller inevitably.

In order to solve these problems, for example, the image pickup apparatus 1 according to the present embodiment can include a structure in which plural pixels 541 share one pixel circuit 210, and the shared pixel circuit 210 is arranged to overlap photodiodes PD, and a structure in which a connection wire that connects floating diffusions FD of the plural pixels 541 with each other into one, and a connection wire that connects VSS contact regions 118 of the plural pixels 541 with each other into one are provided in the first substrate 100.

Here, if the second manufacturing method mentioned earlier is used as a manufacturing method for providing the first substrate 100 with the connection wire that connects the floating diffusions FD of the plural pixels 541 with each other into one, and the connection wire that connects the VSS contact regions 118 of the plural pixels 541 with each other into one, for example, it can be manufactured by using processes that are appropriate according to the configuration of each of the first substrate 100 and the second substrate 200, and a high-quality, high-performance image pickup apparatus can be manufactured. In addition, connection wires of the first substrate 100 and the second substrate 200 can be formed with easy processes. Specifically, in a case where the second manufacturing method described above is used, the front surface of the first substrate 100 and the front surface of the second substrate 200 which surfaces become boundary surfaces on which the first substrate 100 and the second substrate 200 are pasted together are provided with electrodes to be connected to the floating diffusions FD, and electrodes to be connected to the VSS contact regions 118. Further, electrodes that are formed in the front surfaces of the first substrate 100 and the second substrate 200 are made larger preferably such that the electrodes formed in the front surfaces of these two substrates come into contact with each other even if positional misalignment occurs between the electrodes provided in these two substrates when the front surfaces of these two substrates are pasted together. In this case, it can be considered that it inevitably becomes difficult to arrange the electrodes described above within a limited area size of each pixel provided in the image pickup apparatus 1.

In order to solve a problem that it becomes necessary to form large electrodes at the boundary surfaces on which the first substrate 100 and the second substrate 200 are pasted together, for example, the first manufacturing method mentioned earlier can be used as a method of manufacturing the image pickup apparatus 1 according to the present embodiment in which plural pixels 541 share one pixel circuit 210, and the shared pixel circuit 210 is arranged to overlap photodiodes PD. Thereby, alignment of elements formed in each of the first substrate 100 and the second substrate 200 becomes easier, and a high-quality, high-performance image pickup apparatus can be manufactured. Further, a unique structure that is generated by using this manufacturing method can be provided. That is, the image pickup apparatus includes a structure in which the semiconductor layer 100S and the wiring layer 100T of the first substrate 100, and the semiconductor layer 200S and the wiring layer 200T of the second substrate 200 are stacked one on another in this order, in other words, a structure in which the first substrate 100 and the second substrate 200 are stacked one on another face-to-back, and the image pickup apparatus includes through-electrodes 120E and 121E that penetrate the semiconductor layer 200S of the second substrate 200 and the wiring layer 100T of the first substrate 100 from the front surface side of the semiconductor layer 200S, and reach the front surface of the semiconductor layer 100S of the first substrate 100.

If the structure in which the connection wire that connects the floating diffusions FD of the plural pixels 541 with each other into one, and the connection wire that connects the VSS contact regions 118 of the plural pixels 541 with each other into one are provided in the first substrate 100, and the second substrate 200 are stacked one on another by using the first manufacturing method, and the pixel circuits 210 are formed in the second substrate 200, there is a possibility that influence of a heating process that is necessary when active elements provided in the pixel circuits 210 are formed inevitably reaches the connection wires described above formed in the first substrate 100.

In view of this, in order to solve the problem that the influence of the heating process when the active elements described above are formed inevitably reaches the connection wires described above, the image pickup apparatus 1 according to the present embodiment desirably uses a highly heat-resistant electrically conductive material for the connection wire that connects the floating diffusions FD of the plural pixels 541 with each other into one, and the connection wire that connects the VSS contact regions 118 of the plural pixels 541 with each other into one. Specifically, as the highly heat-resistant electrically conductive material, a material having a melting point higher than that of at least some of wire materials included in the wiring layer 200T of the second substrate 200 can be used.

In such a manner, for example, the image pickup apparatus 1 according to the present embodiment includes: (1) the structure in which the first substrate 100 and the second substrate 200 are stacked one on another face-to-back (specifically, the structure in which the semiconductor layer 100S and the wiring layer 100T of the first substrate 100, and the semiconductor layer 200S and the wiring layer 200T of the second substrate 200 are stacked one on another in this order); (2) the structure in which the through-electrodes 120E and 121E that penetrate the semiconductor layer 200S of the second substrate 200 and the wiring layer 100T of the first substrate 100 from the front surface side of the semiconductor layer 200S, and reach the front surface of the semiconductor layer 100S of the first substrate 100 are provided; and (3) the structure in which the connection wire that connects the floating diffusions FD provided in the plural pixels 541 with each other into one, and the connection wire that connects the VSS contact regions 118 provided in the plural pixels 541 with each other into one include a highly heat-resistant electrically conductive material. Because of this, it is made possible to provide the first substrate 100 with the connection wire that connects the floating diffusions FD provided in the plural pixels 541 with each other into one, and the connection wire that connects the VSS contact regions 118 provided in the plural pixels 541 with each other into one, without including large electrodes at the interface between the first substrate 100 and the second substrate 200.

[Operation of Image Pickup Apparatus 1]

Figure 50:
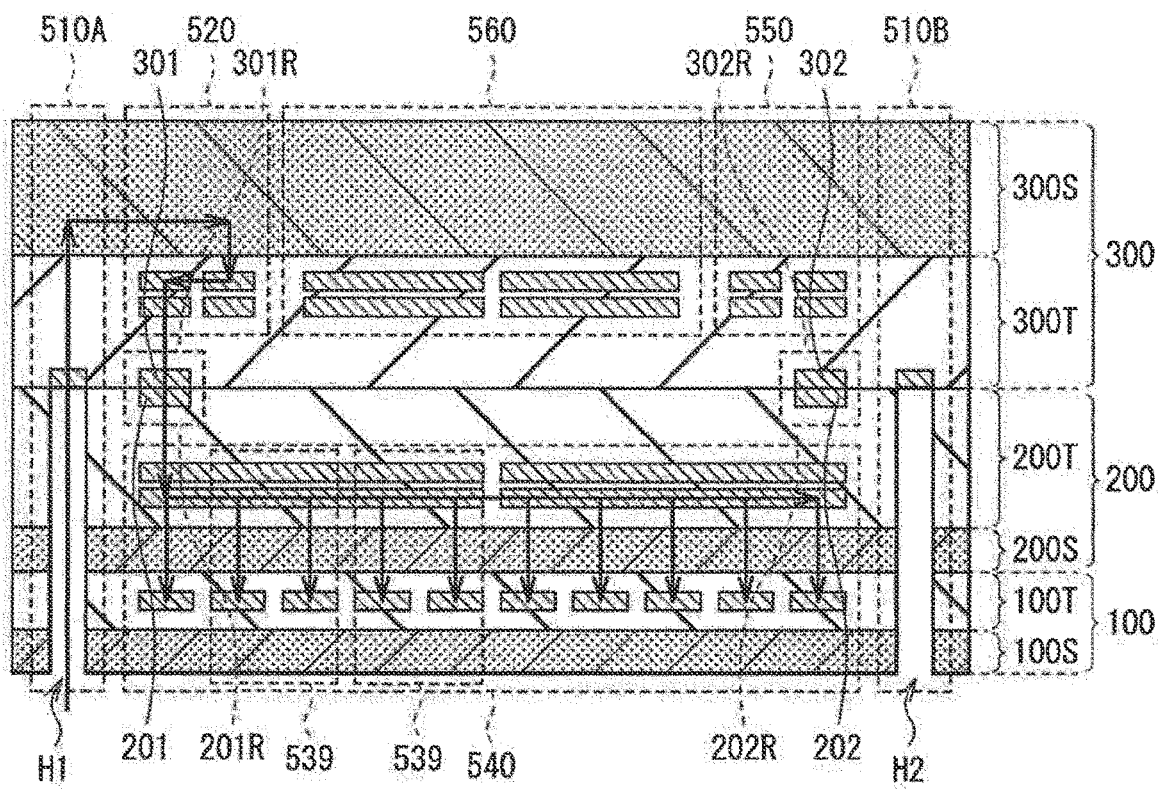
FIG. 50 is a schematic diagram for explaining paths of signals input to the image pickup apparatus depicted in FIG. 40.
Figure 51:
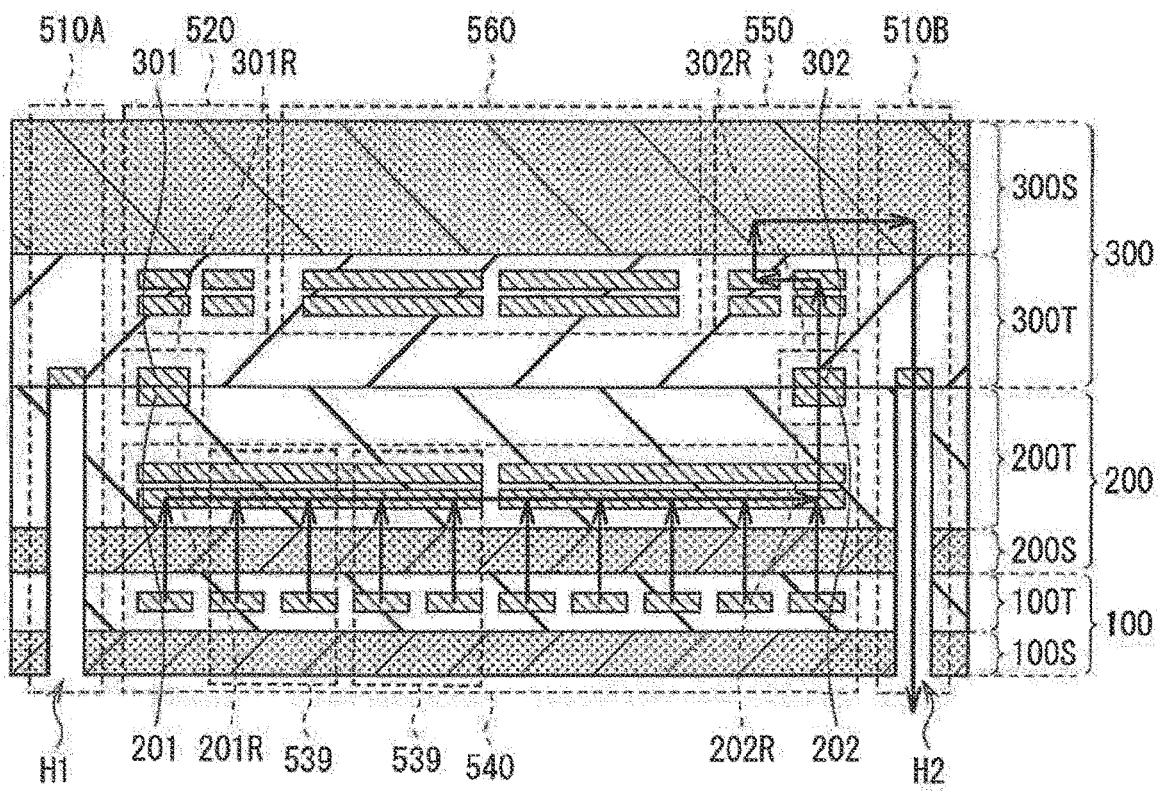
FIG. 51 is a schematic diagram for explaining signal paths of pixel signals of the image pickup apparatus depicted in FIG. 40.

Next, operation of the image pickup apparatus 1 is explained by using FIG. 50 and FIG. 51. As compared with FIG. 40, FIG. 50 and FIG. 51 additionally depict arrows representing paths of signals. FIG. 50 represents paths of an input signal input to the image pickup apparatus 1 from the outside, and a power supply potential and a reference potential with arrows. FIG. 51 represents signal paths of pixel signals output from the image pickup apparatus 1 to the outside with arrows. For example, the input signal (e.g., a pixel clock and synchronization signal) input to the image pickup apparatus 1 via the input section 510A is transferred to the row driving section 520 of the third substrate 300, and row driving signals are produced at the row driving section 520. The row driving signals are sent to the second substrate 200 via the contact sections 301 and 201. Further, the row driving signals reach pixel sharing units 539 of the pixel array section 540 via row driving signal lines 542 in the wiring layer 200T. In the row driving signals having reached the pixel sharing units 539 of the second substrate 200, driving signals other than those for transfer gates TG are input to pixel circuits 210, and transistors included in the pixel circuits 210 are driven. The driving signals for the transfer gates TG are input to transfer gates TG1, TG2, TG3 and TG4 of the first substrate 100 via through-electrodes TGV, and pixels 541A, 541B, 541C and 541D are driven (FIG. 50). In addition, the power supply potential and the reference potential supplied from the outside of the image pickup apparatus 1 to the input section 510A (input terminal 511) of the third substrate 300 are sent to the second substrate 200 via the contact sections 301 and 201, and are supplied to the pixel circuits 210 of the pixel sharing units 539 via wires in the wiring layer 200T. The reference potential is further supplied also to the pixels 541A, 541B, 541C and 541D of the first substrate 100 via through-electrodes 121E. On the other hand, pixel signals photoelectrically converted at the pixels 541A, 541B, 541C and 541D of the first substrate 100 are sent to pixel circuits 210 of the second substrate 200 for each pixel sharing unit 539 via the through-electrodes 120E. Pixel signals based on the pixel signals are sent from the pixel circuits 210 to the third substrate 300 via vertical signal lines 543 and the contact sections 202 and 302. The pixel signals are processed at the column signal processing section 550 and the image signal processing section 560 of the third substrate 300, and then are output to the outside via the output section 510B.

[Advantages]

In the present embodiment, pixels 541A, 541B, 541C and 541D (pixel sharing units 539), and pixel circuits 210 are provided in different substrates (the first substrate 100 and the second substrate 200). Thereby, as compared with a case where the pixels 541A, 541B, 541C and 541D and the pixel circuit 210 are formed in the same substrate, the area sizes of the pixels 541A, 541B, 541C and 541D and the pixel circuit 210 can be expanded. As a result, the amounts of pixel signals obtained by photoelectric conversion can be increased, and transistor noise of the pixel circuits 210 can be reduced. Thereby, the signal/noise ratio of pixel signals can be improved, and the image pickup apparatus 1 can output better pixel data (image information). In addition, miniaturization of the image pickup apparatus 1 (i.e., reduction of pixel sizes, and size reduction of the image pickup apparatus 1) becomes possible. Due to the reduction of pixel sizes, the image pickup apparatus 1 can have a larger number of pixels per unit area size, and can output high image-quality images.

In addition, in the image pickup apparatus 1, the first substrate 100 and the second substrate 200 are electrically connected with each other by through-electrodes 120E and 121E provided in the insulation region 212. For example, possible methods include a method in which the first substrate 100 and the second substrate 200 are connected by junctions between pad electrodes, and a method in which the first substrate 100 and the second substrate 200 are connected by through-wires (e.g., TSVs (Thorough Si Vias)) that penetrate semiconductor layers. As compared with such methods, by providing the through-electrodes 120E and 121E in the insulation region 212, it is possible to reduce area sizes necessary for connection of the first substrate 100 and the second substrate 200. Thereby, pixel sizes can be reduced, and the size of the image pickup apparatus 1 can be reduced further. In addition, further miniaturization of the area size per pixel enables a higher resolution. When it is not necessary to reduce the chip sizes, the formation regions of pixels 541A, 541B, 541C and 541D and pixel circuits 210 can be expanded. As a result, the amounts of pixel signals obtained by photoelectric conversion can be increased, and noise of transistors provided in the pixel circuits 210 can be reduced. Thereby, the signal/noise ratio of pixel signals can be improved, and the image pickup apparatus 1 can output better pixel data (image information).

In addition, in the image pickup apparatus 1, pixel circuits 210, and the column signal processing section 550 and the image signal processing section 560 are provided in different substrates (the second substrate 200 and the third substrate 300). Thereby, as compared with a case where the pixel circuits 210, and the column signal processing section 550 and the image signal processing section 560 are formed in the same substrate, the area size for the pixel circuits 210, and the area size for the column signal processing section 550 and the image signal processing section 560 can be expanded. Thereby, it becomes possible to reduce noise that occurs in the column signal processing section 550, mount a more advanced image processing circuit on the image signal processing section 560, and so on. Therefore, the signal/noise ratio of pixel signals can be improved, and the image pickup apparatus 1 can output better pixel data (image information).

In addition, in the image pickup apparatus 1, the pixel array section 540 is provided in the first substrate 100 and the second substrate 200, and the column signal processing section 550 and the image signal processing section 560 are provided in the third substrate 300. In addition, contact sections 201, 202, 301 and 302 that connect the second substrate 200 and the third substrate 300 are formed above the pixel array section 540. Because of this, it becomes possible for the contact sections 201, 202, 301 and 302 to have a freer layout without being interfered by various types of wires provided in the pixel array in terms of layouts. Thereby, it becomes possible to use the contact sections 201, 202, 301 and 302 for electrical connection between the second substrate 200 and the third substrate 300. By using the contact sections 201, 202, 301 and 302, for example, the degree of freedom of the layout of the column signal processing section 550 and the image signal processing section 560 becomes higher. Thereby, it becomes possible to reduce noise that occurs in the column signal processing section 550, mount a more advanced image processing circuit on the image signal processing section 560, and so on. Accordingly, the signal/noise ratio of pixel signals can be improved, and the image pickup apparatus 1 can output better pixel data (image information).

In addition, in the image pickup apparatus 1, the pixel separating section 117 penetrates the semiconductor layer 100S. Thereby, even in a case where the distances between adjacent pixels (pixels 541A, 541B, 541C and 541D) become shorter due to miniaturization of the area size per pixel, color mixing between the pixels 541A, 541B, 541C and 541D can be suppressed. Thereby, the signal/noise ratio of pixel signals can be improved, and the image pickup apparatus 1 can output better pixel data (image information).

In addition, in the image pickup apparatus 1, a pixel circuit 210 is provided for each pixel sharing unit 539. Thereby, as compared with a case where a pixel circuit 210 is provided for each of the pixels 541A, 541B, 541C and 541D, the formation regions for transistors (amplification transistors AMP, reset transistors RST, selection transistors SEL and FD conversion gain switch transistors FDG) included in the pixel circuits 210 can be increased. For example, by increasing the formation regions for the amplification transistors AMP, it becomes possible to suppress noise. Thereby, the signal/noise ratio of pixel signals can be improved, and the image pickup apparatus 1 can output better pixel data (image information).

Further, in the image pickup apparatus 1, pad sections 120 each of which electrically connects floating diffusions FD (floating diffusions FD1, FD2, FD3 and FD4) of four pixels (pixels 541A, 541B, 541C and 541D) are provided in the first substrate 100. Thereby, as compared with a case where such pad sections 120 are provided in the second substrate 200, the number of through-electrodes (through-electrodes 120E) that connect the first substrate 100 and the second substrate 200 can be reduced. Accordingly, it is possible to make the insulation region 212 small, and to ensure that there is a sufficiently large formation region (semiconductor layer 200S) for transistors included in the pixel circuits 210. Thereby, it becomes possible to reduce noise of the transistors included in the pixel circuits 210, it becomes possible to improve the signal/noise ratio of pixel signals, and the image pickup apparatus 1 can output better pixel data (image information).

Hereinafter, modification examples of the image pickup apparatus 1 according to the embodiment described above are explained. In the following modification examples, configurations which are the same as those in the embodiment described above are explained by giving them identical reference characters.

2. First Modification Example

Figure 52:
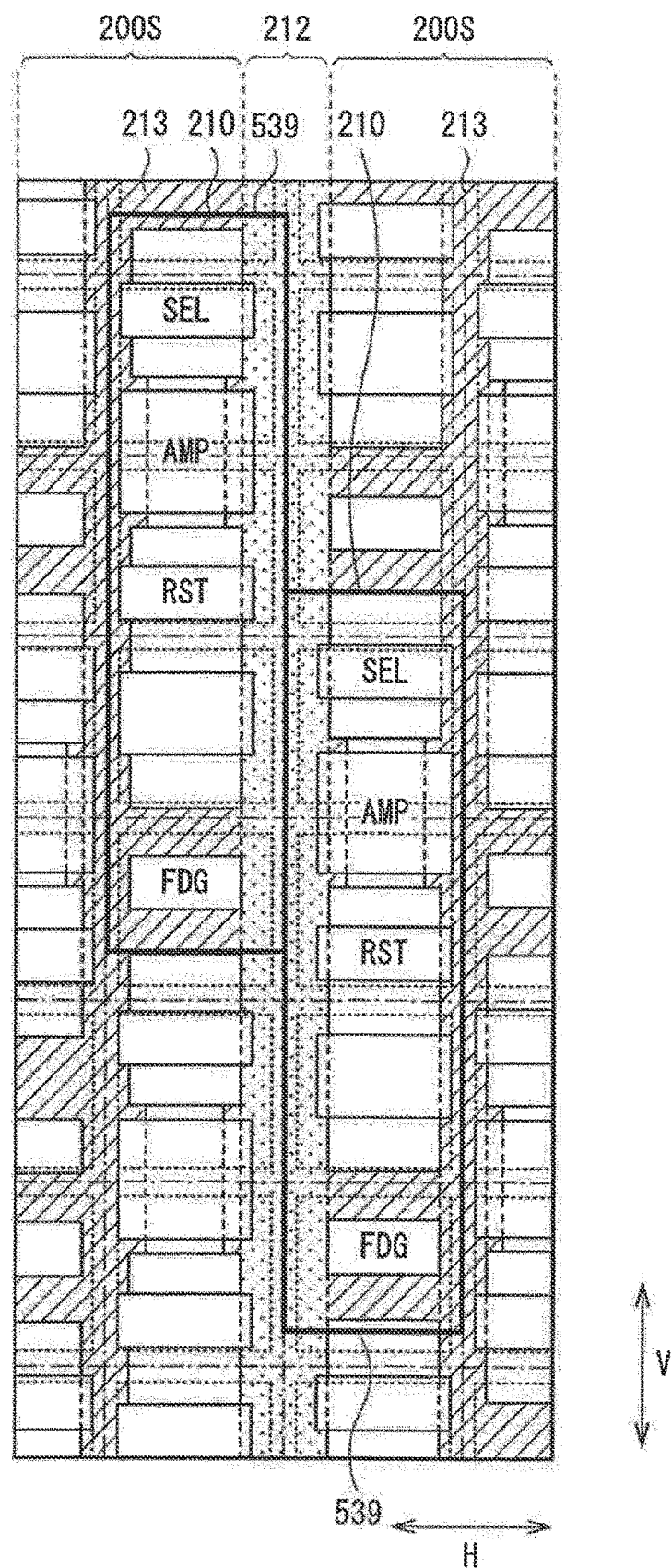
FIG. 52 is a schematic diagram representing a modification example of a planar configuration of the second substrate (semiconductor layer) depicted in FIG. 45.
Figure 53:
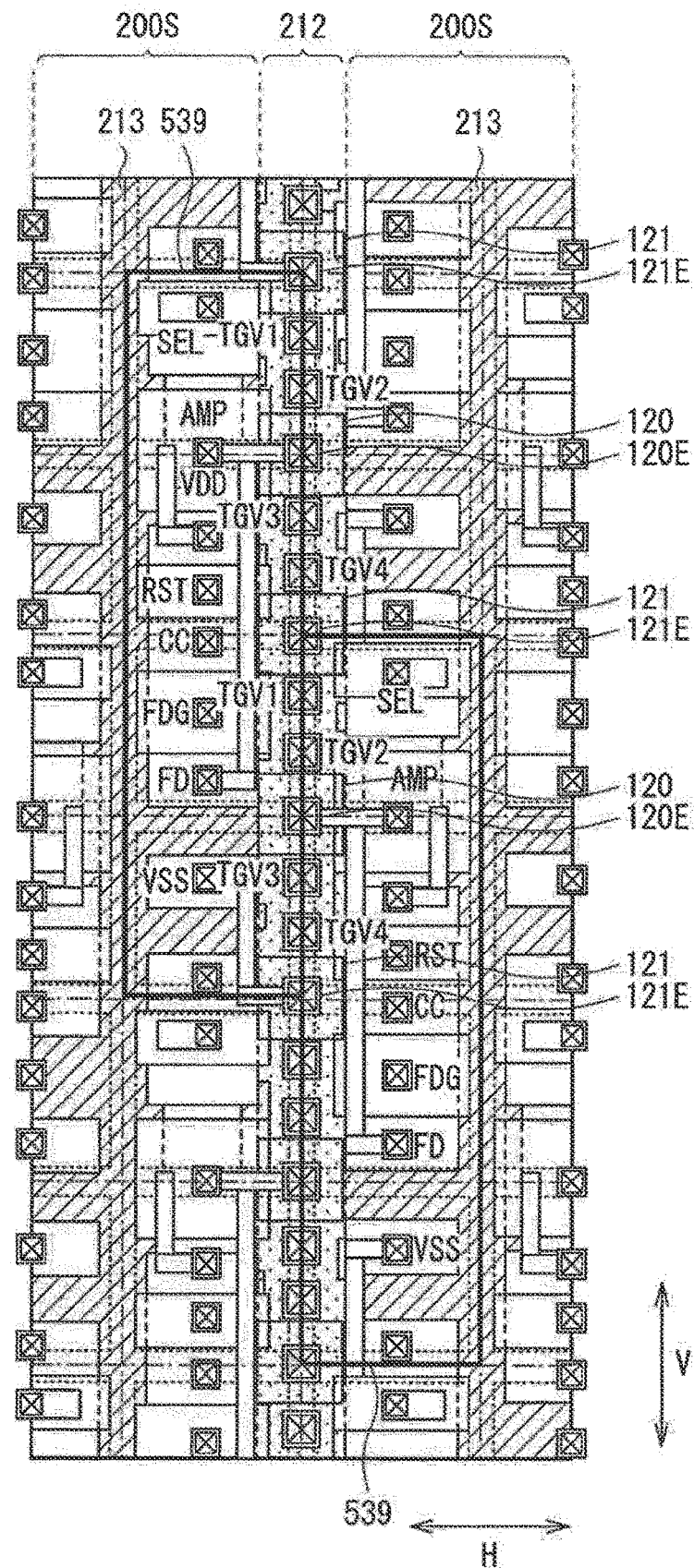
FIG. 53 is a schematic diagram representing a planar configuration of main sections of the first wiring layer and the first substrate along with pixel circuits depicted in FIG. 52.
Figure 54:
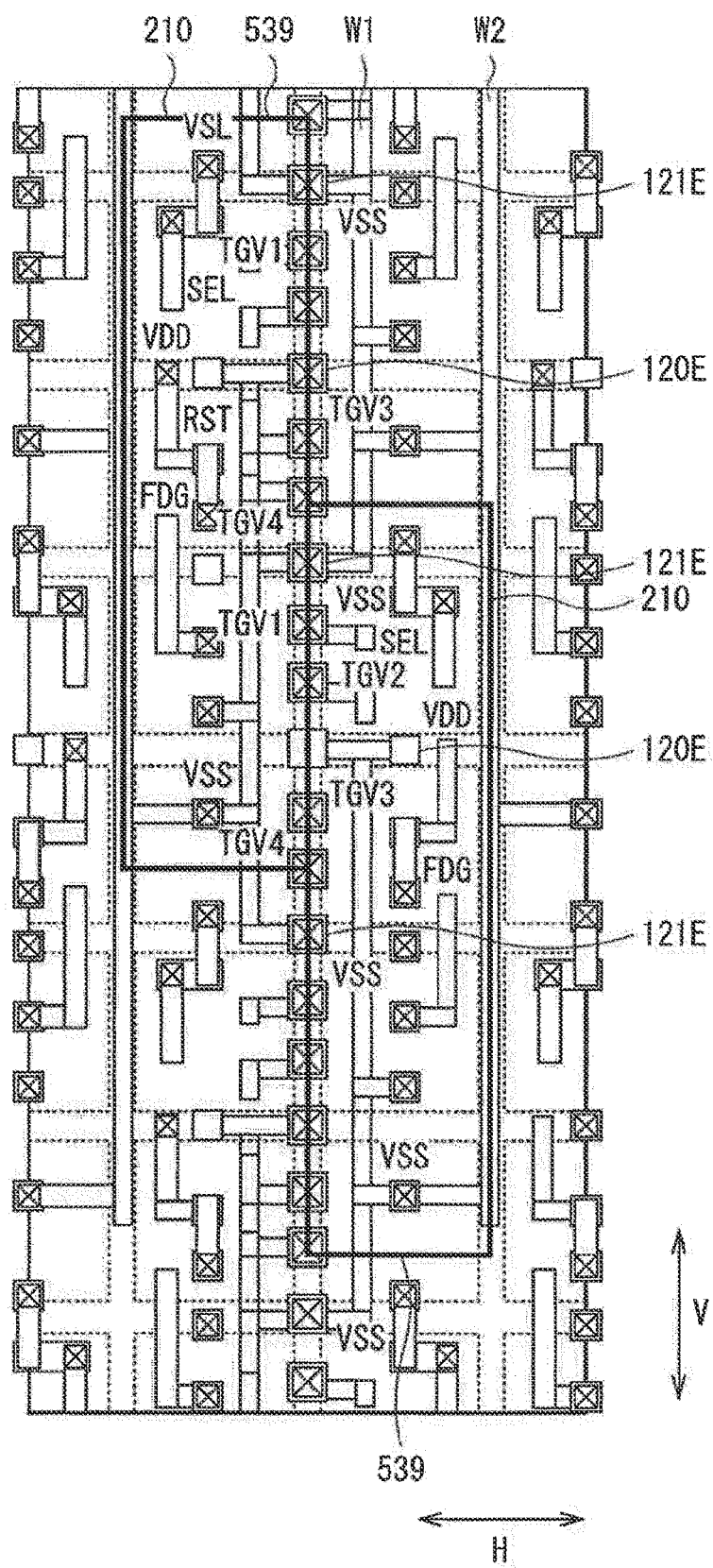
FIG. 54 is a schematic diagram representing an example of a planar configuration of the second wiring layer along with the first wiring layer depicted in FIG. 53.
Figure 55:
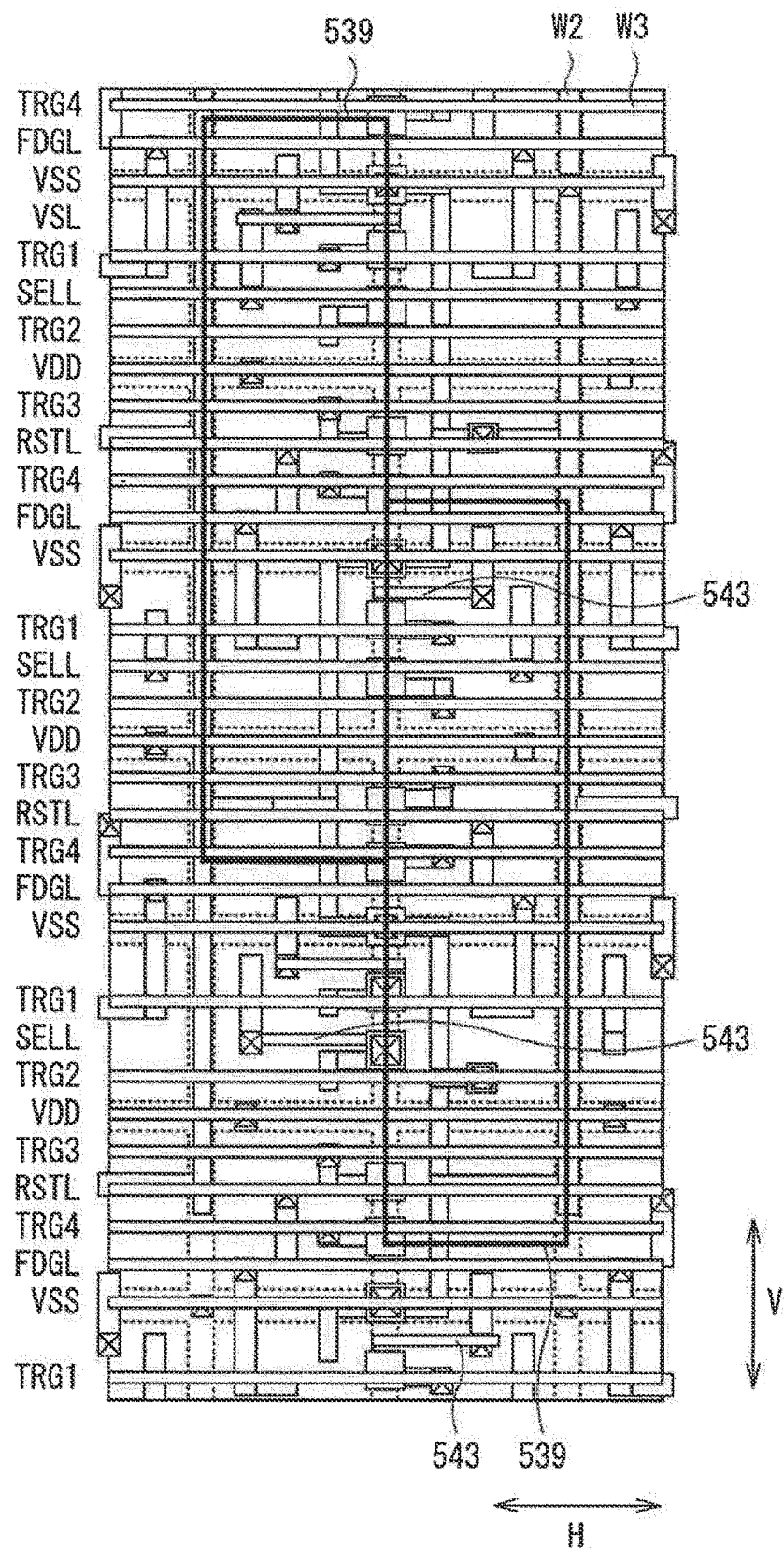
FIG. 55 is a schematic diagram representing an example of a planar configuration of the third wiring layer along with the second wiring layer depicted in FIG. 54.
Figure 56:
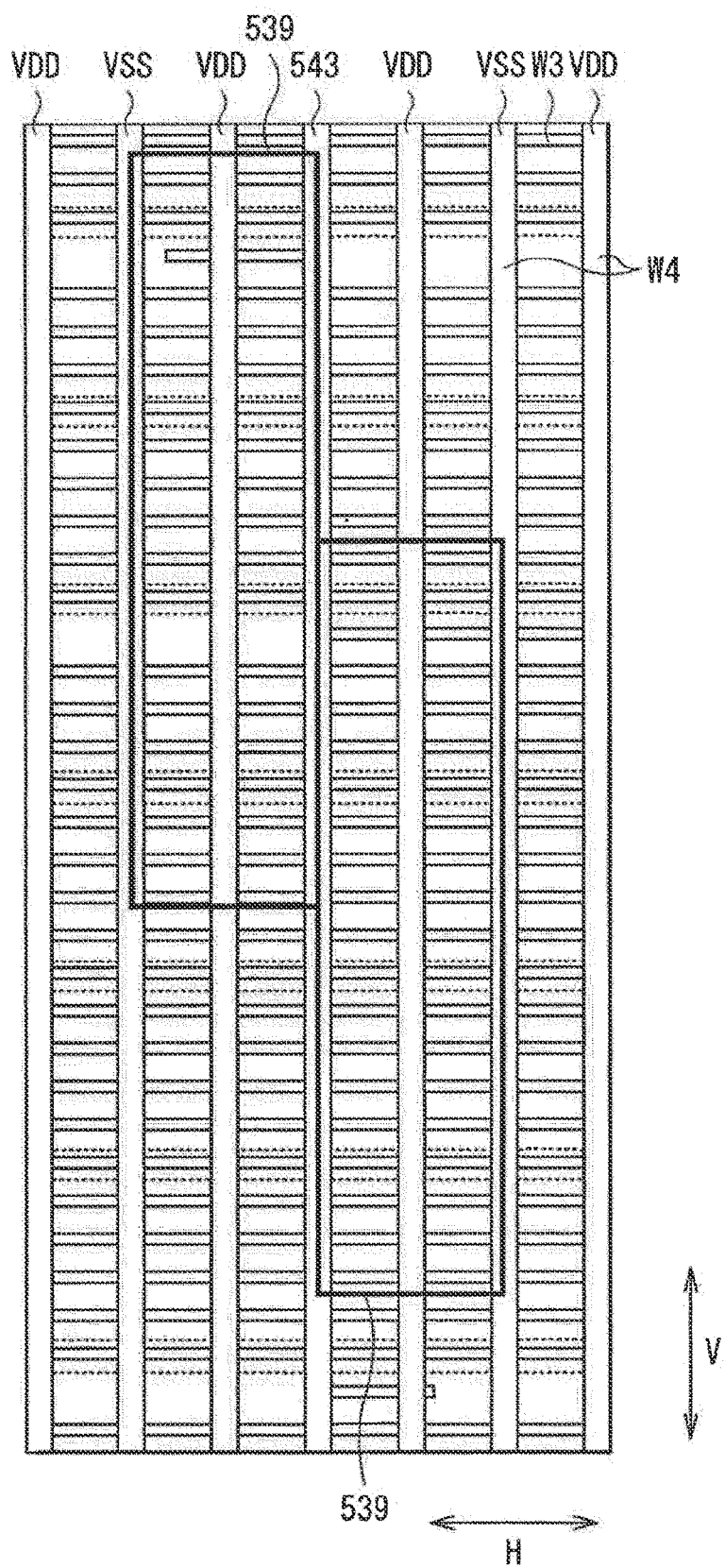
FIG. 56 is a schematic diagram representing an example of a planar configuration of the fourth wiring layer along with the third wiring layer depicted in FIG. 55.

FIG. 52 to FIG. 56 represent a modification example of a planar configuration of the image pickup apparatus 1 according to the embodiment described above. FIG. 52 schematically represents a planar configuration near the front surface of the semiconductor layer 200S of the second substrate 200, and corresponds to FIG. 45 explained in the embodiment described above. FIG. 53 schematically represents a configuration of the first wiring layer W1, and each section that is in the semiconductor layer 200S and the first substrate 100, and is connected to the first wiring layer W1, and corresponds to FIG. 46 explained in the embodiment described above. FIG. 54 represents an example of a planar configuration of the first wiring layer W1 and the second wiring layer W2, and corresponds to FIG. 47 explained in the embodiment described above. FIG. 55 represents an example of a planar configuration of the second wiring layer W2 and the third wiring layer W3, and corresponds to FIG. 48 explained in the embodiment described above. FIG. 56 represents an example of a planar configuration of the third wiring layer W3 and the fourth wiring layer W4, and corresponds to FIG. 49 explained in the embodiment described above.

In the present modification example, as depicted in FIG. 53, the internal layout of one pixel sharing unit 539 (e.g., one on the right side on the paper surface) in two pixel sharing units 539 of the second substrate 200 that are next to each other in direction H has a configuration that is an inversion only in direction H of the internal layout of the other pixel sharing unit 539 (e.g., one on the left side on the paper surface). In addition, displacement in direction V between the outline of the one pixel sharing unit 539 and the outline of the other pixel sharing unit 539 is larger than the displacement (FIG. 46) explained in the embodiment described above. By making the displacement in direction V larger in such a manner, the distance between an amplification transistor AMP of the other pixel sharing unit 539, and a pad section 120 (the other pad section 120 (one on the lower side on the paper surface) in two pixel sharing units 539 that are next to each other in direction V described in FIG. 76) connected to the amplification transistor AMP can be reduced. Due to such a layout, in the first modification example of the image pickup apparatus 1 described in FIG. 52 to FIG. 56, the area sizes of two pixel sharing units 539 that are next to each other in direction H can be made the same as the area sizes of pixel sharing units 539 of the second substrate 200 explained in the embodiment described above without inverting the planar layouts of two pixel sharing units 539 relative to each other in direction V. Note that the planar layout of pixel sharing units 539 of the first substrate 100 is the same as the planar layout (FIG. 44A and FIG. 44B) explained in the embodiment described above. Accordingly, the image pickup apparatus 1 according to the present modification example can provide similar advantages to those of the image pickup apparatus 1 explained in the embodiment described above. The arrangement of pixel sharing units 539 of the second substrate 200 is not limited to the arrangement explained in the embodiment described above and the present modification example.

3. Second Modification Example

Figure 57:
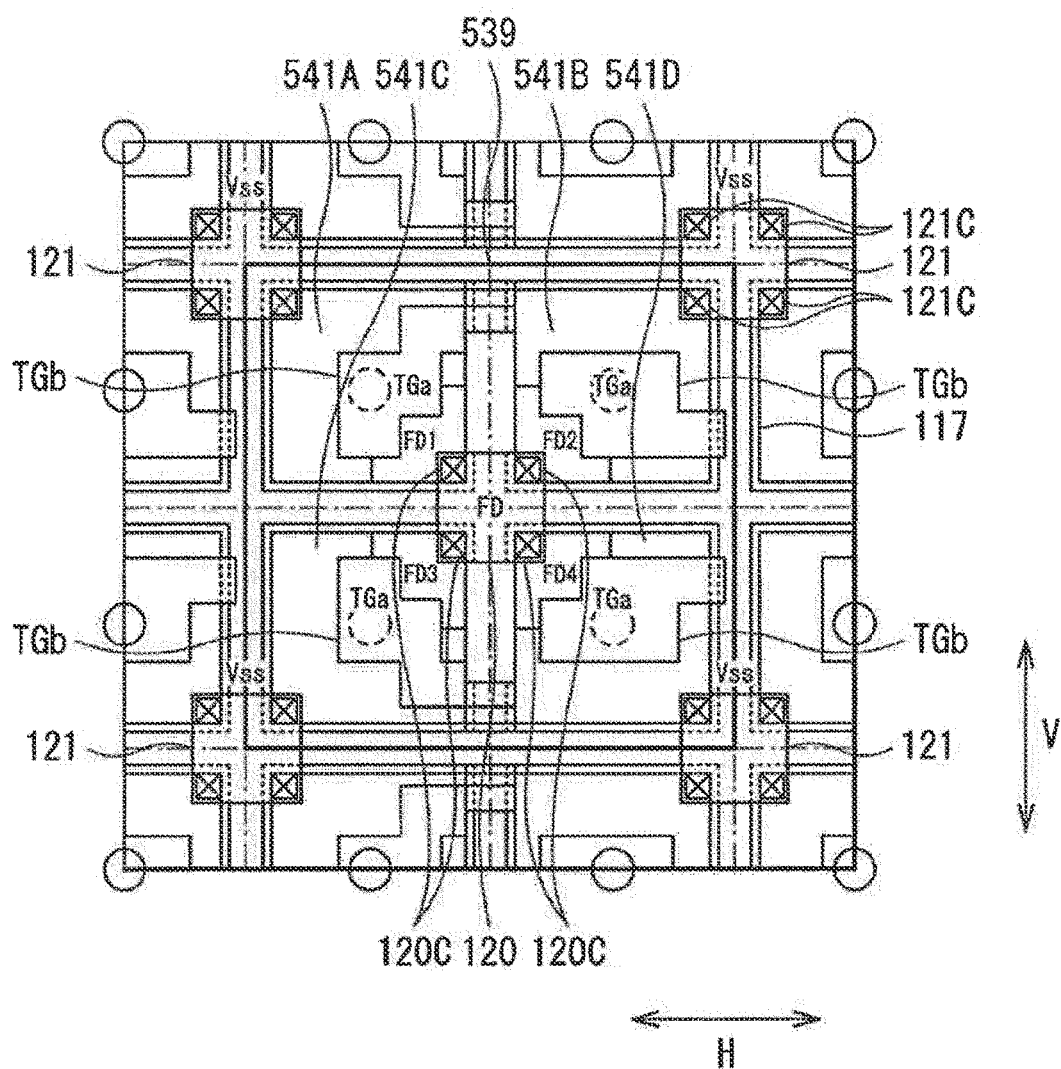
FIG. 57 is a schematic diagram representing a modification example of a planar configuration of the first substrate depicted in FIG. 44A.
Figure 58:
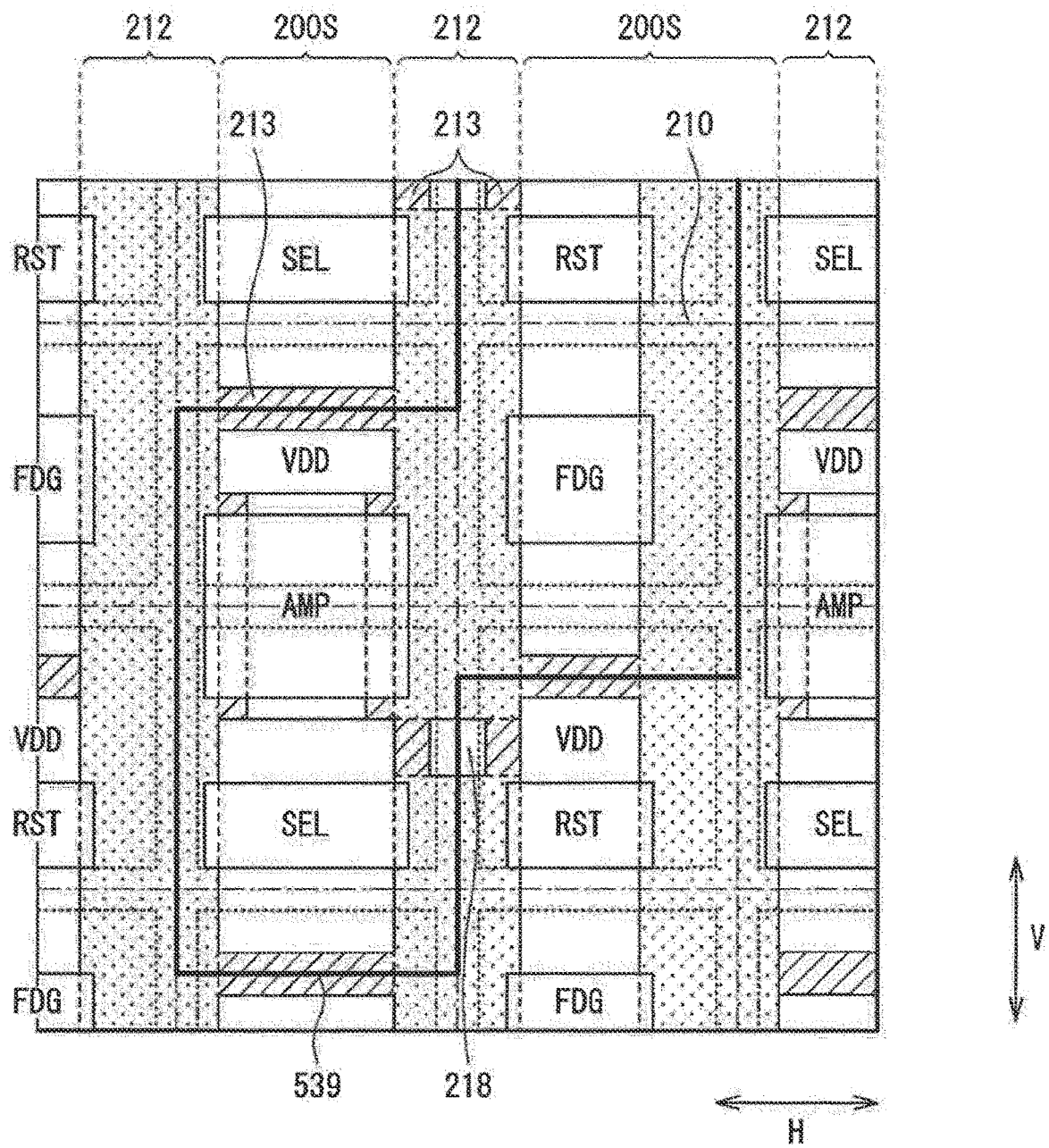
FIG. 58 is a schematic diagram representing an example of a planar configuration of the second substrate (semiconductor layer) stacked on the first substrate depicted in FIG. 57.
Figure 59:
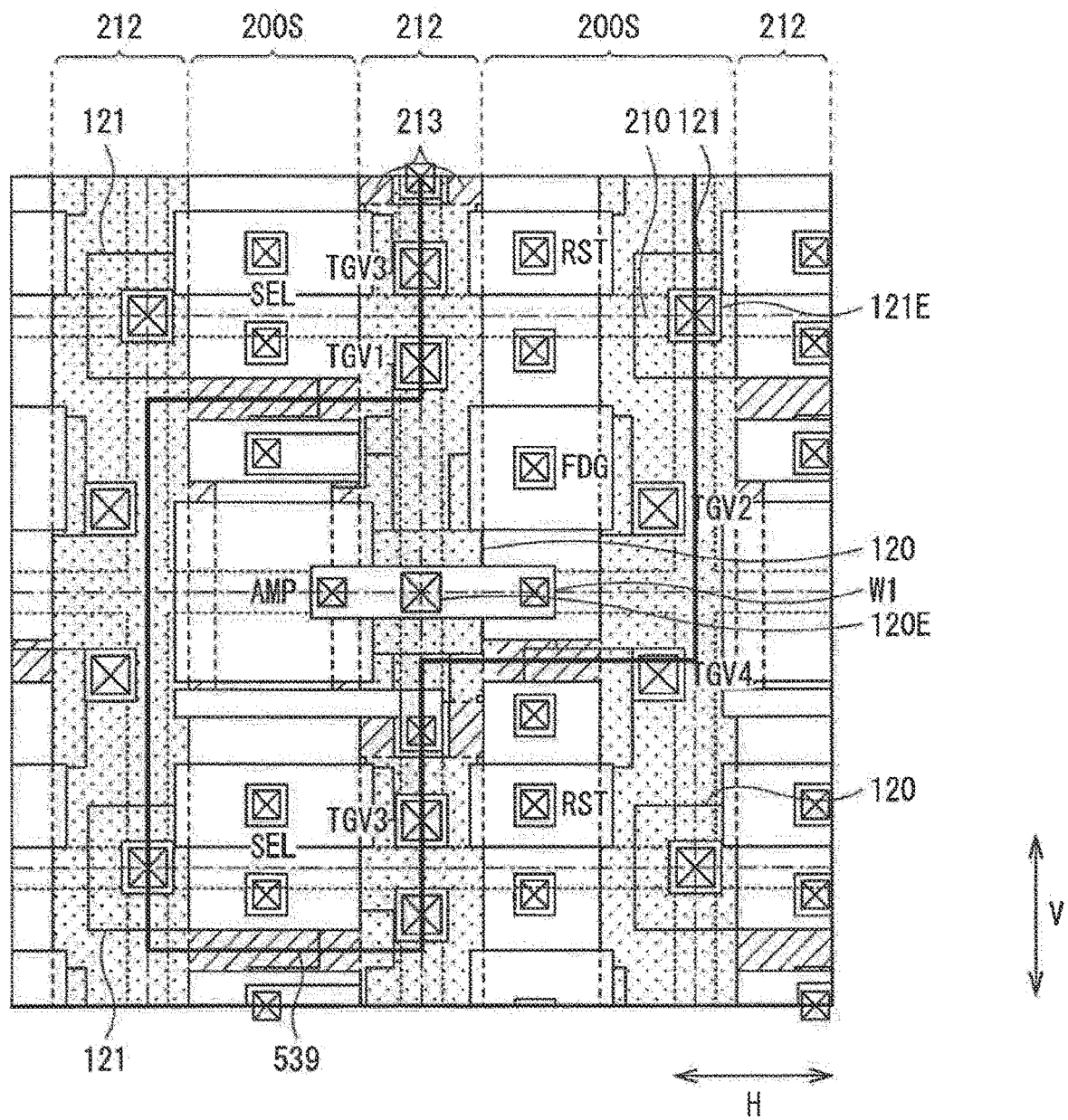
FIG. 59 is a schematic diagram representing an example of a planar configuration of the first wiring layer along with a pixel circuit depicted in FIG. 58.
Figure 60:
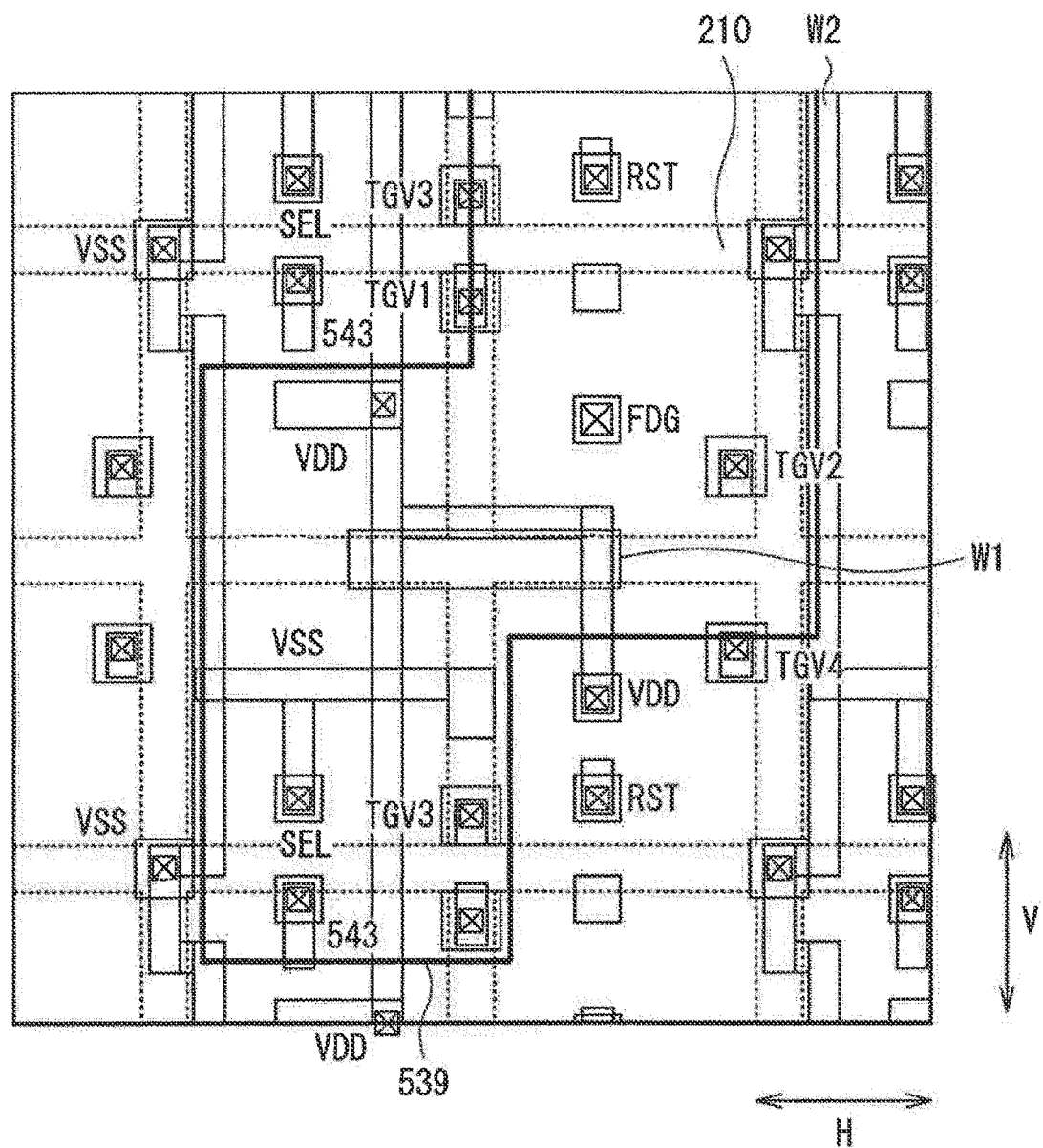
FIG. 60 is a schematic diagram representing an example of a planar configuration of the second wiring layer along with the first wiring layer depicted in FIG. 59.
Figure 61:
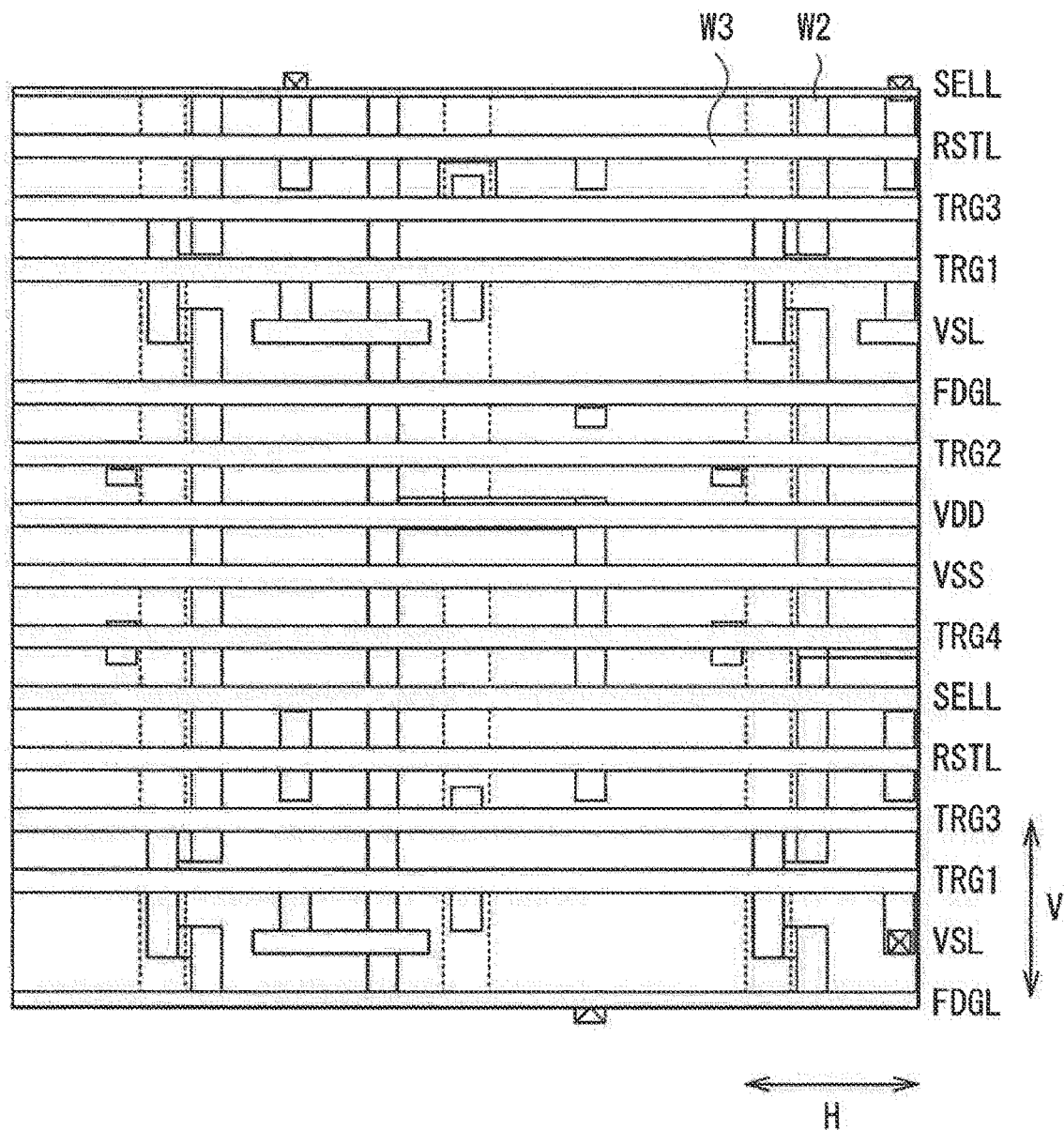
FIG. 61 is a schematic diagram representing an example of a planar configuration of the third wiring layer along with the second wiring layer depicted in FIG. 60.
Figure 62:
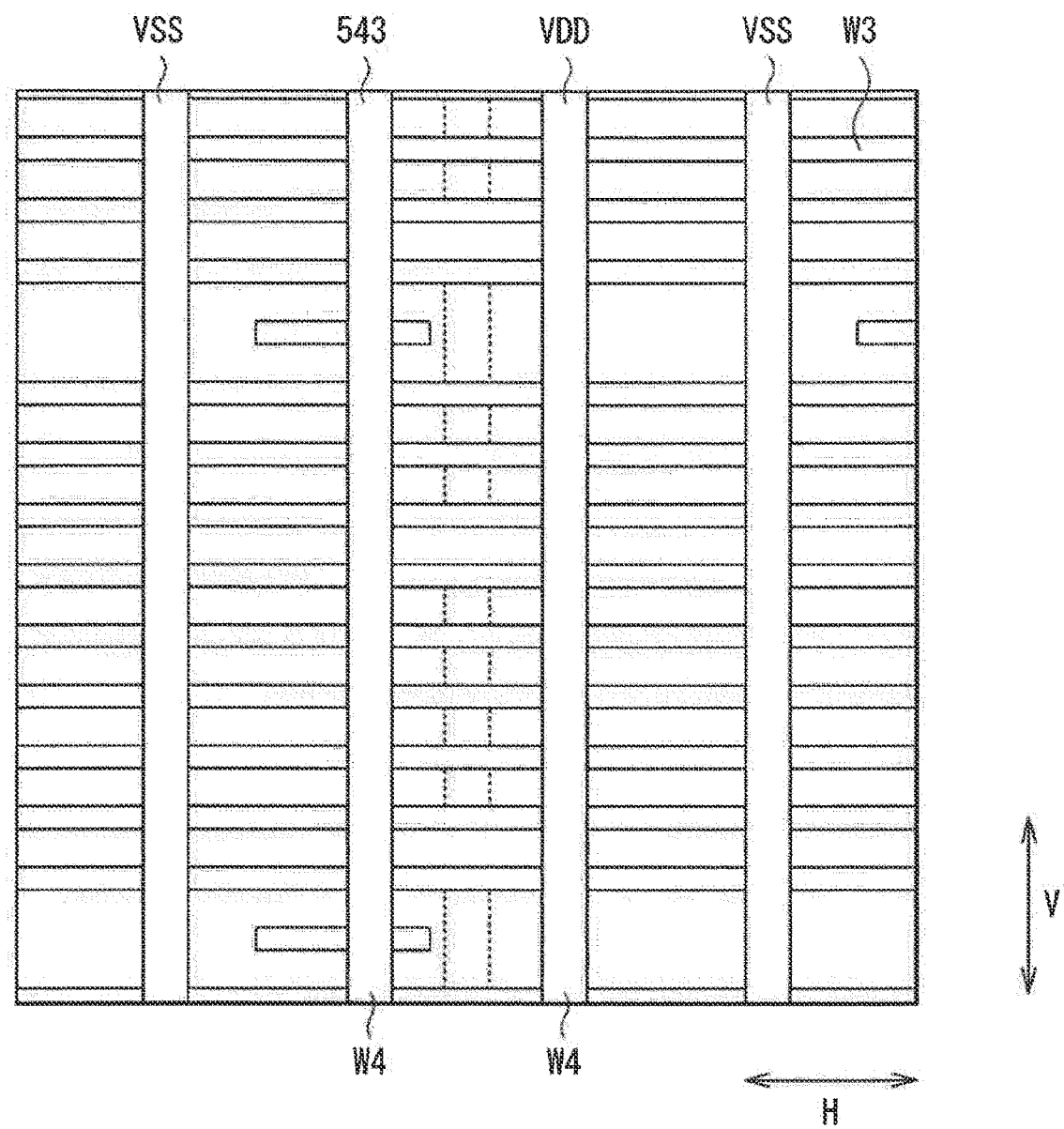
FIG. 62 is a schematic diagram representing an example of a planar configuration of the fourth wiring layer along with the third wiring layer depicted in FIG. 61.

FIG. 57 to FIG. 62 represent a modification example of a planar configuration of the image pickup apparatus 1 according to the embodiment described above. FIG. 57 schematically represents a planar configuration of the first substrate 100, and corresponds to FIG. 44A explained in the embodiment described above. FIG. 58 schematically represents a planar configuration near the front surface of the semiconductor layer 200S of the second substrate 200, and corresponds to FIG. 45 explained in the embodiment described above. FIG. 59 schematically represents a configuration of the first wiring layer W1 and each section that is in the semiconductor layer 200S and the first substrate 100 and is connected to the first wiring layer W1, and corresponds to FIG. 46 explained in the embodiment described above. FIG. 60 represents an example of a planar configuration of the first wiring layer W1 and the second wiring layer W2, and corresponds to FIG. 47 explained in the embodiment described above. FIG. 61 represents an example of a planar configuration of the second wiring layer W2 and the third wiring layer W3, and corresponds to FIG. 48 explained in the embodiment described above. FIG. 62 represents an example of a planar configuration of the third wiring layer W3 and the fourth wiring layer W4, and corresponds to FIG. 49 explained in the embodiment described above.

In the present modification example, the outline of each pixel circuit 210 has an approximately square planar shape (FIG. 58, etc.). In this respect, the planar configuration of the image pickup apparatus 1 according to the present modification example is different from the planar configuration of the image pickup apparatus 1 explained in the embodiment described above.

For example, as explained in the embodiment described above, pixel sharing units 539 of the first substrate 100 are formed in a pixel region including two rows and two columns, and have an approximately square planar shape (FIG. 57). For example, in each pixel sharing unit 539, horizontal portions TGb of transfer gates TG1 and TG3 of a pixel 541A and a pixel 541C in one pixel column extend from positions overlapping the vertical portions TGa in a direction toward a middle section of the pixel sharing unit 539 in direction H (more specifically, in a direction toward the outer edges of the pixels 541A and 541C, and in a direction toward the middle section of the pixel sharing unit 539), and horizontal portions TGb of transfer gates TG2 and TG4 of a pixel 541B and a pixel 541D in the other pixel column extend from positions overlapping the vertical portions Tga in a direction toward the outside of the pixel sharing unit 539 in direction H (more specifically, in a direction toward the outer edges of the pixels 541B and 541D, and in a direction toward the outside of the pixel sharing unit 539). Pad sections 120 connected to floating diffusions FD are provided in middle sections of pixel sharing units 539 (middle sections of the pixel sharing units 539 in direction H and direction V), and pad sections 121 connected to VSS contact regions 118 are provided at end sections of the pixel sharing units 539 at least in direction H (in direction H and direction V in FIG. 57).

As another possible arrangement example, horizontal portions TGb of transfer gates TG1, TG2, TG3 and TG4 can be provided only in regions facing the vertical portions Tga. At this time, as explained in the embodiment described above, the semiconductor layer 200S tends to be split into smaller pieces. Accordingly, it becomes difficult to form large transistors in pixel circuits 210. On the other hand, if horizontal portions TGb of transfer gates TG1, TG2, TG3 and TG4 extend from positions overlapping the vertical portions Tga in direction H as in the modification example described above, it becomes possible to increase widths of the semiconductor layer 200S as explained in the embodiment described above. Specifically, it becomes possible to arrange the positions in direction H of through-electrodes TGV1 and TGV3 connected to transfer gates TG1 and TG3 proximately to the position in direction H of a through-electrode 120E, and arrange the positions in direction H of through-electrodes TGV2 and TGV4 connected to transfer gates TG2 and TG4 proximately to the position in direction H of a through-electrode 121E (FIG. 59). Thereby, as explained in the embodiment described above, the widths (sizes in direction H) of the semiconductor layer 200S extending in direction V can be increased. Therefore, it becomes possible to increase the sizes of transistors of pixel circuits 210, particularly the sizes of amplification transistors AMP. As a result, the signal/noise ratio of pixel signals can be improved, and the image pickup apparatus 1 can output better pixel data (image information).

For example, the sizes of pixel sharing units 539 of the second substrate 200 are approximately the same as the sizes in direction H and direction V of pixel sharing units 539 of the first substrate 100, and, for example, are provided in regions corresponding to pixel regions including approximately two rows and two columns. For example, in each pixel circuit 210, a selection transistor SEL and an amplification transistor AMP are arranged next to each other in direction V in one semiconductor layer 200S extending in direction V, and an FD conversion gain switch transistor FDG and a reset transistor RST are arranged next to each other in direction V in one semiconductor layer 200S extending in direction V. The one semiconductor layer 200S provided with the selection transistor SEL and the amplification transistor AMP, and the one semiconductor layer 200S provided with the FD conversion gain switch transistor FDG and the reset transistor RST are next to each other in direction H with an insulation region 212 being interposed therebetween. The insulation region 212 extends in direction V (FIG. 58).

Here, the outline of pixel sharing units 539 of the second substrate 200 is explained with reference to FIG. 58 and FIG. 59. For example, a pixel sharing unit 539 of the first substrate 100 depicted in FIG. 57 is connected with an amplification transistor AMP and a selection transistor SEL that are provided on one side (the left side on the paper surface of FIG. 59) in direction H of a pad section 120, and an FD conversion gain switch transistor FDG and a reset transistor RST that are provided on the other side (the right side on the paper surface of FIG. 59) in direction H of the pad section 120. The outline of the sharing unit 541 of the second substrate 200 including the amplification transistor AMP, the selection transistor SEL, the FD conversion gain switch transistor FDG and the reset transistor RST is determined by the following four outer edges.

A first outer edge is an outer edge on one end (an end on the upper side on the paper surface of FIG. 59) in direction V of the semiconductor layer 200S including the selection transistor SEL and the amplification transistor AMP. This first outer edge is provided between the amplification transistor AMP included in the pixel sharing unit 539, and a selection transistor SEL included in a pixel sharing unit 539 adjacent to the pixel sharing unit 539 on one side (the upper side on the paper surface of FIG. 59) in direction V. More specifically, the first outer edge is provided at a middle section in direction V of an element separation region 213 between the amplification transistor AMP and the selection transistor SEL. A second outer edge is an outer edge on the other end (an end on the lower side on the paper surface of FIG. 59) in direction V of the semiconductor layer 200S including the selection transistor SEL and the amplification transistor AMP. This second outer edge is provided between the selection transistor SEL included in the pixel sharing unit 539, and an amplification transistor AMP included in a pixel sharing unit 539 adjacent to the pixel sharing unit 539 on the other side (the lower side on the paper surface of FIG. 59) in direction V. More specifically, the second outer edge is provided at a middle section in direction V of an element separation region 213 between the selection transistor SEL and the amplification transistor AMP. A third outer edge is an outer edge on the other end (an end on the lower side on the paper surface of FIG. 59) in direction V of the semiconductor layer 200S including the reset transistor RST and the FD conversion gain switch transistor FDG. This third outer edge is provided between the FD conversion gain switch transistor FDG included in the pixel sharing unit 539, and a reset transistor RST included in a pixel sharing unit 539 adjacent to the pixel sharing unit 539 on the other side (the lower side on the paper surface of FIG. 59) in direction V. More specifically, the third outer edge is provided at a middle section in direction V of an element separation region 213 between the FD conversion gain switch transistor FDG and the reset transistor RST. A fourth outer edge is an outer edge on one end (an end on the upper side on the paper surface of FIG. 59) in direction V of the semiconductor layer 200S including the reset transistor RST and the FD conversion gain switch transistor FDG. This fourth outer edge is provided between the reset transistor RST included in the pixel sharing unit 539, and an FD conversion gain switch transistor FDG (not depicted) included in a pixel sharing unit 539 adjacent to the pixel sharing unit 539 on one side (the upper side on the paper surface of FIG. 59) in direction V. More specifically, the fourth outer edge is provided at a middle section in direction V of an element separation region 213 (not depicted) between the reset transistor RST and the FD conversion gain switch transistor FDG.

The outline of the pixel sharing unit 539 of the second substrate 200 including such first, second, third and fourth outer edges is arranged such that the third and fourth outer edges are displaced toward one side in direction V relative to the first and second outer edges (in other words, offset toward one side in direction V). By using such a layout, it becomes possible to arrange both the gate of the amplification transistor AMP and the source of the FD conversion gain switch transistor FDG proximately to a pad section 120 as much as possible. Accordingly, it becomes easier to reduce the area sizes of wires connecting them, and to miniaturize the image pickup apparatus 1. Note that a VSS contact region 218 is provided between the semiconductor layer 200S including the selection transistor SEL and the amplification transistor AMP, and the semiconductor layer 200S including the reset transistor RST and the FD conversion gain switch transistor FDG. For example, plural pixel circuits 210 have mutually the same arrangement.

The image pickup apparatus 1 having such a second substrate 200 also can provide advantages similar to those explained in the embodiment described above. The arrangement of pixel sharing units 539 of the second substrate 200 is not limited to the arrangement explained in the embodiment described above and the present modification example.

4. Third Modification Example

Figure 63:
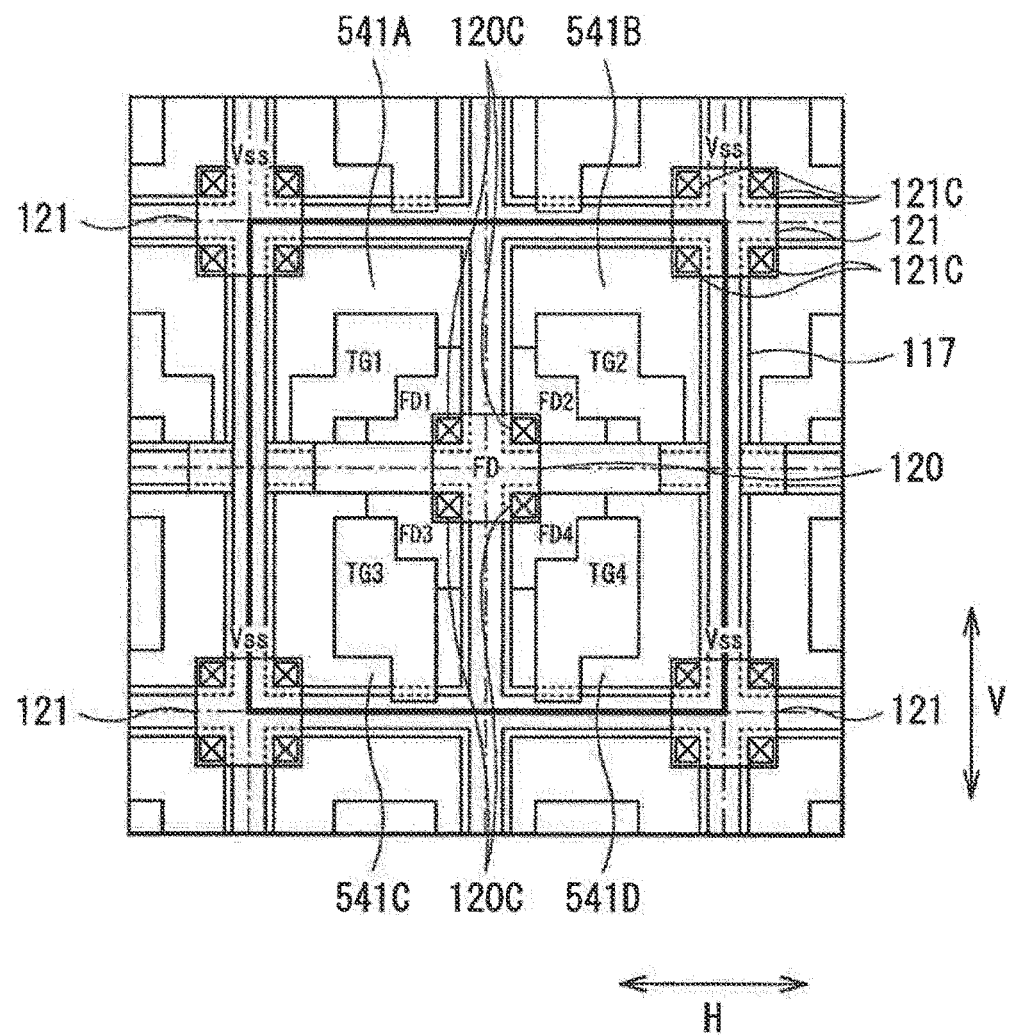
FIG. 63 is a schematic diagram representing another example of a planar configuration of the first substrate depicted in FIG. 57.
Figure 64:
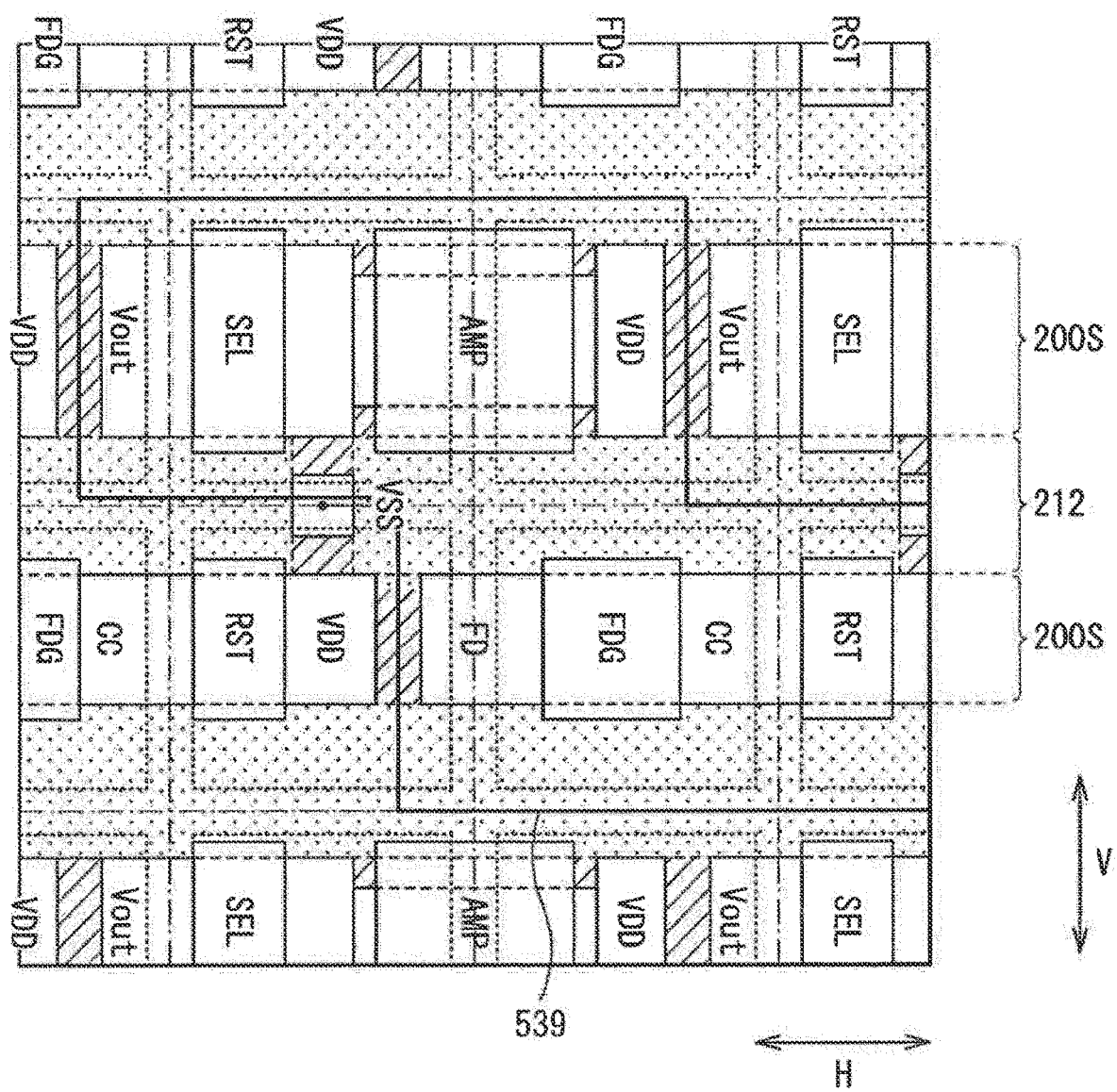
FIG. 64 is a schematic diagram representing an example of a planar configuration of the second substrate (semiconductor layer) stacked on the first substrate depicted in FIG. 63.
Figure 65:
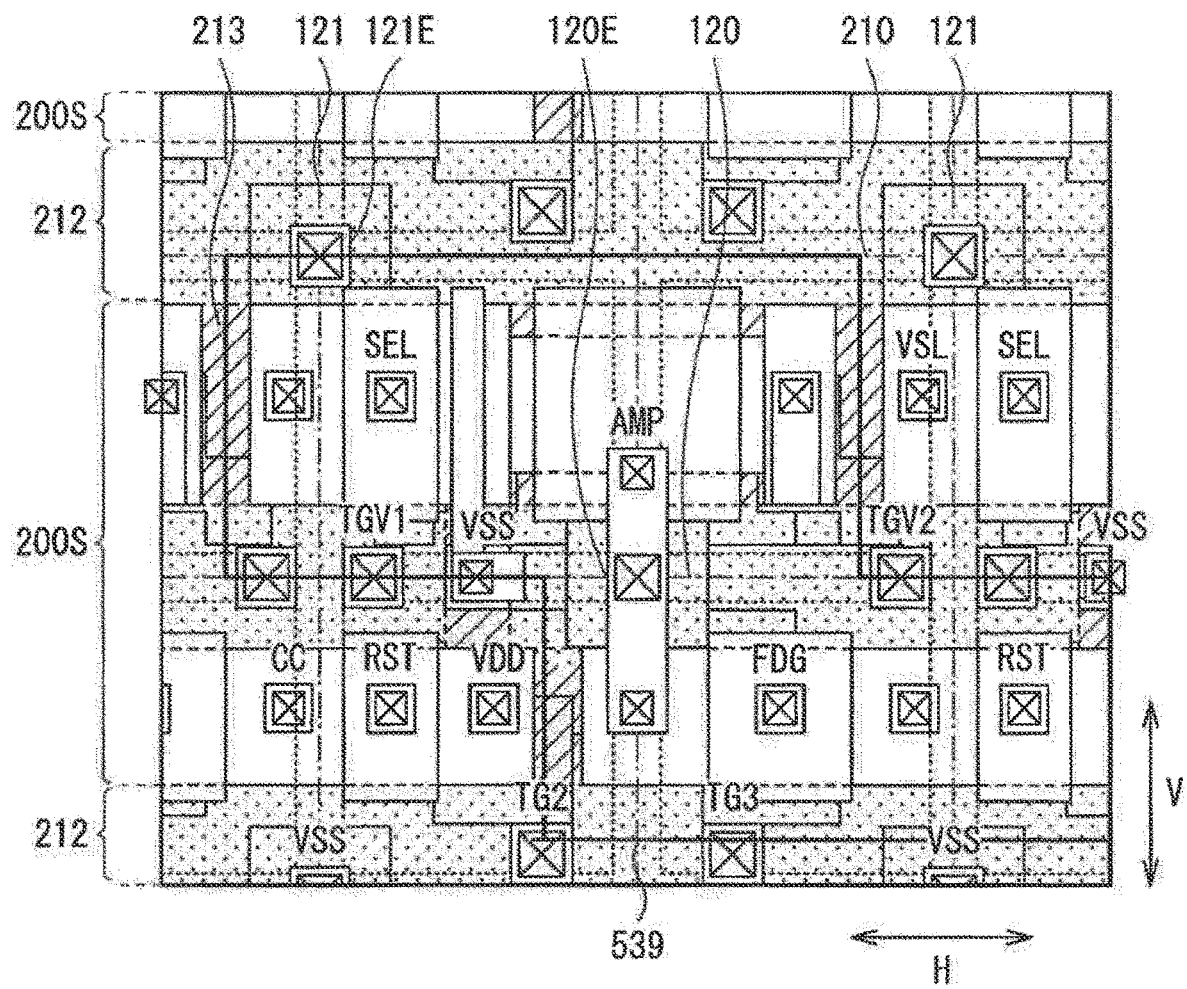
FIG. 65 is a schematic diagram representing an example of a planar configuration of the first wiring layer along with a pixel circuit depicted in FIG. 64.
Figure 66:
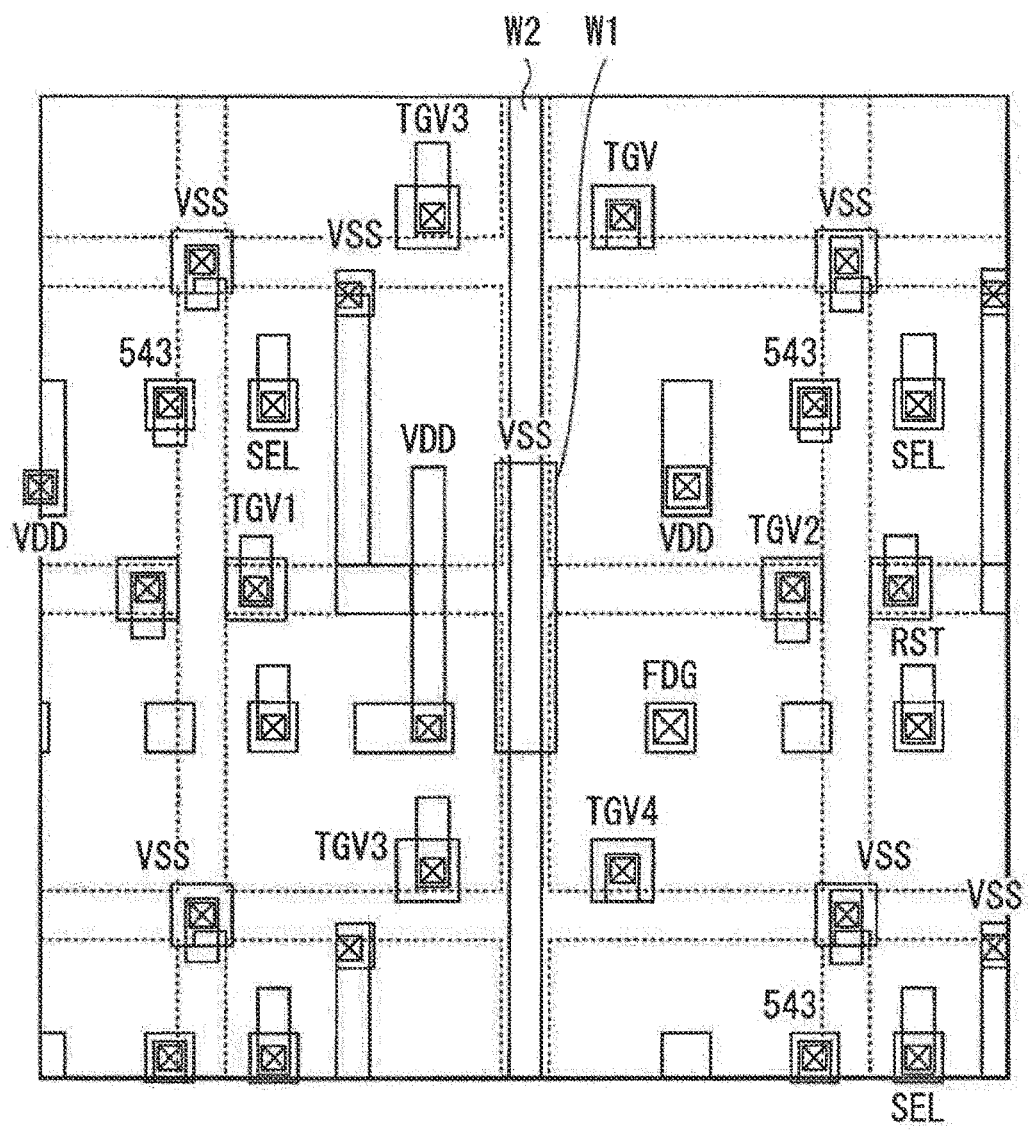
FIG. 66 is a schematic diagram representing an example of a planar configuration of the second wiring layer along with the first wiring layer depicted in FIG. 65.
Figure 67:
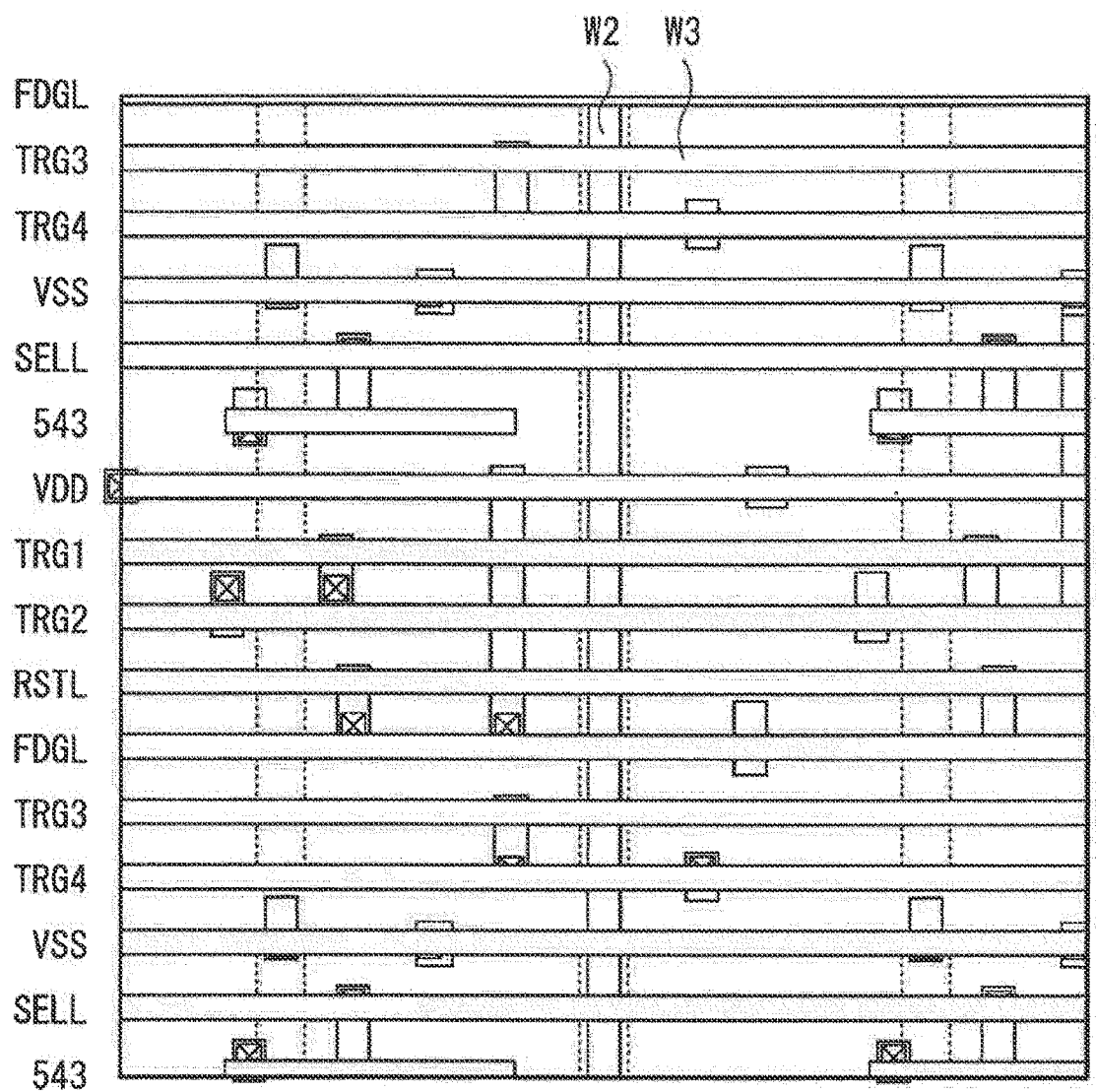
FIG. 67 is a schematic diagram representing an example of a planar configuration of the third wiring layer along with the second wiring layer depicted in FIG. 66.
Figure 68:
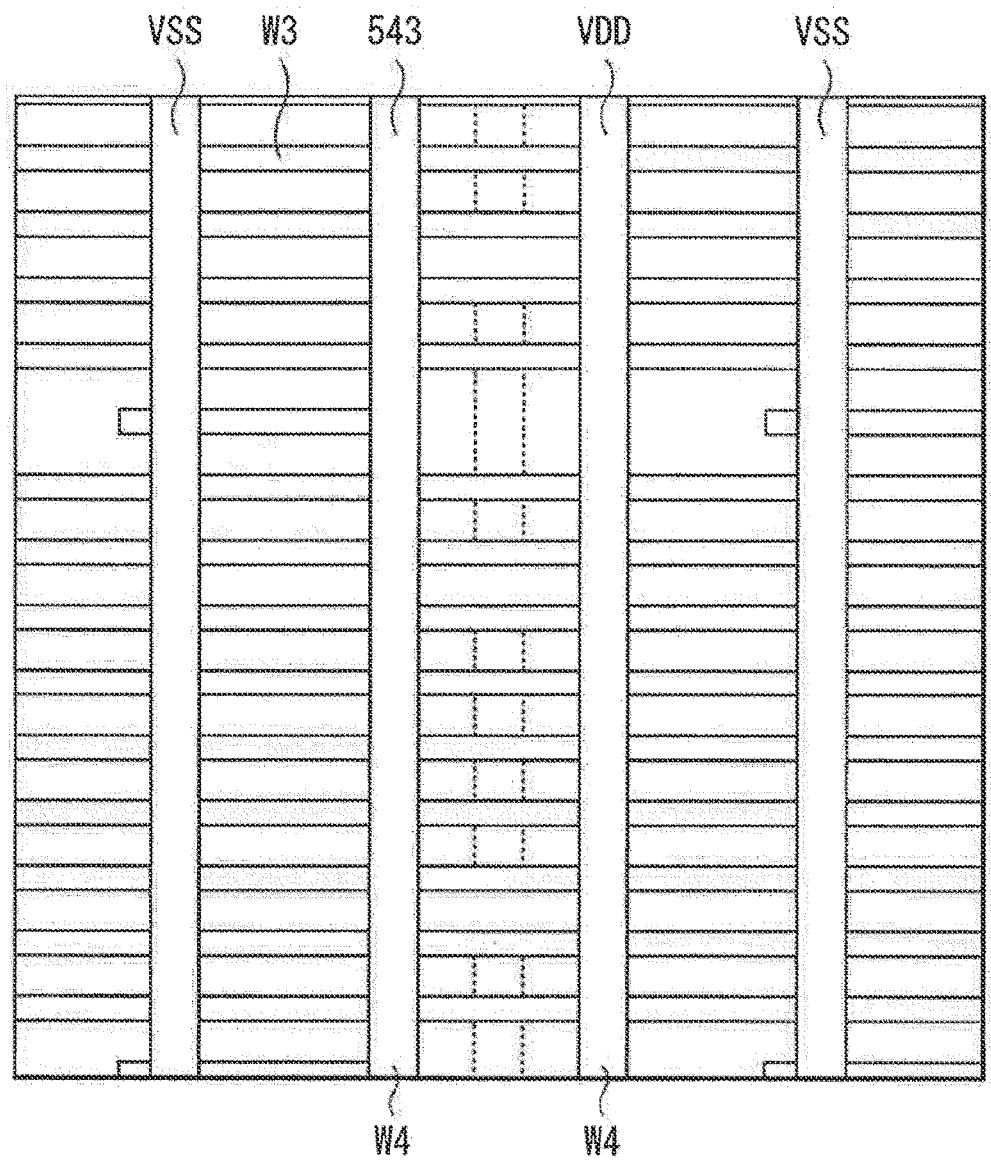
FIG. 68 is a schematic diagram representing an example of a planar configuration of the fourth wiring layer along with the third wiring layer depicted in FIG. 67.

FIG. 63 to FIG. 68 represent a modification example of a planar configuration of the image pickup apparatus 1 according to the embodiment described above. FIG. 63 schematically represents a planar configuration of the first substrate 100, and corresponds to FIG. 44B explained in the embodiment described above. FIG. 64 schematically represents a planar configuration near the front surface of the semiconductor layer 200S of the second substrate 200, and corresponds to FIG. 45 explained in the embodiment described above. FIG. 65 schematically represents a configuration of the first wiring layer W1 and each section that is in the semiconductor layer 200S and the first substrate 100 and is connected to the first wiring layer W1, and corresponds to FIG. 46 explained in the embodiment described above. FIG. 66 represents an example of a planar configuration of the first wiring layer W1 and the second wiring layer W2, and corresponds to FIG. 47 explained in the embodiment described above. FIG. 67 represents an example of a planar configuration of the second wiring layer W2 and the third wiring layer W3, and corresponds to FIG. 48 explained in the embodiment described above. FIG. 68 represents an example of a planar configuration of the third wiring layer W3 and the fourth wiring layer W4, and corresponds to FIG. 49 explained in the embodiment described above.

In the present modification example, the semiconductor layer 200S of the second substrate 200 extends in direction H (FIG. 65). That is, this approximately corresponds to a configuration which is obtained by rotating the planar configuration of the image pickup apparatus 1 depicted in FIG. 58 and the like described above by 90 degrees.

For example, as explained in the embodiment described above, pixel sharing units 539 of the first substrate 100 are formed in a pixel region including two rows and two columns, and have an approximately square planar shape (FIG. 63). For example, in each pixel sharing unit 539, transfer gates TG1 and TG2 of a pixel 541A and a pixel 541B in one pixel row extend toward a middle section of the pixel sharing unit 539 in direction V, and transfer gates TG3 and TG4 of a pixel 541C and a pixel 541D in the other pixel row extend in a direction toward the outside of the pixel sharing unit 539 in direction V. Pad sections 120 connected to floating diffusions FD are provided in middle sections of pixel sharing units 539, and pad sections 121 connected to VSS contact regions 118 are provided at end sections of pixel sharing units 539 at least in direction V (in direction V and direction H in FIG. 63). At this time, the positions in direction V of through-electrodes TGV1 and TGV2 of the transfer gates TG1 and TG2 become closer to the position in direction V of a through-electrode 120E, and the positions in direction V of through-electrodes TGV3 and TGV4 of the transfer gates TG3 and TG4 become closer to the position in direction V of a through-electrode 121E (FIG. 65). Accordingly, for a reason similar to that explained in the embodiment described above, the widths (sizes in direction V) of the semiconductor layer 200S extending in direction H can be increased. Therefore, it becomes possible to increase the sizes of amplification transistors AMP, and suppress noise.

In each pixel circuit 210, a selection transistor SEL and an amplification transistor AMP are arranged next to each other in direction H, and a reset transistor RST is arranged at a position adjacent to a selection transistor SEL in direction V with an insulation region 212 being interposed therebetween (FIG. 64). An FD conversion gain switch transistor FDG is arranged next to the reset transistor RST in direction H. A VSS contact region 218 is provided like an island in the insulation region 212. For example, the third wiring layer W3 extends in direction H (FIG. 67), and the fourth wiring layer W4 extends in direction V (FIG. 68).

The image pickup apparatus 1 having such a second substrate 200 also can provide advantages similar to those explained in the embodiment described above. The arrangement of pixel sharing units 539 of the second substrate 200 is not limited to the arrangement explained in the embodiment described above and the present modification example. For example, the semiconductor layer 200S explained in the embodiment and the first modification example described above may extend in direction H.

5. Fourth Modification Example

Figure 69:
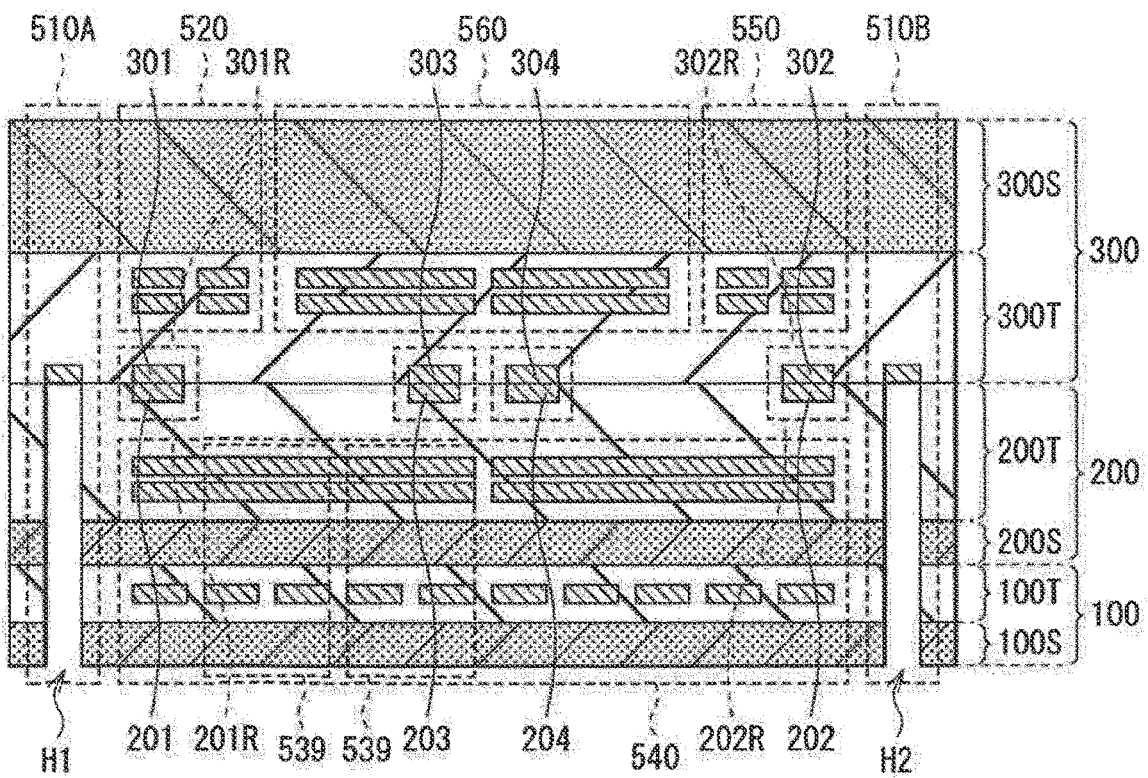
FIG. 69 is a cross-sectional schematic diagram representing another example of the image pickup apparatus depicted in FIG. 40.

FIG. 69 schematically represents a modification example of a cross-sectional configuration of the image pickup apparatus 1 according to the embodiment described above. FIG. 69 corresponds to FIG. 40 explained in the embodiment described above. In the present modification example, in addition to the contact sections 201, 202, 301 and 302, the image pickup apparatus 1 has contact sections 203, 204, 303 and 304 at positions facing a middle section of the pixel array section 540. In this respect, the image pickup apparatus 1 according to the present modification example is different from the image pickup apparatus 1 explained in the embodiment described above.

The contact sections 203 and 204 are provided in the second substrate 200, and exposed at a surface of junction with the third substrate 300. The contact sections 303 and 304 are provided in the third substrate 300, and exposed at a surface of junction with the second substrate 200. The contact section 203 is in contact with the contact section 303, and the contact section 204 is in contact with the contact section 304. That is, in this image pickup apparatus 1, the second substrate 200 and the third substrate 300 are connected by the contact sections 203, 204, 303 and 304 in addition to the contact sections 201, 202, 301 and 302.

Figure 70:
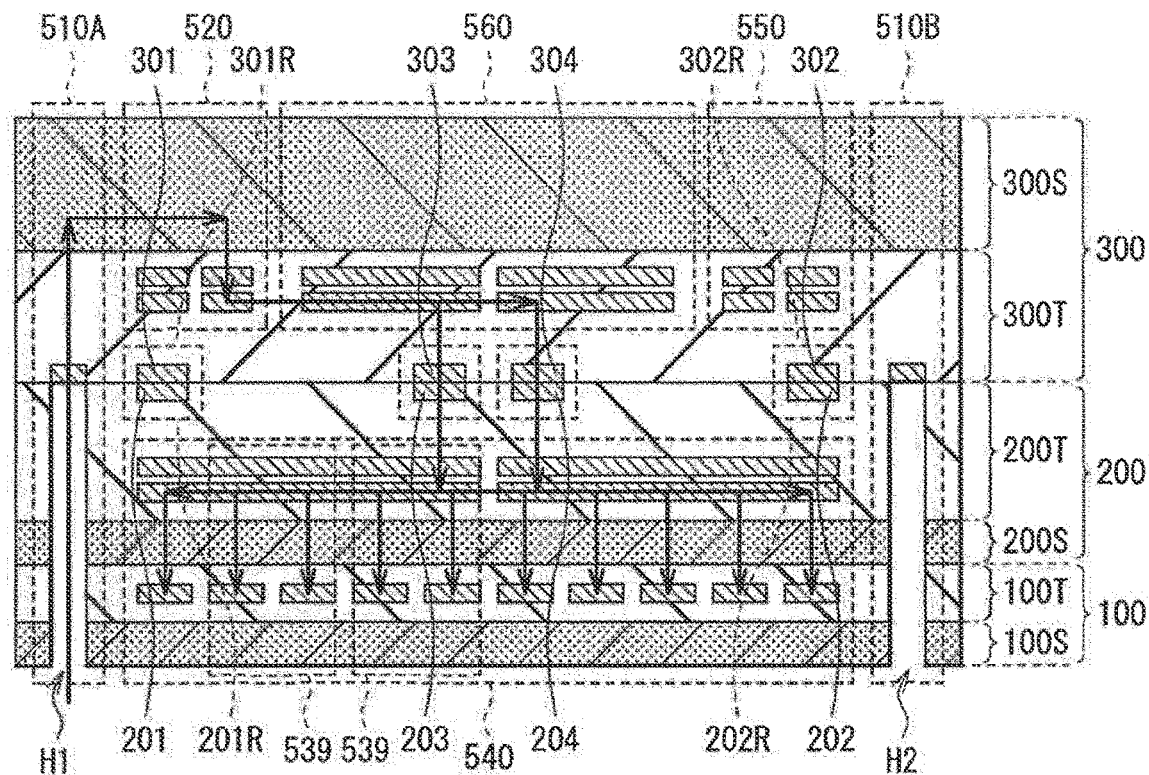
FIG. 70 is a schematic diagram for explaining paths of signals input to the image pickup apparatus depicted in FIG. 69.
Figure 71:
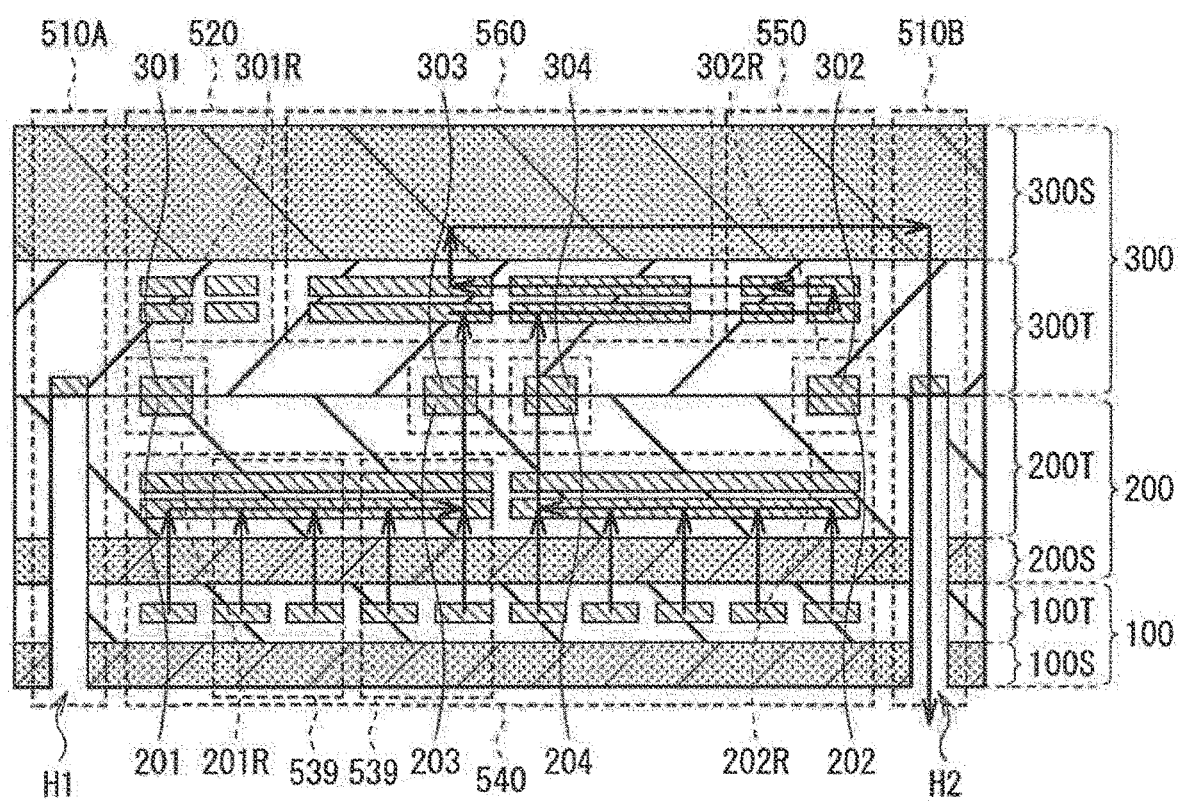
FIG. 71 is a schematic diagram for explaining signal paths of pixel signals of the image pickup apparatus depicted in FIG. 69.

Next, operation of the image pickup apparatus 1 is explained by using FIG. 70 and FIG. 71. FIG. 70 represents paths of an input signal input to the image pickup apparatus 1 from the outside, and a power supply potential and a reference potential with arrows. FIG. 71 represents signal paths of pixel signals output from the image pickup apparatus 1 to the outside with arrows. For example, the input signal input to the image pickup apparatus 1 via the input section 510A is transferred to the row driving section 520 of the third substrate 300, and row driving signals are produced at the row driving section 520. The row driving signals are sent to the second substrate 200 via the contact sections 303 and 203. Further, the row driving signals reach pixel sharing units 539 of the pixel array section 540 via row driving signal lines 542 in the wiring layer 200T. In the row driving signals having reached the pixel sharing units 539 of the second substrate 200, driving signals other than those for transfer gates TG are input to pixel circuits 210, and transistors included in the pixel circuits 210 are driven. The driving signals for the transfer gates TG are input to transfer gates TG1, TG2, TG3 and TG4 of the first substrate 100 via through-electrodes TGV, and pixels 541A, 541B, 541C and 541D are driven. In addition, the power supply potential and the reference potential supplied from the outside of the image pickup apparatus 1 to the input section 510A (input terminal 511) of the third substrate 300 are sent to the second substrate 200 via the contact sections 303 and 203, and are supplied to the pixel circuits 210 of the pixel sharing units 539 via wires in the wiring layer 200T. The reference potential is further supplied also to the pixels 541A, 541B, 541C and 541D of the first substrate 100 via through-electrodes 121E. On the other hand, pixel signals photoelectrically converted at the pixels 541A, 541B, 541C and 541D of the first substrate 100 are sent to pixel circuits 210 of the second substrate 200 for each pixel sharing unit 539. Pixel signals based on the pixel signals are sent from the pixel circuits 210 to the third substrate 300 via vertical signal lines 543 and the contact sections 204 and 304. The pixel signals are processed at the column signal processing section 550 and the image signal processing section 560 of the third substrate 300, and then are output to the outside via the output section 510B.

The image pickup apparatus 1 having such contact sections 203, 204, 303 and 304 also can provide advantages similar to those explained in the embodiment described above. It is possible to change the positions, number and the like of the contact sections 303 and 304 according to the design of circuits or the like of the third substrate 300 which are the destinations of connection of wires via the contact sections.

6. Fifth Modification Example

Figure 72:
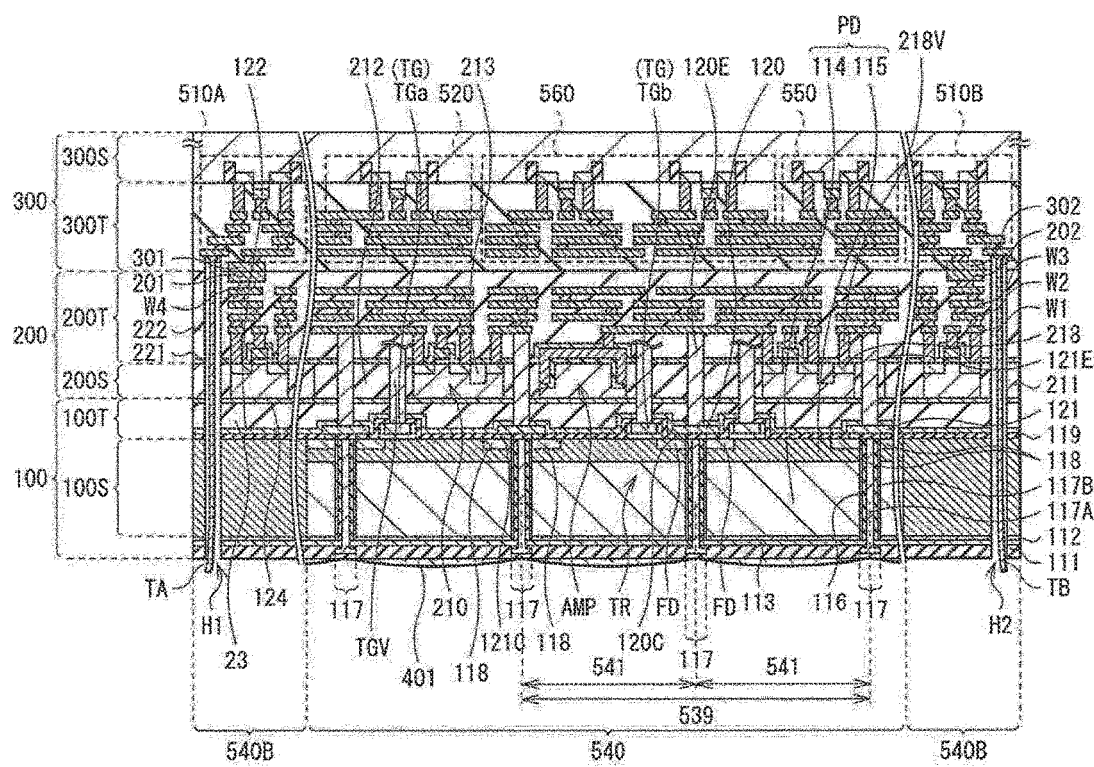
FIG. 72 is a cross-sectional schematic diagram representing another example of the image pickup apparatus depicted in FIG. 43.

FIG. 72 represents a modification example of a cross-sectional configuration of the image pickup apparatus 1 according to the embodiment described above. FIG. 72 corresponds to FIG. 43 explained in the embodiment described above. In the present modification example, transfer transistors TR having a planar structure are provided in the first substrate 100. In this respect, the image pickup apparatus 1 according to the present modification example is different from the image pickup apparatus 1 explained in the embodiment described above.

In the transfer transistors TR, transfer gates TG include only horizontal portions TGb. Stated differently, the transfer gates TG do not have vertical portions Tga, and are provided to face the semiconductor layer 100S.

The image pickup apparatus 1 having such transfer transistors TR with the planar structure also can provide advantages similar to those explained in the embodiment described above. Further, by providing the planar transfer gates TG in the first substrate 100, it is possible to consider forming photodiodes PD to positions close to the front surface of the semiconductor layer 100S and thereby increasing the saturation signal amount (Qs), as compared with a case where vertical transfer gates TG are provided in the first substrate 100. In addition, it is also possible to consider that the method of forming the planar transfer gates TG in the first substrate 100 requires a small number of manufacturing steps, and is less likely to cause negative influence on photodiodes PD due to the manufacturing steps, as compared with the method of forming the vertical transfer gates TG in the first substrate 100.

7. Sixth Modification Example

Figure 73:
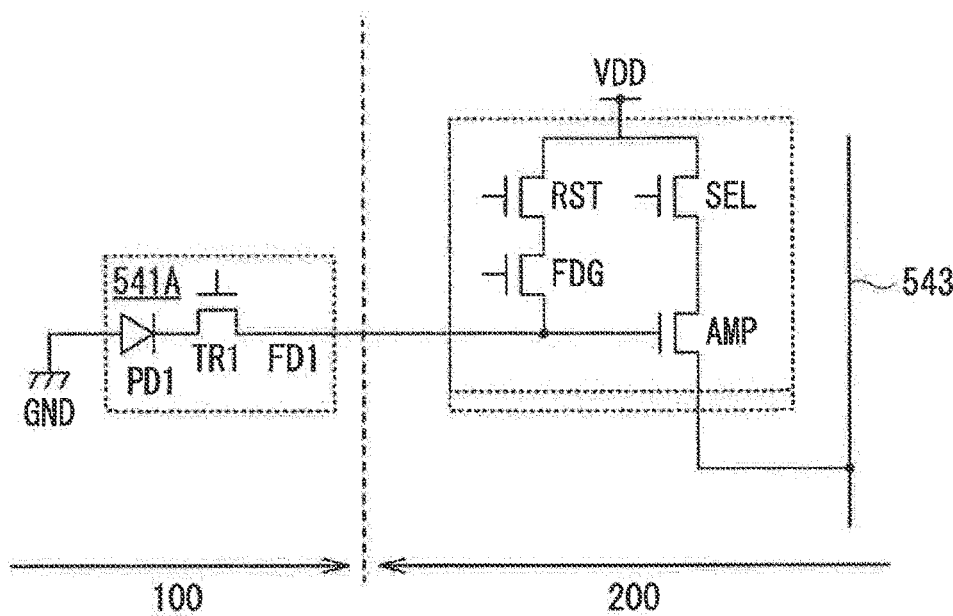
FIG. 73 is a figure representing another example of the equivalent circuit depicted in FIG. 41.

FIG. 73 represents a modification example of a pixel circuit of the image pickup apparatus 1 according to the embodiment described above. FIG. 73 corresponds to FIG. 41 explained in the embodiment described above. In the present modification example, a pixel circuit 210 is provided for each pixel (pixel 541A). That is, the pixel circuit 210 is not shared by plural pixels. In this respect, the image pickup apparatus 1 according to the present modification example is different from the image pickup apparatus 1 explained in the embodiment described above.

The image pickup apparatus 1 according to the present modification example is the same as the image pickup apparatus 1 explained in the embodiment described above in that pixels 541A and pixel circuits 210 are provided in different substrates (the first substrate 100 and the second substrate 200). Because of this, the image pickup apparatus 1 according to the present modification example also can provide advantages similar to those explained in the embodiment described above.

8. Seventh Modification Example

Figure 74:
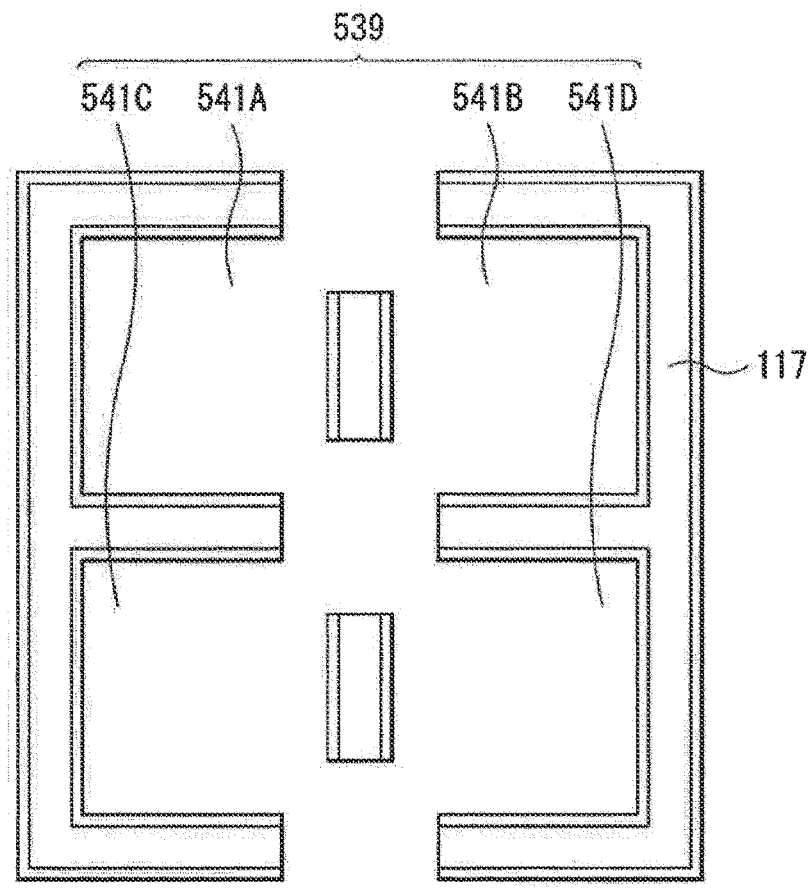

FIG. 74 represents a modification example of a planar configuration of the pixel separating section 117 explained in the embodiment described above. Gaps may be provided in the pixel separating section 117 surrounding pixels 541A, 541B, 541C and 541D. That is, the entire circumference of the pixels 541A, 541B, 541C and 541D may not be surrounded by the pixel separating section 117. For example, the gaps of the pixel separating section 117 are provided near pad sections 120 and 121 (see FIG. 44B).

While the pixel separating section 117 has an FTI structure penetrating the semiconductor layer 100S in the example explained in the embodiment described above (see FIG. 43), the pixel separating section 117 may have a configuration other than the FTI structure. For example, the pixel separating section 117 may not be provided to penetrate the semiconductor layer 100S completely, and may have what is generally called a DTI (Deep Trench Isolation) structure.

Fifth Embodiment

Figure 75:
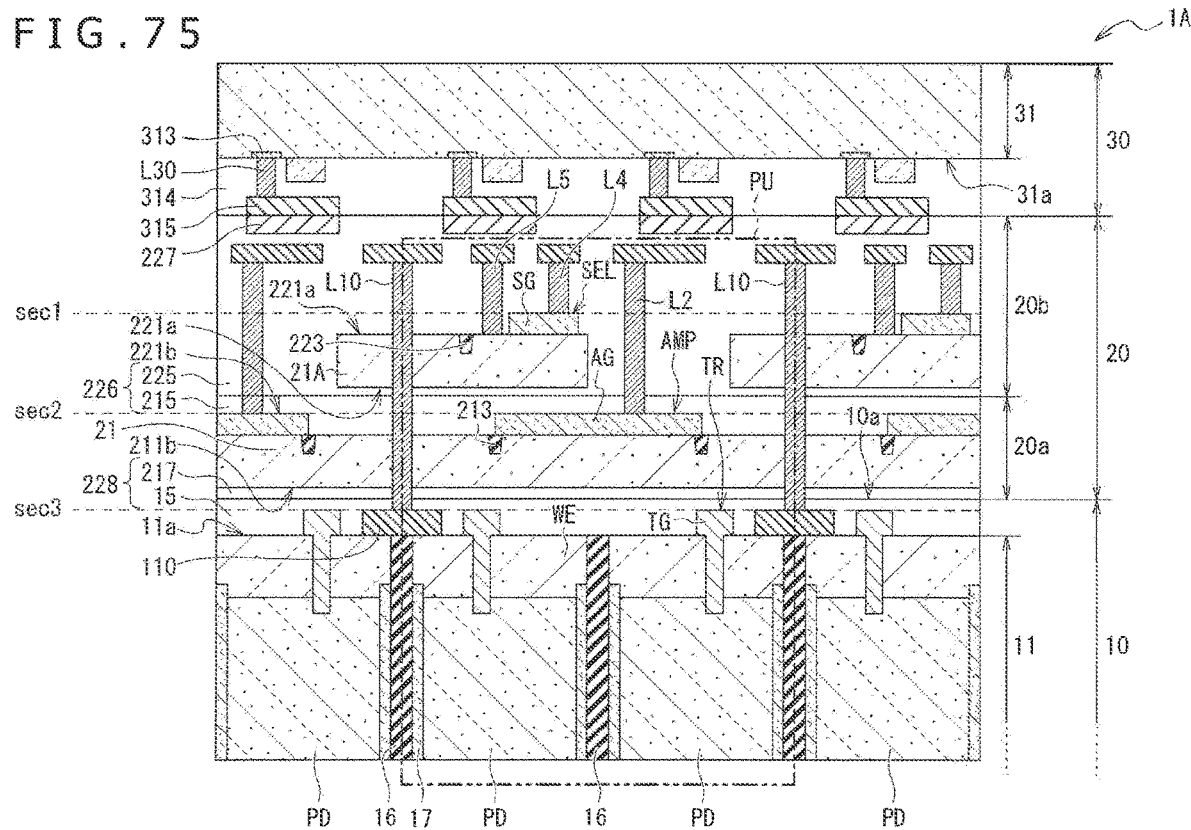
FIG. 75 is a cross-sectional view depicting a configuration example of an image pickup apparatus according to a fifth embodiment of the present disclosure taken along the thickness direction.
Figure 76:
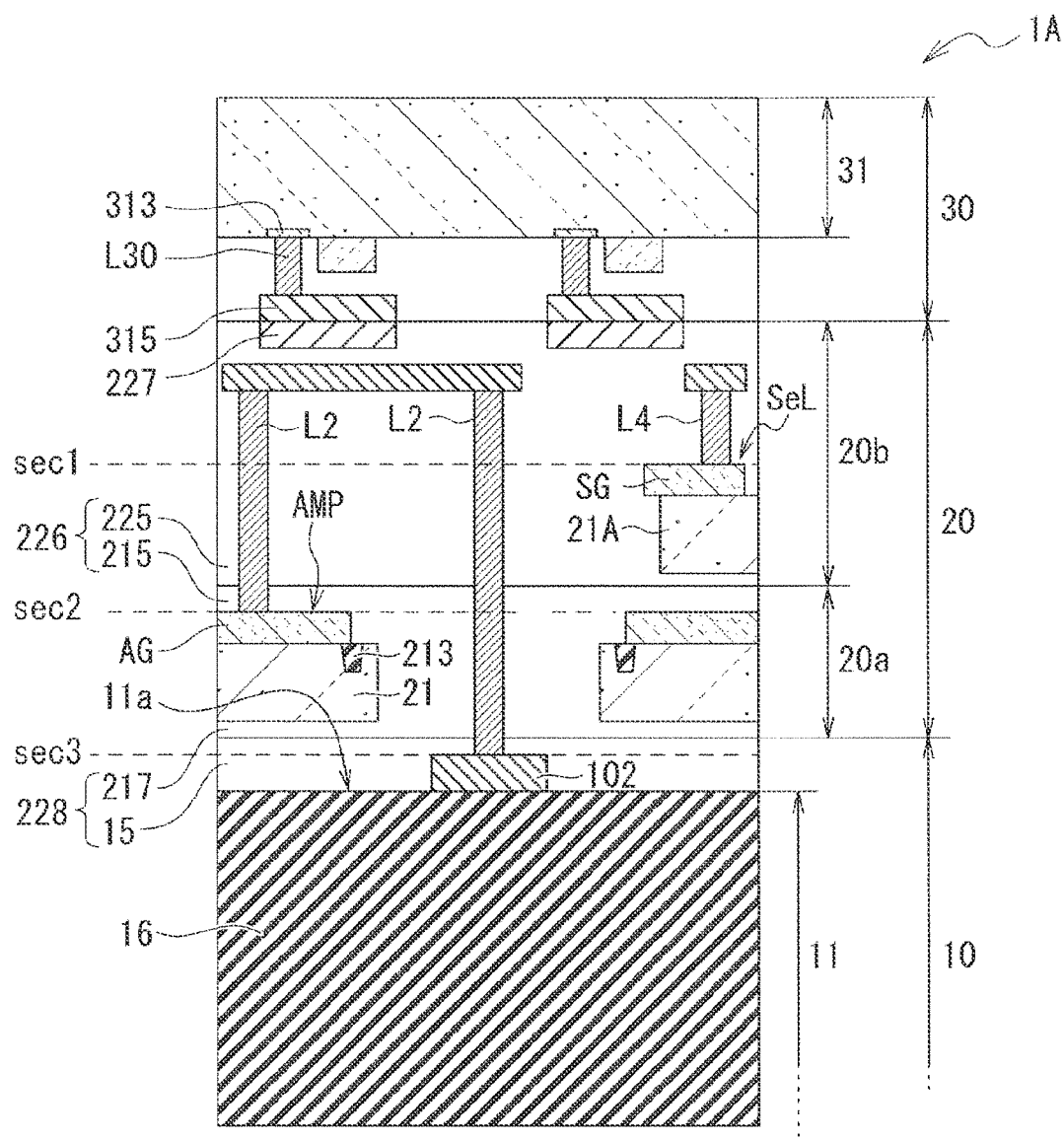
FIG. 76 is a cross-sectional view depicting a configuration example of the image pickup apparatus according to the fifth embodiment of the present disclosure taken along the thickness direction.
Figure 77:
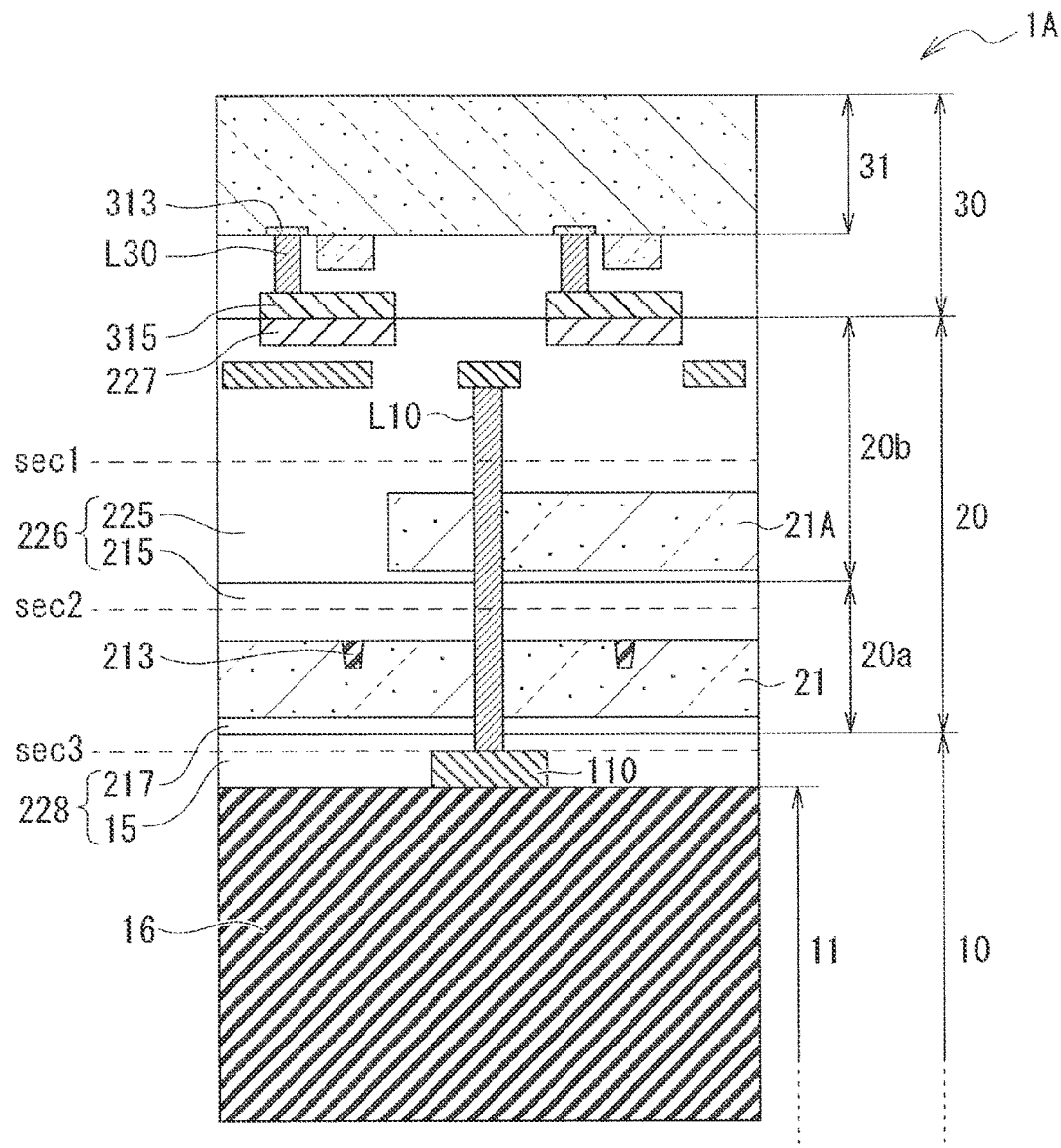
FIG. 77 is a cross-sectional view depicting a configuration example of the image pickup apparatus according to the fifth embodiment of the present disclosure taken along the thickness direction.
Figure 78:
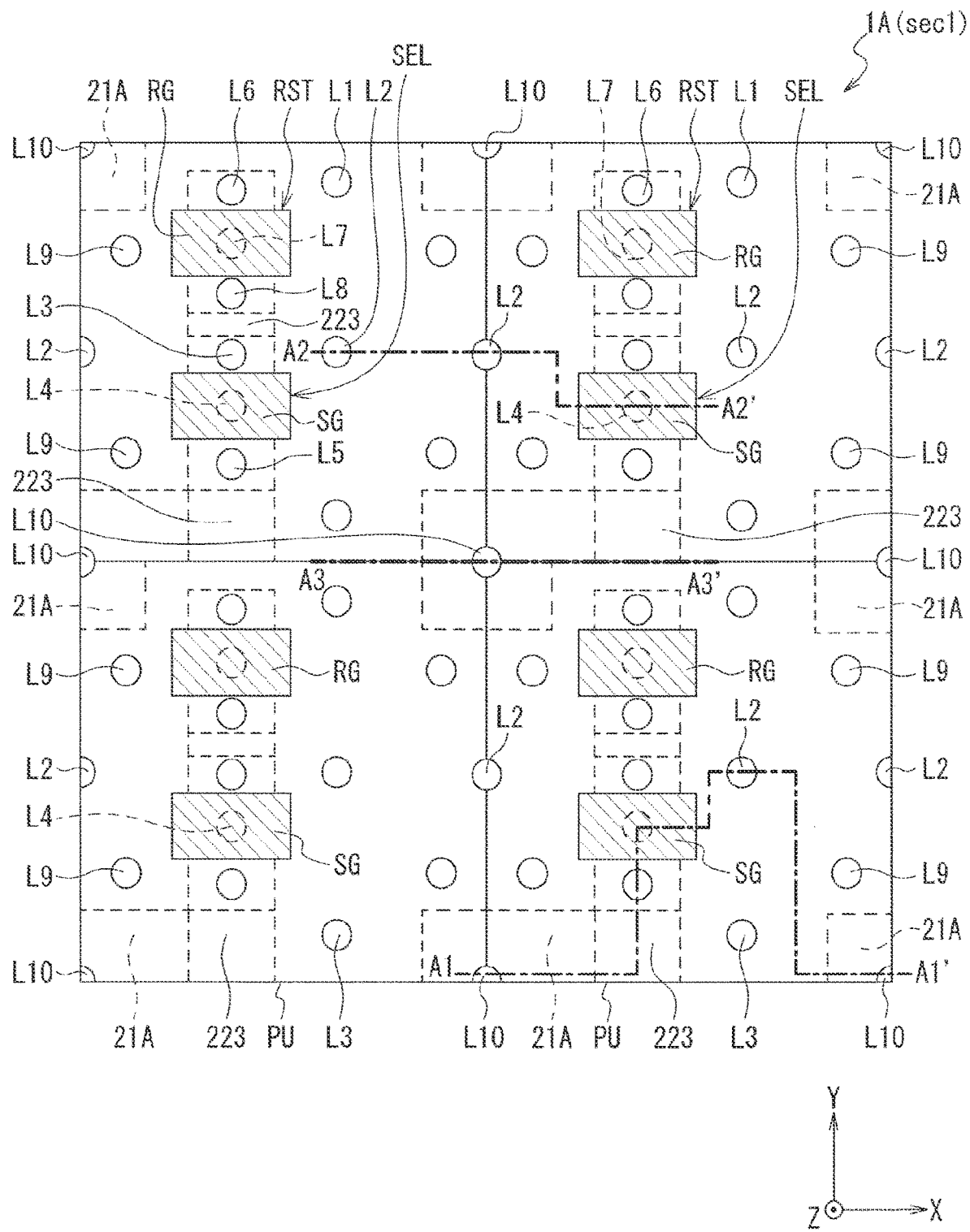
FIG. 78 is a horizontal cross-sectional view depicting a layout example of plural pixel units according to the fifth embodiment of the present disclosure.
Figure 79:
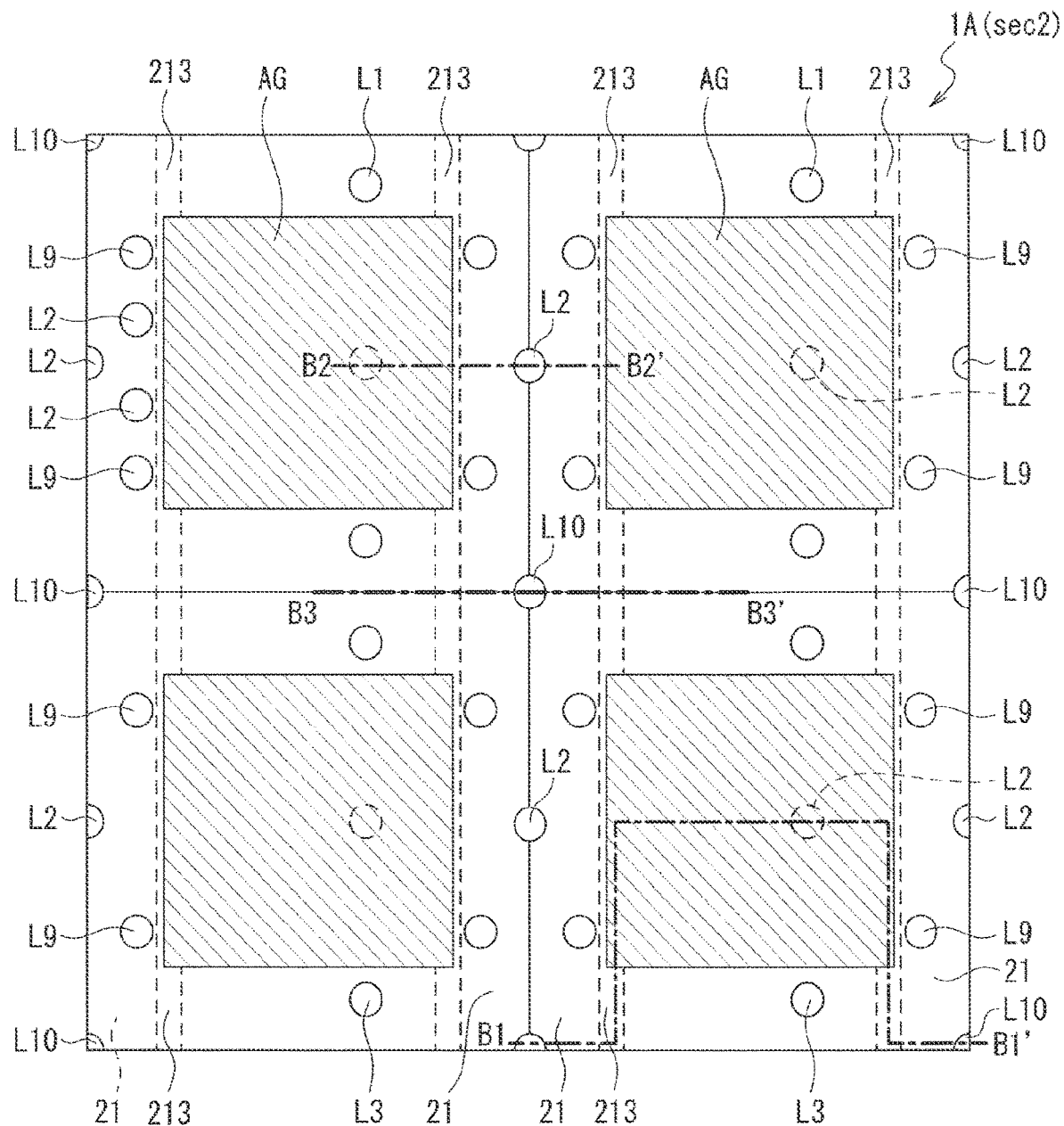
FIG. 79 is another horizontal cross-sectional view depicting a layout example of plural pixel units according to the fifth embodiment of the present disclosure.
Figure 80:
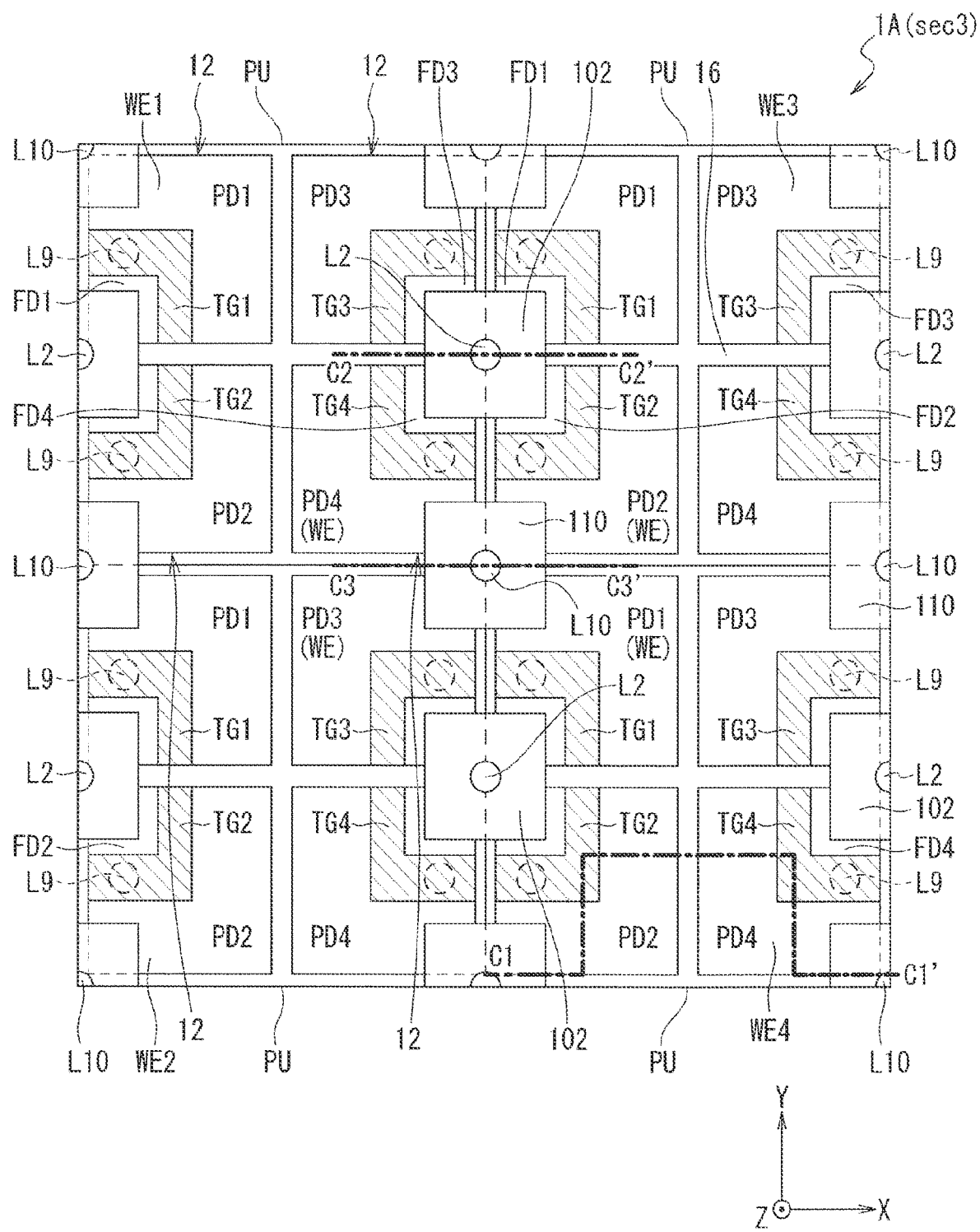
FIG. 80 is still another horizontal cross-sectional view depicting a layout example of plural pixel units according to the fifth embodiment of the present disclosure.

FIG. 75 to FIG. 77 are cross-sectional views depicting a configuration example of an image pickup apparatus 1A according to a fifth embodiment of the present disclosure taken in the thickness direction. FIG. 78 to FIG. 80 are horizontal cross-sectional views depicting a layout example of plural pixel units PU according to the fifth embodiment of the present disclosure. Note that the cross-sectional views depicted in FIG. 75 to FIG. 77 are merely schematic diagrams, and are not figures aimed for strictly correctly depicting the actual structure. In order to explain the configuration of the image pickup apparatus 1A in an easy-to-understand manner on the paper surfaces, in the cross-sectional views depicted in FIG. 75 to FIG. 77, horizontal positions of depicted transistors and impurity diffusion layers are intentionally made different among positions sec1 to sec3.

Specifically, in a pixel unit PU of the image pickup apparatus 1A depicted in FIG. 75, the cross-section at position sec1 is a cross-section taken along line A1-A1' in FIG. 78, the cross-section at position sec2 is a cross-section taken along line B1-B1' in FIG. 79, and the cross-section at position sec3 is a cross-section taken along line C1-C1' in FIG. 80. Similarly, in the image pickup apparatus 1A depicted in FIG. 76, the cross-section at position sec1 is a cross-section taken along line A2-A2' in FIG. 78, the cross-section at position sec2 is a cross-section taken along line B2-B2' in FIG. 79, and the cross-section at position sec3 is a cross-section taken along line C2-C2' in FIG. 80. In the image pickup apparatus 1A depicted in FIG. 77, the cross-section at position sec1 is a cross-section taken along line A3-A3' in FIG. 78, the cross-section at position sec2 is a cross-section taken along line B3-B3' in FIG. 79, and the cross-section at position sec3 is a cross-section taken along line C3-C3' in FIG. 80.

As depicted in FIG. 75, the second substrate 20 is stacked on the front surface 10a side of the first substrate section 10. Photodiodes PD, transfer transistors TR and floating diffusions FD are provided on the front surface 10a side of the first substrate 10. A photodiode PD, a transfer transistor TR and a floating diffusion FD are provided for each sensor pixel 12. The other surface of the first substrate 10 is a light-incidence surface. The image pickup apparatus 1 is a backside illumination image pickup apparatus, and has color filters and light-reception lenses that are provided on the backside thereof. A color filter and a light-reception lens are provided for each sensor pixel 12.

The semiconductor substrate 11 that the first substrate 10 has includes a silicon substrate, for example. Well layers WE of a first conductivity type (e.g., p type) are provided at and near parts of the front surface of the semiconductor substrate 11, and photodiodes PD of a second conductivity type (e.g., n type) are provided in regions deeper than the well layers WE. Well-contact layers with a higher p-type concentration than that of the well layers WE, and n-type floating diffusions FD are provided in the well layers WE.

The semiconductor substrate 11 is provided with element separation layers 16 that electrically separate mutually adjacent sensor pixels 12. For example, the element separation layers 16 have an STI (Shallow Trench Isolation) structure, and extend in the depth direction of the semiconductor substrate 11. In the semiconductor substrate 11, impurity diffusion layers 17 are provided between the element separation layers 16 and the photodiodes PD. For example, the impurity diffusion layers 17 have p-type layers and n-type layers extending in the thickness direction of the semiconductor substrate 11. The p-type layers are positioned on the element separation layer 16 sides, and the n-type layers are positioned on the photodiode PD sides. An insulating film 15 is provided on a front surface 11a side of the semiconductor substrate 11.

The second substrate 20 has a lower substrate 20a and an upper substrate 20b. The lower substrate 20a has a first semiconductor substrate 21. For example, the first semiconductor substrate 21 is a silicon substrate including monocrystalline silicon. On one surface 211a side of the first semiconductor substrate 21, amplification transistors AMP, and element separation layers 213 surrounding the circumference of the amplification transistors AMP are provided. Each element separation layer 213 electrically separates one amplification transistors AMP of adjacent pixel units PU and the other amplification transistor AMP. The lower substrate 20a has an insulating film 215 covering a front surface 211a of the first semiconductor substrate 21. The insulating film 215 covers the amplification transistors AMP and the element separation layers 213. In addition, the lower substrate 20a has an insulating film 217 covering the other surface 211b of the first semiconductor substrate 21. The insulating film 15 of the first substrate 10 and the insulating film 217 of the lower substrate 20a are joined together to form an interlayer dielectric film 228.

The upper substrate 20b has a second semiconductor substrate 21A. For example, the second semiconductor substrate 21A is a silicon substrate including monocrystalline silicon. On one surface 221a side of the second semiconductor substrate 21A, reset transistors RST and selection transistors SEL, and element separation layers 223 are provided. For example, each element separation layers 223 is provided between a reset transistor RST and a selection transistor SEL or between a selection transistor SEL and a well layer of the second semiconductor substrate 21A. The upper substrate 20b has an insulating film 225 that covers a front surface 221a, a backside 221b and side surfaces of the second semiconductor substrate 21A. The insulating film 215 of the lower substrate 20a and the insulating film 225 of the upper substrate 20b are joined together to form an interlayer dielectric film 226.

The image pickup apparatus 1 includes plural wires L1 to L10 that are provided in the interlayer dielectric films 226 and 228, and are electrically connected to at least one of the first substrate 10 and the second substrate 20. The wire L1 electrically connects the drain of an amplification transistor AMP and a power line VDD. The wire L2 electrically connects four floating diffusions FD included in one pixel unit PU and a gate electrode AG of the amplification transistor AMP. The wire L3 electrically connects the source of the amplification transistor AMP and the drain of a selection transistor SEL. The wire L4 electrically connects a gate electrode SG of the selection transistor SEL and a pixel driving line 23 (see FIG. 1).

The wire L5 electrically connects the source of the selection transistor SEL and a vertical signal line 24. The wire L6 electrically connects the drain of a reset transistor RST and the power line VDD. The wire L7 electrically connects a gate electrode RG (see FIG. 4A mentioned below) of the reset transistor RST and the pixel driving line 23. The wire L8 electrically connects the source of the reset transistor RST and the wire L2. The wire L9 (an example of a first wire) electrically connects a gate electrode TG of a transfer transistor TR and the pixel driving line 23 (see FIG. 1). The wire L10 electrically connects a well-contact layer and a reference potential line that supplies a reference potential (e.g., ground potential: 0 V).

In the wires L1 to L10, portions extending in the thickness direction of the stack include tungsten (W), and portions extending in a direction (e.g., the horizontal direction) orthogonal to the thickness direction of the stack include copper (Cu) or a Cu alloy including Cu as its principal component. It should be noted however that in embodiments of the present disclosure, a material included in the wires L1 to L10 is not limited to these, and another material may be included. The second substrate 20 has plural pad electrodes 227 that are connected to certain wires (e.g., the wires L1, L4 to L7, L9 and L10) in the wires L1 to L10 described above.

The third substrate 30 is arranged on a side of the second substrate 20 which is opposite to a surface that faces the first substrate 10. The third substrate 30 includes the semiconductor substrate 31, an insulating film 304 that covers a front surface 301a side of the semiconductor substrate 31, plural wires L30 provided on the front surface 301a side of the semiconductor substrate 31, and pad electrodes 305 connected to the plural wires L30. For example, the semiconductor substrate 31 is a silicon substrate including monocrystalline silicon.

The wires L30 are provided in contact holes. In the wires L30, portions extending in the thickness direction of the third substrate 30 include titanium (Ti) or cobalt (Co), and portions extending in a direction (e.g., the horizontal direction) orthogonal to the thickness direction of the third substrate 30 include Cu or a Cu alloy including Cu as its principal component. At connecting sections between the wires L30 and the semiconductor substrate 31, a silicide 39 (e.g., titanium silicide (TiSi) or cobalt silicide ($CoSi_2$)) is formed.

For example, the plural pad electrodes 305 include Cu or a Cu alloy. In the thickness direction of the image pickup apparatus 1, the pad electrodes 305 of the third substrate 30 face, and are electrically connected with the pad electrodes 227 of the second substrates 20. For example, the pad electrodes 305 and 227 are integrated into one by being Cu—Cu-joined in a state in which they face each other. Thereby, the second substrate 20 and the third substrate 30 are electrically connected, and the strength of pasting of the second substrate 20 and the third substrate 30 is increased.

In the fifth embodiment of the present disclosure, one floating-diffusion contact may be arranged for each set of plural sensor pixels 12. For example, four mutually adjacent sensor pixels 12 may share one floating-diffusion contact. Similarly, one well contact may be arranged for each set of plural sensor pixels 12. For example, four mutually adjacent sensor pixels 12 may share one well contact. In addition, one wire L2 (floating diffusion contact) that is electrically connected with a floating diffusion FD, and one wire L10 (well contact) that is electrically connected with a well layer WE may be arranged for each of plural sensor pixels 12.

As depicted in FIG. 76 and FIG. 80, in the image pickup apparatus 1A, each common pad electrode 102 (an example of a "first common pad electrode" of the present disclosure) arranged across plural sensor pixels 12, and each wire L2 provided on the common pad electrode 102 are shared. For example, when seen in a plan view, in the image pickup apparatus 1A, there are regions where floating diffusions FD1 to FD4 of four sensor pixels 12 are adjacent to each other with element separation layers 16 being interposed therebetween. In each of these regions, a common pad electrode 102 is provided. The common pad electrode 102 is arranged across the four floating diffusions FD1 to FD4, and is electrically connected with each of the four floating diffusions FD1 to FD4. For example, the common pad electrodes 102 include polysilicon films doped with n-type impurities or p-type impurities.

One wire L2 (i.e., a floating diffusion contact) is provided on a central section of each common pad electrode 102. As depicted in FIG. 76 and FIG. 78 to FIG. 80, the wire L2 provided on the central section of the common pad electrode 102 penetrates the lower substrate 20a of the second substrate 20 from the first substrate 10, extends to the upper substrate 20b of the second substrate 20, and is connected to a gate electrode AG of an amplification transistor AMP via a wire or the like provided in the upper substrate 20b.

In addition, as depicted in FIG. 75 and FIG. 80, in the image pickup apparatus 1A, each common pad electrode 110 (an example of a "second common pad electrode" of the present disclosure) arranged across plural sensor pixels 12, and each wire L10 provided on the common pad electrode 110 are shared. For example, when seen in a plan view, in the image pickup apparatus 1A, there are regions where well layers WE of four sensor pixels 12 are adjacent to each other with element separation layers 16 being interposed therebetween. In each of these regions, a common pad electrode 110 is provided. The common pad electrode 110 is arranged across the well layers WE of the four sensor pixels 12, and is electrically connected with the well layers WE of the four sensor pixels 12. In an example, the common pad electrode 110 is arranged between one common pad electrode 102 and another common pad electrode 102 that are next to each other in the Y-axis direction. In the Y-axis direction, the common pad electrodes 102 and 110 are alternately arranged next to each other. For example, the common pad electrodes 110 include polysilicon films doped with n-type impurities or p-type impurities.

One wire L10 (i.e., a well contact) is provided on a central section of each common pad electrode 110. As depicted in FIG. 75 and FIG. 77 to FIG. 80, the wire L10 provided on the central section of the common pad electrode 110 penetrates the lower substrate 20a of the second substrate 20 from the first substrate 10, extends to the upper substrate 20b of the second substrate 20, and is connected to a reference potential line that supplies a reference potential (e.g., ground potential: 0 V) via a wire or the like provided in the upper substrate 20b.

Each wire L10 provided on a central section of a common pad electrode 110 is electrically connected to the top surface of the common pad electrode 110, the inner side surface of a through-hole provided through the lower substrate 20a, and the inner side surface of a through-hole provided through the upper substrate 20b. Thereby, a well layer WE of the semiconductor substrate 11 of the first substrate 10, and a well layer of the lower substrate 20a and a well layer of the upper substrate 20b of the second substrate 20 are connected to a reference potential (e.g., ground potential: 0 V).

The image pickup apparatus 1A according to the fifth embodiment of the present disclosure includes: the first substrate 10 provided with sensor pixels 12 that perform photoelectric conversion; and the second substrate 20 that is arranged on a front surface 12a side of the first substrate 10, and has read circuits 22 that output pixel signals based on electric charge output from the sensor pixels 12. The second substrate 20 has: the first semiconductor substrate 21 provided with amplification transistors AMP included in the read circuits 22; and the second semiconductor substrate 21A that is arranged on the front surface 211a side of the first semiconductor substrate 21, and is provided with selection transistors SEL and reset transistors RST that are included in the read circuits 22.

According to this, as compared with a case where all transistors included in read circuits 22 are arranged in one semiconductor substrate, the area size of arrangement regions of the transistors can be increased, and so the degree of freedom of the layout of the read circuits 22 is enhanced. Thereby, the area size of the gate of an amplification transistor AMP can be maximized in each pixel unit PU, and favorable noise characteristics can be realized. By maximizing the area size of each amplification transistor AMP, it becomes possible to reduce random noise generated in the image pickup apparatus 1.

In addition, the image pickup apparatus 1A further includes common pad electrode 102 and 110 that are provided on the front surface 11a side of the semiconductor substrate 11 included in the first substrate 10, and are arranged across plural mutually adjacent sensor pixels 12 (e.g., four sensor pixels). Each common pad electrode 102 is electrically connected with floating diffusions FD of four sensor pixels 12. Each common pad electrode 110 is electrically connected with well layers WE of the four sensor pixels 12. According to this, each set of four sensor pixels 12 can share a wire L2 connected to the floating diffusions FD. Each set of four sensor pixels 12 can share a wire L10 connected to the well layers WE. Thereby, the numbers of the wires L2 and L10 can be reduced, and so it is possible to reduce the area sizes sensor pixels 12, and to reduce the size of the image pickup apparatus 1A.

In addition, similarly to the fifth embodiment of the present disclosure, while amplification transistors AMP, reset transistors RST and selection transistors SEL that can be included in read circuits 22 are formed in the same semiconductor substrate 21 in the example depicted regarding the second substrate 20 of the semiconductor apparatus according to the first embodiment depicted in FIG. 25, at least one type of transistor may be formed in the semiconductor substrate 21, and the remaining types of transistors may be formed in the semiconductor substrate 21A which is different from the semiconductor substrates 11 and 21. Although not depicted, for example, regarding the semiconductor substrate 21A, insulation layers 52 and 57, connecting sections 59 and connection wires 55 are formed on the semiconductor substrate 21, and furthermore the semiconductor substrate 21A is stacked thereon. The new semiconductor substrate is stacked on a surface opposite to a surface of the interlayer dielectric film 51 to be stacked on the semiconductor substrate 11, and desired transistors can be formed therein. For example, amplification transistors AMP can be formed in the semiconductor substrate 21, and reset transistors RST and/or selection transistors SEL can be formed in the semiconductor substrate 21A.

In addition, plural new semiconductor substrates may be provided, and transistors of desired read circuits 22 may be provided in each of them. For example, amplification transistors AMP can be formed in the semiconductor substrate 21. Further, if an insulation layer, connecting sections and connection wires are stacked on the semiconductor substrate 21, and furthermore the semiconductor substrate 21A is stacked thereon, reset transistors RST can be formed in the semiconductor substrate 21A. If an insulation layer, connecting sections and connection wires are stacked on the semiconductor substrate 21A, and furthermore a semiconductor substrate 21B is stacked thereon, selection transistors SEL can be formed in the semiconductor substrate 21B. Transistors formed in the semiconductor substrates 21, 21A and 21B may be any transistors included in the read circuits 22.

Due to the configuration in which the second substrate 20 is provided with plural semiconductor substrates in such a manner, it is possible to reduce the area size in the semiconductor substrate 21 that is occupied by one read circuit 22. It becomes possible also to reduce the area sizes of chips if it is possible to reduce the area size of each read circuit 22 and miniaturize each transistor. In addition, it is possible to expand the area size of a desired transistor in an amplification transistor, a reset transistor and a selection transistor that can be included in a read circuit 22. In particular, a noise reduction effect can also be expected by expanding the area size of the amplification transistor.

In such a manner, in the configuration of the semiconductor apparatus according to the first to fourth embodiments also, the second substrate 20 can be provided with plural semiconductor substrates. In a case where the configuration in which plural semiconductor substrates are provided in the second substrate 20 is adopted, each of the plural semiconductor substrates provided in the second substrate 20 may be a compound semiconductor substrate. Examples of a material of the compound semiconductor substrate include, for example, gallium nitride (GaN), gallium arsenide (GaAs), silicon carbide (SiC), indium phosphide (InP), aluminum gallium arsenide (AlGaAs) and the like.

Application Example

Figure 81:
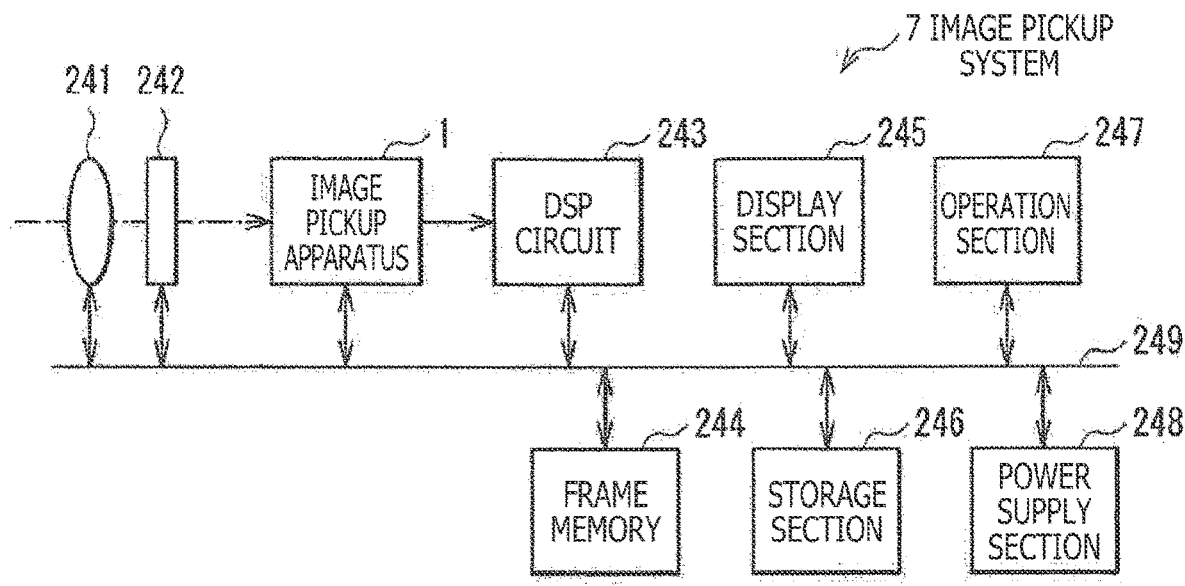
FIG. 81 is a figure representing an example of a schematic configuration of an image pickup system including the image pickup apparatus according to the embodiments described above and modification examples thereof.

FIG. 81 represents an example of a schematic configuration of an image pickup system 7 including the image pickup apparatus 1 according to the embodiment described above and modification examples thereof.

For example, the image pickup system 7 is electronic equipment such as an image pickup apparatus such as a digital still camera or a video camera, or a mobile terminal apparatus such as a smartphone or a tablet-type terminal. For example, the image pickup system 7 includes the image pickup apparatus 1 according to the embodiment described above and modification examples thereof, a DSP circuit 243, a frame memory 244, a display section 245, a storage section 246, an operation section 247 and a power supply section 248. In the image pickup system 7, the image pickup apparatus 1 according to the embodiment described above and modification examples thereof, the DSP circuit 243, the frame memory 244, the display section 245, the storage section 246, the operation section 247 and the power supply section 248 are connected with each other via a bus line 249.

The image pickup apparatus 1 according to the embodiment described above and modification examples thereof outputs image data according to incident light. The DSP circuit 243 is a signal processing circuit that processes signals (image data) output from the image pickup apparatus 1 according to the embodiment described above and modification examples thereof. The frame memory 244 temporarily retains framewise image data processed by the DSP circuit 243. For example, the display section 245 includes a panel-type display apparatus such as a liquid crystal panel or an organic EL (Electro Luminescence) panel, and displays moving images or still images picked up by the image pickup apparatus 1 according to the embodiment described above and modification examples thereof. The storage section 246 records image data of moving images or still images picked up by the image pickup apparatus 1 according to the embodiment described above and modification examples thereof on a recording medium such as a semiconductor memory or a hard disk. According to operation by a user, the operation section 247 gives an operation command for various types of functions that the image pickup system 7 has. As appropriate, the power supply section 248 supplies the image pickup apparatus 1 according to the embodiment described above and modification examples thereof, the DSP circuit 243, the frame memory 244, the display section 245, the storage section 246 and the operation section 247 with various types of power supplies to be operation power supplies of those supply targets.

Next, an image pickup procedure at the image pickup system 7 is explained.

Figure 82:
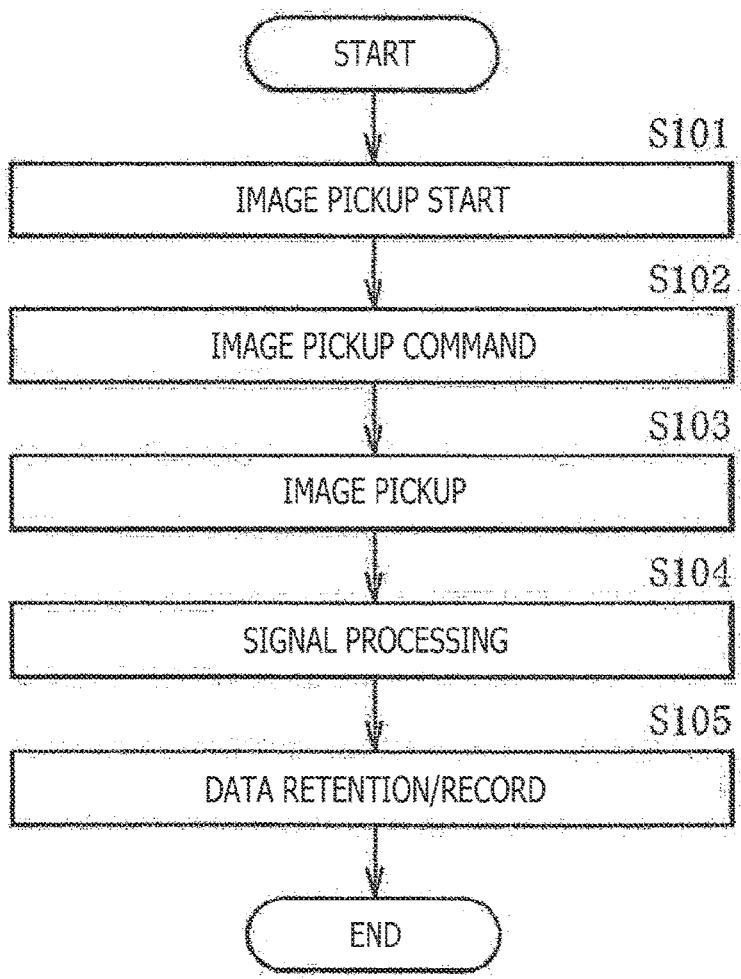
FIG. 82 is a figure representing an example of an image pickup procedure of the image pickup system depicted in FIG. 81.

FIG. 82 represents an example of a flowchart of image pickup operation at the image pickup system 7. A user operates the operation section 247 to thereby give instructions on start image pickup (Step S101). Then, the operation section 247 transmits an image pickup command to the image pickup apparatus (Step S102). Upon receiving the image pickup command, the image pickup apparatus 1 (specifically, the system control circuit 36) executes image pickup by a predetermined image pickup method (Step S103).

The image pickup apparatus 1 outputs image data obtained by the image pickup to the DSP circuit 243. Here, the image data means data corresponding to all pixels of pixel signals generated on the basis of electric charge temporarily retained in floating diffusions FD. On the basis of the image data input from the image pickup apparatus 1, the DSP circuit 243 performs predetermined signal processing (e.g., a noise reduction process, etc.) (Step S104). The DSP circuit 243 makes the frame memory 244 retain the image data on which the predetermined signal processing has been performed, and the frame memory 244 causes the image data to be stored on the storage section 246 (Step S105). In such a manner, image pickup at the image pickup system 7 is performed.

In the present application example, the image pickup apparatus 1 according to the embodiment described above and modification examples thereof is applied to the image pickup system 7. Thereby, the image pickup apparatus 1 with a smaller size or higher resolution can be realized, and so the image pickup system 7 with a smaller size or higher resolution can be provided.

Application Examples

First Application Example

The technology according to the present disclosure (present technology) can be applied to various products. For example, the technology according to the present disclosure may be realized as an apparatus to be mounted on any type of mobile body such as an automobile, an electric automobile, a hybrid electric automobile, a motorcycle, a bicycle, a personal mobility, an airplane, a drone, a ship or a robot.

Figure 83:
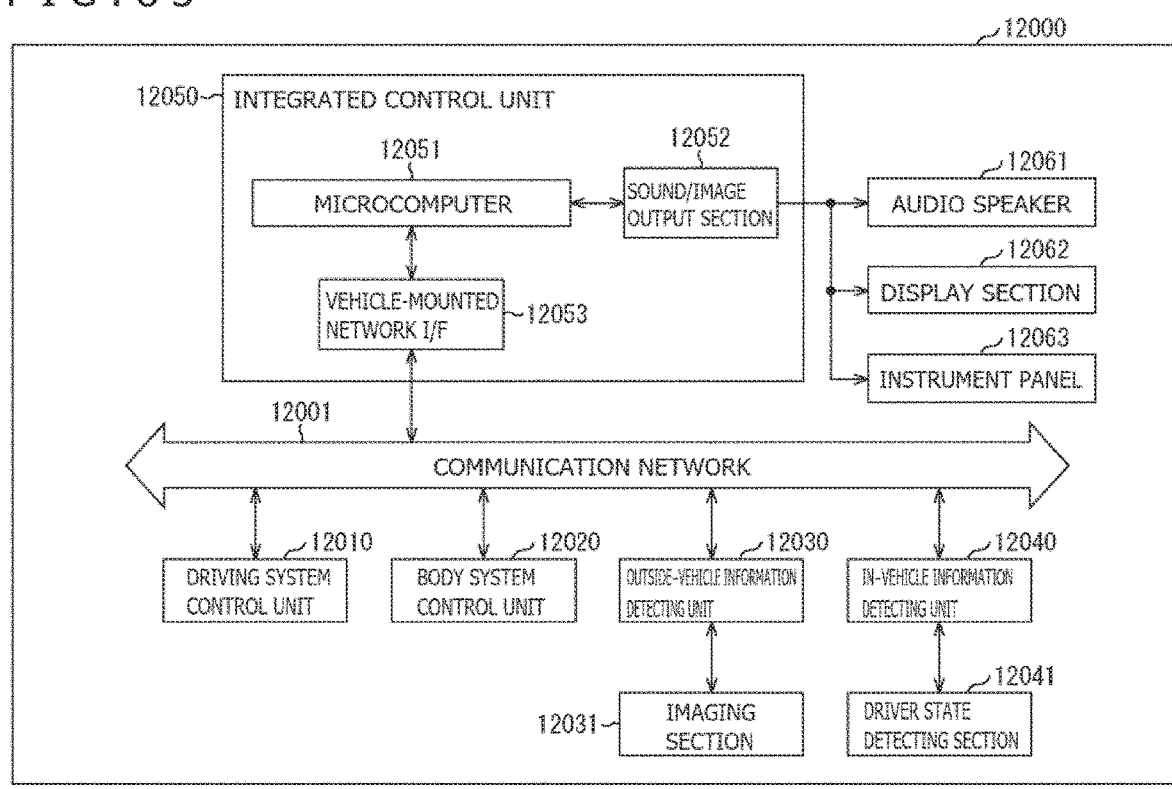
FIG. 83 is a block diagram depicting an example of a schematic configuration of a vehicle control system.

FIG. 83 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 83, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 83, an audio speaker 12061, a display section 12062, and an instrument panel 12063 are illustrated as the output device. The display section 12062 may, for example, include at least one of an on-board display and a head-up display.

Figure 84:
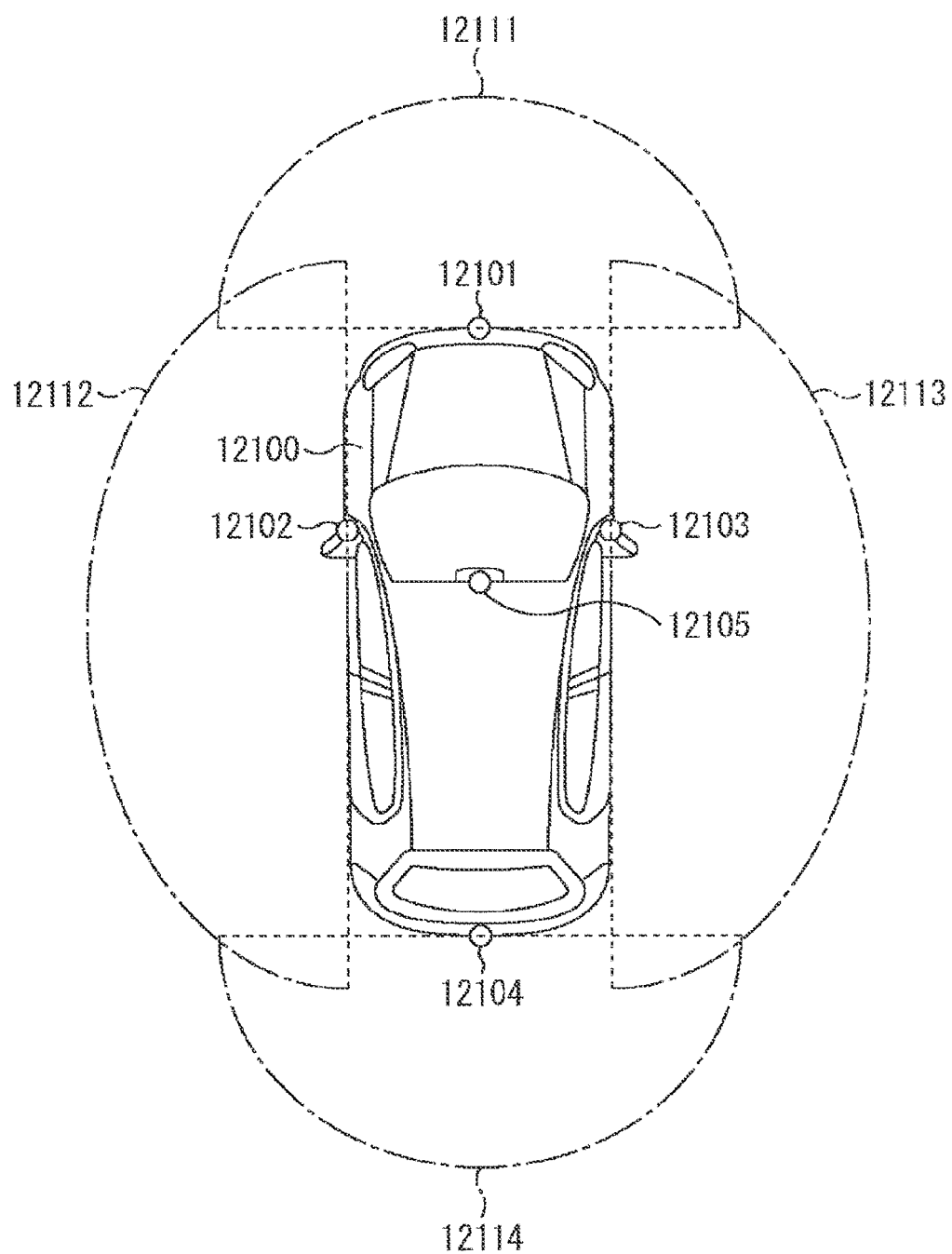
FIG. 84 is a diagram of assistance in explaining an example of installation positions of an outside-vehicle information detecting section and an imaging section.

FIG. 84 is a diagram depicting an example of the installation position of the imaging section 12031.

In FIG. 84, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 84 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the mobile body control system to which the technology according to the present disclosure can be applied is explained above. The technology according to the present disclosure can be applied to the imaging section 12031 in the configuration explained above. Specifically, the image pickup apparatus 1 according to the embodiment described above and modification examples thereof can be applied to the imaging section 12031. By applying the technology according to the present disclosure to the imaging section 12031, high-resolution captured images with less noise can be obtained, and so highly precise control using the captured images can be performed in the mobile body control system.

Second Application Example

Figure 85:
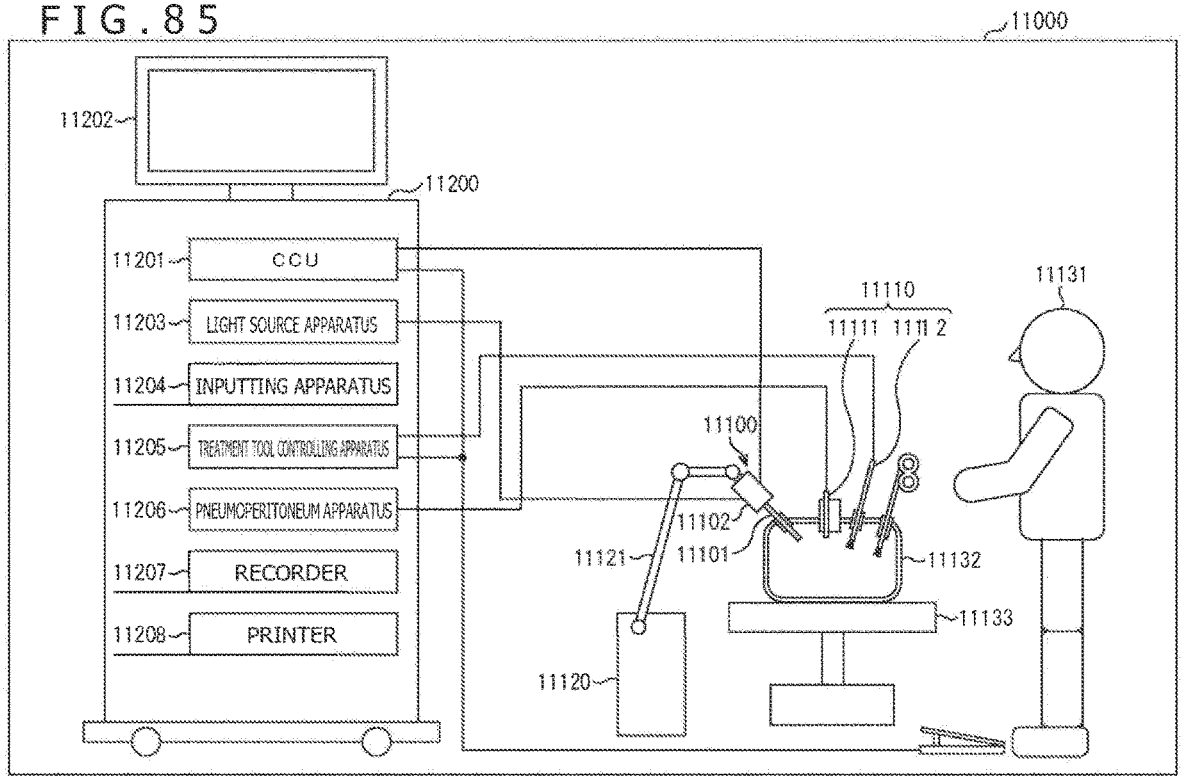
FIG. 85 is a view depicting an example of a schematic configuration of an endoscopic surgery system.

FIG. 85 is a view depicting an example of a schematic configuration of an endoscopic surgery system to which the technology according to an embodiment of the present disclosure (present technology) can be applied.

In FIG. 85, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 86:
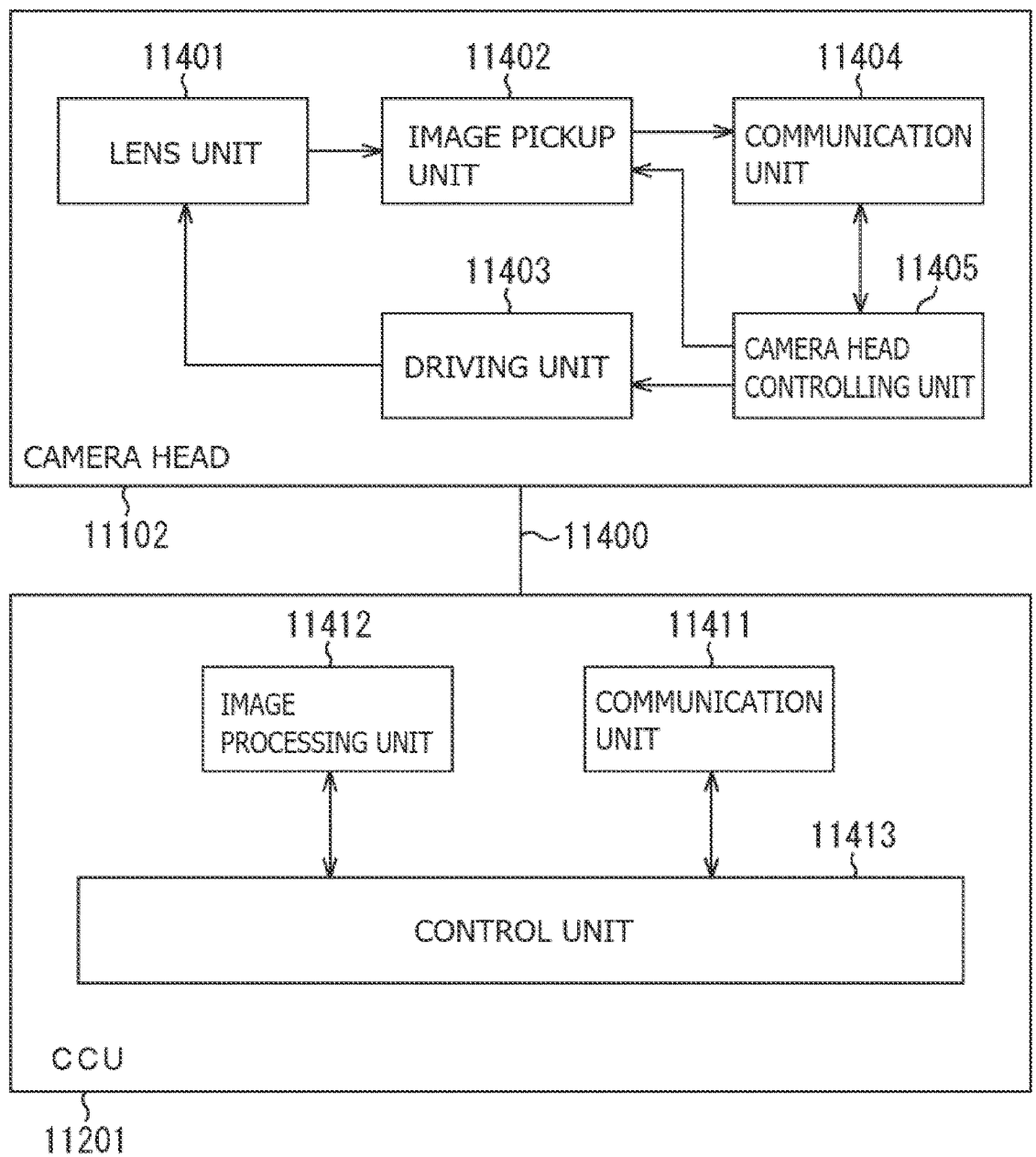
FIG. 86 is a block diagram depicting an example of a functional configuration of a camera head and a camera control unit (CCU).

FIG. 86 is a block diagram depicting an example of a functional configuration of the camera head 11102 and the CCU 11201 depicted in FIG. 85.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied is explained above. The technology according to the present disclosure can be suitably applied to the image pickup unit 11402 provided in the camera head 11102 of the endoscope 11100 in the configurations explained above. By applying the technology according to the present disclosure to the image pickup unit 11402, the image pickup unit 11402 with a smaller size or higher resolution can be realized, and so the endoscope 11100 with a smaller size or higher resolution can be provided.

While the present disclosure has been explained above by mentioning embodiments, and modification examples, application examples and application examples thereof, the present disclosure is not limited to the embodiments and the like described above, and a variety of modifications are possible. Note that advantages described in the present specification are presented merely for illustrative purposes. Advantages of the present disclosure are not limited to the advantages described in the present specification. The present disclosure may have advantages other than the advantages described in the present specification.

Note that the present disclosure can have configurations like the ones below, for example.

(1)

A semiconductor apparatus including:

a first substrate that includes a first element layer including a first active element, and a first wiring layer arranged on the first element layer; and a second substrate that includes a second element layer including a second active element arranged on the first wiring layer, and a second wiring layer arranged on the second element layer, in which the first substrate and the second substrate are stacked one on another, and the second active element is provided in a first compound semiconductor substrate.

(2)

The semiconductor apparatus according to (1), in which the first active element is provided in a silicon substrate.

(3)

The semiconductor apparatus according to (1), in which the first active element is provided in a first silicon substrate, and the second active element is provided in the first compound semiconductor substrate stacked on a second silicon substrate.

(4)

The semiconductor apparatus according to any one of (1) to (3), in which a third substrate is stacked on the second substrate.

(5)

The semiconductor apparatus according to (1), in which the first substrate further includes a photoelectric converting section arranged under the first element layer.

(6)

The semiconductor apparatus according to (5), in which the first active element and the photoelectric converting section are provided in a second compound semiconductor substrate.

(7)

The semiconductor apparatus according to any one of (1) to (6), in which the semiconductor apparatus is included in a solid-state image pickup apparatus.

(8)

A semiconductor apparatus including:

a first substrate that includes a photoelectric converting section and a first wiring layer arranged on the photoelectric converting section; and a second substrate that includes an element layer including an active element arranged on the first wiring layer, and a second wiring layer arranged on the element layer, in which the first substrate and the second substrate are stacked one on another, and the photoelectric converting section is provided in a first compound semiconductor substrate.

(9)

The semiconductor apparatus according to (8), in which the first compound semiconductor substrate includes a semiconductor having a bandgap wider than a bandgap of silicon.

(10)

The semiconductor apparatus according to (8), in which the first compound semiconductor substrate includes a semiconductor having a bandgap narrower than a bandgap of silicon.

(11)

The semiconductor apparatus according to any one of (8) to (10), in which the active element is provided in a second compound semiconductor substrate.

(12)

The semiconductor apparatus according to any one of (8) to (11), in which the first compound semiconductor substrate is provided on a third compound semiconductor substrate.

(13)

A semiconductor apparatus manufacturing method including:

forming a first substrate including a first element layer including a first active element, and a first wiring layer by forming the first wiring layer on the first element layer;

preparing a second substrate in which a second element layer including a second active element is formed;

forming the second element layer on the first wiring layer by pasting, on a first wiring layer side of the first substrate, a second element layer side of the second substrate; and forming a second wiring layer on the second element layer.

(14)

A semiconductor apparatus manufacturing method including:

forming a first substrate including a photoelectric converting section provided in a compound semiconductor substrate, and a first wiring layer by forming the first wiring layer on the photoelectric converting section;

preparing a second substrate in which an element layer including an active element is formed;

forming the element layer on the first wiring layer by pasting, on a first wiring layer side of the first substrate, an element layer side of the second substrate; and forming a second wiring layer on the element layer.

REFERENCE SIGNS LIST 1, 1A: Image pickup apparatus
2, 7: Image pickup system
10: First substrate
11: Semiconductor substrate
12: Sensor pixel
20a: Lower substrate
20b: Upper substrate
21, 21A: Semiconductor substrate
22: Read circuit
23: Pixel driving line
24: Vertical signal line
30: Third substrate
31: Semiconductor substrate
32: Logic circuit
34: Column signal processing circuit
35: Horizontal driving circuit
36: System control circuit
38: Reference voltage supply section
40: Color filter
42: p well layer
43: Element separating section
44: p well layer
45: Fixed electric charge film
46: Insulation layer
47, 48: Through-wire
50: Light-reception lens
51: Interlayer dielectric film
52, 53: Insulation layer
54: Through-wire
55: Connection wire
56: Wiring layer
57: Insulation layer
58: Pad electrode
59: Connecting section
61: Interlayer dielectric film
64: Pad electrode
62: Wiring layer
63: Insulation layer
64: Pad electrode
100: First substrate
100S, 200S, 300S: Semiconductor layer
100T, 200T, 300T: Wiring layer
102, 110: Common pad electrode
111: Insulating film
112: Fixed electric charge film
113: First pinning region
114: n-type semiconductor region
115: p well layer
116: Second pinning region
117: Pixel separating section
117A: Light-shielding film
117B: Insulating film
118, 218: VSS contact region
119, 123, 222: Interlayer dielectric film
120, 121: Pad section
120E, 121E: Through-electrode
122, 221: Passivation film
124: Junction film 141: DSP circuit
142: Frame memory
143: Display section
144: Storage section
145: Operation section
146: Power supply section
147: Bus line
200: Second substrate
201, 202, 203, 204, 301, 302, 303, 304: Contact section
212: Insulation region
213: Element separation region
218V, TGV: Connection hole
227, 305: Pad electrode
300: Third substrate
401: Light-reception lens
541A, 541B, 541C, 541D: Pixel
1001: Pixel region
1002: Pixel
1003: Vertical driving circuit
1004: Column signal processing circuit
1005: Horizontal driving circuit
1006: Output circuit
1007: Control circuit
1008a: Pixel driving wire
1008b: Vertical signal line
1009: Horizontal signal line
1010: Sensor layer
1011: Semiconductor substrate (Si substrate)
1011a, 1011b, 1011c: Photoelectric converting section
1012: Element separating section
1020: First element layer
1021: First active element
1030: First wiring layer
1031, 1032, 1033, 1034: Wire
1035: Interlayer dielectric film
1042: Insulating film
1050: Second element layer
1051a: Semiconductor substrate (Si substrate)
1051b: Semiconductor substrate (compound semiconductor substrate)
1052, 1053, 1054, 1055: Second active element
1060: Second wiring layer
1070: Third wiring layer
1080: Third element layer
1081: Semiconductor substrate (Si substrate)
1091: Flattening film
1092: Color filter
1093: Microlens
1101: First substrate
1101a: Photoelectric converting section formation region
1102: Second substrate
1102a: Pixel transistor formation region
1103: Third substrate
1103a: Logic circuit formation region
2011: Compound semiconductor substrate
2012: Antireflection film
2013: Element separating section
2021, 2022: Diffusion layer
2051: Semiconductor substrate (Si substrate)
2081: Semiconductor substrate (Si substrate)
2101: Support substrate
2102: Insulating film
2103: Epitaxial growth layer (ART layer)
2104: Epitaxial growth layer
2105: Insulating film
2106: Support substrate 2107: Insulating film
2201: Support substrate
2202: Strain relaxation buffer layer (SRB layer)
2203: Epitaxial growth layer
2204: Insulating film
2205: Support substrate
2206: Insulating film
3200: Semiconductor apparatus
3201: Optical system (optical lens)
3202: Shutter apparatus
3204: Driving section
3203: Signal processing section
TR: Transfer transistor
TG: Transfer gate
RST: Reset transistor
AMP: Amplification transistor
SEL: Selection transistor
FDG: FD transfer transistor
FD: Floating diffusion

The invention claimed is:

1. A semiconductor apparatus, comprising:
a first substrate that includes:
    a first element layer including a first active element; and
    a first wiring layer on the first element layer; and
a second substrate that includes:
    a second element layer including a second active element on the first wiring layer, wherein the second element layer includes a first compound semiconductor substrate; and
    a second wiring layer on the second element layer, wherein
    the second element layer is between the first wiring layer and the second wiring layer,
    the first substrate is on the second substrate,
    the second active element includes a transistor, and
    a source region and a drain region of the second active element are in the first compound semiconductor substrate.

2. The semiconductor apparatus according to claim 1, wherein the first active element is in a silicon substrate.

3. The semiconductor apparatus according to claim 1, wherein
the first active element is in a first silicon substrate, and
the first compound semiconductor substrate is on a second silicon substrate.

4. The semiconductor apparatus according to claim 1, further comprising a third substrate on the second substrate.

5. The semiconductor apparatus according to claim 1, wherein the first substrate further includes a photoelectric converting section under the first element layer.

6. The semiconductor apparatus according to claim 5, wherein the first active element and the photoelectric converting section are in a second compound semiconductor substrate.

7. The semiconductor apparatus according to claim 1, wherein the semiconductor apparatus is in a solid-state image pickup apparatus.

8. A semiconductor apparatus, comprising:
a first substrate that includes:
    a photoelectric converting section, wherein the photoelectric converting section is in a first compound semiconductor substrate; and
    a first wiring layer on the photoelectric converting section; and
a second substrate that includes:
    an element layer including an active element on the first wiring layer; and
    a second wiring layer on the element layer, wherein
    the element layer is between the first wiring layer and the second wiring layer, and
    the first substrate is on the second substrate.

9. The semiconductor apparatus according to claim 8, wherein the first compound semiconductor substrate includes a semiconductor having a bandgap wider than a bandgap of silicon.

10. The semiconductor apparatus according to claim 8, wherein the first compound semiconductor substrate includes a semiconductor having a bandgap narrower than a bandgap of silicon.

11. The semiconductor apparatus according to claim 8, wherein
the active element includes a transistor, and
a source region and a drain region of the active element is in a second compound semiconductor substrate.

12. The semiconductor apparatus according to claim 8, further comprising a third compound semiconductor substrate, wherein the first compound semiconductor substrate is on the third compound semiconductor substrate.

13. A semiconductor apparatus manufacturing method, comprising:
forming a first substrate including a first element layer and a first wiring layer by forming the first wiring layer on the first element layer, wherein the first element layer includes a first active element;
preparing a second substrate in which a second element layer including a second active element is formed, wherein the second element layer includes a compound semiconductor substrate;
forming the second element layer on the first wiring layer by pasting, on a first wiring layer side of the first substrate, a second element layer side of the second substrate; and
forming a second wiring layer on the second element layer, wherein
the second element layer is between the first wiring layer and the second wiring layer,
the second active element includes a transistor, and
a source region and a drain region of the second active element are in the compound semiconductor substrate.

14. A semiconductor apparatus manufacturing method, comprising:
forming a first substrate including a photoelectric converting section and a first wiring layer by forming the first wiring layer on the photoelectric converting section, wherein the photoelectric converting section is in a compound semiconductor substrate;
preparing a second substrate in which an element layer including an active element is formed, wherein the active element includes a transistor;
forming the element layer on the first wiring layer by pasting, on a first wiring layer side of the first substrate, an element layer side of the second substrate; and
forming a second wiring layer on the element layer, wherein
the element layer is between the first wiring layer and the second wiring layer.

* * * * *